US011366143B2

(12) United States Patent
Spanier et al.

(10) Patent No.: US 11,366,143 B2
(45) Date of Patent: Jun. 21, 2022

(54) INTELLIGENT ELECTRONIC DEVICE WITH ENHANCED POWER QUALITY MONITORING AND COMMUNICATION CAPABILITIES

(71) Applicant: Electro Industries/Gauge Tech, Westbury, NY (US)

(72) Inventors: Joseph Spanier, Brooklyn, NY (US); Erran Kagan, Great Neck, NY (US); Wei Wang, Mahwah, NJ (US)

(73) Assignee: Electro Industries/GaugeTech, Westbury, NY (US)

( * ) Notice: Subject to any disclaimer, the term of this patent is extended or adjusted under 35 U.S.C. 154(b) by 0 days.

(21) Appl. No.: 14/503,512

(22) Filed: Oct. 1, 2014

(65) Prior Publication Data

US 2015/0019148 A1 Jan. 15, 2015

Related U.S. Application Data

(63) Continuation of application No. 13/447,346, filed on Apr. 16, 2012, now Pat. No. 8,862,435, which is a (Continued)

(51) Int. Cl.
*G01R 19/25* (2006.01)
*G01R 19/00* (2006.01)
(Continued)

(52) U.S. Cl.
CPC ......... *G01R 19/2513* (2013.01); *G01R 13/00* (2013.01); *G01R 19/00* (2013.01); (Continued)

(58) Field of Classification Search
None
See application file for complete search history.

(56) References Cited

U.S. PATENT DOCUMENTS 1,863,741 A 6/1932 Leon
2,292,163 A 8/1942 Shea
(Continued)

FOREIGN PATENT DOCUMENTS

JP 08247783 9/1996
WO WO9854583 12/1998
WO WO01055733 8/2001

OTHER PUBLICATIONS

IEC 61000-4-15: Electromagnetic compatibility (EMC) Part 4: Testing and measuring techniques, Section 15: Flickermeter—Functional and design specifications; CENELEC—European Committee for Electrotechnical Standardization; Apr. 1998.
(Continued)

*Primary Examiner* — Lina M Cordero
(74) *Attorney, Agent, or Firm* — Gerald Hespos; Michael Porco; Matthew T. Hespos

(57) ABSTRACT

An intelligent electronic device (IED) has enhanced power quality and communications capabilities. The power meter can perform energy analysis by waveform capture, detect transient on the front end voltage input channels and provide revenue measurements. The power meter splits and distributes the front end input channels into separate circuits for scaling and processing by dedicated processors for specific applications by the power meter. Front end voltage input channels are split and distributed into separate circuits for transient detection, waveform capture analysis and revenue measurement, respectively. Front end current channels are split and distributed into separate circuits for waveform capture analysis and revenue measurement, respectively.

23 Claims, 164 Drawing Sheets

Related U.S. Application Data continuation of application No. 12/080,479, filed on Apr. 3, 2008, now Pat. No. 8,160,824, which is a continuation-in-part of application No. 12/036,356, filed on Feb. 25, 2008, now Pat. No. 7,899,630, which is a continuation of application No. 11/341,802, filed on Jan. 27, 2006, now Pat. No. 7,337,081.

(60) Provisional application No. 60/921,621, filed on Apr. 3, 2007, provisional application No. 60/921,659, filed on Apr. 3, 2007, provisional application No. 60/647,669, filed on Jan. 27, 2005.

(51) Int. Cl.
*G01R 13/00* (2006.01)
*G06F 17/40* (2006.01)
*G01R 22/10* (2006.01)
*G01R 21/133* (2006.01)
*G16Z 99/00* (2019.01)

(52) U.S. Cl.
CPC .......... *G01R 21/133* (2013.01); *G01R 22/10* (2013.01); *G06F 17/40* (2013.01); *G16Z 99/00* (2019.02)

(56) References Cited

U.S. PATENT DOCUMENTS 2,435,753 A 2/1948 Richter et al.
2,606,943 A 8/1952 Barker
2,883,255 A 4/1959 Anderson
2,900,605 A 8/1959 Squires et al.
2,987,704 A 6/1961 Gimpel et al.
2,992,365 A 7/1961 Brill
3,084,863 A 4/1963 Du
3,142,820 A 7/1964 Daniels
3,166,726 A 1/1965 Jensen et al.
3,205,439 A 9/1965 Michael et al.
3,333,194 A 7/1967 Reynolds
3,453,540 A 7/1969 Dusheck
3,458,810 A 7/1969 Wald
3,467,864 A 9/1969 Plaats
3,504,164 A 3/1970 Farrell et al.
3,534,247 A 10/1970 Miljanic
3,535,637 A 10/1970 Goransson
3,629,852 A * 12/1971 Thexton ................ G01R 13/06 324/102
3,737,891 A 6/1973 Metcalf
3,815,013 A 6/1974 Milkovic
3,824,441 A 7/1974 Heyman et al.
3,995,210 A 11/1976 Milkovic
4,066,960 A 1/1978 Milkovic
4,077,061 A 2/1978 Johnston et al.
4,140,952 A 2/1979 Miller
4,158,810 A 6/1979 Eskovar
4,182,983 A 1/1980 Heinrich et al.
4,215,697 A 8/1980 Demetrescu
4,240,149 A 12/1980 Fletcher et al.
4,246,623 A 1/1981 Sun
4,255,707 A 3/1981 Miller
4,283,772 A 8/1981 Johnston
4,336,736 A * 6/1982 Mishima ................. G10H 7/06 84/627
4,345,311 A 8/1982 Fielden
4,360,879 A 11/1982 Dameron
4,415,896 A 11/1983 Allgood
4,437,059 A 3/1984 Hauptmann
4,442,492 A 4/1984 Carlsson et al.
4,463,311 A 7/1984 Cobayashi
4,466,071 A 8/1984 Russell
4,486,707 A 12/1984 Randall et al.
4,495,463 A 1/1985 Milkovic
4,608,533 A 8/1986 Starkie
4,642,563 A 2/1987 McEachern et al.
4,689,752 A 8/1987 Fernandes et al.
4,709,339 A 11/1987 Fernandes
4,713,608 A 12/1987 Catiller et al.
4,713,609 A 12/1987 Osapio et al.
4,742,296 A 5/1988 Petr et al.
4,799,008 A 1/1989 Kannari
4,804,957 A 2/1989 Selph et al.
4,839,819 A 6/1989 Begin et al.
4,841,236 A 6/1989 Miljanic et al.
4,843,311 A 6/1989 Rozman et al.
4,884,021 A 11/1989 Hammond et al.
4,897,599 A 1/1990 Koslar
4,902,965 A 2/1990 Bodrug et al.
4,933,633 A 6/1990 Allgood
4,949,029 A 8/1990 Cooper et al.
4,958,294 A 9/1990 Herscher et al.
4,958,640 A 9/1990 Logan
4,979,122 A 12/1990 Davis et al.
4,989,155 A 1/1991 Begin et al.
4,996,646 A 2/1991 Farrington
4,999,572 A 3/1991 Bickford et al.
5,006,790 A 4/1991 Beverly, II et al.
5,006,846 A 4/1991 Granville et al.
5,014,229 A 5/1991 Mceachern
5,017,860 A 5/1991 Germer et al.
5,079,715 A 1/1992 Venkataraman et al.
5,122,735 A 6/1992 Porter et al.
5,132,609 A 7/1992 Nguyen
5,132,610 A 7/1992 Ying-Chang
5,166,887 A 11/1992 Farrington et al.
5,170,115 A 12/1992 Kashiwabara et al.
5,170,360 A 12/1992 Porter et al.
5,185,705 A 2/1993 Farrington
5,212,441 A 5/1993 Mceachern et al.
5,220,495 A 6/1993 Zulaski
5,224,006 A * 6/1993 MacKenzie .......... H02H 1/0015 361/45
5,224,054 A 6/1993 Wallis
5,229,713 A 7/1993 Bullock et al.
5,233,538 A 8/1993 Wallis
5,237,511 A 8/1993 Caird et al.
5,243,536 A 9/1993 Bradford
5,245,275 A 9/1993 Germer et al.
5,248,935 A 9/1993 Sakoyama et al.
5,248,967 A 9/1993 Daneshfar
5,258,704 A 11/1993 Germer et al.
5,289,115 A 2/1994 Germer et al.
5,298,854 A 3/1994 Mceachern et al.
5,298,855 A 3/1994 Mceachern et al.
5,298,856 A 3/1994 Mceachern et al.
5,298,859 A 3/1994 Mceachern et al.
5,298,885 A 3/1994 Mceachern et al.
5,298,888 A 3/1994 Mceachern et al.
5,300,924 A 4/1994 Mceachern et al.
5,301,121 A 4/1994 Garverick et al.
5,302,890 A 4/1994 Mceachern et al.
5,307,009 A 4/1994 Mceachern et al.
5,315,527 A 5/1994 Beckwith
5,325,051 A * 6/1994 Germer .................. G01R 15/09 324/142
5,343,143 A 8/1994 Voisine et al.
5,347,464 A 9/1994 Mceachern et al.
5,391,983 A 2/1995 Lusignan et al.
5,402,148 A 3/1995 Post et al.
5,406,495 A 4/1995 Hill
5,438,257 A 8/1995 Berkcan
5,442,279 A 8/1995 Kitayoshi et al.
5,450,007 A 9/1995 Payne et al.
5,453,697 A 9/1995 Schweer et al.
5,459,395 A 10/1995 Berkcan
5,459,459 A 10/1995 Lee
5,475,628 A 12/1995 Adams et al.
5,514,958 A 5/1996 Germer
5,528,507 A 6/1996 McNamara et al.
5,537,340 A 7/1996 Gawlik
5,544,064 A 8/1996 Beckwith
5,548,527 A 8/1996 Hemminger et al.
5,555,508 A 9/1996 Munday et al.
5,559,719 A 9/1996 Johnson et al.

(56) References Cited

U.S. PATENT DOCUMENTS 5,563,506 A 10/1996 Fielden et al.
5,568,047 A 10/1996 Staver et al.
5,574,654 A 11/1996 Bingham et al.
5,581,173 A 12/1996 Valla et al.
5,592,165 A 1/1997 Jackson et al.
5,606,510 A 2/1997 Glaser et al.
5,619,142 A 4/1997 Schweer et al.
5,627,759 A 5/1997 Bearden et al.
5,642,300 A 6/1997 Gubisch et al.
5,650,936 A 7/1997 Loucks et al.
5,675,754 A 10/1997 King et al.
5,706,204 A 1/1998 Cox et al.
5,706,214 A 1/1998 Putt et al.
5,734,571 A 3/1998 Pilz et al.
5,736,847 A 4/1998 Doorn et al.
5,737,231 A 4/1998 Pyle et al.
5,757,357 A 5/1998 Grande et al.
5,758,331 A 5/1998 Johnson
5,764,523 A 6/1998 Yoshinaga et al.
5,768,632 A 6/1998 Husted et al.
5,774,366 A 6/1998 Beckwith
5,801,643 A 9/1998 Williams et al.
5,819,203 A 10/1998 Moore et al.
5,822,165 A 10/1998 Moran
5,825,656 A 10/1998 Moore et al.
5,828,576 A 10/1998 Loucks et al.
5,832,210 A 11/1998 Akiyama et al.
5,862,391 A 1/1999 Salas et al.
5,874,903 A 2/1999 Shuey et al.
5,890,097 A 3/1999 Cox
5,892,758 A 4/1999 Argyroudis
5,896,547 A 4/1999 Lee
5,897,607 A 4/1999 Jenney et al.
5,898,387 A 4/1999 Davis et al.
5,899,960 A 5/1999 Moore et al.
5,907,238 A 5/1999 Owerko et al.
5,933,029 A 8/1999 Kuroda et al.
5,952,819 A 9/1999 Berkcan et al.
5,963,734 A 10/1999 Ackerman et al.
5,978,655 A 11/1999 Ohura et al.
5,986,574 A 11/1999 Colton
5,994,892 A 11/1999 Turino et al.
5,995,911 A 11/1999 Hart
6,005,759 A * 12/1999 Hart .................... H02J 13/0004 361/66
6,011,519 A 1/2000 Sadler et al.
6,018,690 A 1/2000 Saito et al.
6,018,700 A 1/2000 Edel
6,023,160 A 2/2000 Coburn
6,032,109 A 2/2000 Ritmiller
6,038,516 A 3/2000 Alexander et al.
6,064,192 A 5/2000 Redmyer
6,073,169 A 6/2000 Shuey et al.
6,098,175 A 8/2000 Lee
6,100,817 A 8/2000 Mason et al.
6,112,136 A * 8/2000 Paul .................. G01R 19/2513 700/293
6,121,801 A 9/2000 Lee et al.
6,133,720 A 10/2000 Elmore
6,157,329 A 12/2000 Lee et al.
6,163,243 A 12/2000 Titus
6,167,329 A 12/2000 Engel et al.
6,185,508 B1 2/2001 Van Doorn et al.
6,186,842 B1 2/2001 Hirschbold et al.
6,195,614 B1 2/2001 Kochan
6,262,672 B1 7/2001 Brooksby et al.
6,269,316 B1 7/2001 Hubbard et al.
6,269,482 B1 7/2001 Gershfeld
6,289,267 B1 9/2001 Alexander et al.
6,292,717 B1 * 9/2001 Alexander ......... G01R 19/2513 340/6.1
6,363,057 B1 3/2002 Ardalan et al.
6,374,084 B1 4/2002 Fok
6,396,421 B1 5/2002 Bland
6,396,839 B1 5/2002 Ardalan et al.
6,397,155 B1 5/2002 Przydatek et al.
6,401,054 B1 6/2002 Andersen
6,415,244 B1 7/2002 Dickens et al.
6,417,661 B1 7/2002 Berkcan et al.
6,423,960 B1 7/2002 Engelhardt et al.
6,429,637 B1 8/2002 Gandhi
6,429,785 B1 * 8/2002 Griffin ................. G01R 21/133 340/661
6,433,981 B1 8/2002 Fletcher et al.
6,437,692 B1 8/2002 Petite et al.
6,444,971 B1 9/2002 Engelhardt et al.
6,479,976 B1 11/2002 Edel
6,483,291 B1 11/2002 Bhateja et al.
6,493,644 B1 * 12/2002 Jonker ................. G01R 21/133 702/182
6,509,850 B1 1/2003 Bland
6,519,537 B1 2/2003 Yang
6,522,517 B1 2/2003 Edel
6,528,957 B1 3/2003 Luchaco
6,538,577 B1 3/2003 Ehrke et al.
6,542,838 B1 4/2003 Haddad et al.
6,590,380 B2 7/2003 Edel
6,611,773 B2 8/2003 Przydatek et al.
6,615,147 B1 * 9/2003 Jonker ................. G01R 21/133 702/182
6,621,433 B1 9/2003 Hertz
6,636,030 B1 10/2003 Rose et al.
6,639,538 B1 10/2003 Sechi
6,657,552 B2 12/2003 Belski et al.
6,661,357 B2 12/2003 Bland
6,671,635 B1 12/2003 Forth et al.
6,671,654 B1 12/2003 Forth et al.
6,671,802 B1 12/2003 Ott
6,674,379 B1 1/2004 Li et al.
6,675,071 B1 * 1/2004 Griffin, Jr .......... G01R 19/2513 340/661
6,687,627 B1 2/2004 Gunn et al.
6,694,270 B2 2/2004 Hart
6,700,347 B1 3/2004 Sakurai et al.
6,701,264 B2 3/2004 Caso et al.
6,714,881 B2 3/2004 Carlson et al.
6,717,394 B2 4/2004 Elms
6,735,535 B1 5/2004 Kagan et al.
6,745,138 B2 6/2004 Przydatek et al.
6,751,562 B1 * 6/2004 Blackett ............. G05B 19/4185 702/61
6,751,563 B2 6/2004 Spanier et al.
6,757,628 B1 6/2004 Anderson et al.
6,759,837 B2 7/2004 Gandhi
6,792,364 B2 * 9/2004 Jonker ................. G01R 21/133 324/76.11
6,813,571 B2 11/2004 Lightbody et al.
6,829,267 B2 12/2004 Vaughan et al.
6,836,737 B2 12/2004 Petite et al.
6,842,707 B2 1/2005 Raichle et al.
6,871,150 B2 3/2005 Huber et al.
6,900,738 B2 5/2005 Crichlow
6,917,888 B2 7/2005 Logvinov et al.
6,944,555 B2 9/2005 Blackett et al.
6,957,158 B1 10/2005 Hancock et al.
6,961,641 B1 11/2005 Forth et al.
6,963,195 B1 11/2005 Berkcan
6,985,087 B2 1/2006 Soliman
6,988,043 B1 1/2006 Randall
7,006,934 B2 * 2/2006 Jonker ................. G01R 21/133 324/76.11
7,010,438 B2 3/2006 Hancock et al.
7,035,593 B2 4/2006 Miller et al.
7,043,459 B2 5/2006 Peevey
7,049,975 B2 5/2006 Vanderah et al.
7,050,808 B2 5/2006 Janusz et al.
7,050,916 B2 5/2006 Curtis et al.
7,072,779 B2 7/2006 Hancock et al.
7,085,824 B2 8/2006 Forth et al.
7,085,938 B1 8/2006 Pozzuoli et al.
7,126,493 B2 10/2006 Junker et al.
7,174,261 B2 2/2007 Gunn et al.
7,191,076 B2 3/2007 Huber et al.
7,196,673 B2 3/2007 Savage et al.

(56) References Cited

U.S. PATENT DOCUMENTS 7,209,804 B2 4/2007 Curt et al.
7,239,184 B2 7/2007 Cetrulo et al.
7,243,050 B2 7/2007 Armstrong
7,304,586 B2 12/2007 Wang et al.
7,304,829 B2 12/2007 Nadipuram et al.
7,305,310 B2 12/2007 Slota et al.
7,313,176 B1 12/2007 Groen
7,337,081 B1 * 2/2008 Kagan .................... G01R 22/10 324/103 R
7,342,507 B2 * 3/2008 Jonker ................. G01R 21/133 324/156
7,359,809 B2 4/2008 Bruno
7,369,950 B2 5/2008 Wall et al.
7,372,574 B2 5/2008 Sanders et al.
7,409,303 B2 8/2008 Yeo et al.
7,436,687 B2 10/2008 Patel
7,444,454 B2 10/2008 Yancey et al.
7,511,468 B2 3/2009 Mceachern et al.
7,514,907 B2 4/2009 Rajda et al.
7,554,320 B2 6/2009 Kagan
7,577,542 B2 8/2009 Vacar et al.
7,616,656 B2 11/2009 Wang et al.
7,630,863 B2 12/2009 Zweigle et al.
7,660,682 B2 2/2010 Slota et al.
7,761,910 B2 7/2010 Ransom et al.
7,877,169 B2 1/2011 Slota et al.
7,881,907 B2 2/2011 Curt et al.
7,899,630 B2 * 3/2011 Kagan .................... G01R 22/10 324/103 R
7,916,060 B2 3/2011 Zhu et al.
7,920,976 B2 4/2011 Banhegyesi
7,962,298 B2 6/2011 Przydatek et al.
7,974,713 B2 7/2011 Disch et al.
7,996,171 B2 8/2011 Banhegyesi
7,999,696 B2 8/2011 Wang et al.
3,022,690 A1 9/2011 Kagan
8,063,704 B2 11/2011 Wu et al.
8,073,642 B2 12/2011 Slota et al.
8,078,418 B2 * 12/2011 Banhegyesi ........... G01D 4/004 702/64
8,107,491 B2 1/2012 Wang et al.
8,160,824 B2 * 4/2012 Spanier .............. G01R 19/2513 324/113
8,190,381 B2 * 5/2012 Spanier .................. G01R 22/10 702/60
8,442,660 B2 5/2013 Kagan
8,515,348 B2 8/2013 Kagan
8,599,036 B2 12/2013 Wang et al.
8,620,608 B2 12/2013 Banhegyesi et al.
8,666,688 B2 * 3/2014 Spanier .............. G01R 19/2509 324/102
8,797,202 B2 8/2014 Zhu et al.
8,862,435 B2 * 10/2014 Spanier .............. G01R 19/2513 324/102
8,878,517 B2 11/2014 Banhegyesi
8,930,153 B2 1/2015 Kagan et al.
8,933,815 B2 * 1/2015 Kagan .................... G01D 4/002 340/870.02
9,080,894 B2 7/2015 Spanier et al.
9,092,593 B2 7/2015 Nasle
9,194,898 B2 11/2015 Banhegyesi et al.
9,482,555 B2 11/2016 Spanier et al.
9,897,665 B2 2/2018 Taft
9,903,895 B2 2/2018 Banhegyesi et al.
9,989,618 B2 6/2018 Spanier et al.
2001/0038343 A1 11/2001 Meyer et al.
2002/0018399 A1 2/2002 Schultz et al.
2002/0032535 A1 3/2002 Alexander et al.
2002/0091784 A1 7/2002 Baker et al.
2002/0105435 A1 8/2002 Yee et al.
2002/0109608 A1 8/2002 Petite et al.
2002/0120723 A1 8/2002 Forth et al.
2002/0129342 A1 9/2002 Kil et al.
2002/0169570 A1 11/2002 Spanier et al.
2002/0180420 A1 12/2002 Lavoie et al.
2003/0014200 A1 * 1/2003 Jonker ................. G01R 21/133 702/60
2003/0018982 A1 1/2003 Zeidler et al.
2003/0025620 A1 2/2003 Bland
2003/0065459 A1 4/2003 Huber et al.
2003/0076247 A1 4/2003 Bland
2003/0093429 A1 5/2003 Hishikawa et al.
2003/0154471 A1 8/2003 Teachman et al.
2003/0178982 A1 9/2003 Elms
2003/0178985 A1 9/2003 Briese et al.
2003/0187550 A1 10/2003 Wilson et al.
2003/0204756 A1 * 10/2003 Ransom ............. G01R 19/2513 713/300
2003/0226058 A1 12/2003 Miller et al.
2004/0113810 A1 6/2004 Mason et al.
2004/0122833 A1 6/2004 Forth et al.
2004/0128260 A1 7/2004 Amedure et al.
2004/0138835 A1 7/2004 Ransom et al.
2004/0167686 A1 8/2004 Baker et al.
2004/0172207 A1 9/2004 Hancock et al.
2004/0177062 A1 9/2004 Urquhart et al.
2004/0183522 A1 9/2004 Gunn et al.
2004/0193329 A1 9/2004 Ransom et al.
2004/0208182 A1 10/2004 Boles et al.
2005/0027464 A1 * 2/2005 Jonker ................. G01R 21/133 702/61
2005/0060110 A1 3/2005 Jones et al.
2005/0071106 A1 3/2005 Huber et al.
2005/0093571 A1 5/2005 Suaris et al.
2005/0144437 A1 6/2005 Ransom et al.
2005/0165585 A1 7/2005 Bhateja et al.
2005/0187725 A1 8/2005 Cox
2005/0220079 A1 10/2005 Asokan
2005/0240362 A1 10/2005 Randall
2005/0243204 A1 11/2005 Zhu
2005/0273280 A1 12/2005 Cox
2005/0288876 A1 12/2005 Doig et al.
2006/0047787 A1 3/2006 Agarwal et al.
2006/0052958 A1 3/2006 Hancock et al.
2006/0066456 A1 * 3/2006 Jonker ................. G01R 21/133 340/870.02
2006/0066903 A1 3/2006 Shiimori
2006/0083260 A1 4/2006 Wang et al.
2006/0085419 A1 4/2006 Rosen
2006/0095219 A1 5/2006 Bruno
2006/0145890 A1 7/2006 Junker et al.
2006/0161360 A1 7/2006 Yao et al.
2006/0200599 A1 9/2006 Manchester et al.
2006/0261296 A1 11/2006 Heath et al.
2006/0267560 A1 11/2006 Rajda et al.
2007/0058320 A1 * 3/2007 Lee ...................... H02H 1/0061 361/157
2007/0058634 A1 3/2007 Gupta et al.
2007/0067119 A1 3/2007 Loewen et al.
2007/0067121 A1 3/2007 Przydatek et al.
2007/0081597 A1 4/2007 Disch et al.
2007/0096765 A1 5/2007 Kagan
2007/0096942 A1 * 5/2007 Kagan .................... G01D 4/002 340/870.02
2007/0112446 A1 5/2007 Deveaux et al.
2007/0114987 A1 5/2007 Kagan
2007/0152058 A1 7/2007 Yeakley et al.
2007/0233323 A1 10/2007 Wiemeyer et al.
2008/0075194 A1 3/2008 Ravi et al.
2008/0086222 A1 4/2008 Kagan
2008/0091770 A1 4/2008 Petras et al.
2008/0147334 A1 * 6/2008 Kagan .................... G06Q 50/06 702/60
2008/0172192 A1 7/2008 Banhegyesi
2008/0195794 A1 8/2008 Banker
2008/0215264 A1 * 9/2008 Spanier .............. G01R 19/2509 702/62
2008/0234957 A1 * 9/2008 Banhegyesi ........... G01D 4/004 702/64
2008/0235355 A1 9/2008 Spanier et al.
2008/0238406 A1 10/2008 Banhegyesi
2008/0238713 A1 10/2008 Banhegyesi et al.

(56) References Cited

U.S. PATENT DOCUMENTS

| | | | | |
|---|---|---|---|---|
| 2008/0252481 | A1 | 10/2008 | Vacar et al. | |
| 2009/0012728 | A1 | 1/2009 | Spanier et al. | |
| 2009/0066528 | A1 | 3/2009 | Bickel et al. | |
| 2009/0072813 | A1 | 3/2009 | Banhegyesi | |
| 2009/0096654 | A1 | 4/2009 | Zhu et al. | |
| 2009/0228224 | A1* | 9/2009 | Spanier | G01R 22/10 702/60 |
| 2009/0265124 | A1 | 10/2009 | Kagan | |
| 2010/0054276 | A1 | 3/2010 | Wang et al. | |
| 2010/0076616 | A1 | 3/2010 | Kagan | |
| 2010/0153036 | A1 | 6/2010 | Elwarry et al. | |
| 2010/0169876 | A1 | 7/2010 | Mann | |
| 2010/0324845 | A1* | 12/2010 | Spanier | G01R 19/2513 702/62 |
| 2011/0040809 | A1 | 2/2011 | Spanier et al. | |
| 2011/0153697 | A1 | 6/2011 | Nickolov et al. | |
| 2011/0158244 | A1 | 6/2011 | Long et al. | |
| 2011/0260710 | A1 | 10/2011 | Zhu et al. | |
| 2011/0270551 | A1 | 11/2011 | Kagan et al. | |
| 2012/0025807 | A1 | 2/2012 | Banhegyesi | |
| 2012/0209057 | A1 | 8/2012 | Siess et al. | |
| 2012/0209552 | A1* | 8/2012 | Spanier | G01R 19/2513 702/64 |
| 2012/0209557 | A1 | 8/2012 | Crandall et al. | |
| 2013/0158918 | A1* | 6/2013 | Spanier | G01R 22/10 702/64 |
| 2014/0180613 | A1 | 6/2014 | Banhegyesi et al. | |
| 2014/0222357 | A1 | 8/2014 | Spanier et al. | |
| 2017/0046458 | A1 | 2/2017 | Meagher et al. | |

OTHER PUBLICATIONS

7700 Ion 3-Phase Power Meter, Analyzer and Controller, pp. 1-10, Dec. 8, 1998.

ION Technology, 7500 ION High Visibility 3-Phase Energy & Power Quality Meter, Power Measurement, specification, pp. 1-8, revision date Mar. 21, 2000.

ION Technology, 7500 ION 7600 ION High Visibility Energy & Power Quality Compliance Meters, Power Measurement, specification, pp. 1-8, revision date Nov. 30, 2000.

User's Installation & Operation and User's Programming Manual. The Futura Series, Electro Industries, pp. 1-64, Copyright 1995.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Tech, specification, 16 pages, Nov. 1999.

Performance Power Meter & Data Acquisition Node, Electro Industries/Gauge Tech., Nexus 1250 specification, 8 pages, Dec. 14, 2000.

Futura+Series, "Advanced Power Monitoring and Analysis for the 21st Century", Electro Industries/Gauge Tech, specification, 8 pages, Apr. 13, 2000.

PowerLogic Series 4000 Circuit Monitors, pp. 1-4; Document #3020HO0601; Jan. 2006.

ION7550/ion7650 PowerLogic power-monitoring units, Technical data sheets, Copyright 2006 Schneider Electric.

European Standard EN-50160; "Voltage characteristics of electricity supplied by public distribution networks" Copyright 2007 CENELEC; published Oct. 31, 2007; pp. 1-23.

The Dranetz Field Handbook for Power quality Analysis; Dranetz Technologies Incorporated, Edison, NJ; Copyright 1991; pp. 1-271.

International Standard IEC-1180-1; "High-voltage test techniques for low-voltage equipment"; Copyright Commission Electrotechnique Commission 1992; Geneva, Switzerland; pp. 1-62.

International Standard IEC-61000-2-4, Second Edition; "Electromagnetic compatibility (EMC)—Part 2-4:Enviroment-Compatbility levels in industrial plants for low-frequency conducted distribances"; Copyright Commission Electrotechnique Commission 2002; Geneva, Switzerland; pp. 1-84.

International Standard IEC-61000-4-7, Second Edition; "Electromagnetic compatibility (EMC)—Part 4-7:Testing and measurement techniques"; Copyright Commission Electrotechnique Commission 2002; Geneva, Switzerland; pp. 1-80.

International Standard IEC-61000-4-30, First Edition; "Electromagnetic compatibility (EMC)—Part 4-30:Testing and measurement techniques—Power quality measurement methods"; Copyright Commission Electrotechnique Commission 2003; Geneva, Switzerland; pp. 1-98.

International Standard IEC-687, Second Edition; "Alternating current static watt-hours meters for active energy" Copyright Commission Electrotechnique Commission 1992; Geneva, Switzerland; pp. 1-36.

IEEE Std 519-1992; IEEE Recommended Practices and Requirements for Harmonic Control in Electrical Power Systems; Copyright The Institute of Electrical and Electronics Engineers, Inc. 1993; New York, NY; pp. 1-101.

IEEE Std 1159-1995; IEEE Recommended Practice for monitoring Electric Power Quality; Copyright The Institute of Electrical and Electronics Engineers, Inc. 1995; New York, NY; pp. 1-76.

"Power Quality—A guide to voltage fluctuation and light flicker"; BChydro Power Smart, Vancouver, B.C., Canada; Dated Mar. 2005; pp. 1-12.

Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

Power Platform 4300 Multi-DAQ TASKCard Operator's Manual; Dranetz-BMI, Original Issue—Jul. 2002, pp. 203.

Power Platform PP1 & PP1E TASKCard-Inrush Operator's Manual; Dranetz-BMI, Revision A—Apr. 15, 1997, pp. 231.

Series 5500 InfoNode User's Guide; Dranetz-BMI, Edison, NJ; Copywright 1999, 2002, 2004; pp. 1-220.

Electro Industries/Gauge Tech DM Series-specification brochure, "DMMS 425 Low-Cost Multifunction Power Monitoring Outperforms All Others in its Class", 4 pages.

3720 ACM, 3-phase Power Instruction Package, Power Measurement, specification, 8 pages, revision date Dec. 16, 1998.

3720 ACM, Installation & Operation Manual, Power Measurement, 67 pages, revision date Apr. 4, 2000.

6200 ION, Installation & Basic Setup Instructions, (c)Power Measurement Ltd., Revision Date Apr. 25, 2001, 50 pages.

8400 ION/8500 ION Instruction Leaflet, Power Measurement, pp. 1-8, Oct. 1999.

8500 ION Technical Documentation, 8500 ION and 8500 ION-PQ Advanced Intelligent Billing Meters, specification, Power Measurement, revision date Apr. 15, 1999.

Brochure, Sentinel TM Electronic "Multimeasurement Meter," Schlumberger, Mar. 2001, 4 pages.

Communicator EXT 3.0, User Manual Version 1.28; Electro Industries/Gauge Tech; Doc # E107707 V1.28, Nov. 11, 2005.

http://www.landisgyrus/Landis-Gyr/Meters/2510-socket-meter. asp, Apr. 18, 2005, 25 pages.

ION 7550/ION7650 User Guide Power Measuremen-Revision Date Aug. 31, 2004.

ION Technology 7700 ION 3-Phase Power Meter, Analyzer and Controller, Power Measurement, specification, pp. 1-10, revision date Dec. 8, 1998.

ION Technology 7700 ION Installation & Operation Manual, Power Measurement, revision date Nov. 20, 1996.

ION Technology 8500 ION. 8400 ION Advanced Socket-Mount Meter, specification, Power Measurement, pp. 1-12, revision date Dec. 3, 1999.

ION(R) Technology, Meter Shop User's Guide, (C)Power Measurement Ltd., Revision Date May 10, 2001, 48 pages.

Manual, "3300 ACM, Economical Digital Power Meter/Transducer—Installation and Operation Manual, Power Measurement, Ltd.", 1999, pp. 79.

Nagura et al., "Correction method for a single chip power meter", May 10-12, 1994, IEEE, 1994 IEEE Instrumentation and Measurement Technology Conference, 1994. ITMC/94.

(56) References Cited

OTHER PUBLICATIONS

Ramboz, J.D. and Petersons, O., Nist Measurement Services: A Calibration Service for Current Transformers, U.S. Dept. of Commerce, National Institute of Standards and Tech., U.S. Gov. PMtg. Ofc., Jun. 1991.
Office Action for U.S. Appl. No. 14/948,542, dated Jun. 29, 2016; 6 pages.
Office Action (Notice of Allowance) for U.S. Appl. No. 14/948,542, dated Nov. 16, 2016; 7 pages.
Office Action for U.S. Appl. No. 14/948,542, dated Apr. 26, 2017; 5 pages.
Braden, R (editor), "Requirements for Internet Hosts-Application and Support", RFC 1123, pp. 1-97 Oct. 1989.
Deutsch, P., Emtage, A., and Marine, A., "How to Use Anonymous FTP", RFC1635, pp. 1-13, May 1994.
Hubbert, "What is flat file?", WhatIs.com,http://searchsqlserver.techtarget.com/definition/flat-file, Jul. 2006, 1pp.
Postel, J.B., and Reynolds, J.K. "File Transfer Protocol (FTP)", RFC959, pp. 1-66, Oct. 1985.
Speirs, "What is binary file?", WhatIs.com, http://whatis.techtarget.com/definition/binary-file, Apr. 2005, 1 pp.

* cited by examiner

| | |
|---|---|
| FIG.3A | FIG.3B |
| FIG.3C | FIG.3D |
| FIG.3E | FIG.3F |

| | | | |
|---|---|---|---|
| FIG.6A | FIG.6B | FIG.6C | FIG.6D |
| FIG.6E | FIG.6F | FIG.6G | |

| | | | |
|---|---|---|---|
| FIG.7A | FIG.7B | FIG.7C | FIG.7D |
| FIG.7E | FIG.7F | FIG.7G | FIG.7H |

Boot Mode Selection

DEFAULT = SPI Master Mode Boot

| R10 | R12 | Boot Mode |
|---|---|---|
| Populated | Not Populated | SPI Master |
| Not Populated | Populated | SPI Slave |

| | | | |
|---|---|---|---|
| FIG.8A | FIG.8B | FIG.8C | FIG.8D |
| FIG.8E | FIG.8F | FIG.8G | |

| | |
|---|---|
| FIG.9A | FIG.9B |
| FIG.9C | FIG.9D |
| FIG.9E | FIG.9F |

| FIG.10A | FIG.10B | FIG.10C | FIG.10D |
|---|---|---|---|
| FIG.10E | FIG.10F | | |

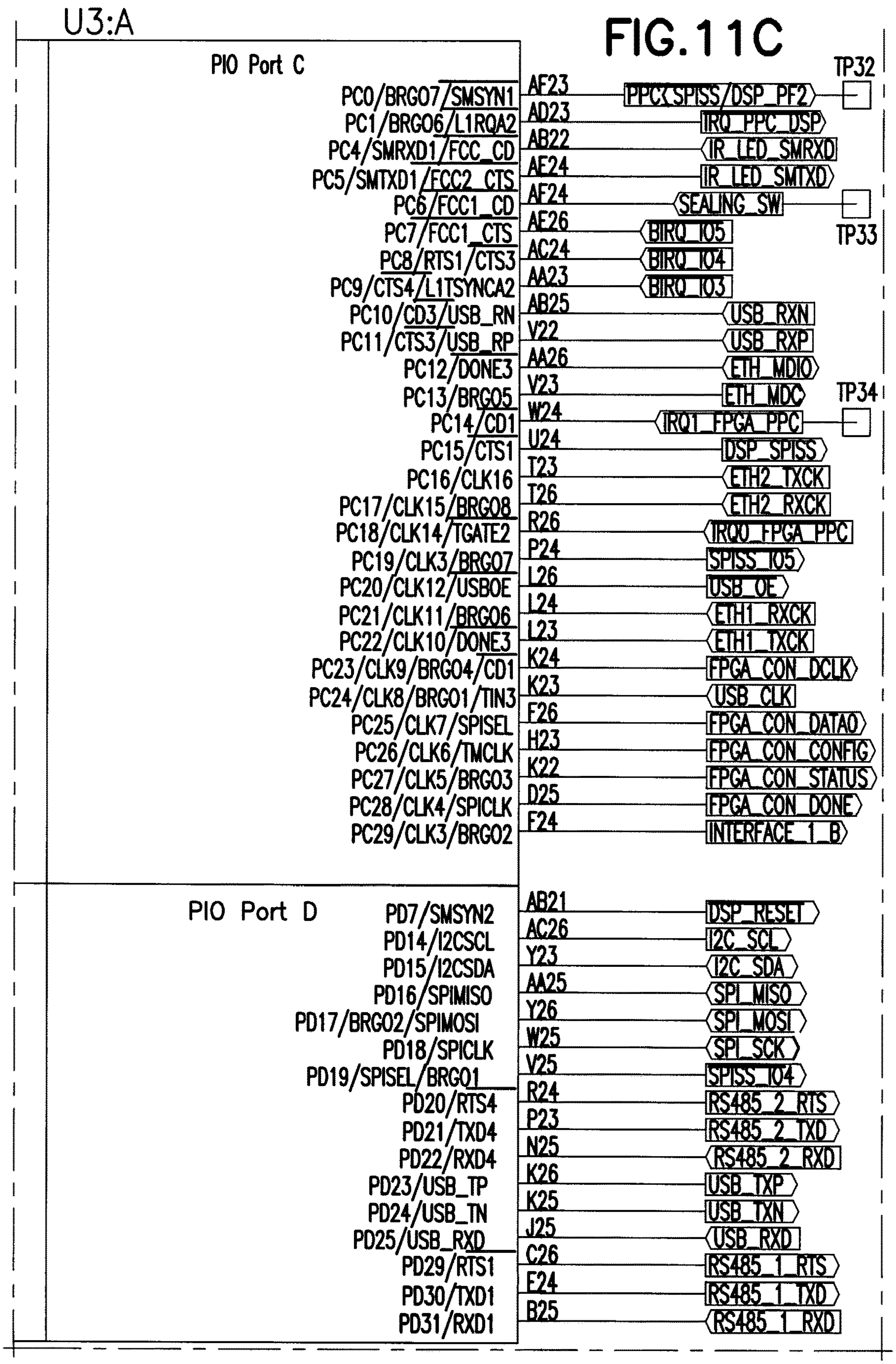
U3:A
FIG.11C
PIO Port C
PC0/BRGO7/SMSYN1 AF23 PPC_SPISS/DSP_PF2 TP32
PC1/BRGO6/L1RQA2 AD23 IRQ_PPC_DSP
PC4/SMRXD1/FCC_CD AB22 IR_LED_SMRXD
PC5/SMTXD1/FCC2_CTS AF24 IR_LED_SMTXD
PC6/FCC1_CD AF24 SEALING_SW TP33
PC7/FCC1_CTS AE26 BIRQ_IO5
PC8/RTS1/CTS3 AC24 BIRQ_IO4
PC9/CTS4/L1TSYNCA2 AA23 BIRQ_IO3
PC10/CD3/USB_RN AB25 USB_RXN
PC11/CTS3/USB_RP V22 USB_RXP
PC12/DONE3 AA26 ETH_MDIO
PC13/BRGO5 V23 ETH_MDC TP34
PC14/CD1 W24 IRQ1_FPGA_PPC
PC15/CTS1 U24 DSP_SPISS
PC16/CLK16 T23 ETH2_TXCK
PC17/CLK15/BRGO8 T26 ETH2_RXCK
PC18/CLK14/TGATE2 R26 IRQ0_FPGA_PPC
PC19/CLK3/BRGO7 P24 SPISS_IO5
PC20/CLK12/USBOE L26 USB_OE
PC21/CLK11/BRGO6 L24 ETH1_RXCK
PC22/CLK10/DONE3 L23 ETH1_TXCK
PC23/CLK9/BRGO4/CD1 K24 FPGA_CON_DCLK
PC24/CLK8/BRGO1/TIN3 K23 USB_CLK
PC25/CLK7/SPISEL F26 FPGA_CON_DATA0
PC26/CLK6/TMCLK H23 FPGA_CON_CONFIG
PC27/CLK5/BRGO3 K22 FPGA_CON_STATUS
PC28/CLK4/SPICLK D25 FPGA_CON_DONE
PC29/CLK3/BRGO2 F24 INTERFACE_1_B
PIO Port D
PD7/SMSYN2 AB21 DSP_RESET
PD14/I2CSCL AC26 I2C_SCL
PD15/I2CSDA Y23 I2C_SDA
PD16/SPIMISO AA25 SPI_MISO
PD17/BRGO2/SPIMOSI Y26 SPI_MOSI
PD18/SPICLK W25 SPI_SCK
PD19/SPISEL/BRGO1 V25 SPISS_IO4
PD20/RTS4 R24 RS485_2_RTS
PD21/TXD4 P23 RS485_2_TXD
PD22/RXD4 N25 RS485_2_RXD
PD23/USB_TP K26 USB_TXP
PD24/USB_TN K25 USB_TXN
PD25/USB_RXD J25 USB_RXD
PD29/RTS1 C26 RS485_1_RTS
PD30/TXD1 E24 RS485_1_TXD
PD31/RXD1 B25 RS485_1_RXD

| | | | |
|---|---|---|---|
| FIG.11A | FIG.11B | FIG.11C | FIG.11D |
| FIG.11E | FIG.11F | FIG.11G | |

| | |
|---|---|
| FIG.12A | FIG.12D |
| FIG.12B | FIG.12E |
| FIG.12C | FIG.12F |

| | | |
|---|---|---|
| FIG.13A | FIG.13B | FIG.13C |
| FIG.13D | FIG.13E | FIG.13F |

| FIG.14A | FIG.14B | FIG.14C | FIG.14D | FIG.14E |
|---|---|---|---|---|

| | | | |
|---|---|---|---|
| FIG.15A | FIG.15B | FIG.15C | FIG.15D |
| FIG.15E | FIG.15F | FIG.15G | |

| | | | |
|---|---|---|---|
| FIG.17A | FIG.17B | FIG.17C | FIG.17D |
| | FIG.17E | FIG.17F | FIG.17G |

| | | |
|---|---|---|
| FIG.18A | FIG.18B | FIG.18C |
| FIG.18D | FIG.18E | FIG.18F |

10/100BASE-TX/FX Transceiver

WIRELESS – DPAC CIRCUIT (OPT 2)

| FIG.22A | FIG.22B | FIG.22C |
|---|---|---|
| FIG.22D | FIG.22E | |

10/100 BASE-TX/FX TRANSCEIVER CIRCUIT

| FIG.23A | FIG.23B | FIG.23C | FIG.23D |
|---|---|---|---|

| FIG.25A | FIG.25B | FIG.25C |
|---|---|---|

| | | | |
|---|---|---|---|
| FIG.26A | FIG.26B | FIG.26C | |
| FIG.26D | FIG.26E | FIG.26F | FIG.26G |

LFSK154501

| | | | |
|---|---|---|---|
| FIG.29A | FIG.29B | FIG.29C | FIG.29D |
| FIG.29E | FIG.29F | FIG.29G | FIG.29H |

| | | | |
|---|---|---|---|
| FIG.30A | FIG.30B | FIG.30C | FIG.30D |
| FIG.30E | FIG.30F | FIG.30G | |

INTELLIGENT ELECTRONIC DEVICE WITH ENHANCED POWER QUALITY MONITORING AND COMMUNICATION CAPABILITIES

PRIORITY

This application is a continuation application of U.S. patent application Ser. No. 13/447,346, filed Apr. 16, 2012, now U.S. Pat. No. 8,862,435, which is a continuation application of U.S. patent application Ser. No. 12/080,479, filed Apr. 3, 2008, now U.S. Pat. No. 8,160,824, which is a continuation-in-part application of U.S. patent application Ser. No. 12/036,356 filed on Feb. 25, 2008, now U.S. Pat. No. 7,899,630, which is a continuation application of U.S. patent application Ser. No. 11/341,802 filed on Jan. 27, 2006 entitled "METERING DEVICE WITH CONTROL FUNCTIONALITY AND METHOD THEREOF", now U.S. Pat. No. 7,337,081, which claims priority to U.S. Provisional Patent Application Ser. No. 60/647,669 filed on Jan. 27, 2005, the contents of which are hereby incorporated by reference in their entireties.

This application also claims priority to U.S. Provisional Patent Application Ser. No. 60/921,651 "INTELLIGENT ELECTRONIC DEVICE WITH ENHANCED POWER QUALITY MONITORING AND COMMUNICATIONS CAPABILITIES" filed in the United States Patent and Trademark Office on Apr. 3, 2007, and U.S. Provisional Patent Application Ser. No. 60/921,659 entitled "HIGH SPEED DIGITAL TRANSIENT TRIGGERING AND CAPTURE SYSTEM AND METHOD FOR USE IN AN INTELLIGENT ELECTRONIC DEVICE" filed in the United States Patent and Trademark Office on Apr. 3, 2007, the contents of which are hereby incorporated by reference.

BACKGROUND

The present disclosure relates generally to an Intelligent Electronic Device ("IED") that is versatile and robust to permit accurate measurements and to pictorially depict power usage and power quality data for any metered point within a power distribution network allowing users to make power related decisions quickly and effectively. In particular, the present disclosure relates to an IED having enhanced power quality monitoring and control capabilities and a communications system for a faster and more accurate processing of revenue and waveform analysis.

The present disclosure provides a transient measurement circuit that addresses problems in power measurement and analysis systems due to transients. Transients are rapid changes in steady state conditions for voltages and currents. Transients can occur in all A.C. power systems. Transients designate a phenomenon or a quantity that varies between two consecutive time states at a shorter time interval than the measured interval of interest. If a voltage transient exceeds a voltage dip and/or a voltage swell threshold, the transient will be recorded as a voltage dip or swell. Various conditions such as weather conditions, lightning strikes, power surges and swells, blackouts, brownouts and fault conditions can severely compromise power quality monitoring capabilities by IEDs. It is therefore desirable to have an IED capable of detecting transients and other power quality disturbances.

SUMMARY

An IED, e.g. a power meter, with enhanced power quality and communications capabilities is provided. The power meter can perform energy analysis by waveform capture, detect transients on front end voltage input channels and provide revenue measurements.

The power meter splits and distributes the front end input channels of voltages and currents into separate circuits for scaling and processing by dedicated processors or processing functions for specific applications by the power meter.

Front end voltage input channels are split and distributed into separate circuits for transient detection, waveform capture analysis and revenue measurement, respectively.

In one aspect of the present disclosure, the transient measurement circuit of the present disclosure addresses problems due to transient voltage spikes. The transient measurement circuit of the present disclosure provides a circuit for measuring transients for voltage input channels and for avoiding the introduction of crosstalk from the waveform capture and revenue measurement circuits onto the transient detection circuit. This sensitivity for the transient detection provides for a faster and more sensitive measurement of the transients and provides data for better analysis of the transients.

FIG. 2 illustrates how various voltage and current channels may be input to each of the aforementioned paths or circuits after being converted into digital signals by their respective A/D converters. The outputs of each of the A/D converters can either have its own dedicated processor for the particular application involved or use processors having dedicated firmware for the particular application involved, e.g. transient detection, waveform capture and revenue measurement. One or more of the same processors in which the firmware for the particular application is written/programmed therein can be utilized by the power meter for these particular applications. In this way, redundancy can exist in the power meter where the same firmware for a particular application may be available in more than one processor. The definition of a processor may also include a microprocessor, micro-controller, a digital signal processor, a field programmable logic device utilizing an internal "soft core" such a CORTEX® core licensed by Actel Corp, or any other similar device that can execute software code whether embedded internal or stored in external memory.

According to one aspect of the present disclosure, a system for measuring AC voltage and current signals for an intelligent electronic device (IED) is provided including an IED into which a plurality of input channels for AC voltages and currents are fed, sensors for sensing the plurality of input channels, a plurality of analog to digital converters and a processing system including at least one central processing unit or host processor (CPU) or one or more digital signal processors; a plurality of paths into which the at least one input signal is split, each of the paths including circuitry for scaling its respective split signal and utilizing its respective scaled signal for a particular application by the IED; wherein the particular applications include the IED having the ability to measure energy for revenue applications and record waveforms on power quality events, the IED includes the ability to measure transient signals at or above 1 mHZ frequency for at least one of the phase voltage inputs, and wherein the IED includes the ability to transmit captured waveform samples generated by at least one of the analog to digital converters using serial or Ethernet communication channels. The IED has the ability to measure differing power quality events and place them in bins designating amount of occurrences of a power quality even within a prescribed time period. The IED further comprises a resistor divider into which the voltage signal is fed wherein the signal is decreased. The IED transfers waveform records to non-volatile RAM from volatile RAM.

In another aspect, the scaling circuit of the IED for revenue measurement includes a calibration switch for calibrating the input signal, wherein the IED further includes at least one central processor unit (CPU) or digital signal Processor (DSP processor) to control the calibration switch.

In a further aspect, the system further includes a time overcurrent protective relay function operative to operate relay located in the IED and interrupt a primary current circuit if one of at least one current inputs are not within safe limits.

According to another aspect of the present disclosure, an Intelligent electronic device (IED) for measuring AC voltage and current signals is provided. The IED includes a plurality of input channels for AC voltages and currents are fed, sensors for sensing the plurality of input channels, a plurality of analog to digital converters and a processing system including at least one central processing unit or host processor (CPU) or one or more digital signal processors; wherein the particular applications include the IED having the ability to measure energy for revenue applications and record waveforms on power quality events, wherein the IED includes the ability to measure transient signals at or above 1 mHZ frequency for at least one of the phase voltage inputs, wherein the IED includes the ability to transmit captured waveform samples generated by at least one of the analog to digital converters using serial or Ethernet communication channels wherein the IED includes a graphical, backlit LCD display, a volatile memory and a non-volatile memory for storing captured waveform samples from at least one analog to digital converter. The non-volatile memory includes a compact flash device. A series of bins are used to store the count of the number of the power quality events within the user defined period of time for the range of values for one parameter.

In yet another aspect, the power quality is determined by measuring total harmonic distortion of one of the voltage or current inputs, by measurement of frequency fluctuations of the voltage inputs, by the measurement of harmonic magnitude of each individual harmonic for one of the voltage and current inputs, by measuring fast voltage fluctuation from the voltage inputs, or by measuring flicker severity. The power quality measurement is implemented in embedded software used by at least one CPU or DSP processor.

According to a further aspect of the present disclosure, an architectural structure for an intelligent electronic device (IED) system includes a plurality of analog to digital converters (A/D) adapted to receive input signals and transmit them; a plurality of processors adapted to receive signals outputted from the A/D converters; and a communications gateway for the processors to communicate between each other simultaneously so that data can be retrieved, processed and provided to a user. The communications gateway includes at least one field programmable gate array, at least dual port RAM or a serial communication architecture between the plurality of processors.

In a still another aspect of the present disclosure, an architectural structure for an intelligent electronic device (IED) system includes a plurality of analog to digital (A/D) converters each A/D converter being dedicated to converting analog signals, each of the analog signals containing data for at least one particular application; a plurality of processors, each processor having firmware dedicated to receiving and processing the converted signals containing the data for the at least one particular application outputted from a corresponding one of the A/D converters; and a communications gateway for the processors to communicate between each other simultaneously so that the data can be retrieved and processed and provided to a user. The system is expandable so that additional processors and A/D converters and dual port memory can be added to convert and process and communicate data of at least one additional application.

According to another aspect of the present disclosure, a method for architecturally structuring an intelligent electronic device (IED) system is provided, the steps including converting analog signals by a plurality of analog to digital (A/D) converters, each A/D converter being dedicated to convert at least one of the analog signals containing one type of specific data; processing the signals by the A/D converters by a plurality of processors, each processor having firmware dedicated to receiving and processing the converted signals containing the data of at least one particular application outputted from a corresponding one of the A/D converters; and communicating between the processors simultaneously by dual port simultaneously so that the data can be retrieved and processed and provided to a user.

In a further aspect, a method of reducing noise between circuits is provided, the steps including laying out each circuit in a separate location of printed circuit board; and configuring each trace in each circuit to a preferred width so that each part of one of the circuits does not overlap or lay in close approximation with a part of another of the circuits and each one of each trace is separated from another of the each the trace by a preferred distance preferably in a range of between about 8 mils to about 20 mil or greater thereby reducing noise between the circuits on the printed circuit board. The printed circuit board has a top layer, a bottom layer and one or more middle layers and the traces for the transient detection circuit are placed on one of the one or more mid level layers separate from whichever layers traces for the waveform capture circuit are placed and traces for the revenue measurement circuit are placed.

In another aspect, an intelligent electronic device system includes a transient detection circuit for detecting and capturing transient voltages; and a circuit for resetting input channels to an intelligent electronic device system to their initial settings for highly accurate revenue energy measurement and waveform recording capture on an event into at least one non-volatile memory in the intelligent electronic device system. The highly accurate revenue measurement, the high voltage transient detection and waveform recording capture occur concurrently in the intelligent electronic device system. The circuit for resetting includes at least one calibration switch for calibrating the input signal level and at least one processor controls the at least one calibration switch to switch the at last one calibration switch if the input channels have varied from their initial settings so as to adjust the initial settings by a correction factor stored in the at least one processor provided by the external source.

According to a still further aspect of the present disclosure, a method of calculating a calibrated phase to neutral voltage ($V_{PN}$) RMS in an IED is provided, the steps including sampling a phase to neutral voltage signal ($V_{PE}$) and a neutral to earth voltage signal ($V_{NE}$) relative to the Earth's potential; calculating phase to neutral voltage RMS from the sampled voltage signals as follows:

$$V_{AN} = \sqrt{\begin{matrix} g^2\left(\frac{\sum_n V_{AE}^2 - 2o\sum_n V_{AE}}{n} + o^2\right) - \\ 2gh\left(\frac{\sum_n V_{AE}V_{NE} - o\sum_n V_{NE} - p\sum_n V_{AE}}{n} + op\right) + \\ h^2\left(\frac{\sum_n V_{NE}^2 - 2p\sum_n V_{NE}}{n} + p^2\right) \end{matrix}}$$

where −o, −p, g and h are constants and $V_{AN}$ is the voltage from phase A to neutral, $V_{AE}$ is the voltage measured from phase A to earth and $V_{NE}$ is the voltage measured from neutral to earth.

In a further aspect, a system for calculating a calibrated phase (for example, Phase A, B, or C of a three phase system) to neutral voltage ($V_{PN}$) RMS for an Intelligent Electronic Device (IED) includes sampling circuitry for sampling a phase to neutral voltage signal ($V_{PE}$) and a neutral to earth voltage signal ($V_{NE}$) relative to the Earth's potential, the sampling circuitry including at least one analog to digital converter; a processor for calculating phase to neutral voltage RMS from the sampled voltage signals as follows:

$$V_{AN} = \sqrt{\begin{matrix} g^2\left(\frac{\sum_n V_{AE}^2 - 2o\sum_n V_{AE}}{n} + o^2\right) - \\ 2gh\left(\frac{\sum_n V_{AE}V_{NE} - o\sum_n V_{NE} - p\sum_n V_{AE}}{n} + op\right) + \\ h^2\left(\frac{\sum_n V_{NE}^2 - 2p\sum_n V_{NE}}{n} + p^2\right) \end{matrix}}$$

where −o, −p, g and h are constants and $V_{AN}$ is the voltage from phase A to neutral, $V_{AE}$ is the voltage measured from phase A to earth and $V_{NE}$ is the voltage measured from neutral to earth.

In another aspect, the system further includes an envelope type waveform trigger, wherein the envelope type waveform trigger generates a trigger upon detection of samplings of the at least one scaled, split signal exceeding at least one threshold voltage. The envelope type waveform trigger is implemented by firmware in at least one DSP Processor or CPU.

In a further aspect, the envelope type waveform trigger is determined by, $$Vt1-Vth1<Vt2<Vt1+Vth2$$

where Vt1 is a voltage sampled at time T1 and Vt2 is a voltage sampled at time T2 which is one cycle after time T1 and Vth1 is a first and lower threshold voltage level and Vth2 is a second and upper voltage threshold so that if the signal does not exceed the either the upper threshold voltage or the lower threshold voltage there will be no trigger on the envelope type waveshape.

In still another aspect of the present disclosure, the system further includes a time overcurrent protective relay function operative to operate relay located in the IED and interrupt a primary voltage and current circuit if one of at least the current inputs are not within safe limits, wherein the protective relay system is implemented by firmware within at least one DSP processor or a CPU.

In a further aspect, an intelligent electronic device (IED) for recording at least one waveform of an AC power system is provided, the IED including a voltage input circuit operative to sense line voltage from the AC power system and generate at least one voltage signal representative of the voltage sensed from the AC power system; at least one analog-to-digital converter circuit configured to sample the at least one voltage signal to output digital samples representative of said voltage input circuit; at least one processor operatively coupled to said analog-to-digital converter and configured to perform at least one mathematical computation on samples received from the analog-to-digital converter; and at least one volatile memory operatively coupled to said at least one processor to receive samples from the analog-to-digital converter; wherein the at least one processor is configured to trigger a recording and storing in non-volatile memory at least one of said digital samples based on an algorithm that includes at least one of an adaptive trigger, a waveshape trigger and a rate of change trigger. In one embodiment, the communication device sends said data utilizing SNMP protocol.

In another aspect, a system for an intelligent electronic device (IED) to send data utilizing Simple Network Management Protocol (SNMP) and Modbus TCP is provided. The system includes an SNMP agent; SNMP management software; a software system which communicates via Modbus TCP protocol; and the intelligent electronic device (IED) comprising: an Ethernet communication port located on the IED including at least one of a physical port and a wireless port; and a Modbus TCP protocol stack, wherein the IED can parse Modbus TCP requests coming from the software system. The communication port is configured for transmitting an e-mail alarm while communicating via Modbus TCP protocol and SNMP to at least one software system.

In yet another aspect of the present disclosure, an intelligent electronic device (IED) including an anti-aliased waveform recording system is provided, the waveform recording system including a voltage input circuit operative to sense line voltage from the AC power system and generate at least one voltage signal representative of the voltage sensed from the AC power system; at least one analog-to-digital converter circuit configured to sample the at least one voltage signal to output digital samples representative of said voltage input circuit; at least one of a digital and analog anti-alias filter for filtering the samples above a predetermined set point; at least one processor operatively coupled to said analog-to-digital converter and configured to perform at least one mathematical computation on samples received from the analog-to-digital converter; and at least one volatile memory operatively coupled to said at least one processor to receive samples from the analog-to-digital converter.

BRIEF DESCRIPTION OF THE DRAWINGS

Other aspects will become readily apparent from the foregoing description and accompanying drawings in which.

DETAILED DESCRIPTION OF THE PREFERRED EMBODIMENTS

Preferred embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage, control and communicate the distribution and consumption of electrical power. A power meter is a device that records and measures power events, power quality, current, voltage waveforms, harmonics, transients and other power disturbances. Revenue accurate meters ("revenue meter") relate to high revenue electrical power metering devices with the ability to detect, monitor, report, quantify and communicate power demand and energy information about the power system which they are metering.

Figure 1:
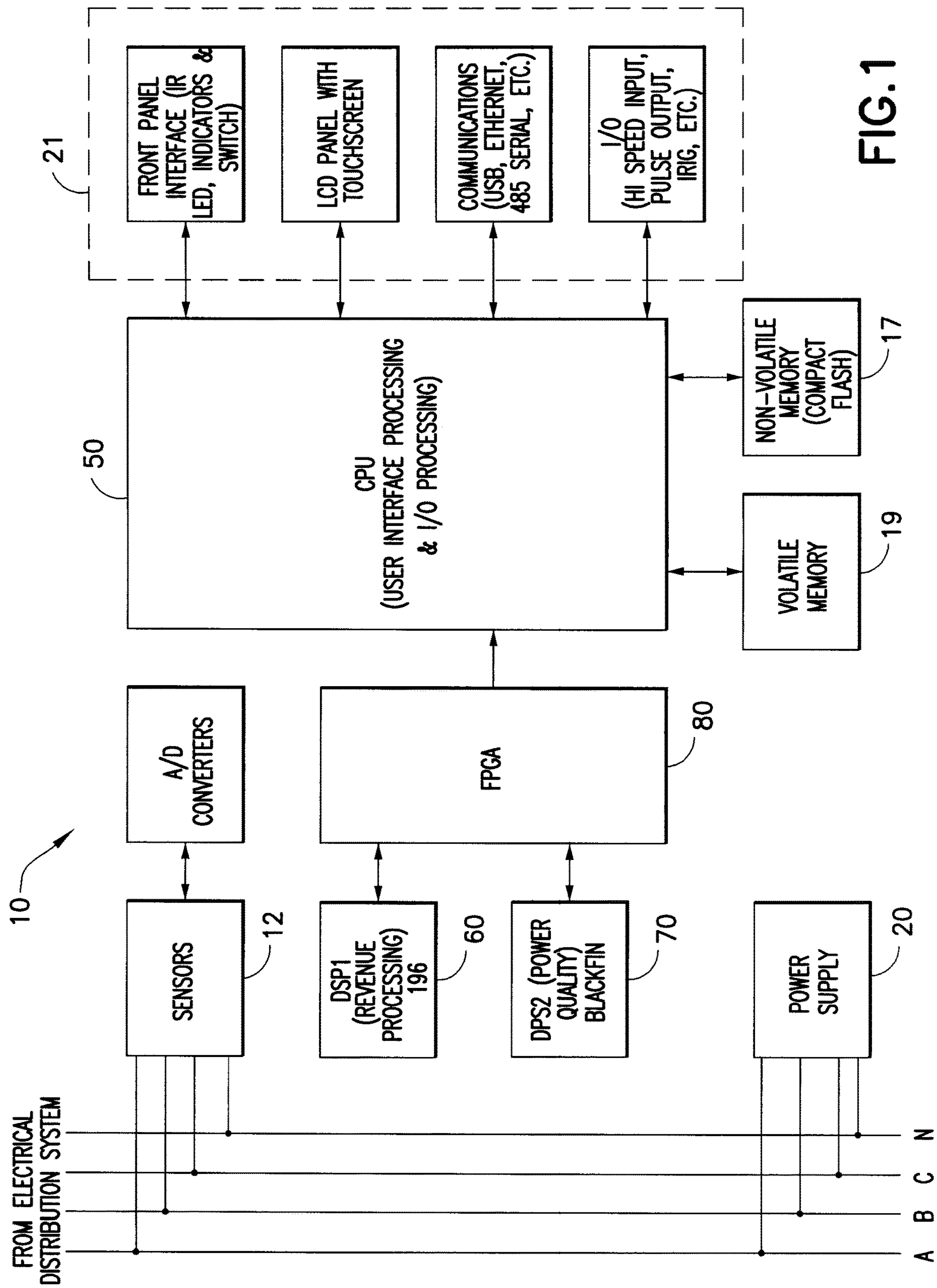
FIG. 1 is a block diagram of an Intelligent Electronic Device in accordance with one embodiment of the present disclosure.

An intelligent electronic device (IED) 10 for monitoring and determining power usage and power quality for any metered point within a power distribution system and for providing a data transfer system for faster and more accurate processing of revenue and waveform analysis is illustrated in FIG. 1. An exemplary design includes sensors 12, a plurality of analog-to-digital (A/D) converters 7,8 and 9 and a processing system that includes at least one central processing unit or host processor (CPU) and one or more digital signal processors (DSP1) 60 and (DSP2) 70.

It shall be noted that the CPU and DSP could be combined into one processor serving both functions. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled through scaling circuitry (see FIGS. 1A and 1B) to the A/D converters 7*a*,8*a*,9*a* and 7*b*,9*b*, respectively, configured to convert the analog output voltage from the transformer to a digital signal that are transmitted to a gate array such as an Field Programmable Gate Array (FPGA) 80, an Erasable Programmable Logic Device (EPLD) or an Complex Programmable Logic Device (CPLD) and then sent to be processed by at least one CPU or DSP processor. It should be noted that the digital samples could be sent to the CPU or DSP processor direct as an additional embodiment.

The at least one CPU or DSP Processor is configured for receiving the digital signals from the A/D converters 7, 8 and 9 to perform the necessary calculations to determine the power usage and controlling the overall operations of the IED 10.

A power supply 20 is also provided for providing power to each component of the IED 10. Preferably, the power supply 20 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 20, e.g., from a different electrical circuit, a uninterruptible power supply (UPS), etc. In another embodiment, the power supply 20 can also be a switch mode power supply in which the primary AC signal will be converted to a form of DC signal and then switched at high frequency such as but not limited to 100 Khz and then brought through a transformer which will step the primary voltage down to, for example, 5 Volts AC. A rectifier and a regulating circuit would then be used to regulate the voltage and provide a stable DC low voltage output.

The IED 10 of the present disclosure will include a multimedia user interface 21 for interacting with a user and for communicating events, alarms and instructions to the user. The user interface 21 will include a display for providing visual indications to the user. The display may include a touch screen, a liquid crystal display (LCD), a plurality of LED number segments, individual light bulbs or any combination of these. The display may provide the information to the user in the form of alpha-numeric lines, computer-generated graphics, videos, animations, etc. One important feature of the display will be that the display will be configured to provide to a user some of the following information. The display will show a user real time trends showing stored historical values in a tabular or graph form. This allows the user to view voltage over time, current distribution, Watt and VAR distribution or even show the harmonic content such as the harmonic magnitude spectrum or a tabular format for the harmonic content including the magnitude or phase angle. Additionally, the display will be programmed to display an event showing an actual captured waveform either at the user request or automatically when a waveform event occurs, e.g., at a trigger. The display shall have the capability to alarm a user by displaying warning or alert symbols such as flashing warning signs, changes in color or other type of annunciation designed to provide an overt, easily viewed alert. The actual captured waveform of the display includes elements such as the waveform cycles, scroll buttons (or bars), marker signifying the beginning and end of the events, etc. The waveform display will also include status inputs that allow a user to view the status of relays and breakers to show the time in milliseconds delay between the beginning of an event and when the relay and/or circuit breaker operated.

The meter shall determine the time using on on-board free-running counter. By measuring the amount of "clock ticks" in proportion to the clock speed in seconds, the meter will be able to determine the time in milliseconds or even microseconds or nanoseconds. Moreover, multiple meters can be tied together using time synchronization method such as IRIG-B which is attained from a GPS clock similar to a Model 1092 manufactured by Arbiter Systems, of California. These clocks have IRIG-B outputs attained from standard satellite time references. The IEDs are configured to receive the time from these clocks and adjust their time reference.

The user interface 21 will also include a speaker or audible output means for audibly producing instructions, alarms, data, etc. The speaker will be coupled to the CPU 50 via a digital-to-analog converter (D/A) for converting digital audio files stored in a volatile memory 19 to analog signals playable by the speaker. An exemplary interface is disclosed and described in commonly owned U.S. application Ser. No. 11/589,381, entitled "POWER METER HAVING AUDIBLE AND VISUAL INTERFACE", now U.S. Pat. No. 8,442,660, which claims priority to expired U.S. Provisional Patent Appl. No. 60/731,006, filed Oct. 28, 2005, the contents of which are hereby incorporated by reference in their entireties.

The IED 10 of the present disclosure will support various file types including but not limited to MICROSOFT™ Windows Media Video files (.wmv), MICROSOFT™ Photo Story files (.asf), MICROSOFT™ Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), MICROSOFT™ Recorded TV Show files (.dvr-ms), MICROSOFT™ Windows Video files (.avi) and MICROSOFT™ Windows Audio files (.wav).

The interface 21 further includes a network communication device that is configured for providing bi-directional connectivity between the meter and a network (for example, via a hardware/software modem) and, structurally, includes one or more cards or modules. In one embodiment, the network communication device supports the TCP/IP and 10/100Base-T Ethernet communication protocols and, optionally, at least some of the Modbus/TCP, Modbus, Distributed Network Protocol (DNP) (e.g., DNP 3.0), RS-485, RS-232 and universal serial bus (USB) architectures. Other communication protocol and to be developed protocols are within the scope of the present disclosure.

The network communication device may be a modem, network interface card (NIC), wireless transceiver, etc. The network communication device will perform its functionality by hardwired and/or wireless connectivity. The hardwire connection may include but is not limited to hard wire cabling (e.g., parallel or serial cables, including RS-232, RS-485, USB, and FIREWIRE™ (IEEE-1394) Ethernet, Fiber Optic, or Fiber Optic over Ethernet cables, and the appropriate communication port configuration. The wireless connection will operate under any of the wireless protocols, providing but not limited to BLUETOOTH™ connectivity, infrared connectivity, radio transmission connectivity including computer digital signal broadcasting and reception commonly referred to as WIFI™ or 802.11.X (where X denotes the transmission protocol), satellite transmission or any other type of communication transmissions, as well as communication architecture or systems currently existing or to be developed for wirelessly transmitting data, including spread-spectrum systems operating at 900 MHz or other frequencies, ZIGBEE™, WIFI™, or mesh-enabled wireless communication systems. Note that it is contemplated within the present disclosure that the data may be transmitted using encryption algorithms such as 128 bit or 64 bit encryption.

The IED of the present disclosure can compute a calibrated $V_{PN}$ (phase to neutral) or $V_{PP}$ (phase to phase) voltage RMS from $V_{PE}$ (phase to earth) and $V_{NE}$ (neutral to earth) signals sampled relative to the Earth's potential, where Phase P may be, for example, Phase A, B or C of a three phase system. The desired voltage signal can be produced by subtracting the received channels, $V_{PN}=V_{PE}-V_{NE}$. Calibration involves removing (by adding or subtracting) an offset (o, p) and scaling (multiplying or dividing) by a gain (g, h) to produce a sampled signal congruent with the original input signal. RMS is the Root-Mean-Square value of a signal, the square root of an arithmetic mean (average of n values) of squared values. Properly combined, one representation of this formula is:

$$V_{AN}=\sqrt{\frac{\sum_n (g(V_{AE}-o)-h(V_{NE}-p))^2}{n}}$$

where $V_{AN}$ is the voltage from phase A to neutral, $V_{AE}$ is the voltage measured from phase A to earth, $V_{NE}$ is the voltage measured from neutral to earth and n is the number of values taken.

Implementation of the computation in this arrangement is comparatively inefficient, in that many computations involving constants (−o, −p, g*, h*) are performed n times, and that computational precision can either be minimized, forcing the use of large numbers (requiring increased memory for storage and increased time to manipulate), or be degraded, increasing the uncertainty. However, a mathematical rearrangement can be carried out on the above formula, producing an equivalent computation that can be carried out more efficiently, decreasing the effort needed to produce similar or superior results. That representation is:

$$V_{AN}=\sqrt{\begin{array}{l} g^2\left(\frac{\sum_n V_{AE}^2-2o\sum_n V_{AE}}{n}+o^2\right)- \\ 2gh\left(\frac{\sum_n V_{AE}V_{NE}-o\sum_n V_{NE}-p\sum_n V_{AE}}{n}+op\right)+ \\ h^2\left(\frac{\sum_n V_{NE}^2-2p\sum_n V_{NE}}{n}+p^2\right)\end{array}}$$

where −o, −p, g and h are constants and $V_{AN}$ is the voltage from phase A to neutral, $V_{AE}$ is the voltage measured from phase A to earth, $V_{NE}$ is the voltage measured from neutral to earth and n is the number of values taken.

Implementation of the computation in this arrangement can be accomplished with more efficiency and precision. All involvement of constants has been shifted to single steps, removed from the need to be applied n times each. This savings in computation can then be partially utilized to perform slower but more precise applications of the gains and Square Root. The result is a value of equal or higher precision in equal or lesser time.

These calculations are preferably software implemented by at least one processor such as the CPU 50 or one of the DSP Processors 60, 70 or and at least one FPGA 80.

Figure 1A:
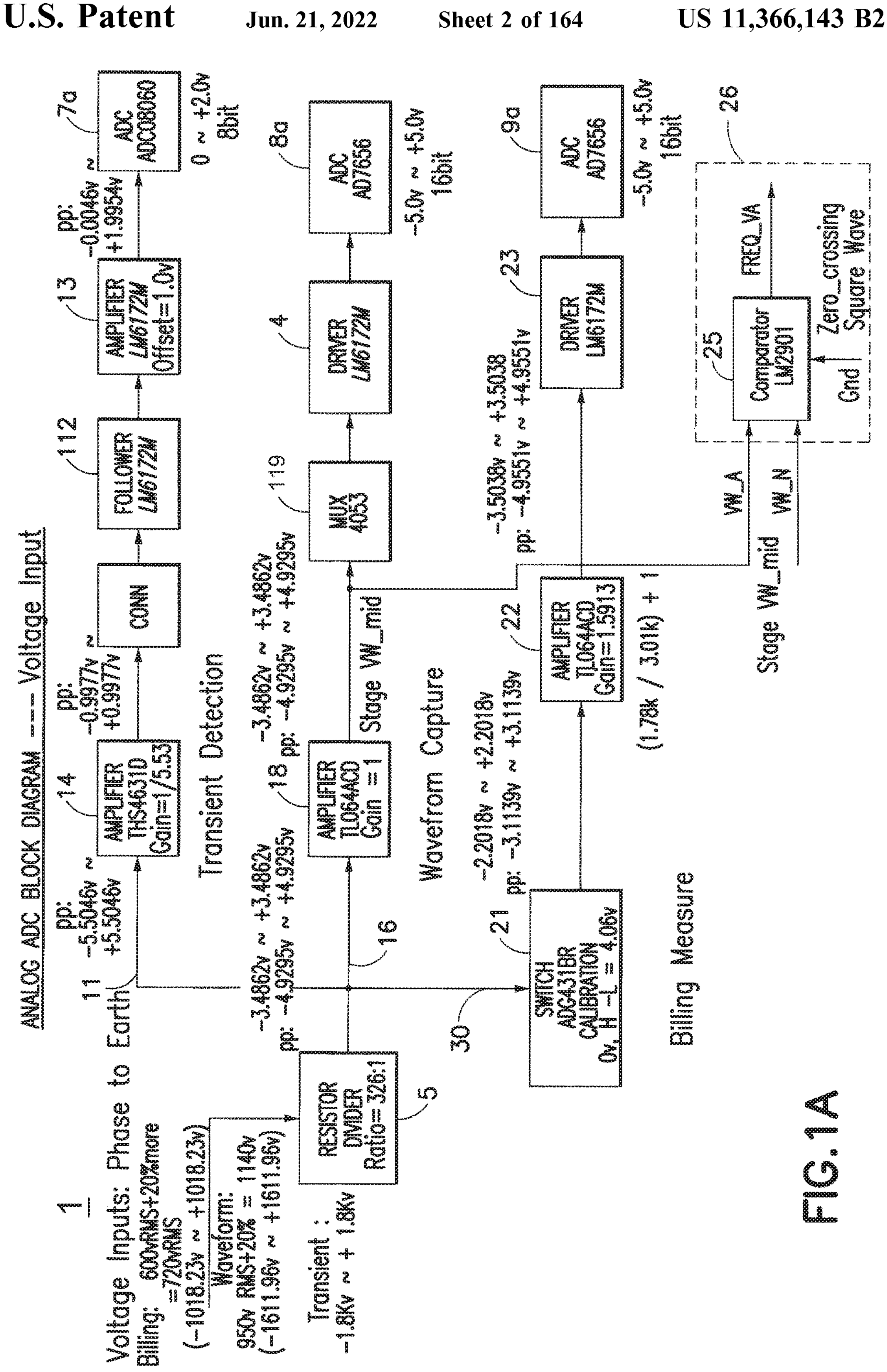
FIG. 1A is a block diagram illustrating how front end voltage input channels are distributed to dedicated circuits where each distributed set of channels are scaled for processing for a particular application such as transient detection, waveform capture analysis and revenue measurement by the power meter in accordance with one embodiment of the present disclosure.

Referring to the drawings, FIG. 1A shows the circuit of the present disclosure for a voltage input.

Voltage channels are applied to the circuit (1) and fed into a resistance divider (5) to reduce the high voltage level for handling by the circuit (1). The reduced voltage channels are split by feeding them into a plurality of paths or circuits, namely, a transient detection scaling path or circuit 11, a waveform capture path or circuit 16 and a revenue measurement scaling path or circuit 30. In the example of FIG. 1A, three circuits are shown. It is understood that the number of circuits used can vary depending on the number of applications to be performed by the power meter. Therefore more circuits may be added as needed for additional applications.

In FIG. 1A, the reduced voltage signal is split into three circuits or paths 11, 16 and 30 for transient detection, waveform capture and revenue measurement, respectively.

Transient detection scaling circuit or path 11 is part of the transient measurement circuit where the input channels are scaled and are fed into an amplifier 14, then a follower 112 and then another amplifier 13 for driving the A/D converter 7 (A/D converter 7 is a block of A/D converters that includes at least one A/D converter). In the transient scaling circuit (11), the signal is scaled by a scaling operation for transient detection. The scaling circuitry for the transient scaling circuit 11 includes the first amplifier 14, a follower (112) and a second amplifier 13. The follower 112 serves to separate the gain stages and the offset of the two amplifiers 14, 13. The four voltage channels are then sent to the A/D converter 7 dedicated to the transient detection and the transient scaling circuit 11. The transient measurement circuit of the present disclosure detects the transients and captures data about theses transients.

Figure 2:
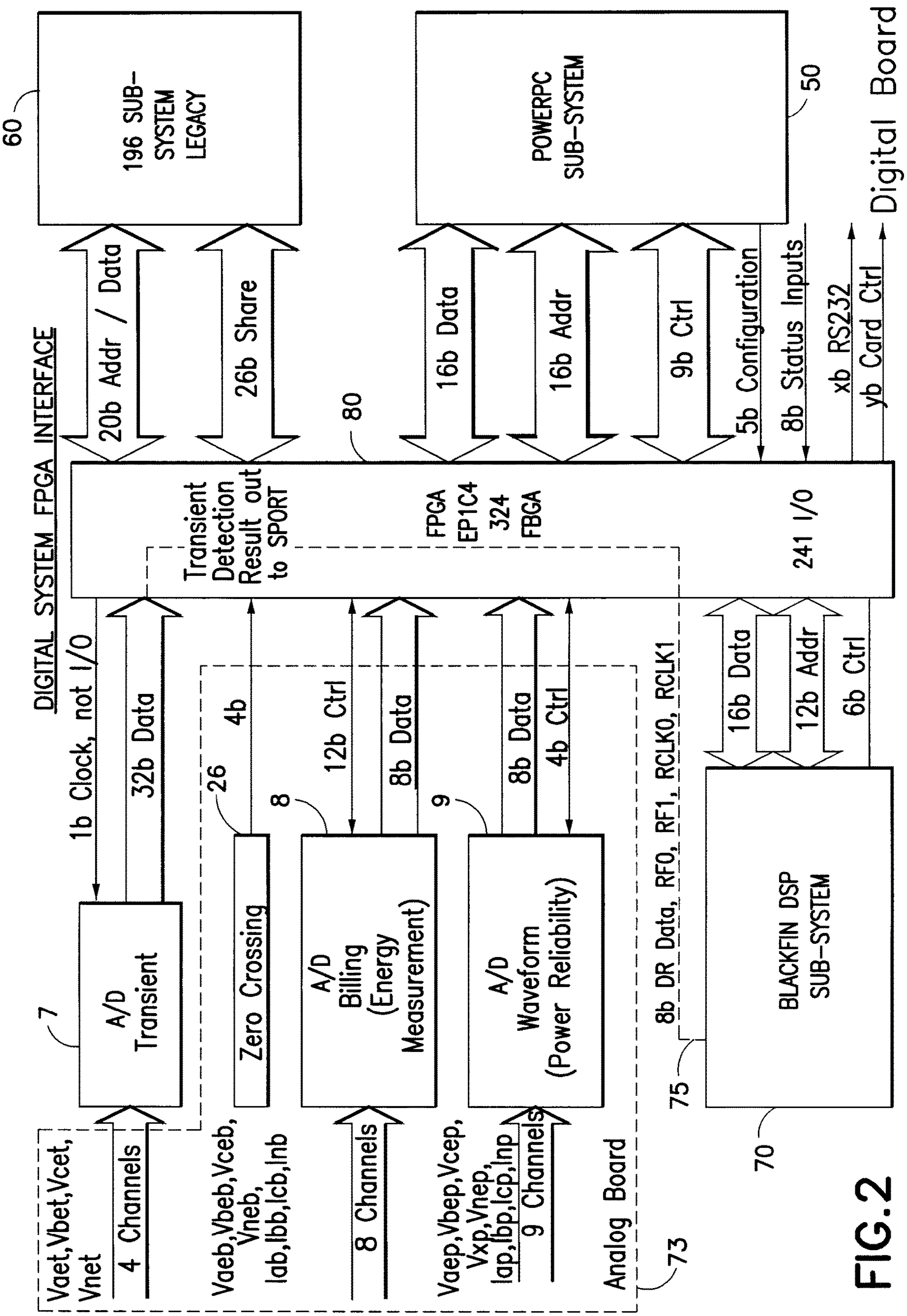
FIG. 2 is a block diagram of the present disclosure showing at least one central processing unit (CPU) or at least one processor and illustrating how various voltage and current channels are input for their particular application after being converted into digital signals by their respective A/D converters and then each is sent to either its own dedicated processor or to a processor having dedicated firmware for its particular application via a communications gateway for the particular application involved, e.g. transient detection, waveform capture and revenue measurement.

As shown in FIG. 2, the four voltage channels are sent via a communications gateway, e.g., the Field Programmable Gate Array 80 (FPGA), to a processor, e.g., the DSP Sub-System Processor 70 at its channel, port channel 75, for processing of the four voltages input channels. The FPGA 80 also provides a clock signal for the A/D converter 7.

The transient scaling circuit 11 scales the input voltage channels for measuring transients for voltage input channels by the transient measurement circuit. The transient scaling circuit 11 has a very great range of voltage due to scaling of the input voltage channels. The transient scaling circuit 11 scales the input peak to peak voltages of ±1800 volts peak to peak. It should be noted the voltage dynamic range is arbitrary and can be modified as per customer specifications. In addition it can also handle peak to peak voltage. The purpose of a transient measurement circuit's speed and scaling for over ranging voltage and a high bandwidth for a very high sample rate—bandwidth is high so as not to filter out samples for high sample rate of 50 MHz. This circuit is used to be able to single out higher speed voltage events that would be missed by the waveform capture A/Ds. See Waveform Capture Circuit 16.

In addition to the transient measurement circuit's a very great over range or preferably ±1800 peak to peak volts (ppv), it also has a very high sample rate or preferably 50 Mhz In the transient scaling circuit 11, the amplifier 14 reduces gain by preferably 1/5.53. The amplifier 13 provides a voltage shift of preferably 1.65 volts. It is understood that these amplifier gains and voltage offsets can vary as desired for appropriate scaling of the input voltage channels and the disclosure is not limited to these illustrative examples.

The transient scaling circuit 11, by illustrative example, operates as follows:

The input channels are reduced by a resistor divider 5 and can be reduced if desired from ±1800 peak to peak volts to ±5.5 peak to peak volts.

The scaling circuit 11 for the transient measurement circuit includes a follower 112 and amplifiers 13 and 14.

The amplifier 14 may have a gain of 1/5.53 and a shift of 1.65 volts so that the +/−5.5 peak to peak volts input to amplifier 14 results in an output of +/−0.997 volts.

Amplifier 13 provides an offset voltage of 1.0 v so that it outputs from 0.00446v to +1.9954v to the NC converter. This scaling of the voltage is needed for the high speed A/D converter 7.

One possible but non-limiting choice of a card that can be used for A/D converter 7 is a low power, 8 bit, 20 MHz to 60 MHz A/D converter as shown in FIG. 1A. One non-limiting example of such a card is ADC 08060 is commercially available from National Semiconductor, Santa Clara, Calif. It is understood that the IED of the present disclosure is not limited to any particular card for A/D converter 7. The scaling circuit of the transient measurement circuit is necessary to scale down the input voltage channels so that the input voltage to the ADC 08060 card or any suitable alternative having that low power input requirements are met. Use of this card or any suitable alternative guarantees that the high speed sampling rate of 50 MHZ or perhaps greater will be possible for the transient measurements including the impulse transient measurements.

The waveform capture scaling circuit 16 has its voltage signal scaled by an amplifier 18. The waveform capture circuit 16 has several channels going into an amplifier 18 for scaling and then a multiplexer 119 to multiplex the channels for the A/D converter 8 that is dedicated to the waveform capture circuit, in two sets—one set of the four input voltage channels and one set of the four input current channels (the current input channels are discussed below with respect to FIG. 1B). The multiplexed signals then go into the driver 4 and the A/D converter 8 (AD converter 8 is a block of A/D converters that includes at least one A/D converter). From the A/D converter 8, the input channels go into the FPGA 80 to the DSP Processor 70. The DSP Processor 70 provides digital signal processing and the waveform analysis is focused on seeing more of the signal even though accuracy is reduced as there is more interest in quality of power and not accuracy. Thus while both A/D converters for the waveform scaling analysis circuit 16 and for the revenue measurement scaling circuit 30 each have 16 bit resolution, there is a difference in the range of input for the revenue A/D converter 9 (A/D converter 9 is a block of A/D converters that includes at least one A/D converter) and for the waveform capture A/D converter 8 due to the difference in the scaling input for each of these two converters. So the range of input of both the A/D revenue converter 9 and the A/D waveform capture converter 8 are different from each other.

Referring now to FIG. 1A a zero crossing circuit 26 is also provided for the IED of the present disclosure and as shown in FIG. 1A the zero crossing circuit 26 can be connected to the waveform capture circuit 16.

The zero crossing circuit 26 operates as follows: the input channels, which are sinusoidal, after amplification in amplifier 18, go into a comparator 25. The sinusoidal channels since they can vary are each sampled just before and after zero crossing by each sinusoidal channel and a pulse is generated for each crossing.

Then the output of comparator 25 is fed into a counter in whichever processor has the firmware for processing the zero crossing application. Again this could be the at least CPU or Host Processor 50 or the DSP Processor 70. Alternatively, another DSP Processor 60 could be used. The counter counts the pulses that are representative of the zero crossings by each of the input channels and thus obtains the frequency reading of the signal. The output of the comparator 25 is fed back into a phase lock loop circuit in the at least one processor with the firmware for zero crossing application—this could be the CPU 50 or the DSP Processor 70. Alternatively another DSP Processor 60 could be used. In this way, this processor, with the firmware for the zero crossing application, controls the sampling rate of front end input channels and adjusts the sampling rate to the pulse count frequency from the output of the counter.

The revenue measure scaling circuit 30 has a calibration switch 21 that calibrates the voltage level and is controlled by at least one processor (e.g., CPU 50).

The revenue measurement scaling circuit 30 has multiple channels input to the calibration switch 21 that has the auto-calibration feature described in U.S. Pat. No. 6,735,535, which is incorporated herein by reference thereto. The calibration switch 21 has two features—a factory calibration feature and a scaling feature.

The factory calibration feature calibrates the meter to a very accurate reference voltage from an external source such as a Model 8000 or 8100 precision power and energy calibrator commercially available from Rotek Instrument Corp. of Waltham, Mass. —a highly stable 3-phase voltage, current and power source. It is understood that the disclosure is not limited to any one particular external source.

This factory calibration also reads the board reference voltages initially and notes any variation of the board reference voltages format at the time of calibration so if there are any variations of board reference voltages later it can be adjusted with temperature range.

The second feature of the calibration switch 21 is that it serves to provide the scaling for the revenue measurement scaling circuit 30 as follows:

The at least one CPU 50 or a DSP processor through the FPGA 80 (see FIG. 2) switches the calibration switch 21 so that it checks the board reference voltages that have varied from their initial factory calibration if they have varied then the correction factor in the at least one CPU 50 or a processor is adjusted to reset the reference board voltages to their initial settings for an accurate reading of the input channels.

In the revenue measurement scaling circuit 30, after the input signals are scaled by the calibration switch 21 they are fed into an amplifier 22 preferably having a gain of 1.5913 for scaling purposes and a driver 23 before being input into an A/D converter 9.

Figure 1B:
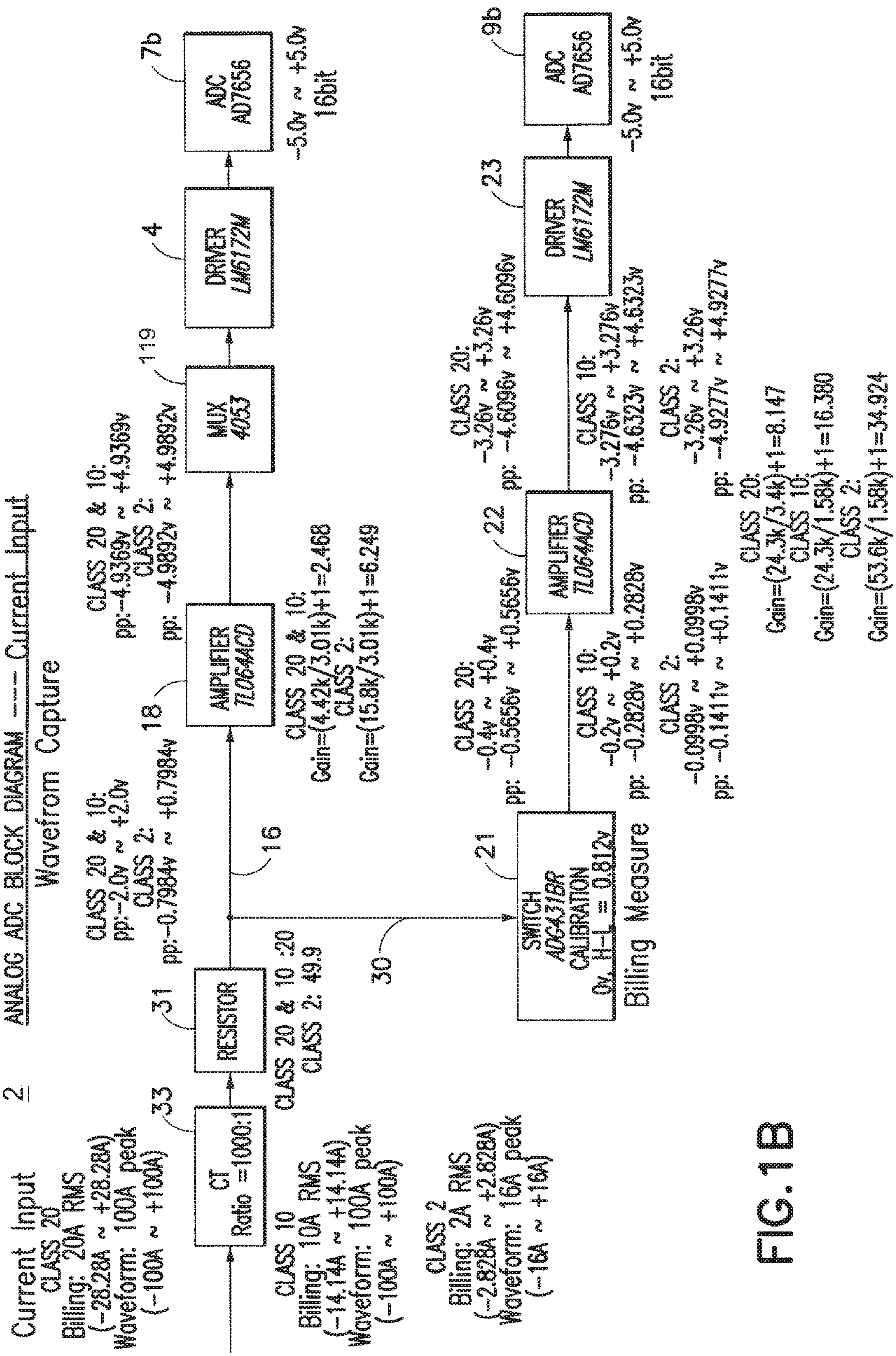
FIG. 1B is a block diagram illustrating how front end current input channels are distributed to dedicated circuits where each distributed set of channels are scaled for processing for a particular application such as waveform capture analysis and revenue measurement by the power meter in accordance with one embodiment of the present disclosure.

FIG. 1B illustrates how the front end current channels 2 are split into the respective circuits or paths for revenue measurement and waveform capture analysis. These circuit paths for the current paths are substantially the same as previously described for the front end voltage channels for the revenue measurement circuit and for the waveform capture analysis circuit 16 and thus are summarized as follows: As shown in FIG. 1B, the input current channels 2, such as by way of non-limiting example iab, ibb, icb and inb, go into a current transformer CT 33 and then a resistor 31. The current channels 2 are then split into two circuits for waveform capture analysis via circuit 16 and revenue measurement via circuit 30, respectively. In the waveform capture analysis circuit 16, the current channels are scaled in an amplifier 18 and then proceed to the multiplexer 119, the driver 4, the A/D converter 7 dedicated to waveform capture analysis 7 and then to the DSP processor dedicated to waveform capture analysis via the FPGA 80 which also clocks the A/D converter 7, as previously described as to the input voltage channels with reference to FIG. 1A.

In the revenue measure scaling circuit 30, the current input channels 2 go into the calibration switch 21 that calibrates the current level and is controlled by a processor (e.g., the at least one CPU 50). As mentioned previously, the revenue measurement scaling circuit 30 has multiple channels inputted to a calibration switch that has the auto-calibration feature. The calibration switch 21 has two features—a factory calibration feature and a scaling feature. In this way the input channels are called and conditioned for processing by the at least one CPU or DSP processor for revenue information.

The factory calibration feature calibrates the meter to a very accurate reference voltage from an external current source that is extremely accurate.

This factory calibration also reads the board reference currents initially and notes any variation of the board reference currents from the time of calibration so if there are any variations of board currents later it can be adjusted with temperature range.

The second feature of the calibration switch 21 is that it serves to provide the scaling for the revenue measurement circuit as follows:

The at least one CPU 50 or DSP processor 70 through the FPGA 80 switches the calibration switch 21 (see FIG. 2) so that it checks the board reference currents that have varied from their initial factory calibration. If they have varied then the correction factor in the at least one CPU 50 or DSP Processor is adjusted to reset the reference board currents to their initial settings for an accurate reading of the input channels.

This feature of resetting the board input channels (channels resetting feature) can be used in combination with the transient detection measurement circuit so it is possible to have a highly accurate revenue measurement and high transient detection and capture simultaneously in the IED of the present disclosure.

The channels resetting feature can check to see if there is a need to reset to the board's initial settings periodically. An illustrative but non-limiting example would be every twelve minutes. In addition, the channels resetting feature is temperature dependent and can reset for changes of internal temperature and/or ambient temperature or any other desired temperature threshold. One non-limiting illustrative example is for resetting for changes of 1 degree to 1.5 degrees.

After the calibration switch 21 in the revenue measurement scaling circuit, the input channels are fed into an amplifier 22 preferably having a gain of 1.5913 for scaling purposes and a driver 23 before being input into an A/D converter 9.

The current channels 2 then go to the amplifier 22, the driver 23, and the dedicated A/D converter 9 for revenue measurement to a processor with the firmware programmed into it for processing the revenue measurement application. This could be either or both the at least one CPU 50 and/or DSP Processor 70. Alternatively, it could be an additional sub-system DSP Processor 60. The revenue measurements are received and processed via the FPGA 80.

Scaling and conditioning of the input channels as described above prior to the input signals feeding into their respective A/D converters is done on the analog circuitry of the analog board 73 as shown in FIG. 2.

FIG. 2 illustrates how various channels may be input to each of the aforementioned paths or circuits. Four channels of voltage (Vaet,Vbet,Vcet,Vnet) are input for the transient detection circuit and four voltage channels ((Vaeb,Vbeb, Vceb and Vneb) are input for the zero crossing circuit. Four channels of voltages (Vaeb,Vbeb,Vzceb,Vneb) and four channels of current (iab,ibb,icb,inb) are input for the revenue measurement path. Nine channels of voltage and current (Vaep,Vbep,Vcep,Vxp,Vnep,iap,ibp,icp,inp) are input for the waveform capture path. It is understood that the number of input channels may change and that the number of input channels shown in FIG. 2 is intended as one illustrative example and is not intended to limit the disclosure thereto.

Figure 3A:
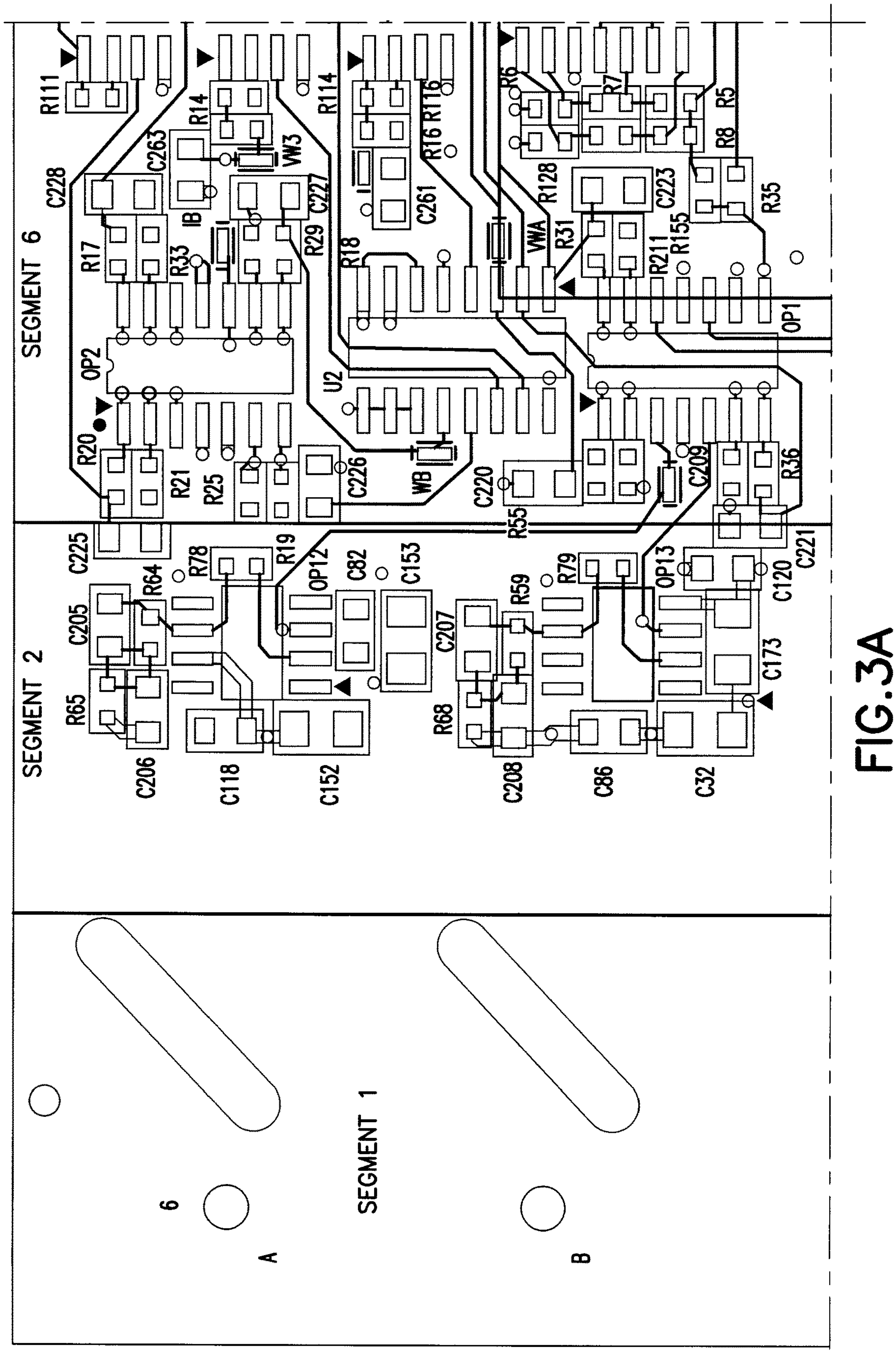
FIG. 3 illustrates how FIGS. 3A, 3B, 3C, 3D, 3E, and 3F would fit together in order to form a single view of an exemplary layout of a top layer of a printed circuit board for an IED showing how the analog circuits dedicated to particular applications are separated from each other in their own respective segments to reduce the possibility of noise.
Figure 3B:
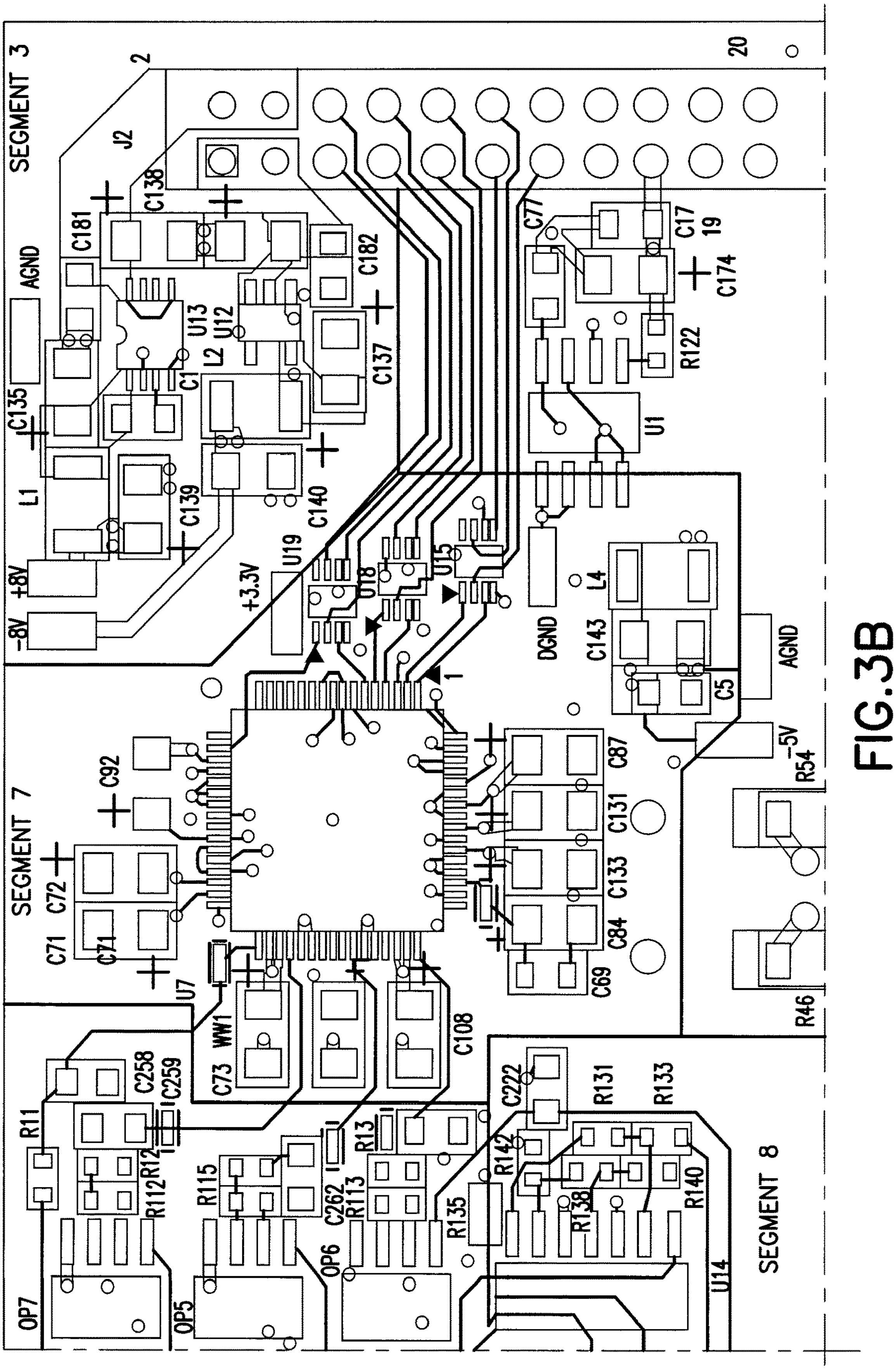
Figure 3C:
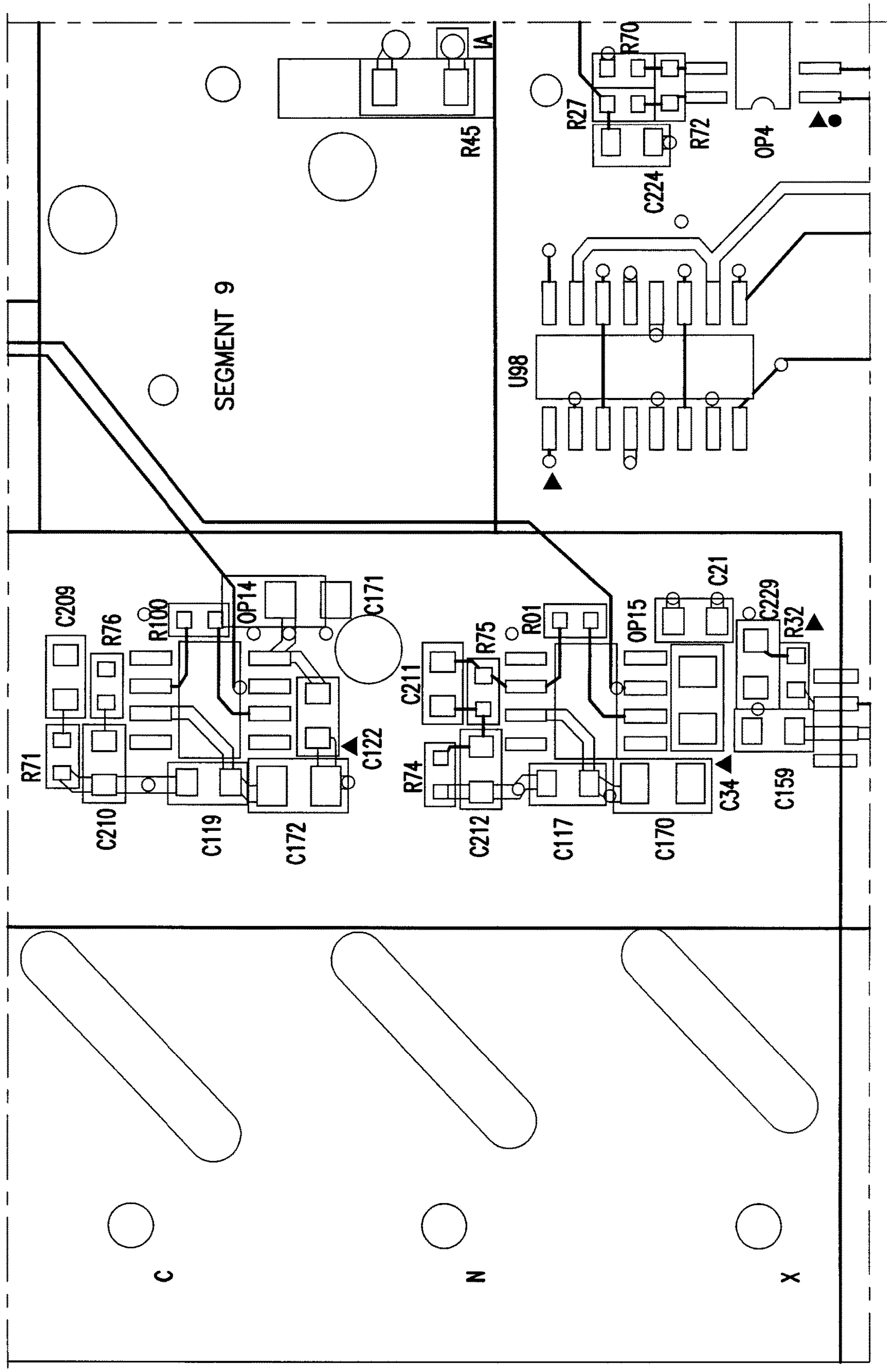
Figure 3D:
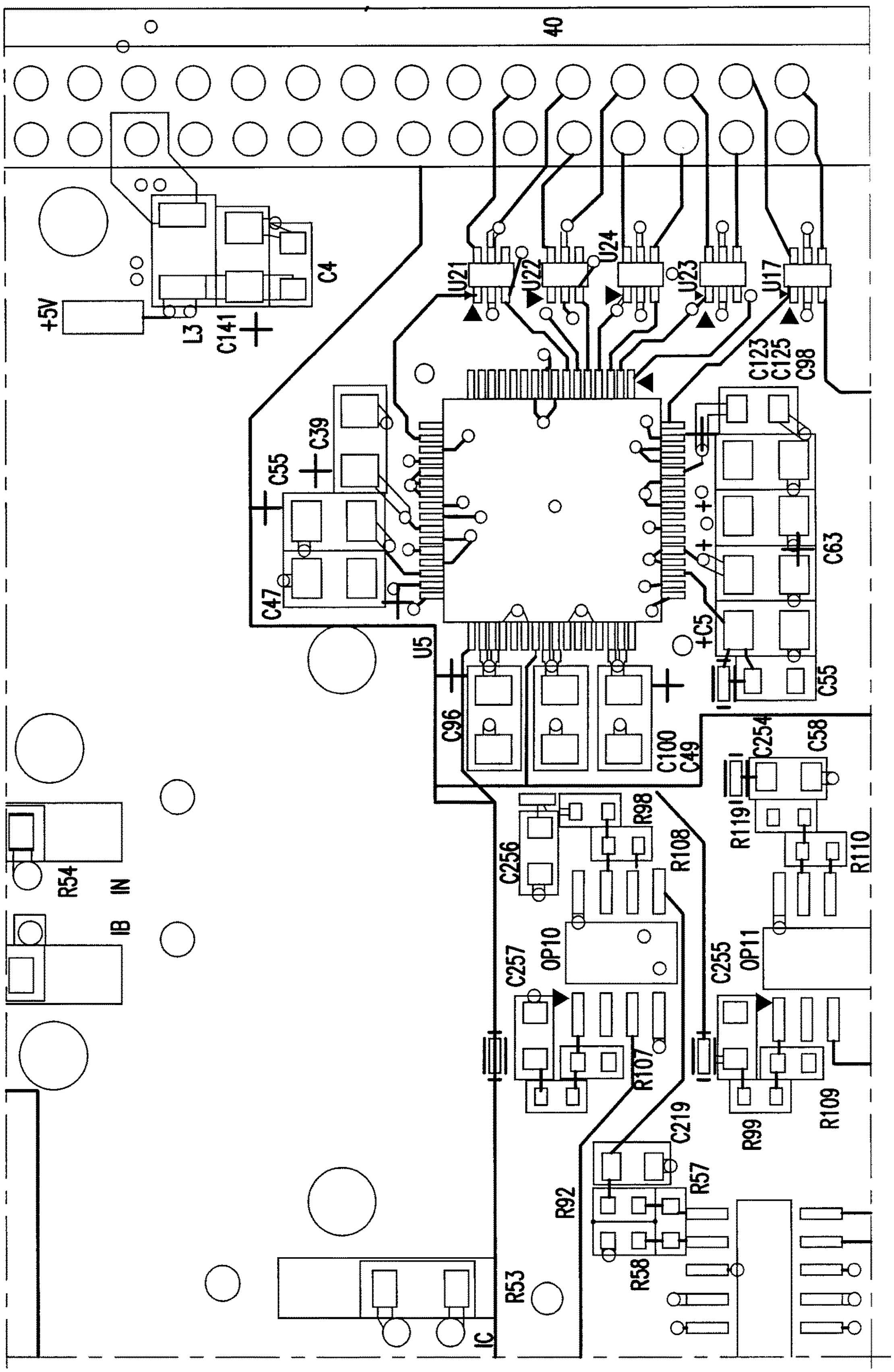
Figure 3E:
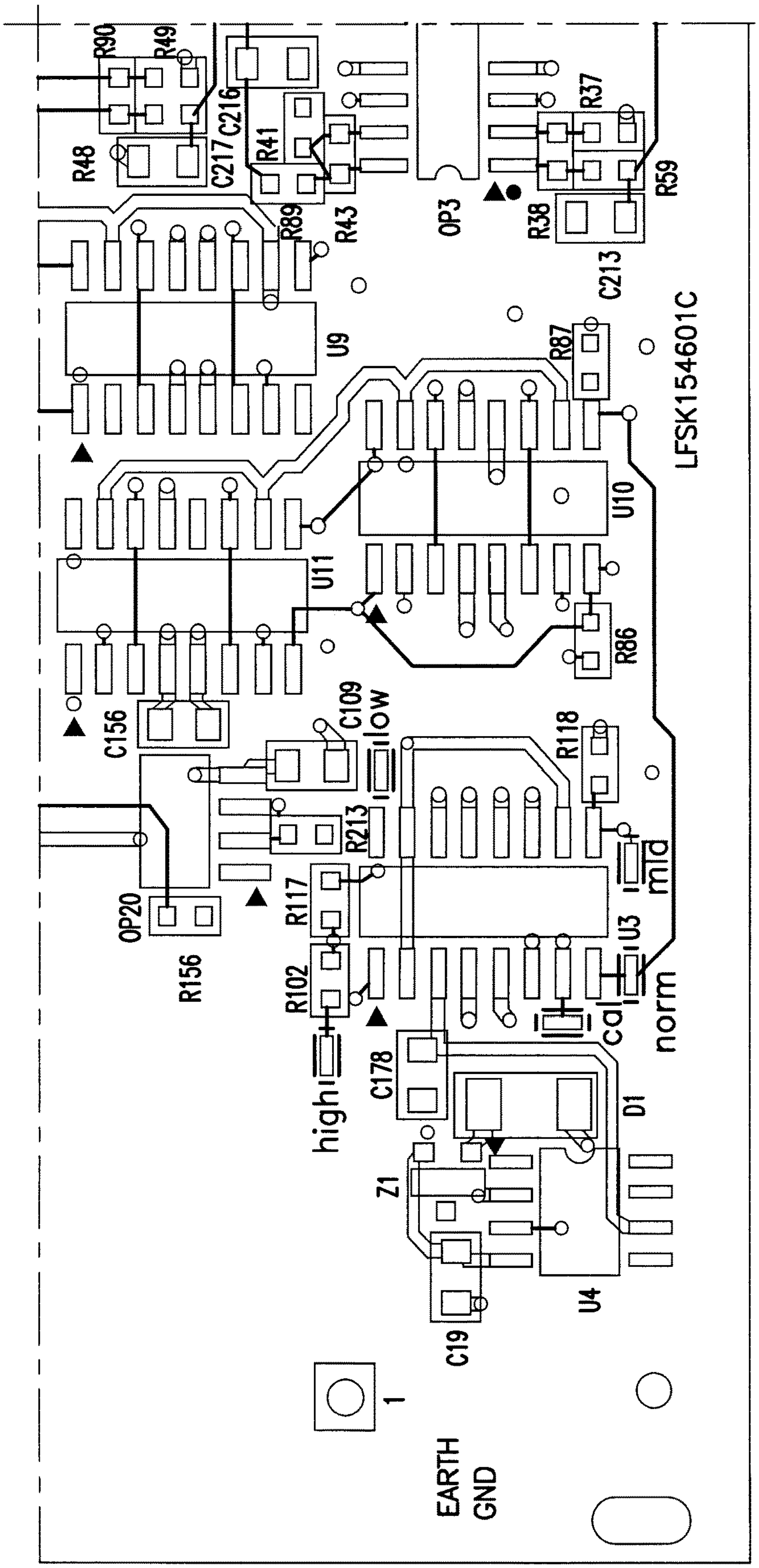
Figures 3, 3F:
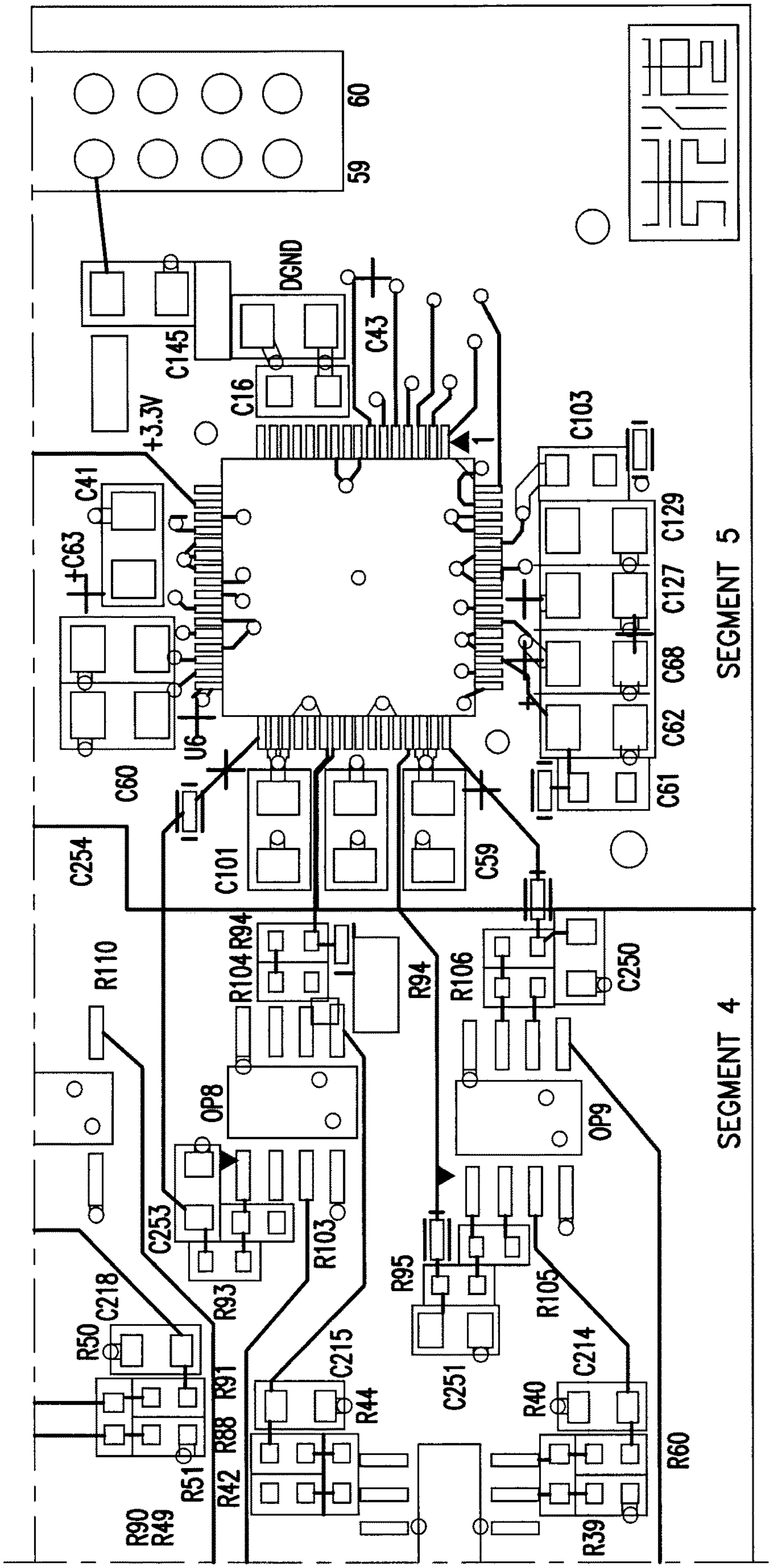

FIG. 3, including FIGS. 3A-3F, illustrates how the circuitry is laid out to reduce the possibility of noise. FIGS. 3A-3F illustrates the top layer of the printed circuit board in which the discrete components for the analog circuitry of the analog board are mounted.

Each application circuitry is partitioned from another one such as the transient measurement circuit is separate from that of the waveform measurement circuit and the revenue measurement circuit as shown in FIGS. 3A-3F. As seen in FIGS. 3A-3F, each of the circuits are laid out and partitioned into their own segments. In addition, each trace in each circuit is dimensioned to have a certain width such as preferably but not limited to 8 mils. A trace is a segment of a route, e.g., a layout of wiring, for a PC (printed circuit) board. The spacing between traces is preferably in a range of between 8 mils to 20 mils to reduce the possibility of noise such as coupling noise. The circuits are laid out on the PCB so that each part of one of the circuits does not overlap or lay in close approximation with a part of another one of the circuits. In this way, cross talk between said circuits on the PCB is reduced. The disclosure with this layout and design configuration for the thickness of each trace can reduce the possibility of noise from the transient detection components to the other circuits—the waveform measurement and the revenue measurement circuit as well as vice verse. In this way each of the circuits can be more efficient and have more accurate data. The transient measurement circuit is sensitive enough to provide for a faster and more sensitive measurement of the transients and data for a better analysis of the transients.

The PCB is preferably configured as a six-layer board with a top layer, a bottom layer and four intermediate layers. It is preferably formed from three boards glued together each board having two surfaces so that when glued together there are six layers. The top layer contains the analog components as shown and the traces within each segment as shown in FIGS. 3A-3F and described above.

The segments shown in FIGS. 3A-3F include segment 1 for the input channels; segment 2 for the transient detection circuit; segment 3 for the power circuitry for the power for all circuits; segment 4 the revenue measurement circuit; segment 5 for the A/D converter segment 6 for the waveform capture circuit; segment 7 for the A/D converter for the waveform capture circuit; segment 8 for the zero crossing circuit; and segment 9 for at least one or more current transformers (CT).

In addition to the top layer there is a bottom layer that has capacitors and resistors mounted thereon for the circuitry of the IED. There are four intermediate layers—mid1, mid 2, mid 3 and mid 4. The mid 4 layer has the traces for the transient detection circuit thereon which connect to other circuitry other than that of the transient detection circuit. No other traces for any other analog circuits, e.g., the traces for the waveform capture circuit and the traces for the revenue measurement circuit are permitted on the mid 4 layer. This ensures the reduction of the possibility of noise from and to the transient detection traces from the traces of the other analog circuits.

Figure 4:
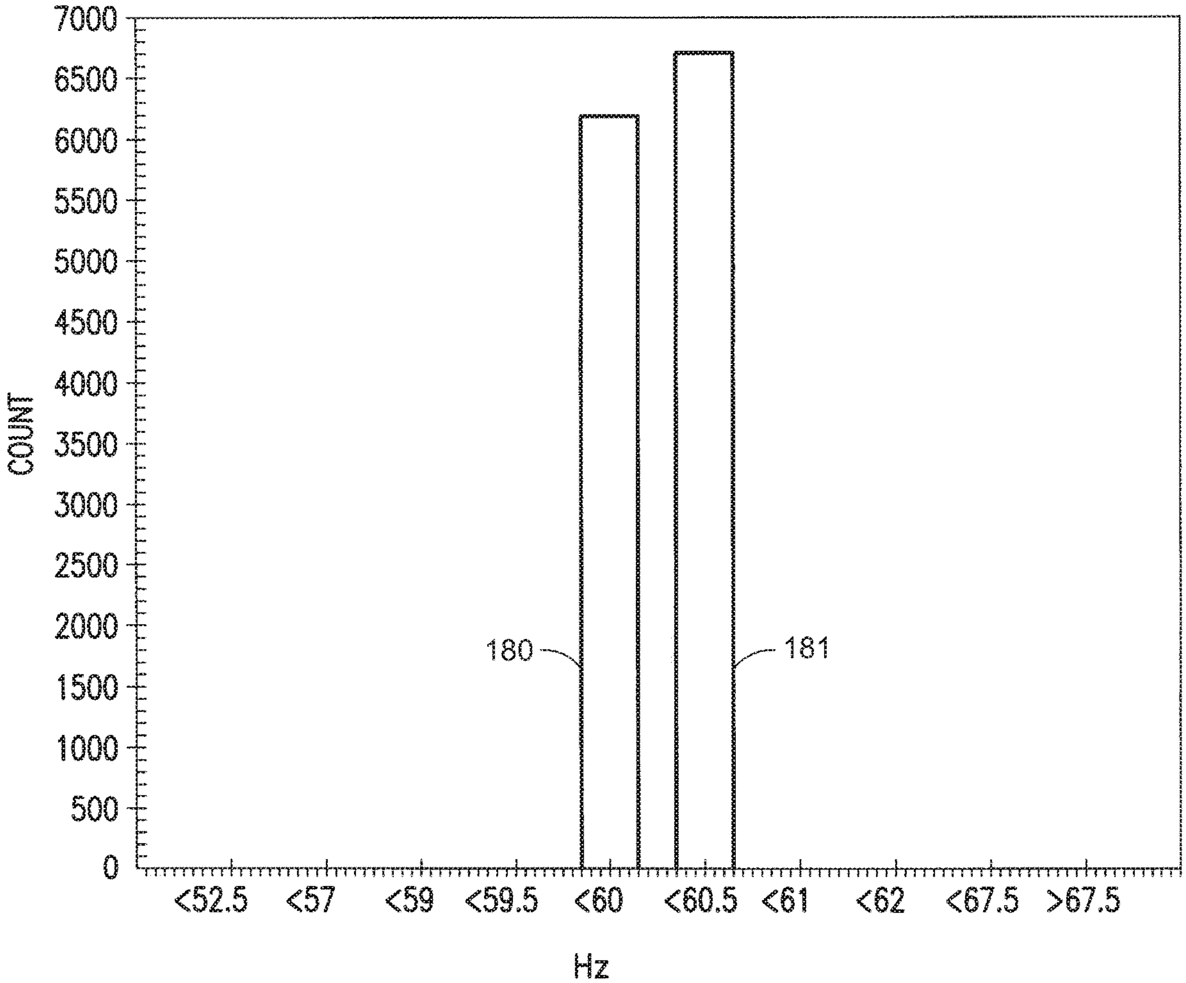
FIG. 4 is a graph illustrating the measurement of power quality, and in this example the power quality measurement is frequency fluctuations, using bins to measure a count of the power quality event within a user defined time period in accordance with this feature of the IED of the present disclosure.

The IED of the present disclosure can be used to measure the power quality in any one or more or all of several ways. The at least one CPU 50 or DSP processor 70 can be programmed with certain parameters to implement such measurements of power quality which can be implemented in firmware (e.g., embedded software written to be executed by the CPU or at least one DSP Processor) within the at least one CPU 50 or DSP Processor 70 or by software programming for the at least one CPU 50 or DSP Processor 70. The different techniques for measuring power quality with the IED of the present disclosure are described below. Each of these techniques is implemented by the IED of the present disclosure by firmware in the at least one CPU 50 or DSP processor 70. In the at least one CPU 50 or DSP processor 70, a series of bins are used to store a count of the number of power quality events within a user defined period of time. These bins can be by way of illustrative, non-limiting example registers of a RAM. These bins can be for a range of values for one parameter such as frequency or voltage by way of illustrative non-limiting example provide the acceptable range for testing the input signals within a specified period of time for the IED. In this way, it can be determined if the measurements are within acceptable parameters for power quality complying with government requirements and/or user needs. FIG. 4 illustrates an example of frequency bins for when the IED of the present disclosure measures for frequency fluctuations. The IED of the present disclosure can measure frequency fluctuations. The nominal frequency of the supply voltage by way of illustrative and non-limiting example is 60 Hertz (Hz). Under normal operating conditions, the mean value of the fundamental frequency of the supply voltage can be measured over a set time interval such as by way of illustrative, non-limiting example over 10 seconds and is within a specified range such as, by way of illustrative, non-limiting example as shown in FIG. 4, 60 Hz+−2% (58.8-61.2 Hz) for preferably a majority of the week—by way of illustrative, non-limiting example 95% of the week, and within a specified range of by way of illustrative non-limiting example +−60 Hz+−15% for a specified percentage of the week by way of illustrative, non-limiting example 100%. For this example in FIG. 4, the bins can be set in a specified range of the mean value of the fundamental frequency of the supply voltage frequencies—in this illustrative example the range for passing this test for power quality of this example can be within 2 percent of 60 Hz so the frequency bins 180, 181 would be between 58.8 Hz and 61.2 Hz for a specified period of 95% of a 10 seconds. If the frequency is below or above this range than the IED of the present disclosure has determined that this power quality test has failed. These values can be programmed into the at least one CPU 50 or DSP processor 60.

The IED additionally will utilize on-board or plug in type non volatile memory 17 as showing by non-limiting example in FIG. 1. In this example, compact flash is used to provide high density non-volatile storage. It should be noted that all other forms of flash and/or storage media are additionally contemplated to be within the scope of this disclosure including but not limited to SDRAM, NVRAM (non-volatile RAM), parallel flash, serial flash, floppy disks, hard drives, USB memory stick etc. This memory will be used, in addition to other purposes, as a non-volatile storage mechanism for retaining captured waveform records originally stored in volatile RAM when power is removed from the instrument. The processor (CPU) will take samples from said analog to digital converters and store said samples in volatile RAM for processing. Upon the processor's decision to store said samples based on a user defined event, the processor will then transfer said stored samples from volatile to said non-volatile RAM. The transfer will include stored samples and a header of information including time and date.

The IED of the present disclosure can measure the total harmonic distortion (THD). Under normal operating conditions, the total harmonic distortion of the nominal supply voltage will be less than or equal to a certain percentage of the nominal supply voltage such as by way of non-limiting illustrative example 8 percent of the nominal supply voltage and including up to harmonics of a high order such as by way of non-limiting example the order of 40. In this non-limiting illustrative example, the bins can be set in a range of the specified percentage of the THD—in this illustrative example of less than or equal to 8% so that if the THD is greater than 8%, the IED of the present disclosure has determined that this power test of this example has failed.

The IED of the present disclosure can measure harmonic magnitude. Under normal operating conditions a mean value RMS (Root Mean Square) of each individual harmonic will be less than or equal to a set of values stored in the at least one CPU or processor memory for a percentage of the week such as by way of illustrative, non-limiting example 95% of the week a mean value RMS (Root Mean Square) of each individual harmonic. For this test, the bins can be set in a specified range of the mean value of the fundamental frequency of the supply voltage frequencies—in this illustrative example the range for passing this test for power quality can be within 2 percent of 60 Hz so the frequency bins would be between 58.8 Hz and 61.2 Hz for a specified period of 95% of a 10 seconds. If the frequency is below or above this range than the IED of the present disclosure has determined that this frequency has failed this power quality test. These values can be programmed into the at least one CPU 50 or DSP processor 60.

The IED of the present disclosure can measure fast voltage fluctuations. Under normal operating conditions a fast voltage fluctuation will not exceed a specified voltage, by way of illustration in a non-limiting example 120 volts+−5% (114 volts-126 volts). In this illustrated, non-limiting example fast voltage fluctuations of up to 120 volts+−10% (108 volts-132 volts) are permitted several times a day. For this test the bins can be set in a specified range of voltages—in this illustrative, non-limiting example the range of voltages 120 volts+−5% or from 114 volts through 126 Volts for passing this test for power for a specified number of several times a day. If the voltage falls below or above this range than the IED of the present disclosure has determined that the voltage has failed this power quality test.

The IED of the present disclosure can measure low speed voltage fluctuations. Under normal operating conditions, excluding voltage interruptions, the mean average of the supply voltage can be measured over a set time interval such as by way of illustrative, non-limiting example over 10 minutes and is within a specified range such as by way of illustrative, non-limiting example 120 volts+−10% (108 volts-132 volts) for preferably a majority of the week—by way of illustrative, non-limiting example 95% of the week. For this test the bins can be set in a specified range of voltages—in this illustrative, non-limiting example the range of voltages of 120 volts+−10% or from 108 volts through 132 Volts for passing this test for power for a specified period of 95% of a week. If the voltage falls below or above this range than the IED of the present disclosure has determined that the voltage has failed this power quality test. These values can be programmed into the at least one CPU 50 or DSP processor 70.

The IED of the present disclosure can measure Flicker. Flicker is the sensation experienced by the human visual system when it is subjected to changes occurring in the illumination intensity of light sources. Flicker can be caused by voltage variations that are caused by variable loads, such as arc furnaces, laser pointers and microwave ovens. Flicker is defined in the IEC specification IEC 61000-4-15 which is incorporated by reference thereto. For the IED of the present disclosure under normal operating conditions, the long term Flicker severity can be caused by voltages fluctuations which are less than a specified amount by way of illustration non limiting example of less than 1 for a specified period of time by way of an illustrative non limiting example for 95% of a week. For this test, the bins can be set in a specified range of Flicker severity—in this illustrative, non-limiting example the range of long term Flicker severity due to voltage fluctuations being less than 1 for a specified period of 95% of a week to pass this power quality test. If the flicker severity is equal to or greater than 1 than the IED of the present disclosure has determined that the long-term Flicker severity has failed this power quality test. These values can be programmed into the at least one CPU or DSP processor.

Figure 2A:
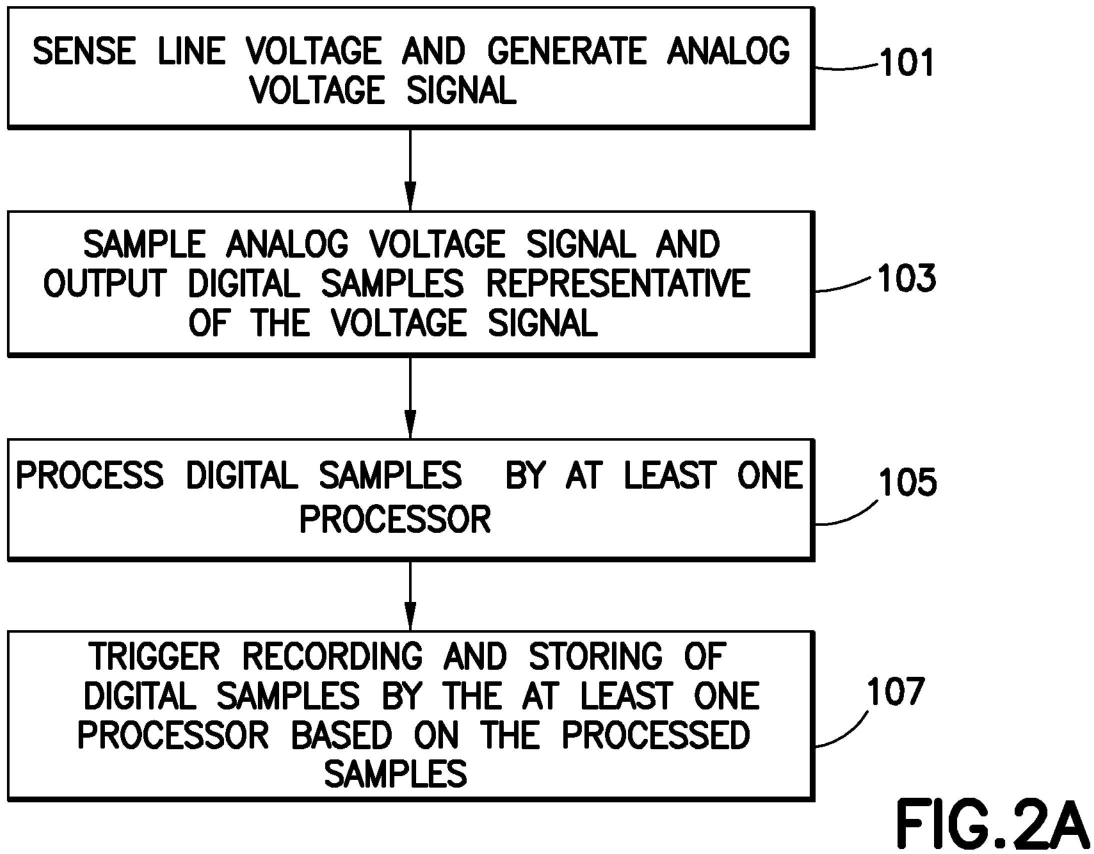
FIG. 2A is a flow chart illustrating a method executed by the at least one processor of FIG. 2

Another feature of the IED of the present disclosure is the envelope type waveform trigger. Based upon the appearance of the waveform, envelope waveform trigger determines if any anomalies exist in the waveform that may distort the waveform signal. This feature is preferably implemented by firmware in at least one CPU 50 or a DSP processor such as by way of non-limiting illustrative example the DSP processor 70. For example, referring to FIG. 2A, sensors of the IED sense line voltages and generate a voltage signals, step 101; analog-to-digital converters sample the voltage signals and generate digital samples, step 103; the digital samples are processes by the at least one processor, step 105; and the at least one processor triggers a recording and storing of the digital samples based on the processing to be described below, step 107. This feature test voltage samples to detect for capacitance switching events. It permits a trigger to be generated when the scaled and conditioned input voltages are sampled and exceed upper or lower voltage thresholds that dynamically change according to the samples in the previous cycle. If this occurs, the voltages are recorded as exceeding these threshold levels. This feature operates as follows.

An AC voltage signal is a sinusoidal signal. Under normal conditions, a signal sample of this AC voltage signal will repeat itself in the next cycle. Thus by sampling at a time T1 for voltage sample Vt1, and then sampling at time T2 for voltage sample Vt2, where time T2 is 1 cycle after T1, then the absolute value of (Vt2−Vt1) should be less than a certain number (a set parameter in the firmware of the at least one CPU or DSP Processor) during normal conditions. This number is the set threshold voltage.

In other words, a user can define two positive threshold values, Vth1, Vth2, then if the signal satisfies this condition, there will be no trigger on the envelope type waveshape.

$$Vt1-Vth1<Vt2<Vt1+Vth2 \quad \text{(Equation 1)}$$

Otherwise, the envelope type waveform shape trigger will be triggered in the IED of the present disclosure alerting the user that a threshold value has been exceeded.

This feature is implemented by firmware in the at least one processor having the firmware for the envelope type waveform trigger feature such as the DSP processor 70 as follows: The DSP Processor has a 256*16=4096 samples circular buffer in its Synchronous Dynamic Random Access Memory (SDRAM) and after collecting 256 new samples, the DSP Processor 70 executes a task. This task will first find what is the current frequency and period, such as 60 Hz, then 1024 samples per cycle, then by looking back 1024 samples from the current 256 samples, find out the corresponding 256 samples in the previous cycle, then comparing each sample, if one of them is not satisfied in Equation 1, then set flag, but the final report is updated with a half cycle finished point, that means clearing the flag at the index of the half cycle finished point.

For example, inside 256 samples, index 70 is the half cycle finish point, the before testing flag (in the circular buffer) is set at zero, and after comparing a sample of 0 to 70, the flag is set to 1, then trigger report is generated for a flag indication of 1, but the flag is cleared back to 0 after completing of the comparison of the 70 samples and before beginning the next comparison of samples 71 to 255.

Other techniques can be used to determine wave shape anomalies. Another preferred embodiment of the IED of the present disclosure would be to collect one cycle worth of samples by the said analog to digital converters and conduct a fast Fourier transform on each of said cycles of samples. Using this technique, the user can trigger a waveform recording when any of the harmonic frequencies are above a user defined threshold. The user can also allow the trigger to capture a waveform record if the percentage of total harmonic distortion is above a prescribed threshold. In this preferred embodiment of the IED of the present disclosure, the Fast Fourier Transform (FFT) is utilized. The FFT is an efficient algorithm to compute the discrete Fourier transform (DFT) and its inverse. Let x0, . . . , xN−1 be complex numbers. The DFT is defined by the formula $$X_k = \sum_{n=0}^{N-1} x_n e^{-\frac{2\pi i}{N}nk}$$

$$k = 0, \ldots, N-1.$$

Evaluating these sums directly would take O(N2) arithmetical operations. An FFT is an algorithm to compute the same result in only O(N log N) operations. In general, such algorithms depend upon the factorization of N, but (contrary to popular misconception) there are O(N log N) FFTs for all N, even prime N.

Many FFT algorithms only depend on the fact that $$e^{-\frac{2\pi i}{N}}$$

is a primitive root of unity, and thus can be applied to analogous transforms over any finite field, such as number-theoretic transforms.

Since the inverse DFT is the same as the DFT, but with the opposite sign in the exponent and a 1/N factor, any FFT algorithm can easily be adapted for it as well.

In the power measurements for the IED of the present disclosure, xn represents data samples, n is the index number represents different sampling points, increase with time passed by. Xk represents the Kth order harmonics components in the frequency domain. N represents how many samples used to do the DFT calculation.

The technique to use harmonics distortion to determine wave-shape trigger is explained as follows: The CPU 50 or at least one DSP Processor 70 collects 128 points of samples in each cycle of interested voltage input, they are x0, x1, x2, . . . , x126, x127. do N=128 points FFT on them, finally it will output 64 points complex number Y0, Y1, . . . Y63, (after combined the negative frequency part with positive frequency part from X0, X1, . . . X127), Y0 represents DC component, Y1 represents fundamental, Y2, Y3, . . . , Yk, . . . , Y62, Y63 represents kth order harmonic components.

$$Y_k = r_k(\cos \Phi_k + i \sin \varphi_k) \quad k=0, 1, \ldots, 63$$

Then the firmware in the CPU 50 or at least DSP Processor 70 does this computation $$A = r_1$$

-continued $$B = \sqrt{\sum_{n=2}^{63} r_n^2}$$

And this one $$P = \frac{B}{A} = \frac{\sqrt{\sum_{n=2}^{63} r_n^2}}{r_1}$$

Where P is the percentage of total harmonic distortion. When the percentage of total harmonic distortion is above a prescribed threshold, the IED of the present disclosure flags the wave-shape trigger.

An additional embodiment would be to collect one cycle worth of samples by the said analog to digital converters and conduct an interpolation from the previous two samples to the currently analyzed sample. Thus, each sample would be stored in the said RAM. The processor would then start from the end of the cycle and analyzing the best sample first and working backwards until each sample is analyzed. The analysis includes plotting the slope of the two previous sample's magnitude and interpolating what the next sample's magnitude based on assuming a sine wave. If the sample falls out at the user programmable boundaries, then the waveform would be recorded.

Waveshape trigger is determined in the IED of the present disclosure by a technique known as interpolation. Interpolation is a method of constructing new data points from a discrete set of known data. In the IED of the present disclosure, this is done by interpolating the previous samples to predict a number as an expectation of a current sample, by comparing these two numbers, if the difference between the expectation number and the current sample is larger than a prescribed threshold, it will flag the wave-shape trigger.

An illustrative, non-limiting example in the IED of the present disclosure employing the use of linear interpolation is using two previous sample, xi-2, xi-1 to calculate an expectation number, yi=2*xi-1−xi-2. The difference between yi, the expectation number, and the current sample xi, will be di=yi−xi.

Note these are operative examples of methods that can be used to determine whether the waveform appearance is in correct. It is contemplated by the present disclosure that the analog to digital converters are sampling at ranges that can be below the bandwidth that the electronic sensors can pass. As such anti-aliasing should be applied to either the hardware using an analog technique or to the firmware using a digital technique to avoid higher level harmonic signals from aliasing to lower level signals. In fact, both analog and digital techniques can be used. The most common anti-alias filter is a low-pass filter. This lets through the lower frequencies and attenuates the higher frequencies. The cut-off frequency (the frequency to which the filter will block signal) will be compatible with the unwanted frequencies above the analog to digital converter measurement bandwidth and the frequencies for which you are measuring. The IED of the present disclosure eliminates unwanted high frequency signals by implementing a low pass filter. It is within the scope of the present disclosure that there are multiple techniques that could be used to filter such unwanted signals and that they are envisioned thereof.

The present disclosure also implements another technique to limit unwanted signals. This technique involves limiting aliasing by making sure the sampling rate, under the Nyquist Theorem, is at least twice the highest input frequency present in the measured signal. This IED presupposes that the sampling will be at least 10 to 20 times the highest frequency component of the real signal. Thus, the higher sampling allows the IED to over-sample the data not allowing the analog to digital converter to be fooled by a higher frequency signals aliasing down into the lower bandwidth sampling. The IED of the present disclosure will utilize such low pass filters and/or digital over-sampling to eliminate the unwanted high frequency signal. This is also very important for not only waveform recording, but to have accurate harmonic measurement techniques. Thus prior to conducting a fast Fourier transform on the sampled waveform samples, the samples will be anti-aliased so that the harmonic content within the waveform can be determined accurately.

There are a number of other ways of removing high frequency noise from the measured signals. The amplifier itself has a high frequency cut-off. An integrating A-D converter will also act as a low-pass filter. Other conditions that are taken into account by the IED design include providing shorter signal wires (as short as possible), using twisted pair wires or shielded wires.

In a further embodiment of the present disclosure, the IED, e.g., electrical power meter, will perform waveform capture and logging of the monitored voltage and current waveforms based on various triggers, as will be described below.

In one embodiment of the IED of the present disclosure, the trigger is determined by the rate of change of a measured parameter. This feature tests the current RMS values of the scaled and conditioned current inputs. Again, this feature is implemented by firmware within at least one DSP Processor or the CPU of the IED and by way of non-limiting illustrative example the processor can be the DSP Processor 70 that triggers on a rate of change, which is defined as the ratio of the present RMS value and the previous RMS value. If the rate of change is above the threshold, then it triggers alerting the user that the rate of change has been exceeded. The trigger will also cause a waveform to be captured for analysis.

For example, at time point T1, current Ia RMS value is updated as ia1, at T2, which is half cycle after T1, current Ia RMS value is updated with a new value ia2, the change of rate is defined as $$Cia=ia2/ia1; \qquad \text{(Equation 2)}$$

If Cia is larger than threshold Cia, this event will be triggered.

The waveform envelope filter or the RMS triggers of the waveform recording can be configured to also perform an adaptive trigger in which the values of the triggers will adapt to the steady state power system voltage. As exemplary technique concerning this type of waveform recording includes collecting 15 minutes of one second updated voltage RMS values (900 values). Then running either a block average or a rolling block average or other type of average on the readings. A block average technique consists of adding the 900 voltage readings and dividing by 900 to provide the 15 minute average reading. A rolling average consists of calculating the same block average for the voltage, but rolling the block average over a predetermined interval. Thus, a user selects 3 intervals, then the calculation will be done 3 times in the 15 minute period by adding 900 of the previous 15 minute samples every 5 minutes. It is conceived by the present disclosure that other averaging techniques may be used. Once the average is calculated then the IED will change the triggers assuming that the nominal voltage has changed to the new average voltage value. It is envisioned by this application the average voltage can be a short as a quarter of one cycle and extending as long many hours or days. This is based on user defined power system characteristics and is envisioned by the present disclosure.

The following is an exemplary technique concerning an adaptive trigger. For this example, a simple RMS trigger will be used, however, it is conceived by the present disclosure that adaptive trigger can be used by any of the triggering techniques. Typical power systems utilize either a 120 volt, 69 volt or 220 volt Phase to Neutral nominal. A nominal voltage is generally the base voltage that is provided to a customer. For this example we will presume that a base voltage is 120 volt nominal. Many factors, however, could cause the base voltage to be slightly higher or lower than a perfect nominal. For instance, when a power system is heavily loaded, it may not be able to supply a full 120 volts. Often utility providers can have voltage drift down to 108 volts at full load. If a customer programs the voltage RMS trigger to trip and record an event below 5% of nominal and the nominal is set to 120 volts, the IED will be in a constant trip/recording mode. This is not advantageous because it could cause the IED to record or trip for steady state conditions thus using all the memory resources to store these events and as such, the IED could record over other useful prior events. Thus, the adaptive algorithm looks at the average voltage to determine what the new nominal condition is and then compares the limit to the new "nominal" value based on the average voltage. This adaptation assures that the IED is recording events that are actually not stead state conditions.

The IED of the present disclosure also includes the ability to operate as a circuit protection device. This feature utilizes the CPU 50 or at least one DSP Processor 70 to run the embedded software allowing the IED, in addition to measuring revenue energy readings and calculating power quality as discussed above, to trigger internal relay outputs (with the at least one CPU 50 or DSP 70 (see FIG. 2) when an alarm condition exists on the power system requiring a circuit breaker to trip and remove current flow from the circuit. Using internal relays outputs, one or more outputs are connected to a trip coil of a protective circuit breaker that is placed in line with the flowing current. This trip coil then triggers the circuit breaker mechanism to open the power system circuit thus shutting off the flow of current through the power system and thus protecting the power system from faults, short circuits, unstable voltage, reverse power, or other such dangerous, destructive or undesirable conditions.

Figure 5:
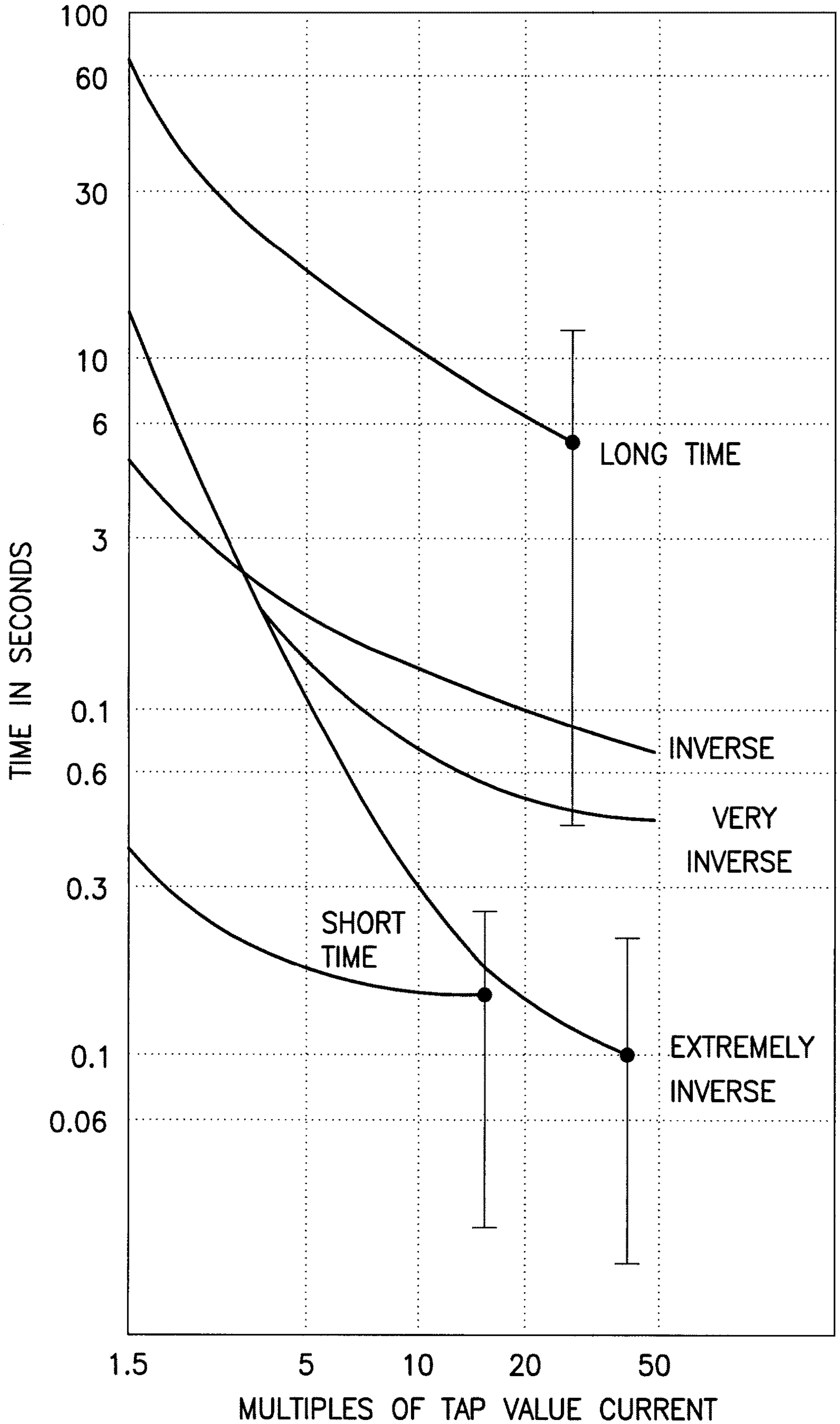
FIG. 5 is a graph illustrating time over current curves in connection with a protective relay feature of the IED of the present disclosure.

The IED calculates protective conditions by using, but not limited to, samples generated by the waveform portion of said IED 16 (see FIGS. 1A and 1B). In the at least one CPU 50 or Processor 70, embedded software is written to collect the waveform samples, filter said samples obtaining fundamental values (if user desired), conduct an RMS or obtain a value if fundamental only on a user defined value of samples, typically one cycle or one half of one cycle of waveform records. The said RMS or fundamental values include but are not limited to Voltage, Current, Frequency and directional Power. The said embedded software also compares the magnitude value to a known chart which is user defined signifying magnitude and duration of an alarm condition. Often these charts are based on curves which vary in time duration as the magnitude increases as to whether an event is harmful to a circuit, such as the chart shown in FIG. 5. These types of trigger events are contemplated by this disclosure. Once the user defined value exceeded said for the user defined time period, the at least one CPU or Processor will activate an on-board dry contact relay by energizing an I/O pin of said CPU or Processor which is operatively connected to the on-board relay. The relay, by non-limiting example, is a 9 amp, latching mechanical nature relay which is mounted to the IED PC board and connected to a trip coil of a circuit breaker. When energized, this trip coil interrupts the primary current flow of the AC current or voltage circuit being monitored. When the relay is activated by the said CPU or processor in said IED, it will cause the circuit breaker trip coil to trigger the circuit breaker to open and protect the circuit from any harmful current or voltage flowing through the line. The purpose and benefit of this feature is that a user will be able to use said IED for circuit interruption benefits as well as monitoring and metering applications.

To protect a circuit, it is desirable to apply and set the IED to provide maximum sensitivity to faults and undesirable conditions, but to avoid their operation on all permissible or tolerable conditions. Both failure to operate and incorrect operation, can result in major system upsets involving increased equipment damage, increased personnel hazards, and possible long interruption of service. These stringent requirements with high potential consequences tend to result in conservative efforts toward protection.

The instantaneous overcurrent alarm will always have a "tap" or "pickup" setting. These terms are interchangeable. The tap value is the amount of current it takes to get the unit to just barely operate. The instantaneous element is intended to operate with no intentional time delay, although there will be some small delay to make sure the element is secure against false operation. Some applications require a short definite time delay after the element is picked up, before the output relay is operated. The operation of the element is still instantaneous but a definite time is added creating a conflict in terminology; instantaneous with definite time delay.

Time overcurrent alarm closely resembles fuse characteristics; at some level of sustained current the fuse will eventually melt. However, the higher the current above minimum melt, the faster the fuse will melt.

As the IED of the present disclosure may be typically used in a distribution application, speed would be slightly less important than if it were used in transmission where system stability issues require faster fault clearing times. Customers will always request that they want the device to be as fast as possible, but never want to be asked to explain an unwanted operation because the relay made a "trip" decision based on just one or two data samples.

The IED will sample said voltage and current waveform samples and filter said sample to create fundamental values of current and voltage. Harmonics often give the relay false information and are seldom needed, and thus filtered out.

Many of the trip conditions are intended to operate with no intentional time delay, such as instantaneous overcurrent. The IED will support instantaneous trip condition by comparing RMS values generated by the waveform recorder. Fast operation is desirable but should not come at the expense of security. The decision that a trip condition is above pickup setting should not be made on one or two samples being above pickup.

A second technique used with instantaneous trip conditions acknowledges that when the sampled value is several times the pickup setting there is more confidence that the current is real and one can trip with less sampling. This results in faster trip times at higher current values. Thus, the IED will analyze the waveform samples using the embedded firmware in one of said CPU or DSP to determine if the condition exists and thus generate a trip signal.

Instantaneous Overcurrent is required to operate within 1.5 cycles at 5 times pickup. The IED will achieve this result by subtracting the operating time of the output relay (probably 4-8 ms) One still has in excess of 1 cycle to make a decision on pickup, which should allow for a secure sampling method.

The IED will be capable of also tripping the relay for time overcurrent which always includes a time delay, by definition. Time to trip becomes shorter as the current increases above pickup, therefore the timing is to be integrated over time to allow for changes in current after the relay begins timing.

The IED will also utilize trip conditions for voltage and power which are often specified to operate within 5 cycles, which allows an even more secure sampling technique.

Referring to FIGS. 6, 6A, 6B, 6C, 6D, 6E, 6F, 6G, 7, 7A, 7B, 7C, 7D, 7E, 7F, 7G, 7H, 8, 8A, 8B, 8C, 8D, 8E, 8F, 8G, 9, 9A, 9B, 9C, 9D, 9E, 9F, 10, 10A, 10B, 10C, 10D, 10E, 10F, 11, 11A, 11B, 11C, 11D, 11E, 11F, 11G, 12, 12A, 12B, 12C, 12D, 12E, 12F, 13, 13A, 13B, 13C, 13D, 13E, 13F, 14, 14A, 14B, 14C, 14D, 14E, 15, 15A, 15B, 15C, 15D, 15E, 15F, 15G, 16, 16A, 16B, 16C, 16D, 16E, 16F, 16G, 17, 17A, 17B, 17C, 17D, 17E, 17F, 17G, 18, 18A, 18B, 18C, 18D, 18E, 18F, 19, 19A, 19B, 19C, 19D, 19E, 20, 21, 21A, 21B, 21C, 21D, 21E, 21F, 22, 22A, 22B, 22C, 22D, 22E, 23, 23A, 23B, 23C, 23D, 24, 24A, 24B, 24C, 24D, 25, 25A, 25B, 25C, 26, 26A, 26B, 26C, 26D, 26E, 26F, 26G, 27, 27A, 27B, 27C, 27D, 27E, 27F, 27G, 27H, 28, 28A, 28B, 28C, 28D, 28E, 28F, 28G, 28H, 29, 29A, 29B, 29C, 29D, 29E, 29F, 29G, 29H, 30, 30A, 30B, 30C, 30D, 30E, 30F and 30G which show the schematics of the Intelligent Electronic Device of the present disclosure which is described as follows:

The digital board of the IED of the present disclosure is described with reference to FIG. 6, 6A, 6B, 6C, 6D, 6E, 6F, 6G, 7, 7A, 7B, 7C, 7D, 7E, 7F, 7G, 7H, 8, 8A, 8B, 8C, 8D, 8E, 8F, 8G, 9, 9A, 9B, 9C, 9D, 9E, 9F, 10, 10A, 10B, 10C, 10D, 10E, 10F, 11, 11A, 11B, 11C, 11D, 11E, 11F, 11G, 12, 12A, 12B, 12C, 12D, 12E, 12F, 13, 13A, 13B, 13C, 13D, 13E, 13F, 14, 14A, 14B, 14C, 14D, 14E, 15, 15A, 15B, 15C, 15D, 15E, 15F, 15G, 16, 16A, 16B, 16C, 16D, 16E, 16F, 16G, 17, 17A, 17B, 17C, 17D, 17E, 17F and 17G.

Figure 6A:
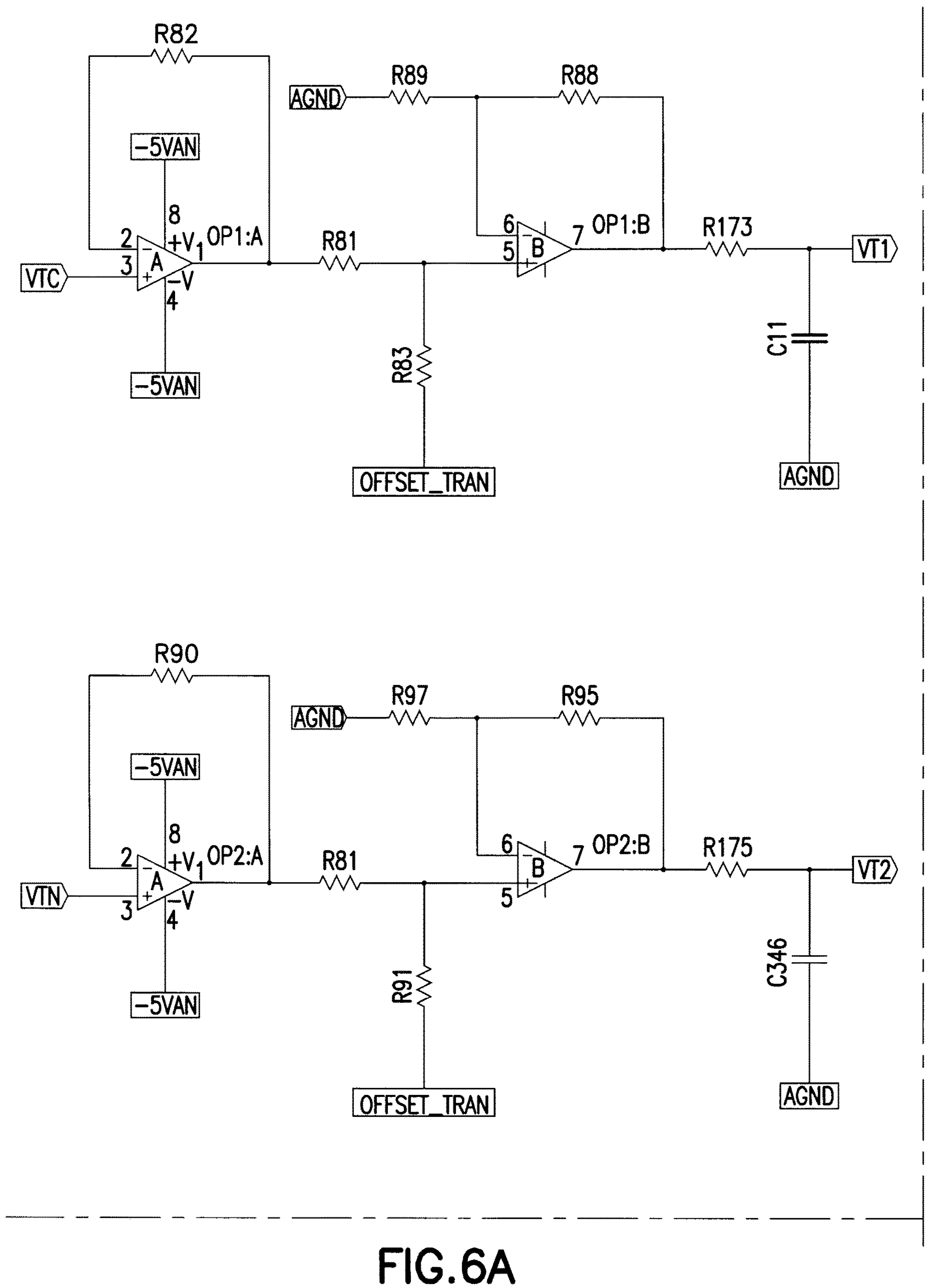
FIG. 6 illustrates how FIGS. 6A, 6B, 6C, 6D, 6E, 6F and 6G would fit together in order to form a single view of a schematic drawing of a portion of an IED of the present disclosure.
Figure 6B:
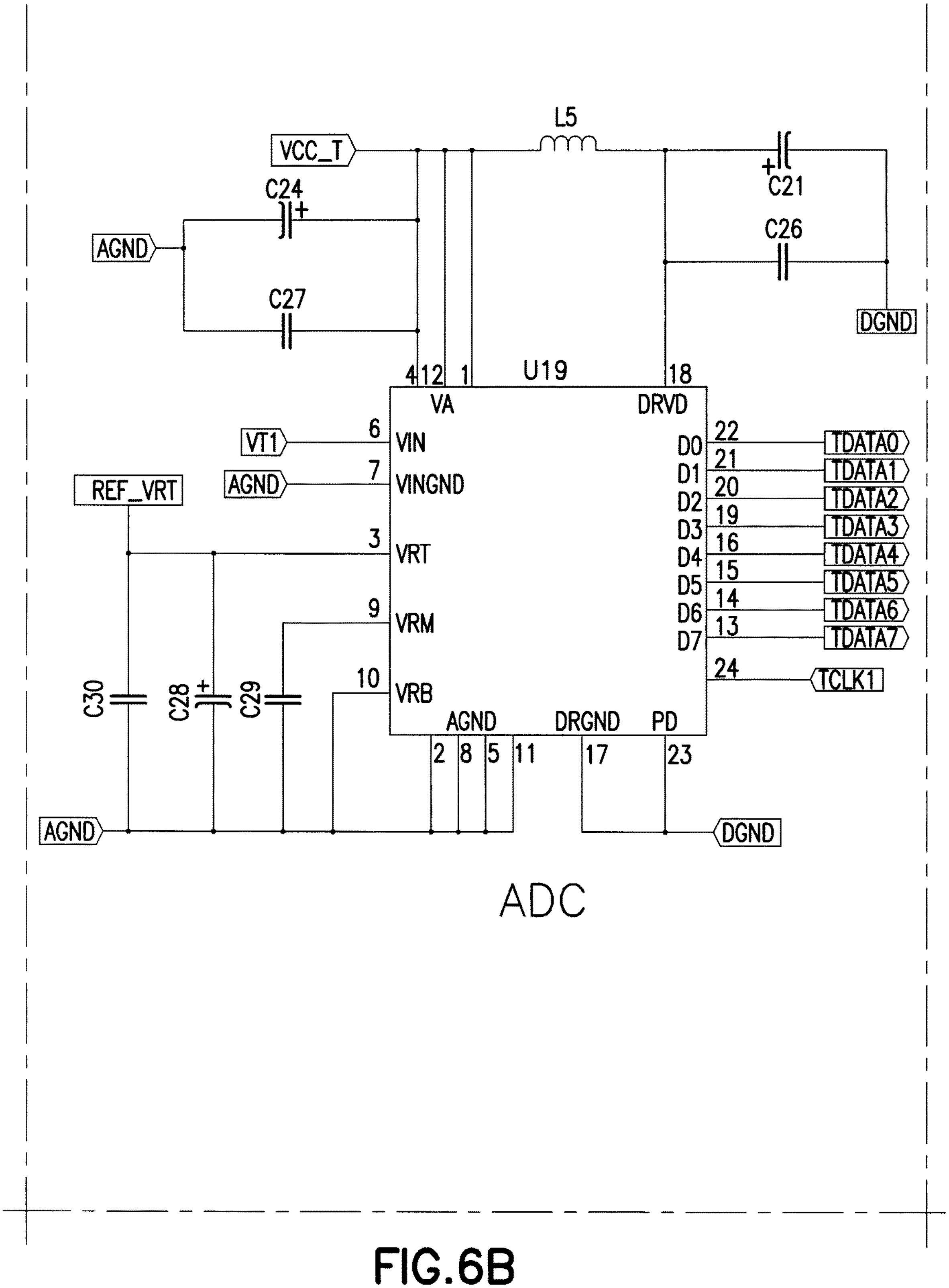
Figure 6C:
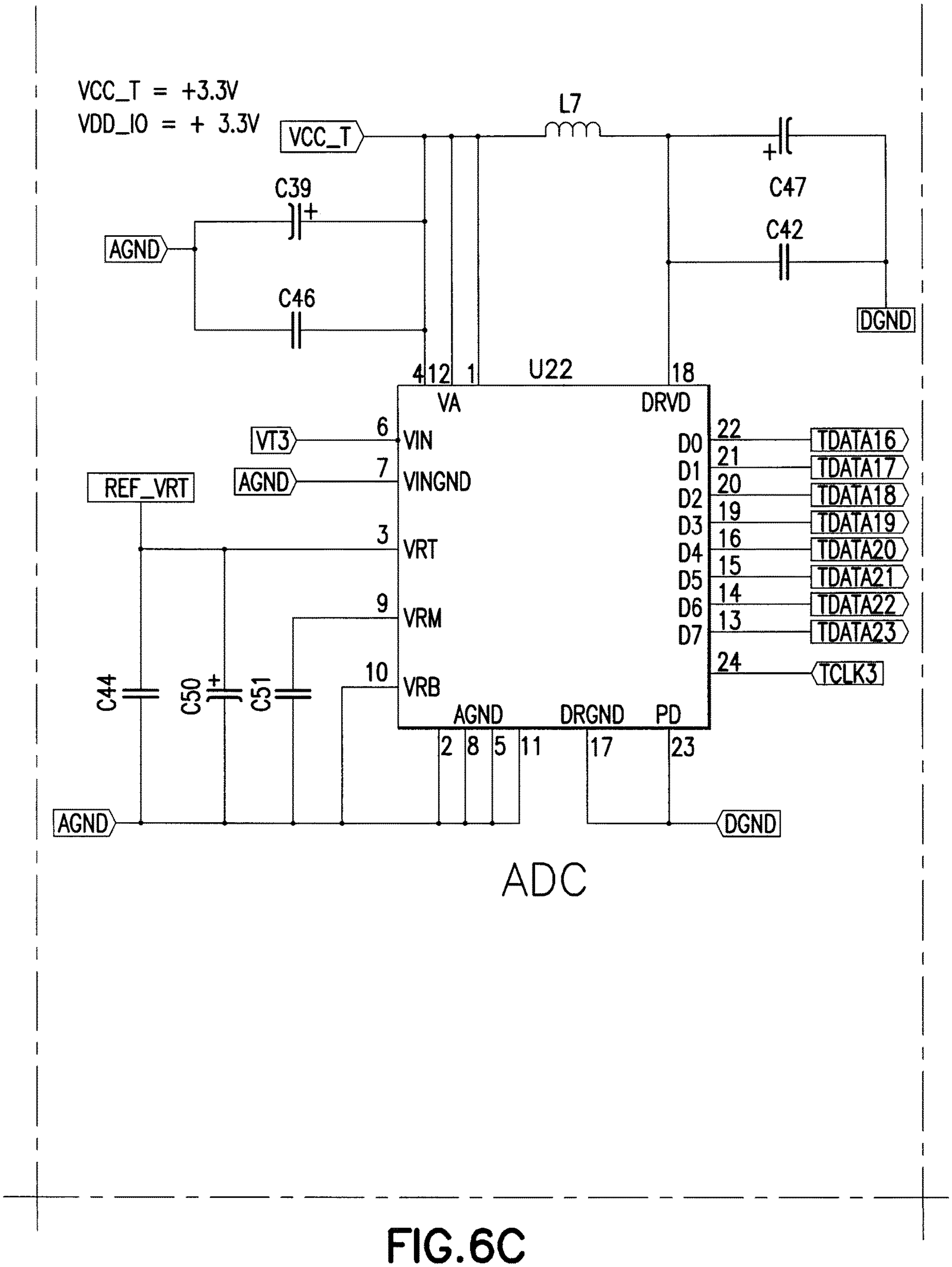
Figure 6D:
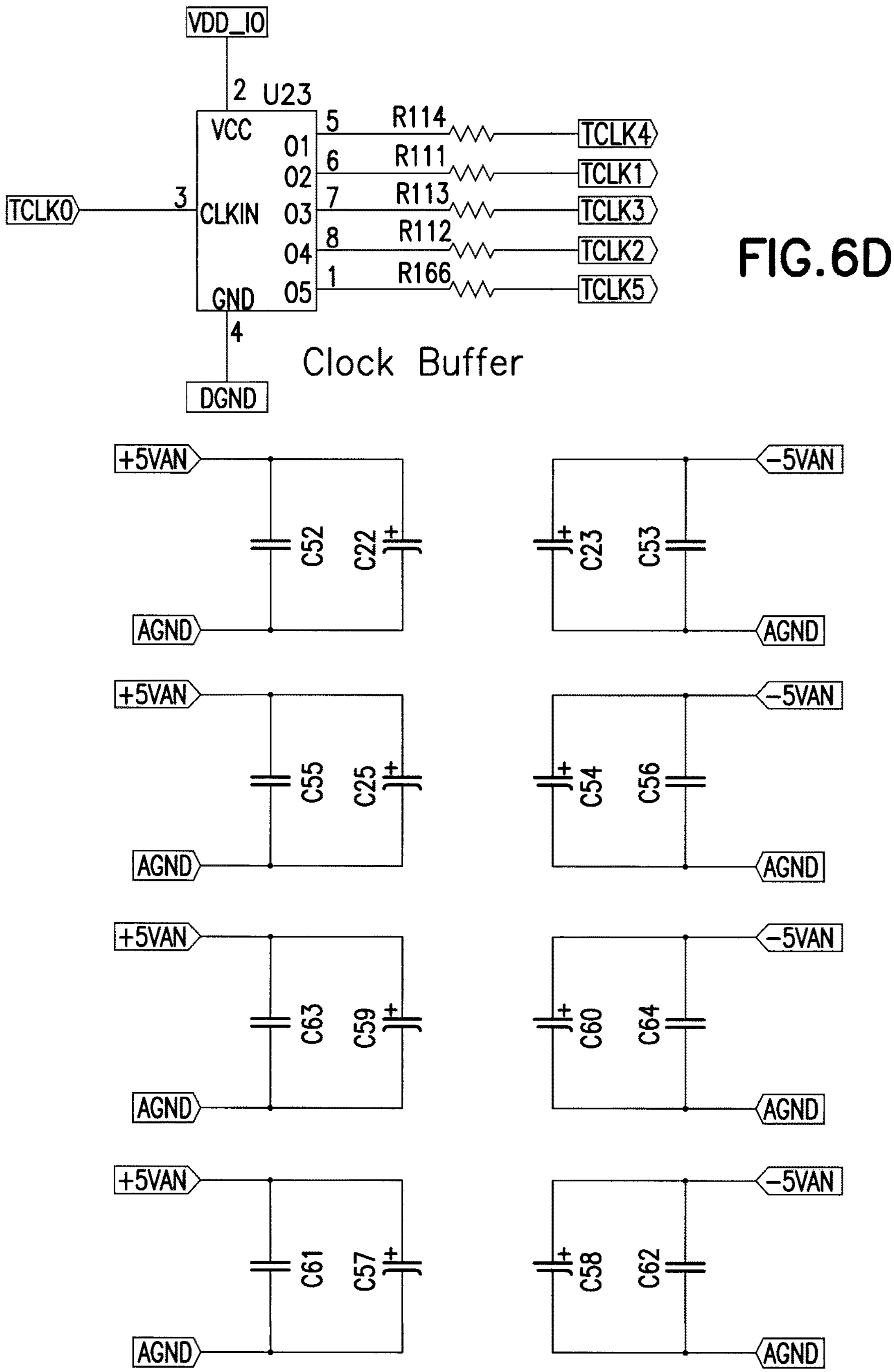
Figure 6E:
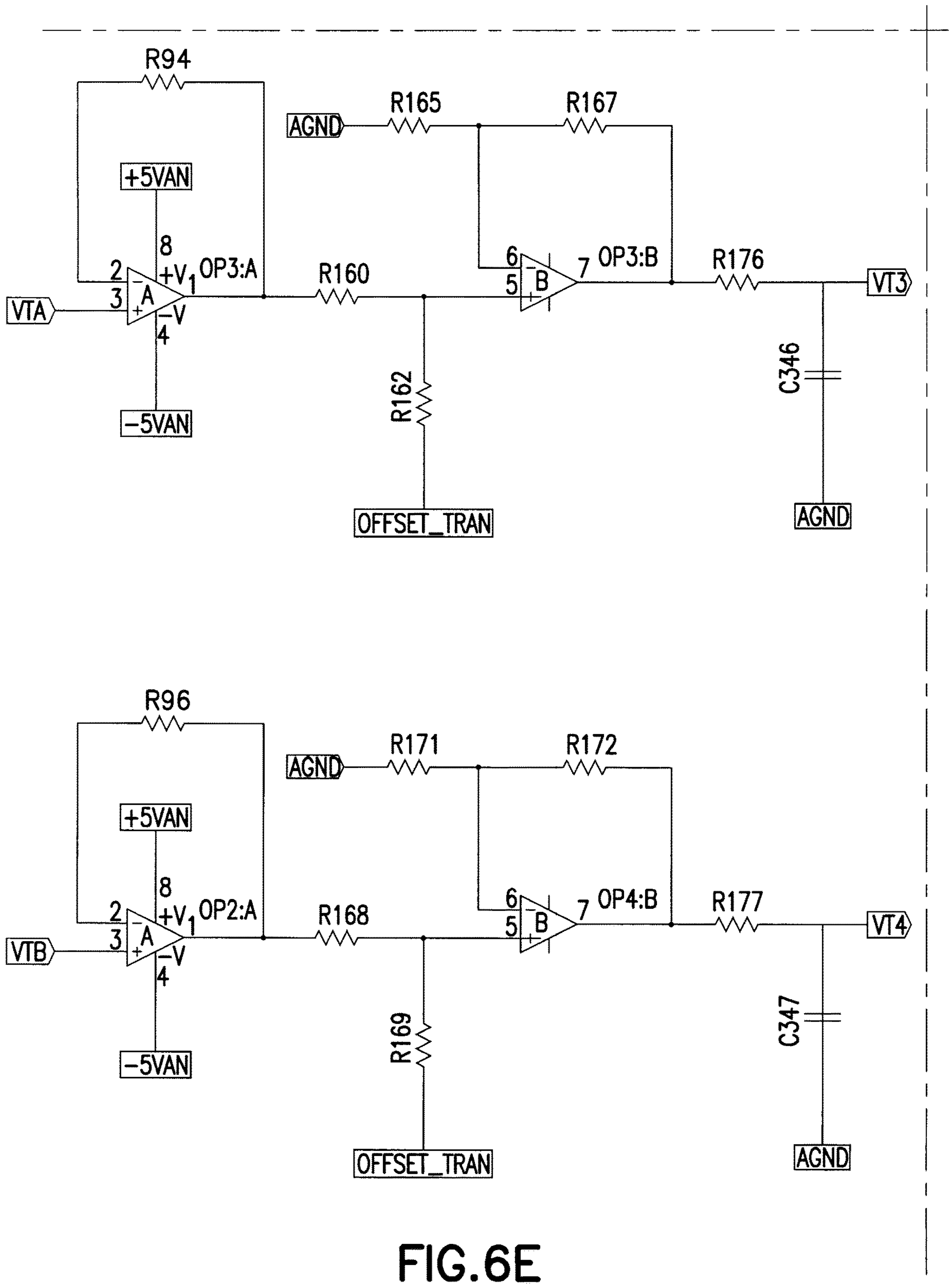
Figure 6F:
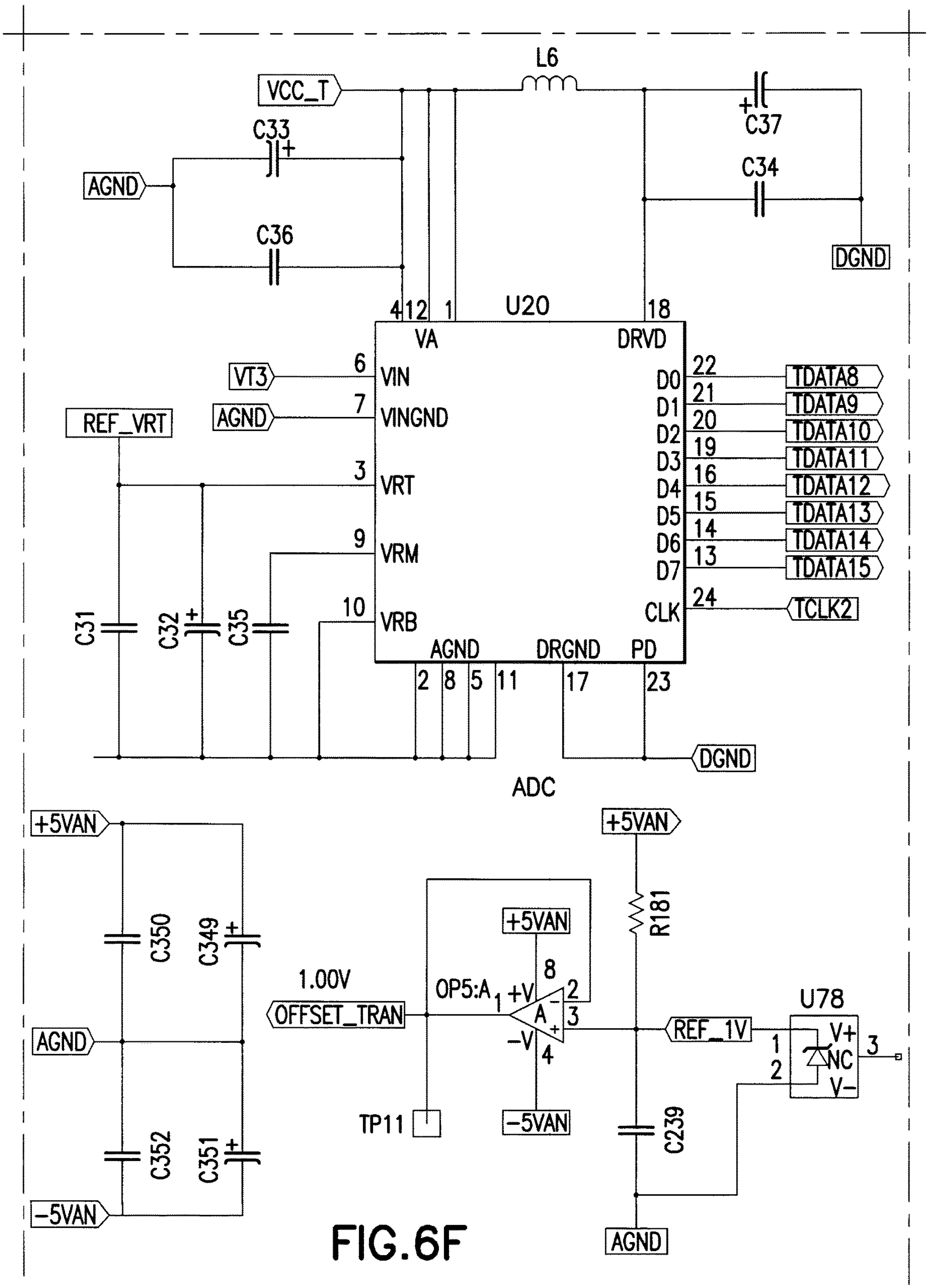
Figures 6, 6G:
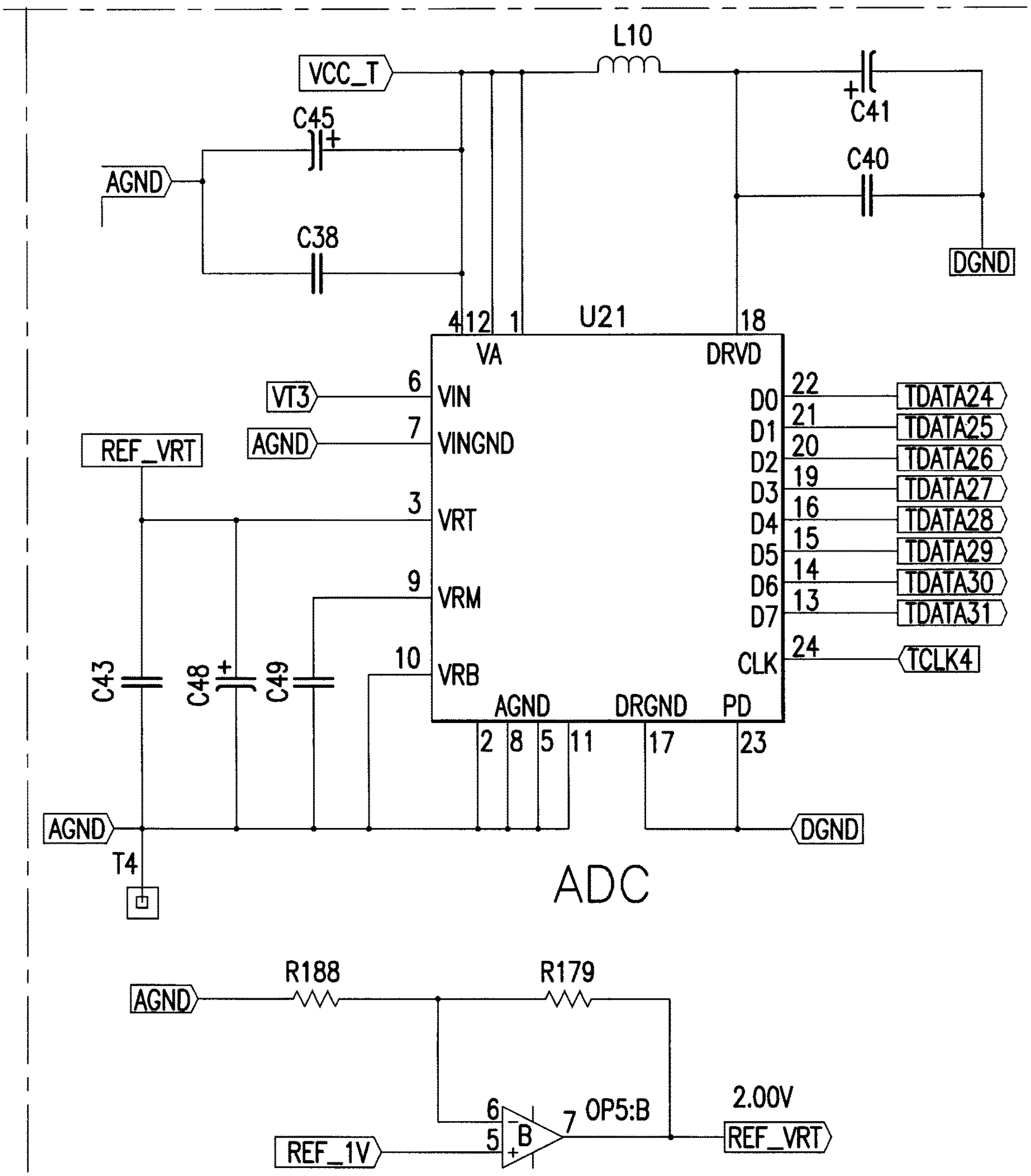

FIGS. 6A and 6B of FIG. 6 shows some of the transient input signals buffered for conditioning and scaling before input to A/D converters.

FIGS. 6C and 6D of FIG. 6 shows additional transient input signals buffered for conditioning and scaling before input to transient A/D converters and shows the clock buffer for the transient A/D converters.

FIG. 6G of FIG. 6 shows more transient input signals buffered for conditioning and scaling before input to A/D converters and shows voltage decoupling capacitors and has a reference voltage for the transient A/D converters and a reference voltage used for offsetting the transient signal properly before going to the transient A/D converters.

Figure 7A:
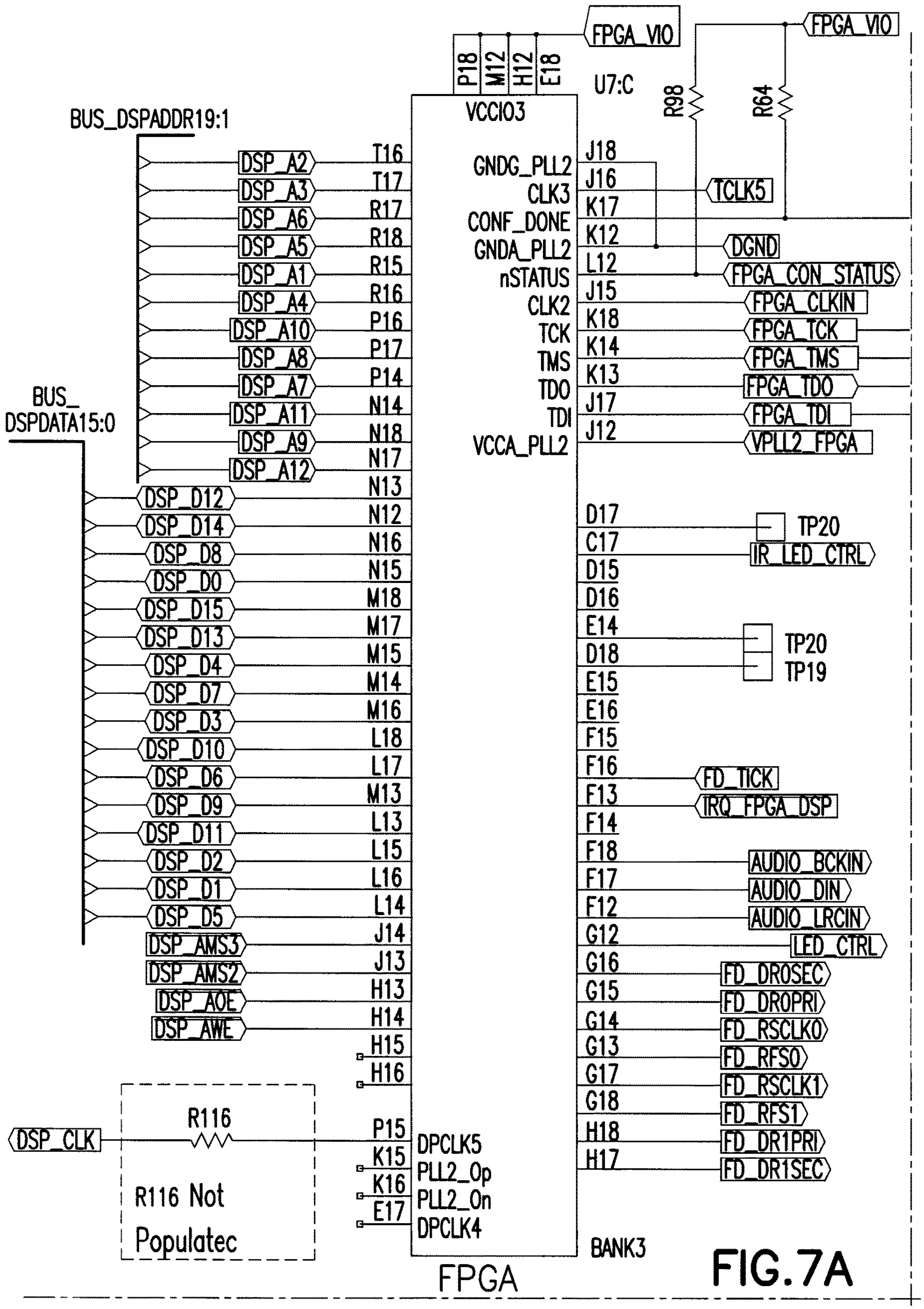
FIG. 7 illustrates how FIGS. 7A, 7B, 7C, 7D, 7E, 7F, 7G and 7H would fit together in order to form a single view of a schematic drawing of a portion of an IED of the present disclosure.
Figure 7B:
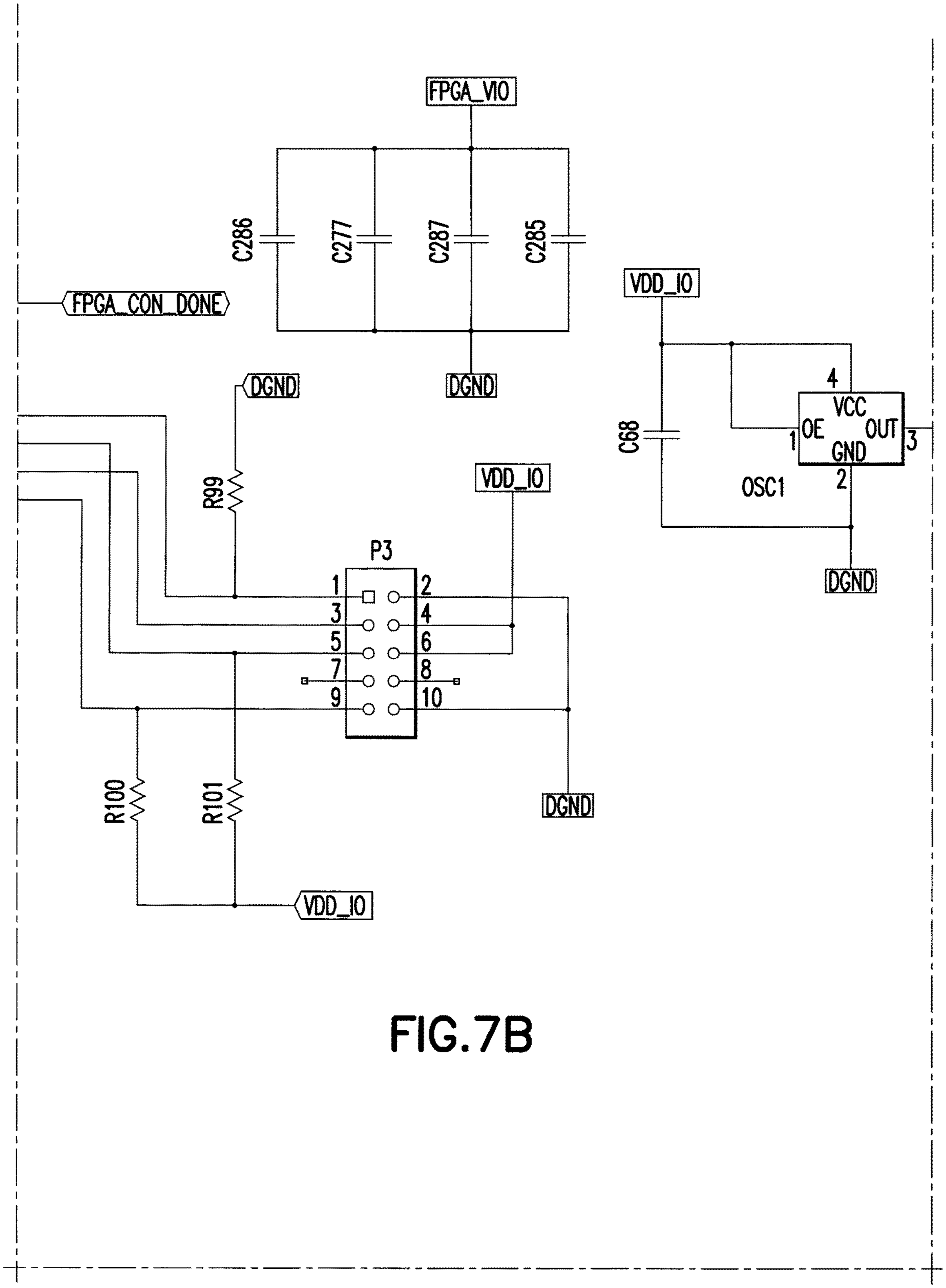
Figure 7C:
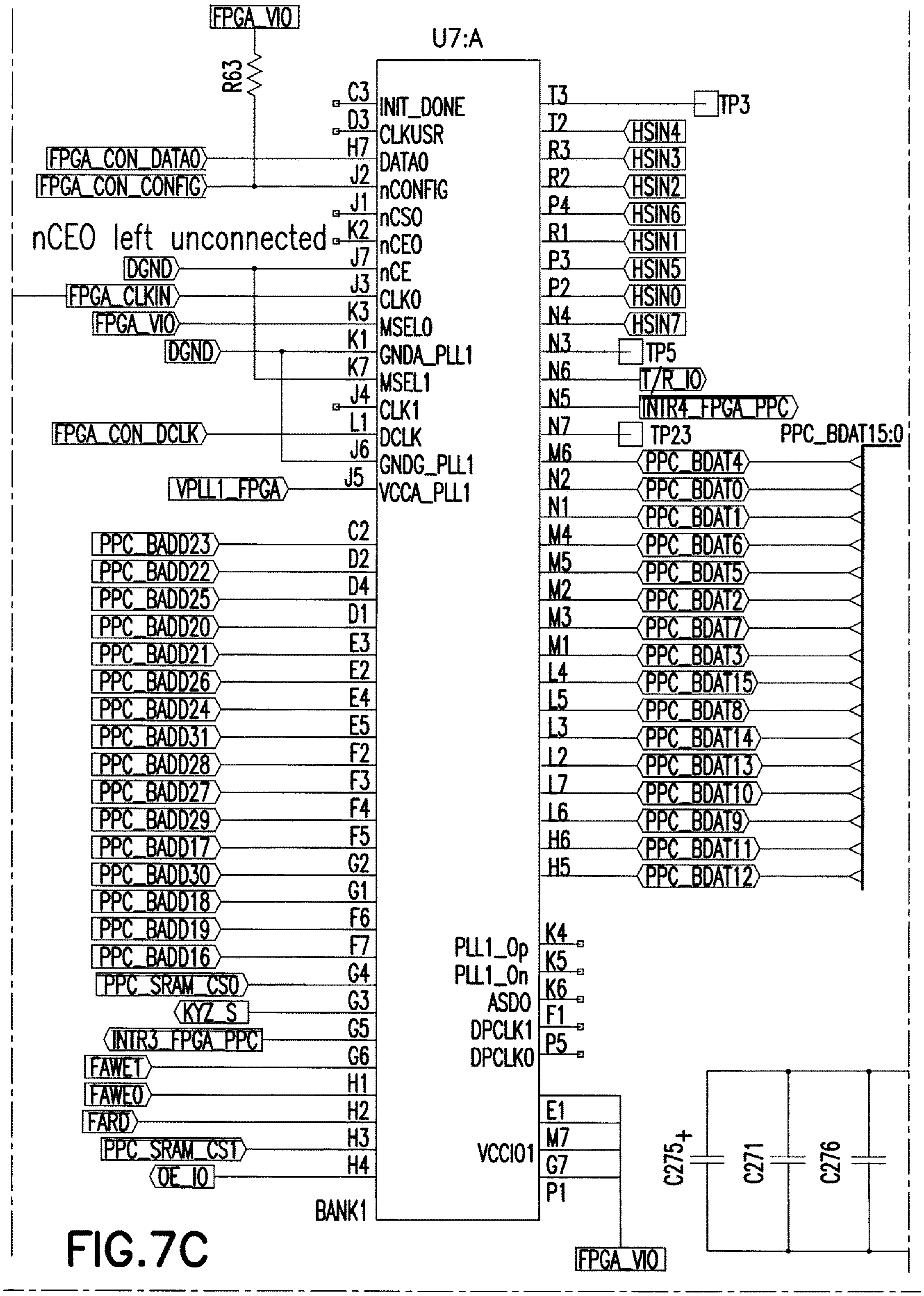
Figure 7D:
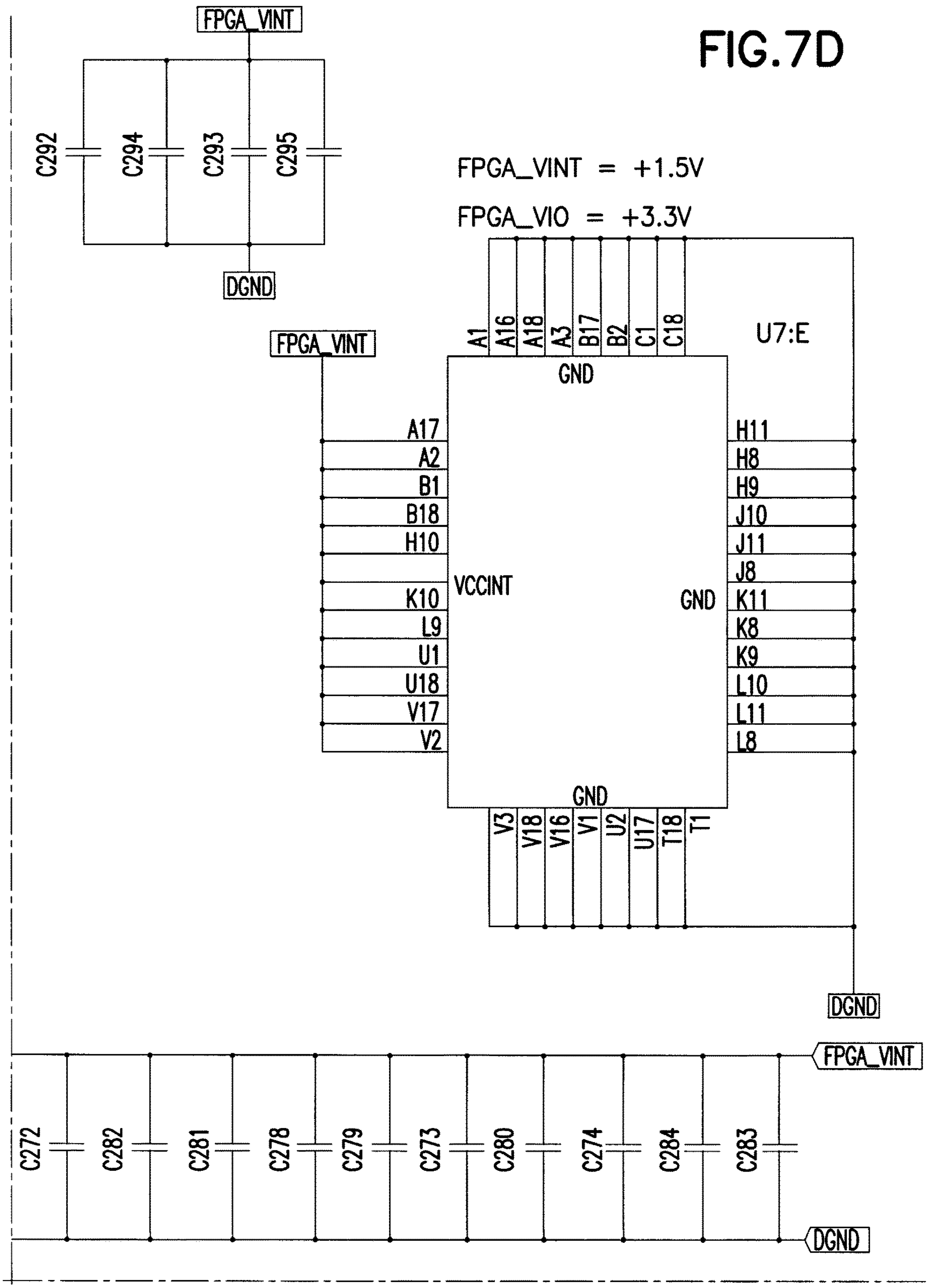
Figure 7E:
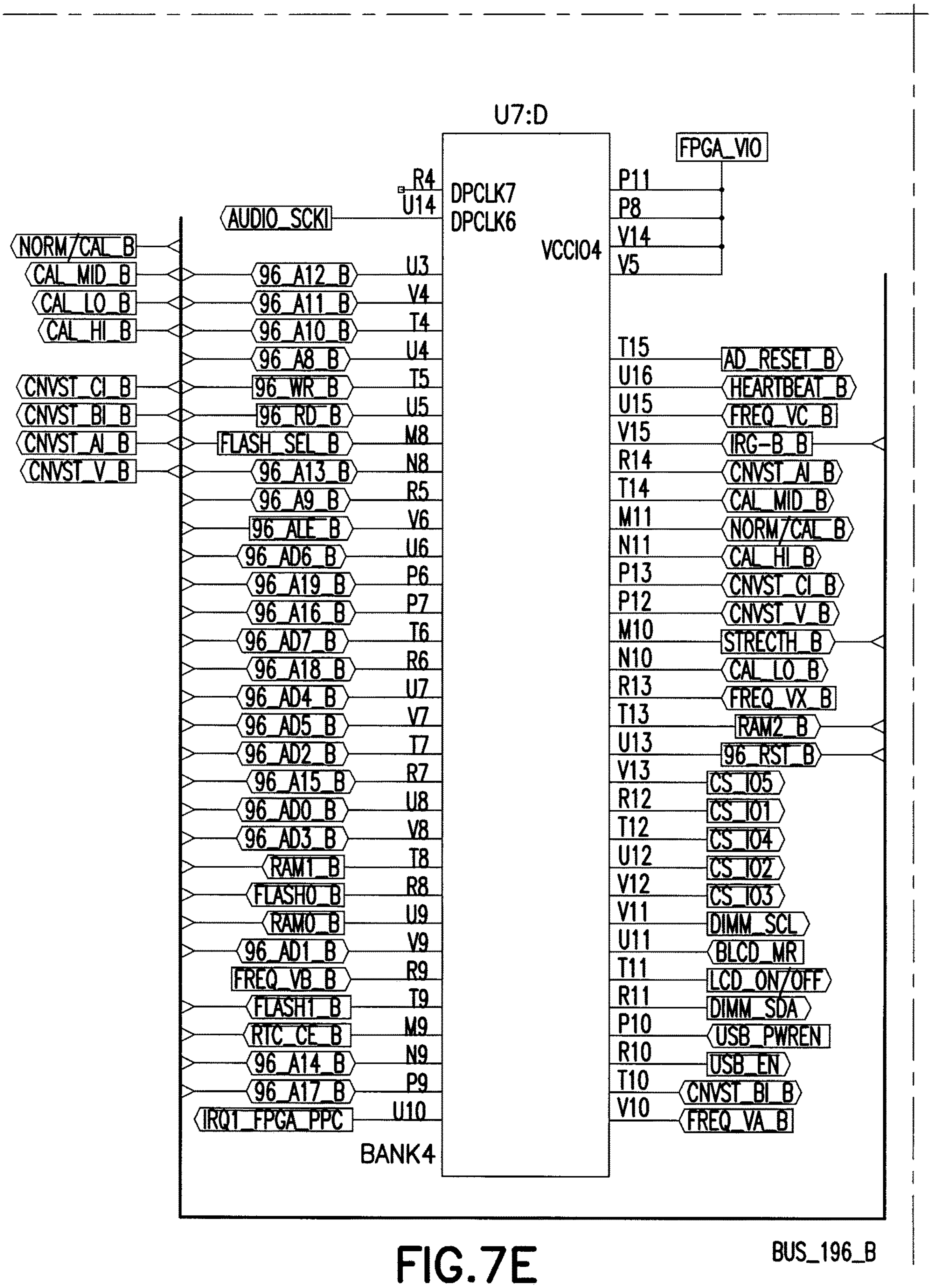
Figure 7F:
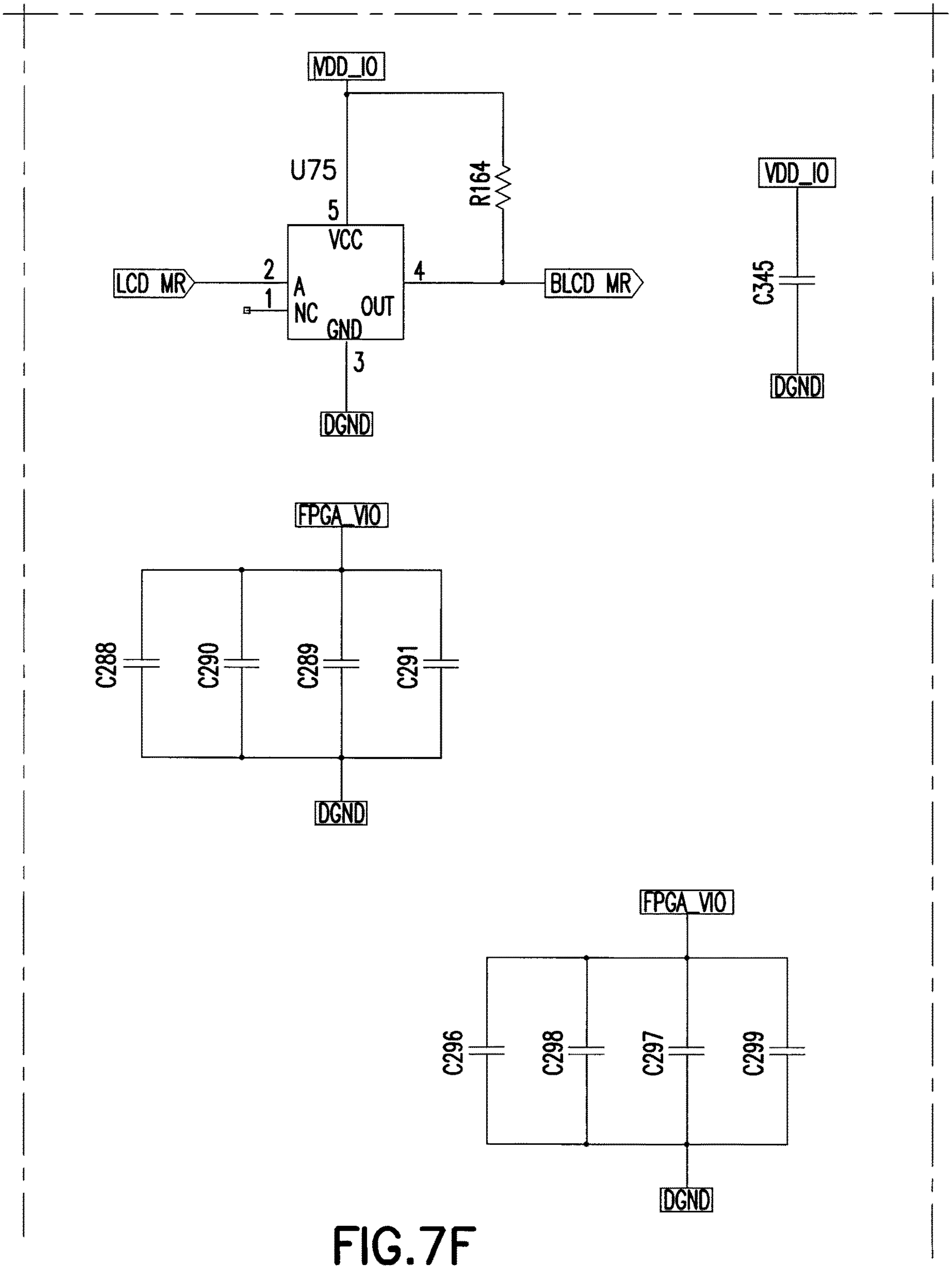
Figure 7G:
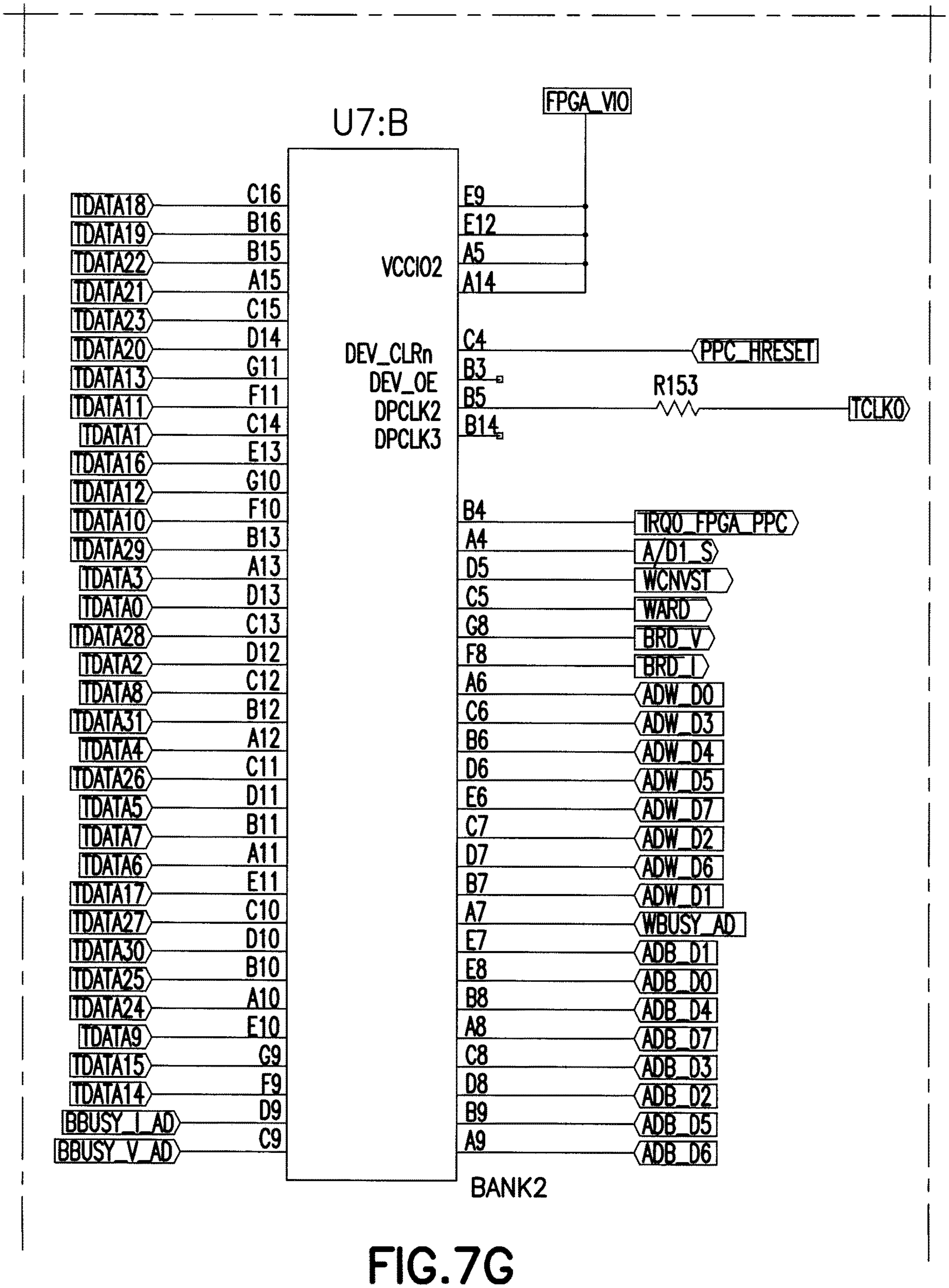
Figures 7, 7H:
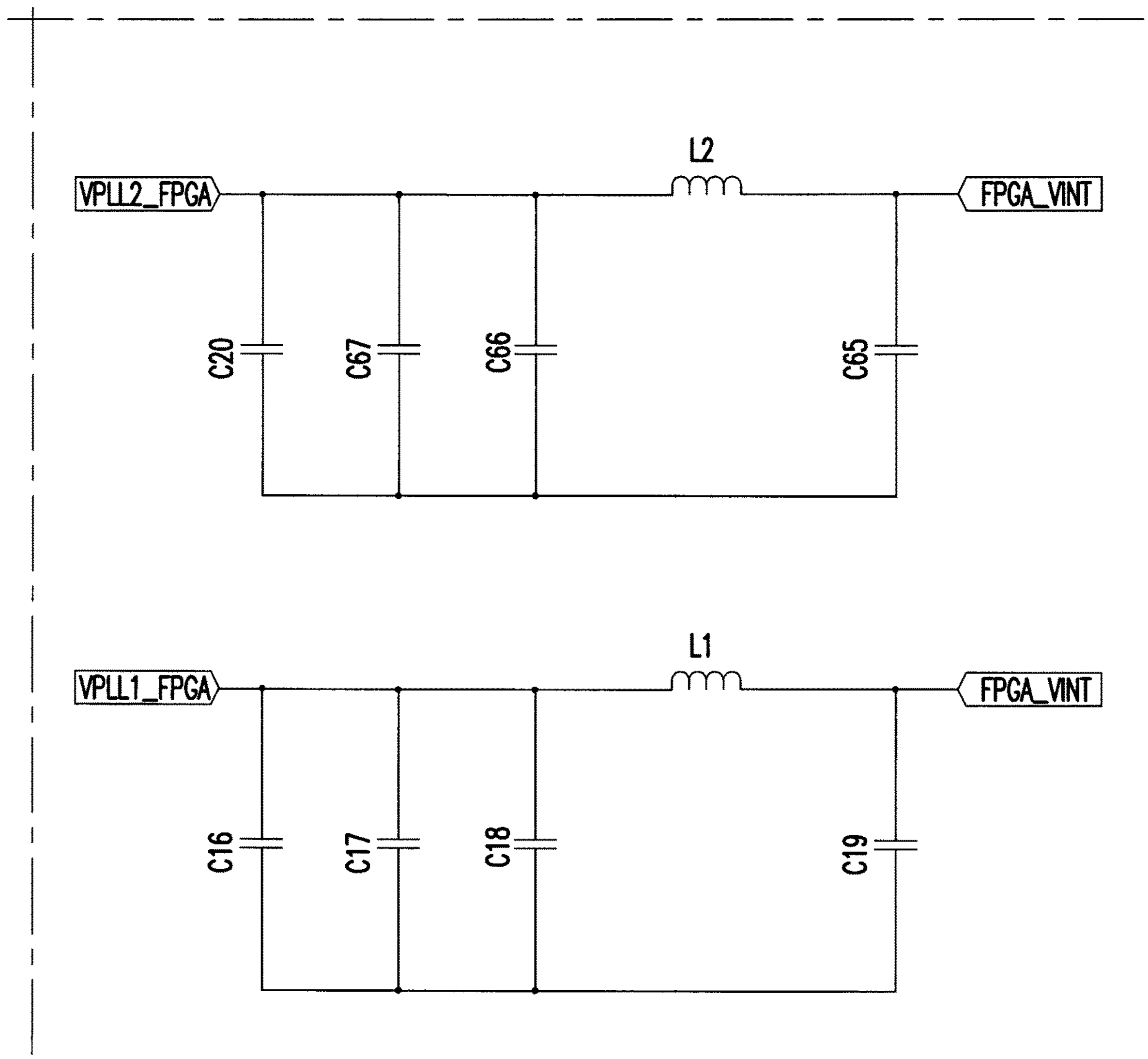

FIGS. 6E and 6F of FIG. 6 shows some of the transient input signals buffered for conditioning and scaling before input to A/D converters FIGS. 7A and 7B of FIG. 7 shows a section of the Programmable Logic Device and the header used to program the FPGA and shows the waveform capture sampling oscillator.

FIGS. 7C, 7D and 7H of FIG. 7 shows I/O signals to the FPGA and voltage inputs to the FPGA and the majority of the signals between the CPU and the FPGA.

FIG. 7G of FIG. 7 shows the majority of the signals between the transient capture A/D converters and the FPGA and the waveform capture data and the FPGA and the revenue measurement data and the FPGA.

FIGS. 7E and 7F of FIG. 7 shows the DSP Processor 60 (or whichever processor the firmware for the DSP Processor 60 resides) interfaces to the FPGA and also the control signals to the analog board and control lines for all I/O cards.

Figure 8A:
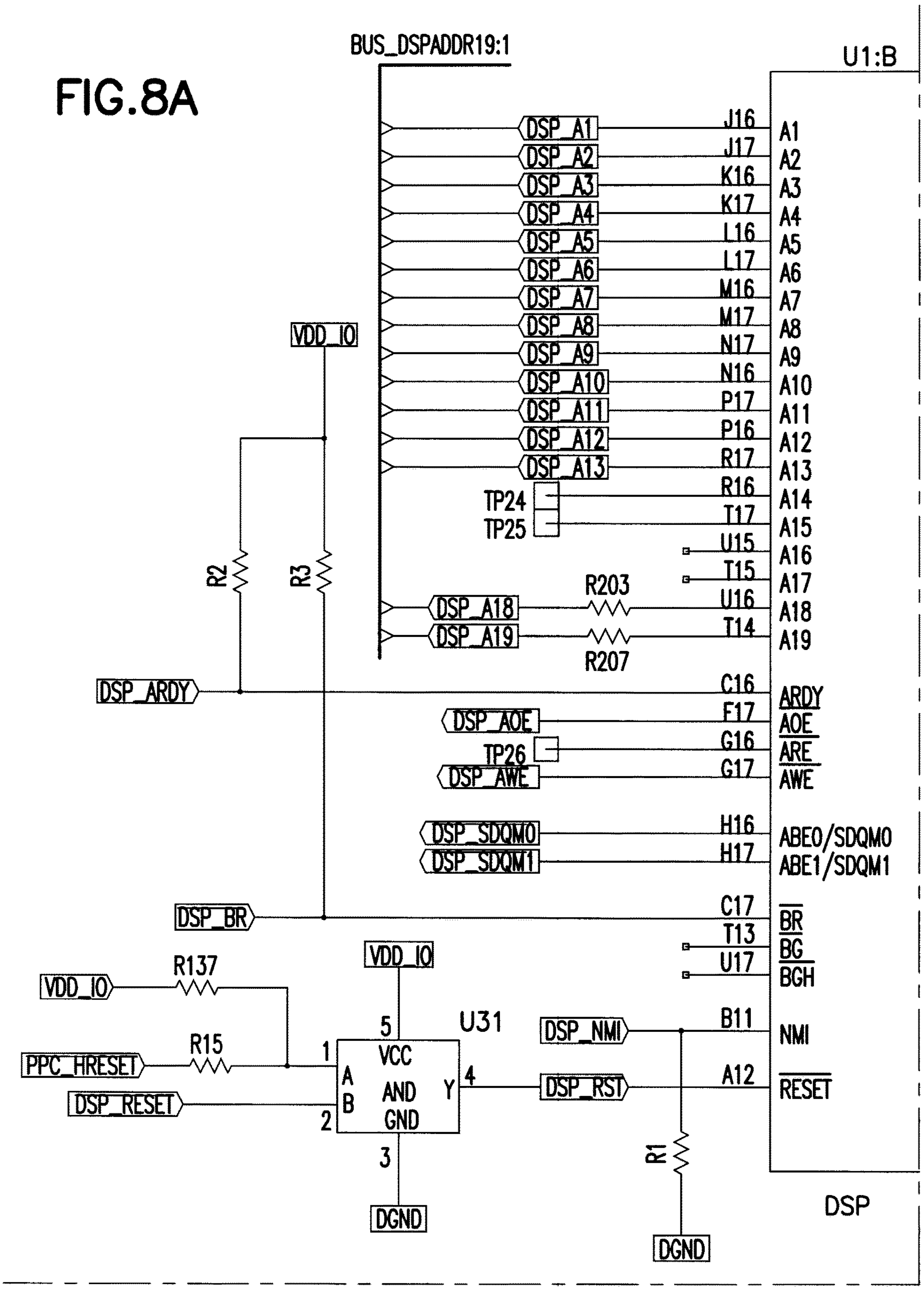
FIG. 8 illustrates how FIGS. 8A, 8B, 8C, 8D, 8E, 8F and 8G would fit together in order to form a single view of a schematic drawing of a portion of an IED of the present disclosure.
Figure 8B:
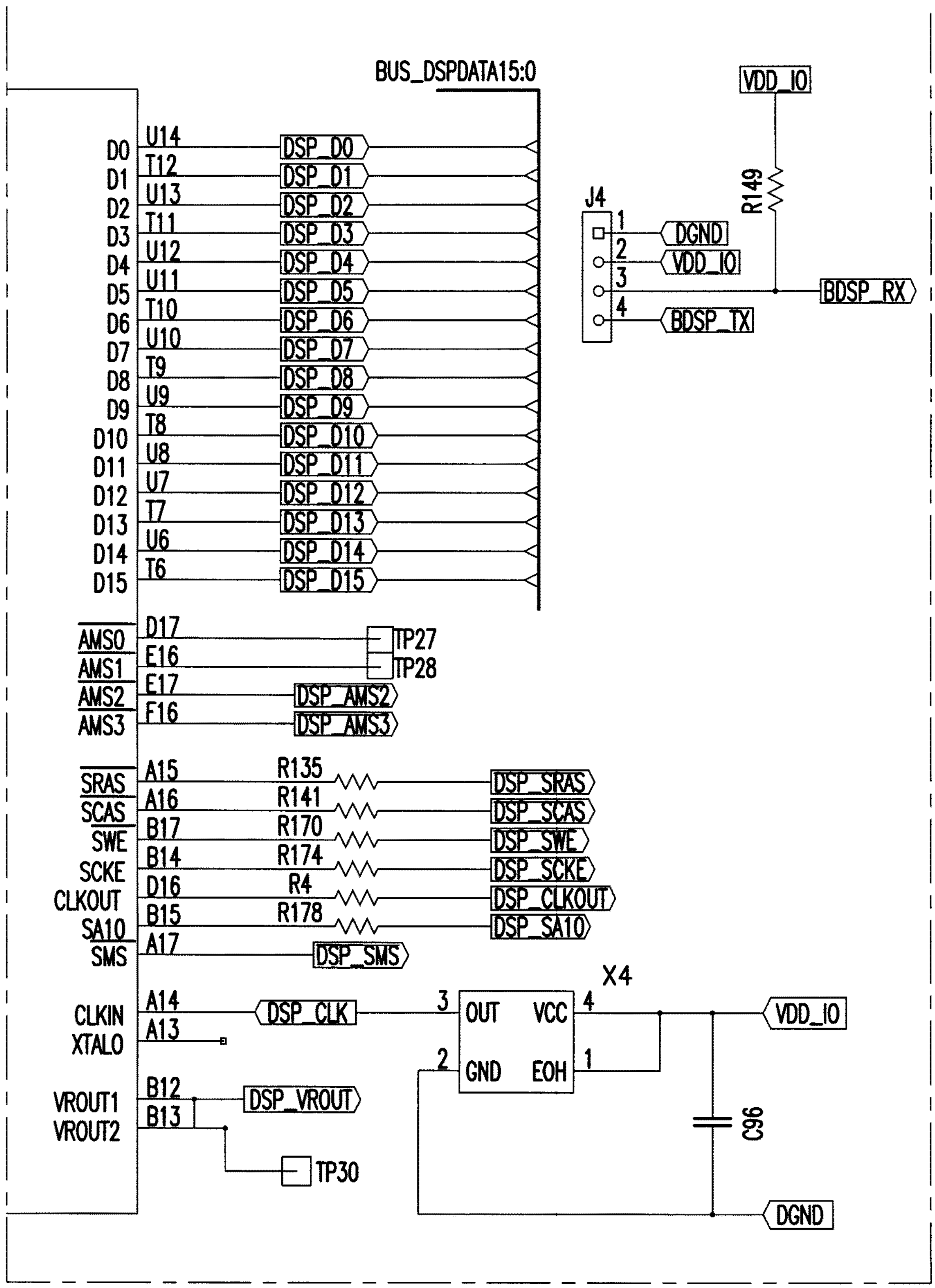
Figure 8C:
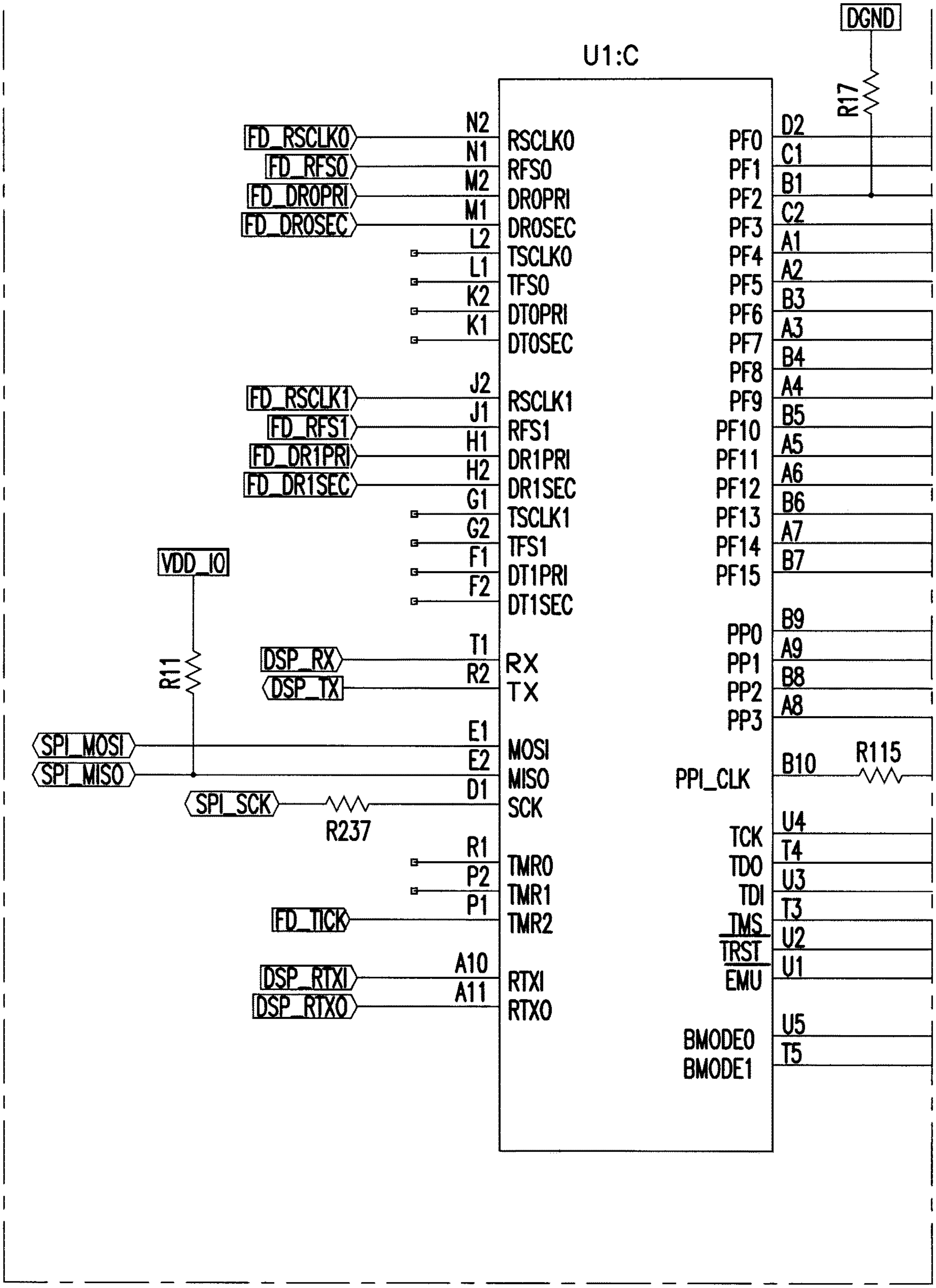
Figure 8D:
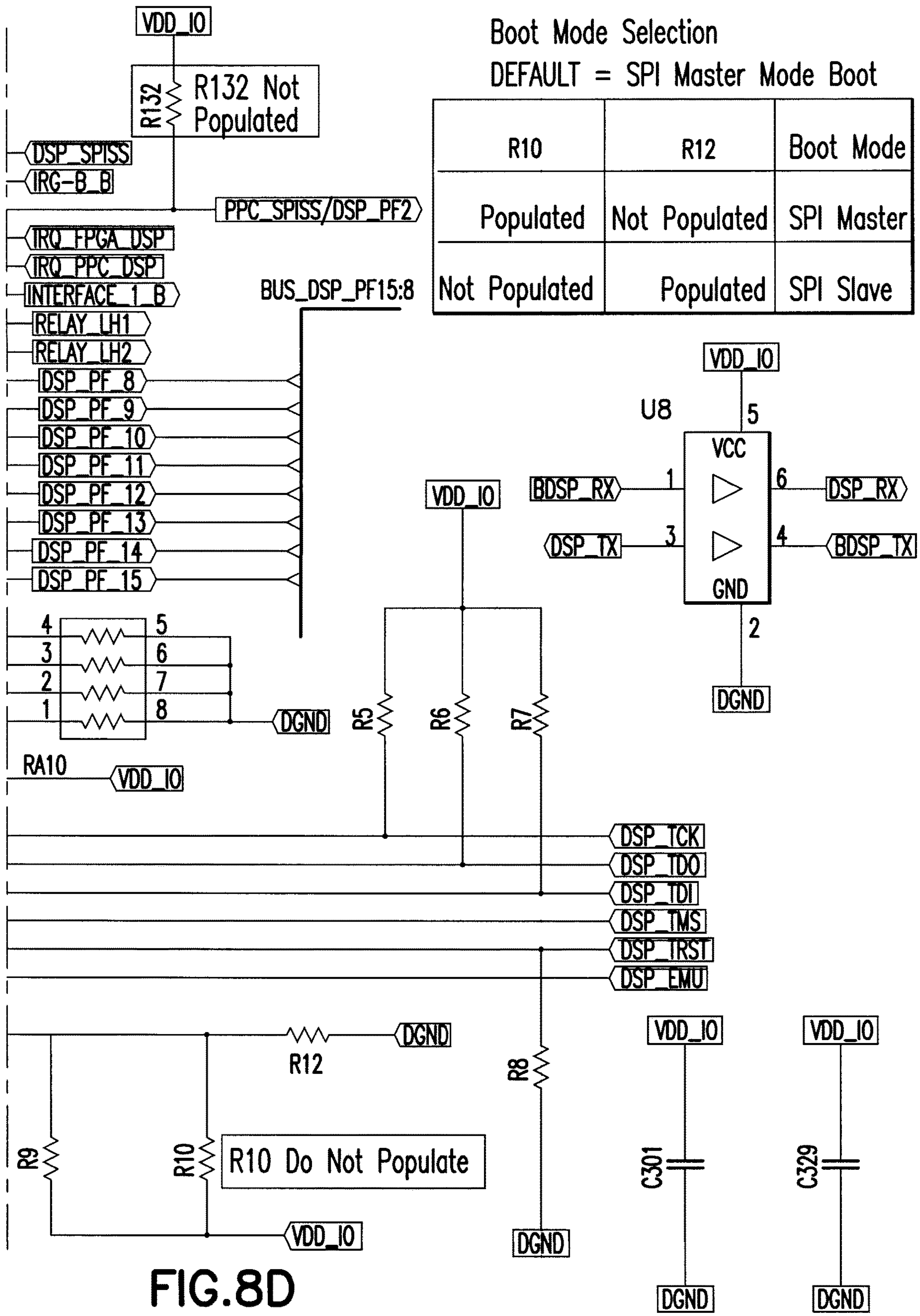
Figure 8E:
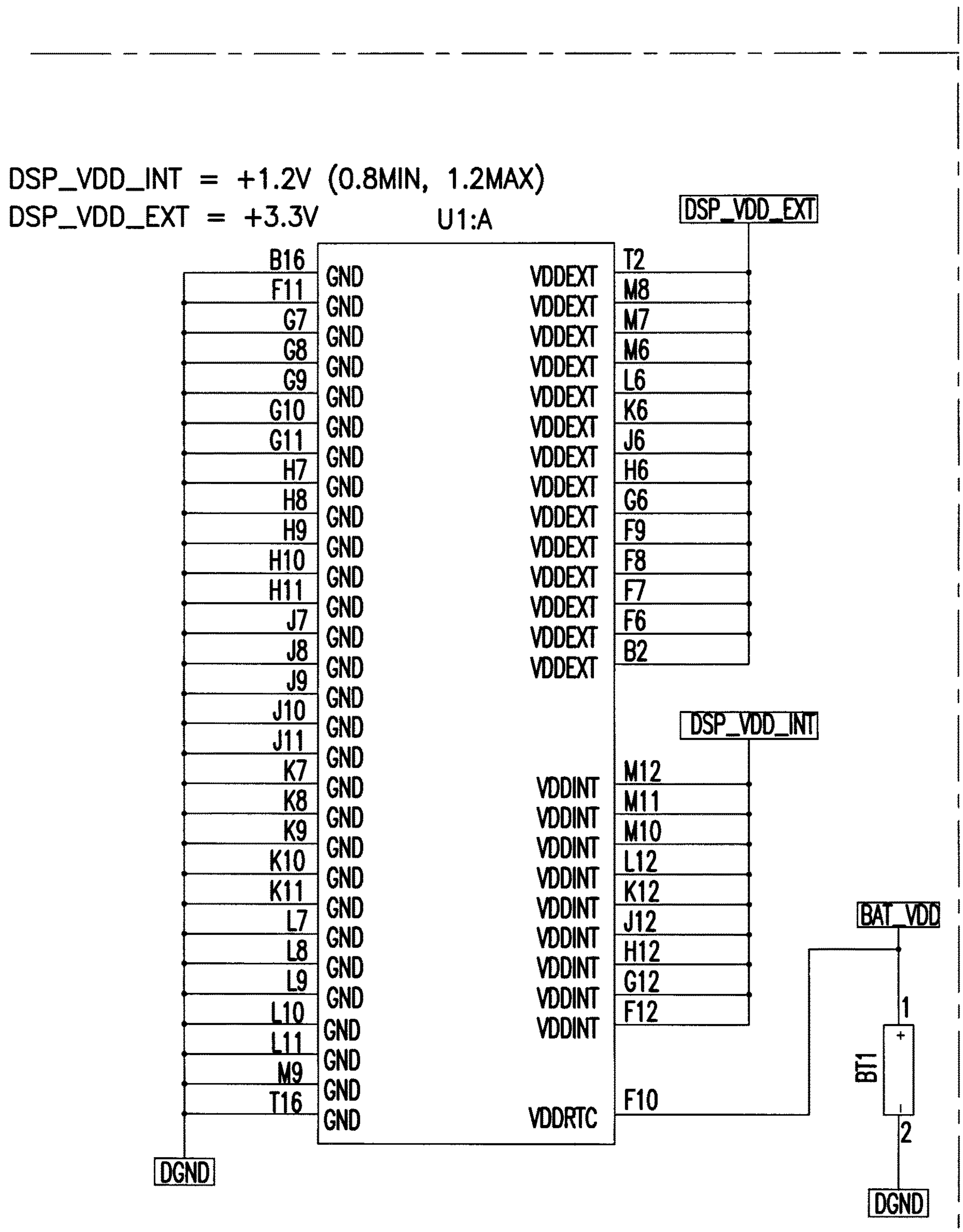
Figure 8F:
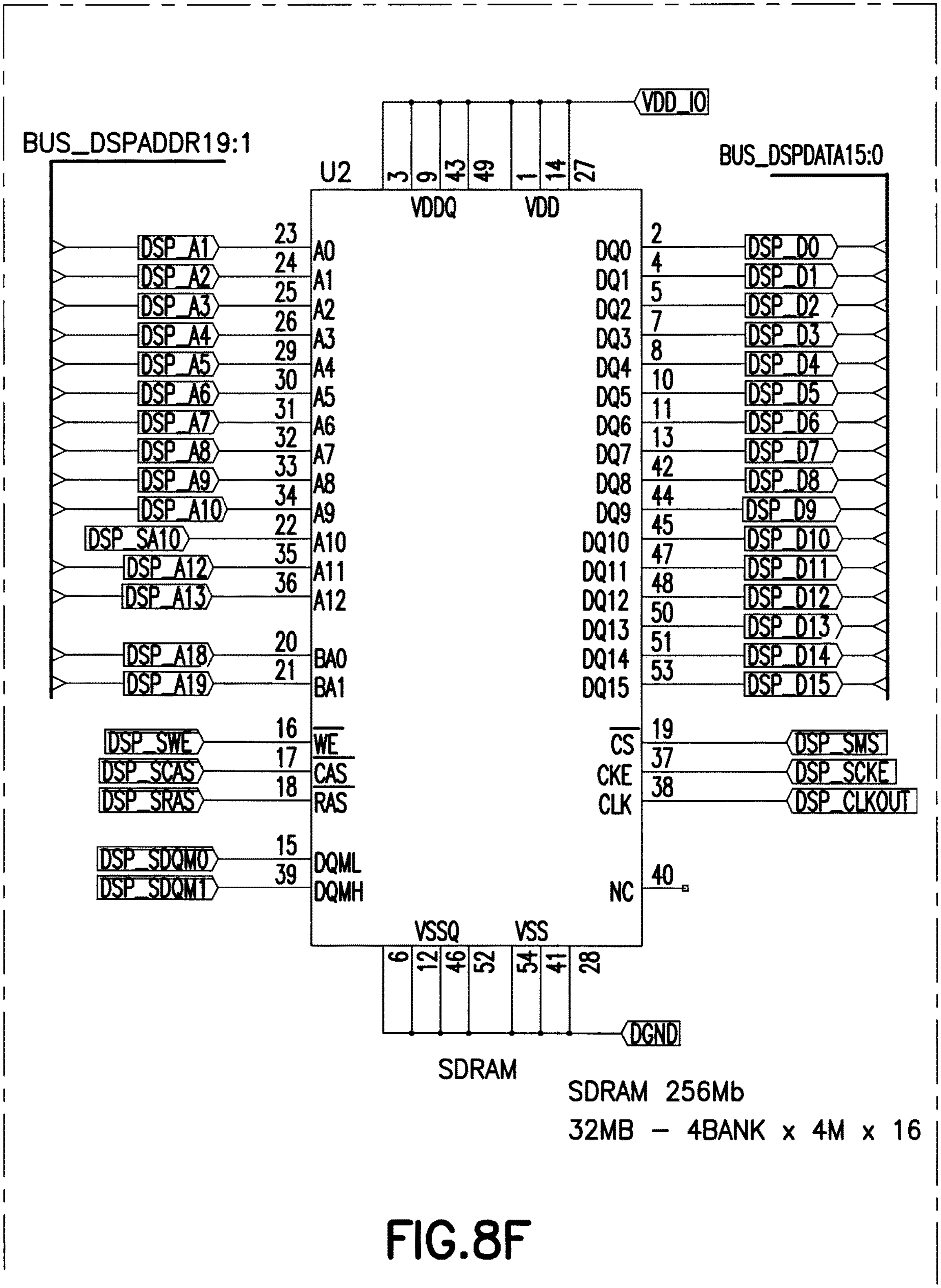
Figures 8, 8G:
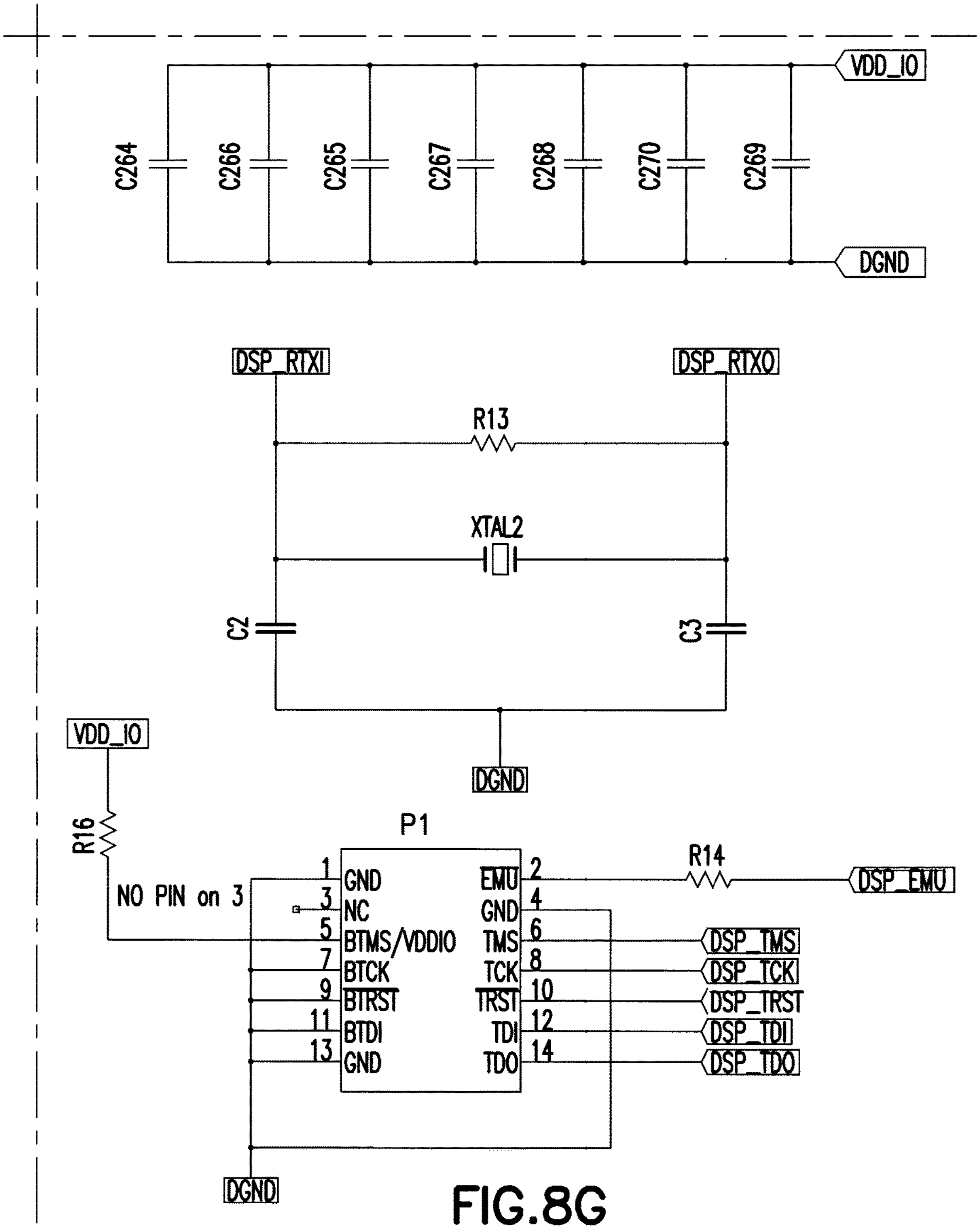

FIGS. 8A and 8B of FIG. 8 shows a section of the DSP Processor 70.

FIGS. 8C and 8D of FIG. 8 shows another section of the DSP Processor 70.

FIG. 8G of FIG. 8 shows the crystal circuit for the DSP Processor 70 and JTAG interface (JTAG stands for Joint Test Action Group and is an IEEE standard interface)—it is understood that the IED of the present disclosure is not limited to any particular interface and that the JTAG interface is an illustrative, non-limiting example.

FIGS. 8E and 8F of FIG. 8 shows voltage inputs for the DSP 70 Processor and shows additional external memory for the DSP processor 70.

Figure 9A:
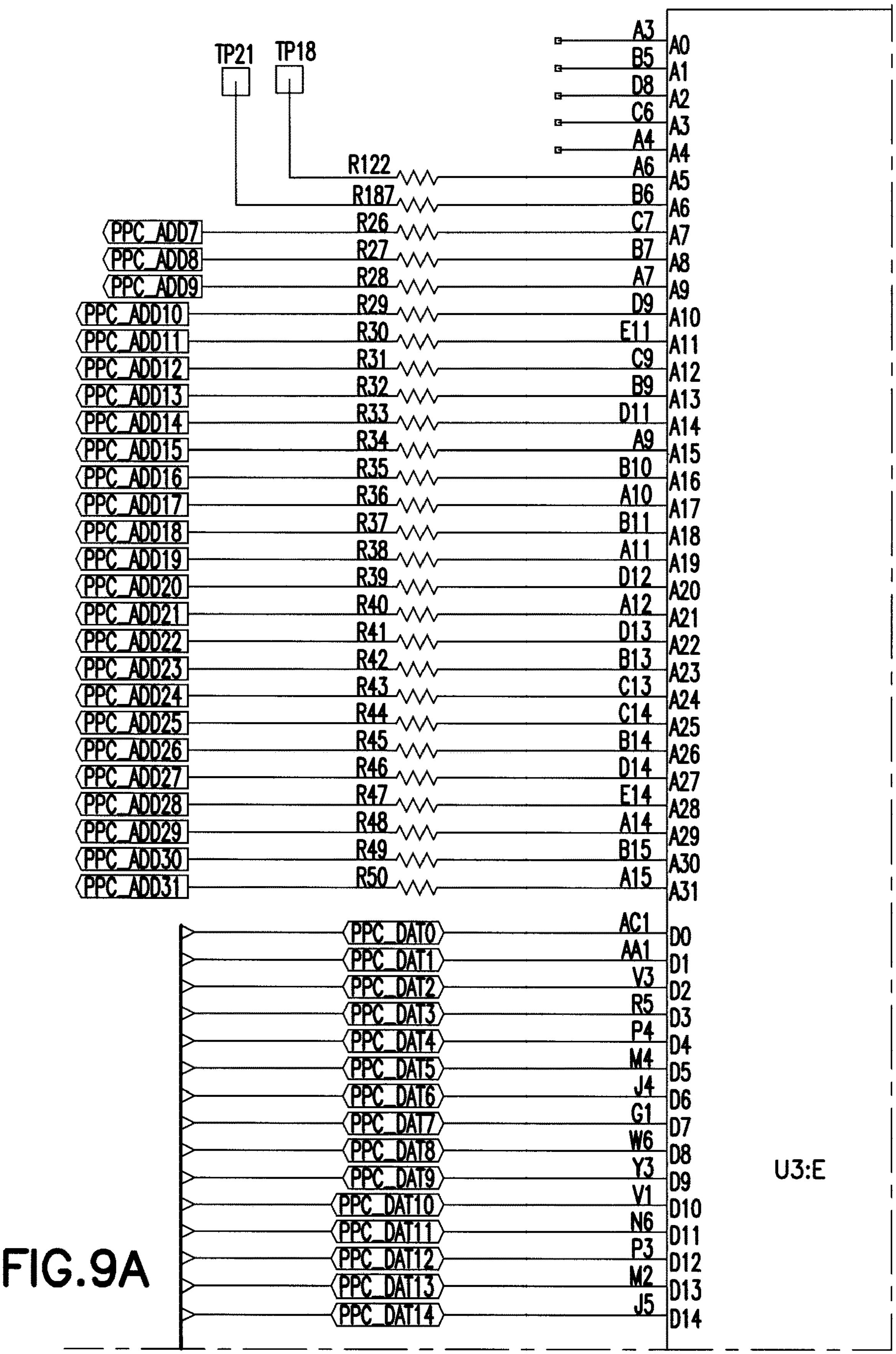
FIG. 9 illustrates how FIGS. 9A, 9B, 9C, 9D, 9E and 9F would fit together in order to form a single view of a schematic drawing of a portion of an IED of the present disclosure.
Figure 9B:
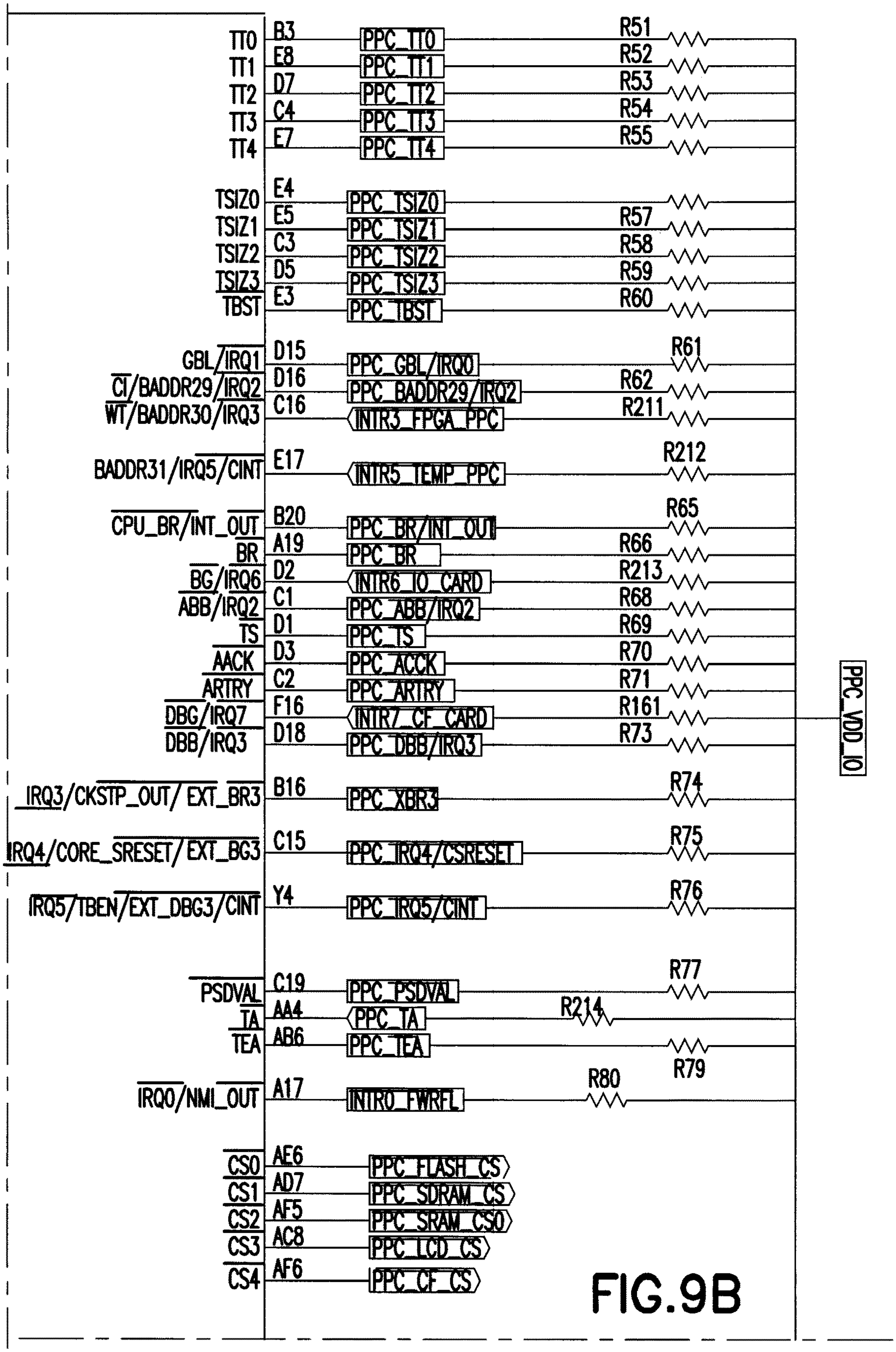
Figure 9C:
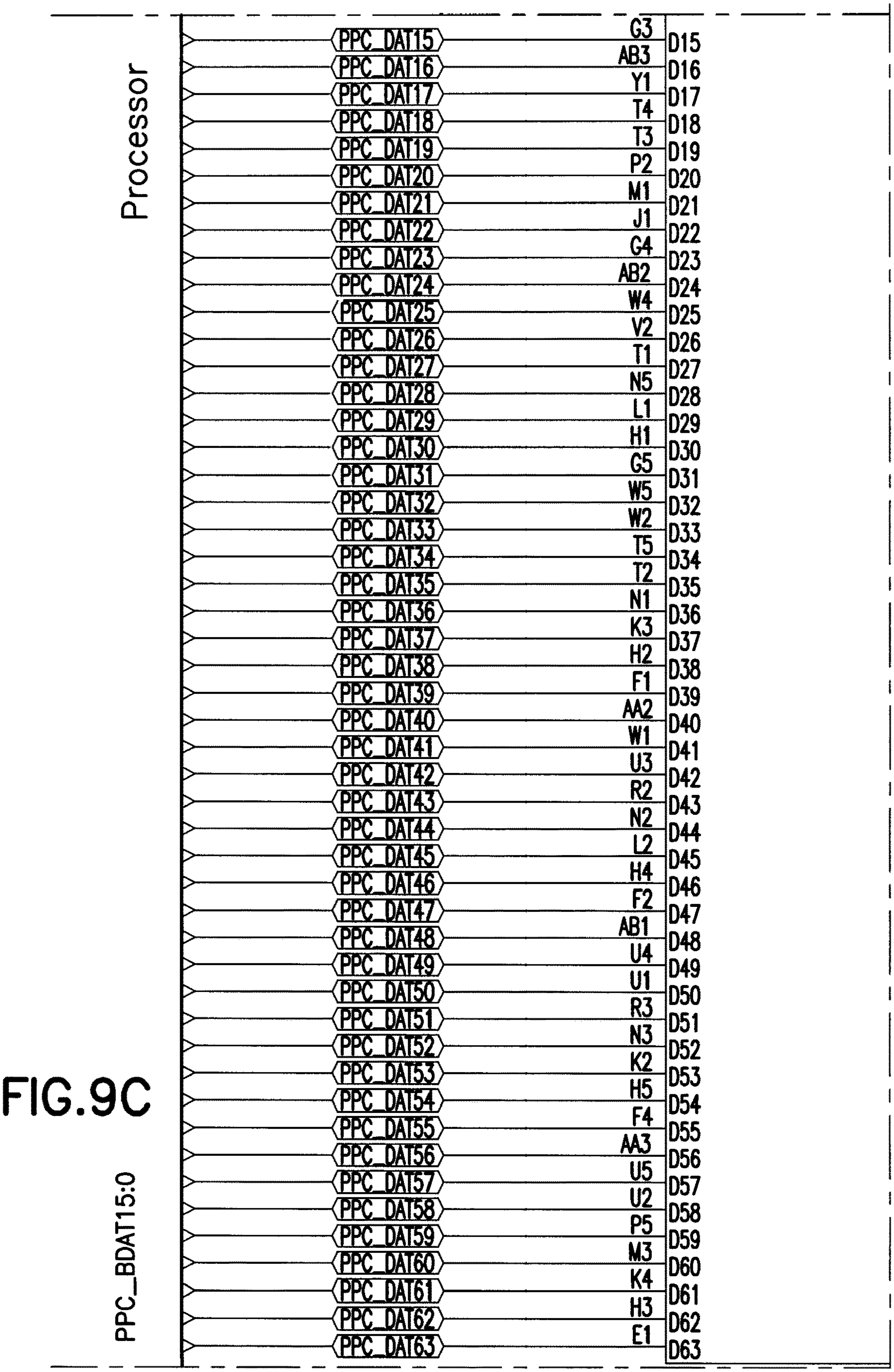
Figure 9D:
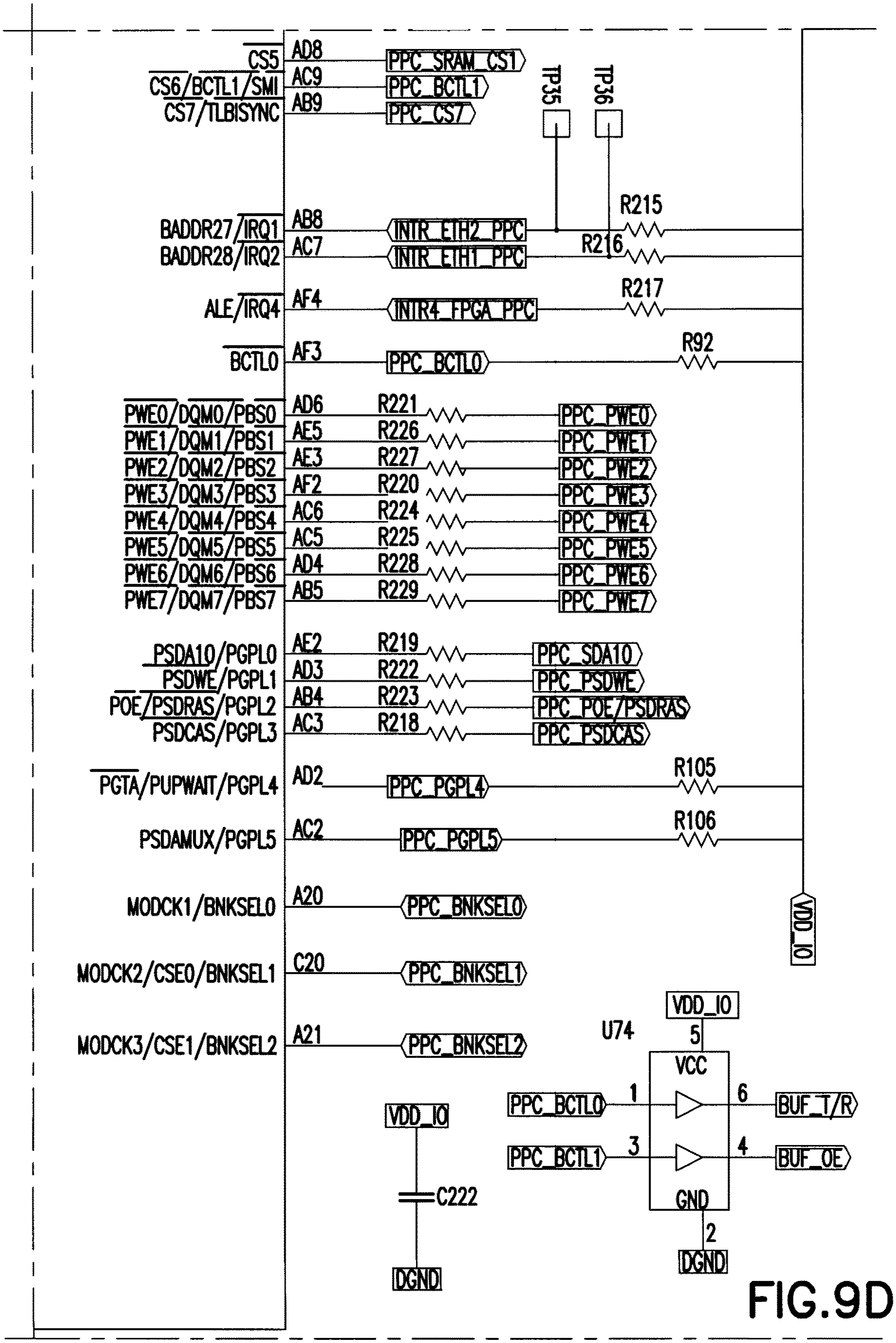
Figure 9E:
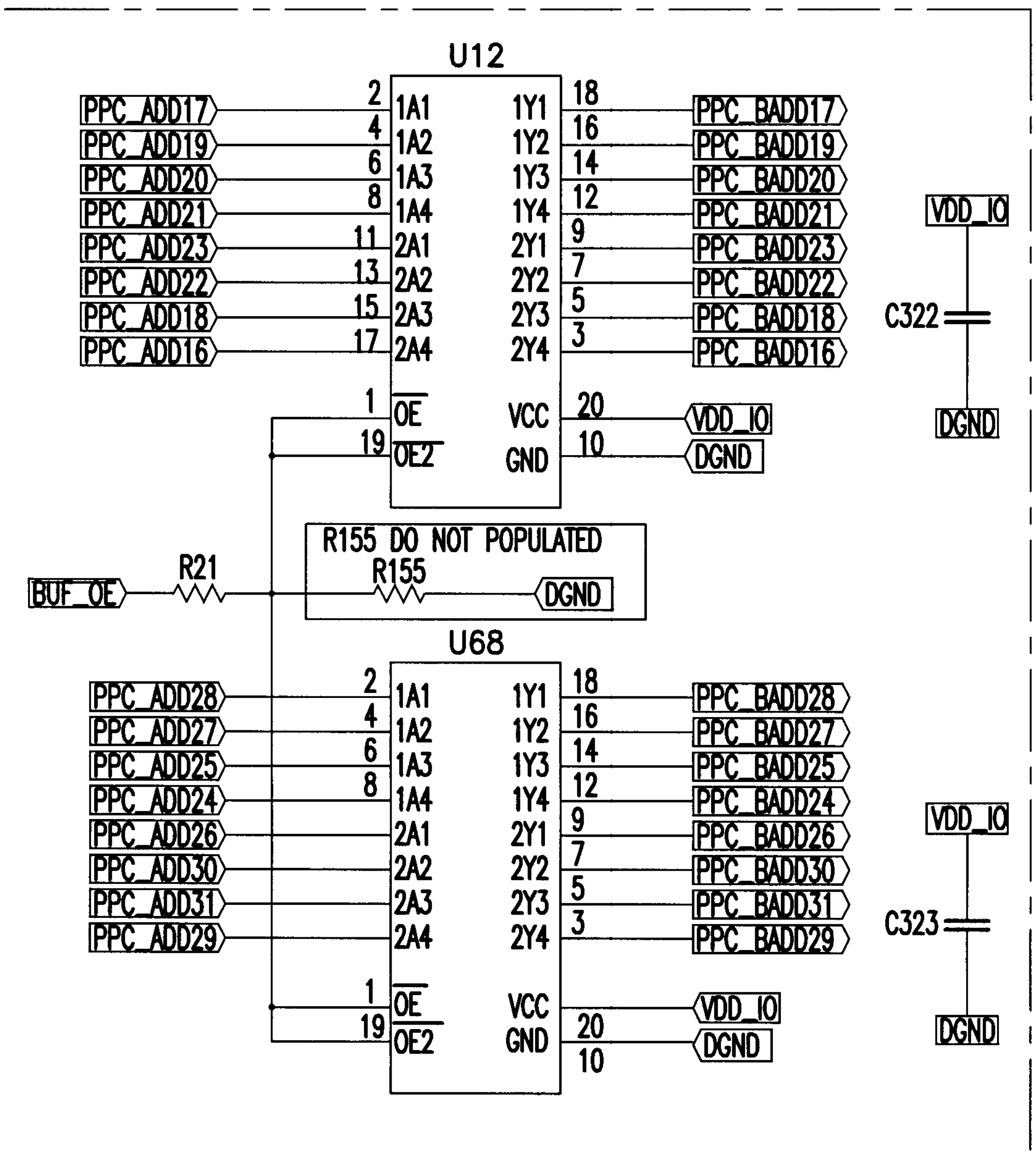
Figures 9, 9F:
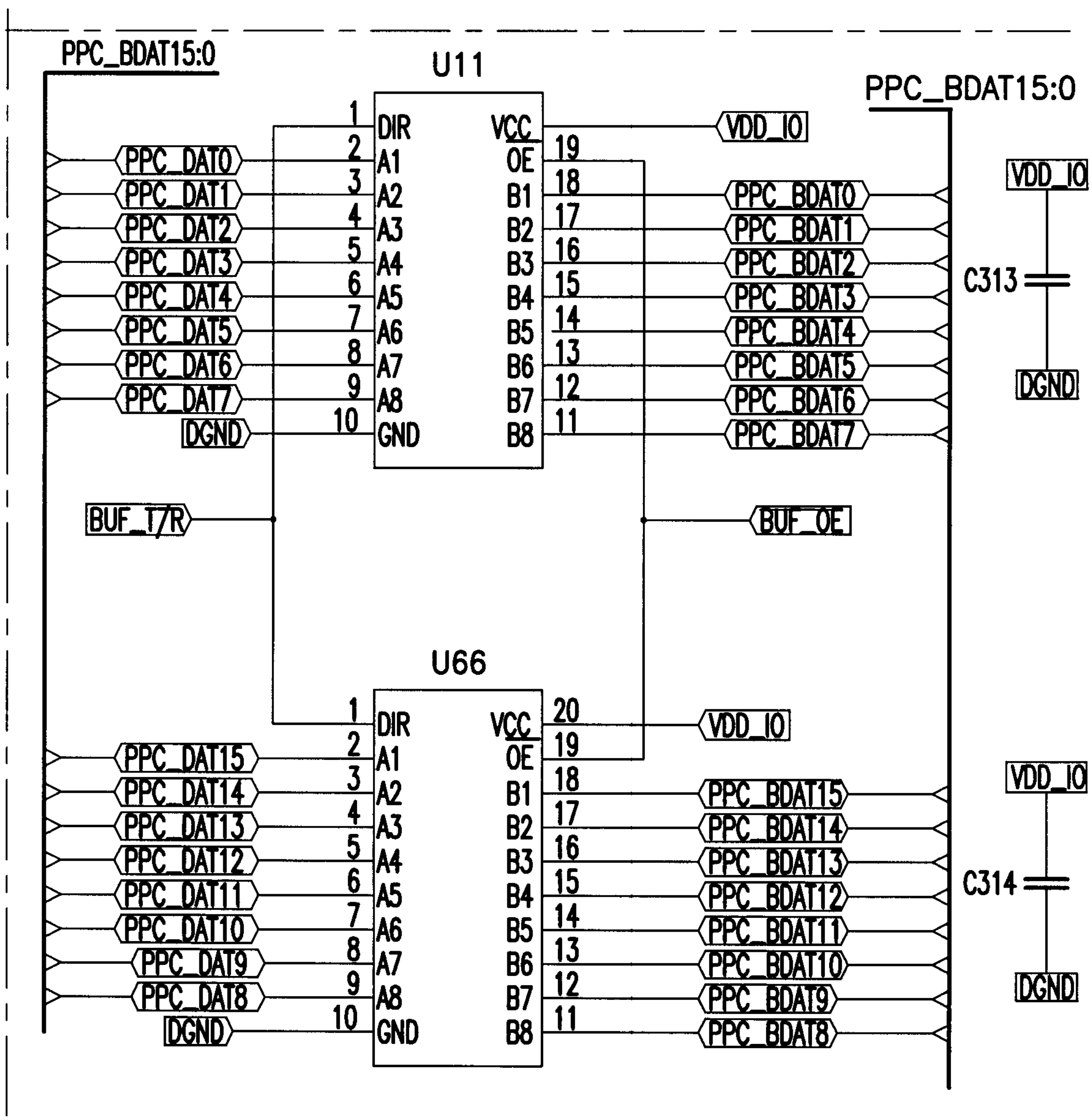

FIG. 9B of FIG. 9 shows a portion of the CPU and the bus control signal of the CPU.

FIGS. 9D and 9E of FIG. 9 shows the data bus buffer for the CPU.

FIG. 9F of FIG. 9 shows address bus buffer for the CPU.

FIG. 9A of FIG. 9 shows the address outputs of the CPU and the data bus outputs of the CPU. FIG. 9C shows the digital inputs of the CPU.

Figure 10A:
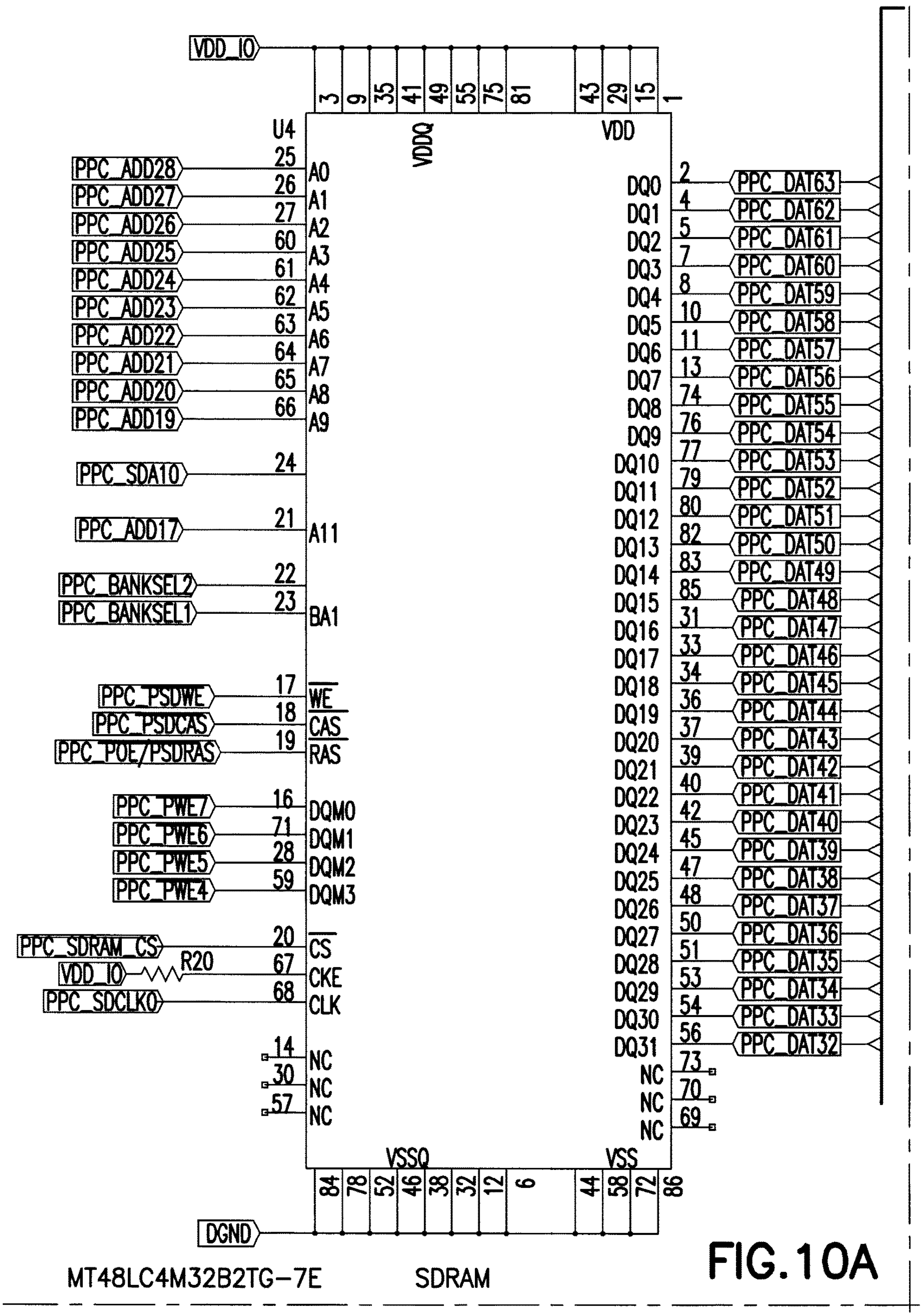
FIG. 10 illustrates how FIGS. 10A, 10B, 10C, 10D, 10E and 10F would fit together in order to form a single view of a schematic drawing of a portion of an IED of the present disclosure.
Figure 10B:
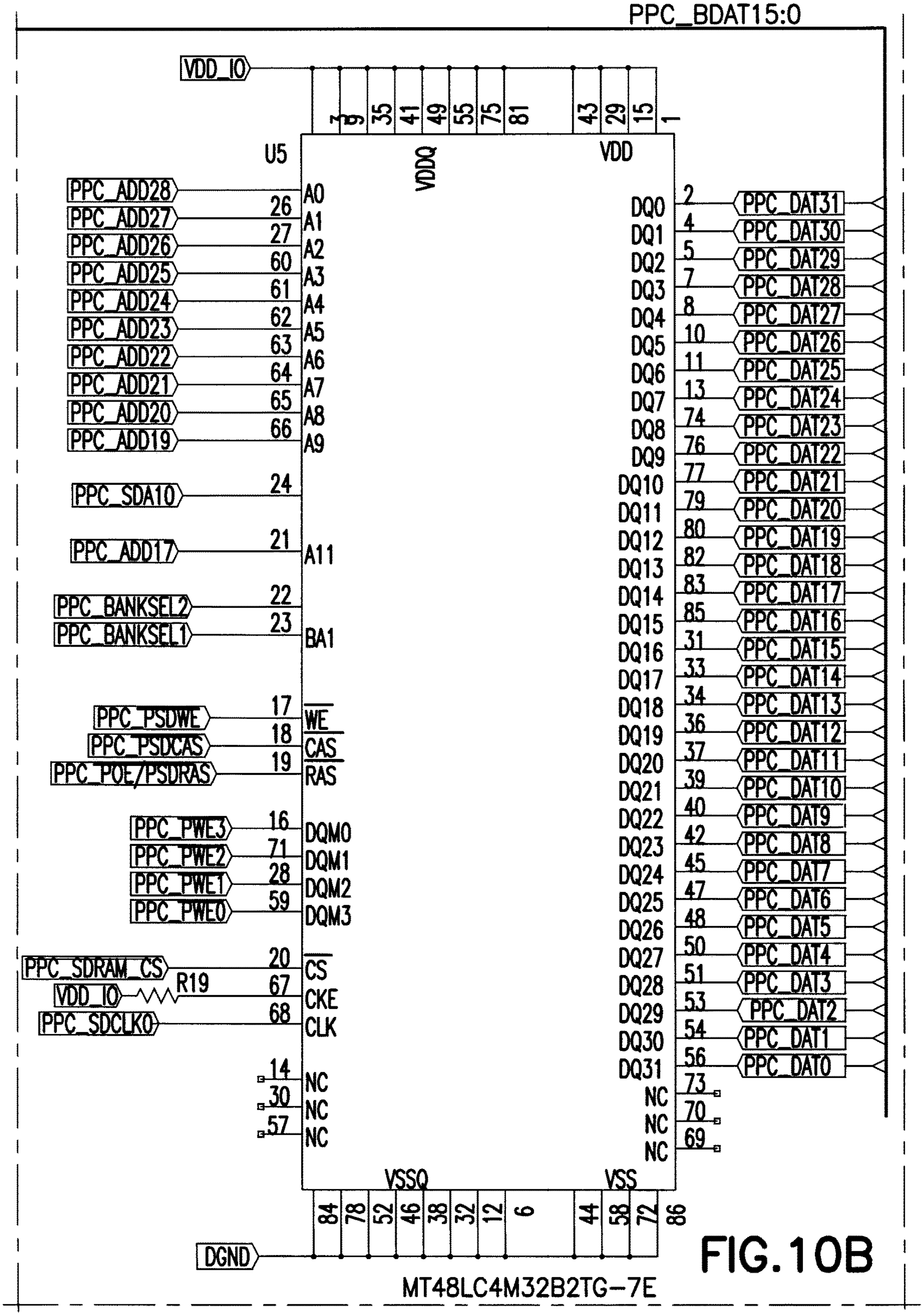
Figure 10C:
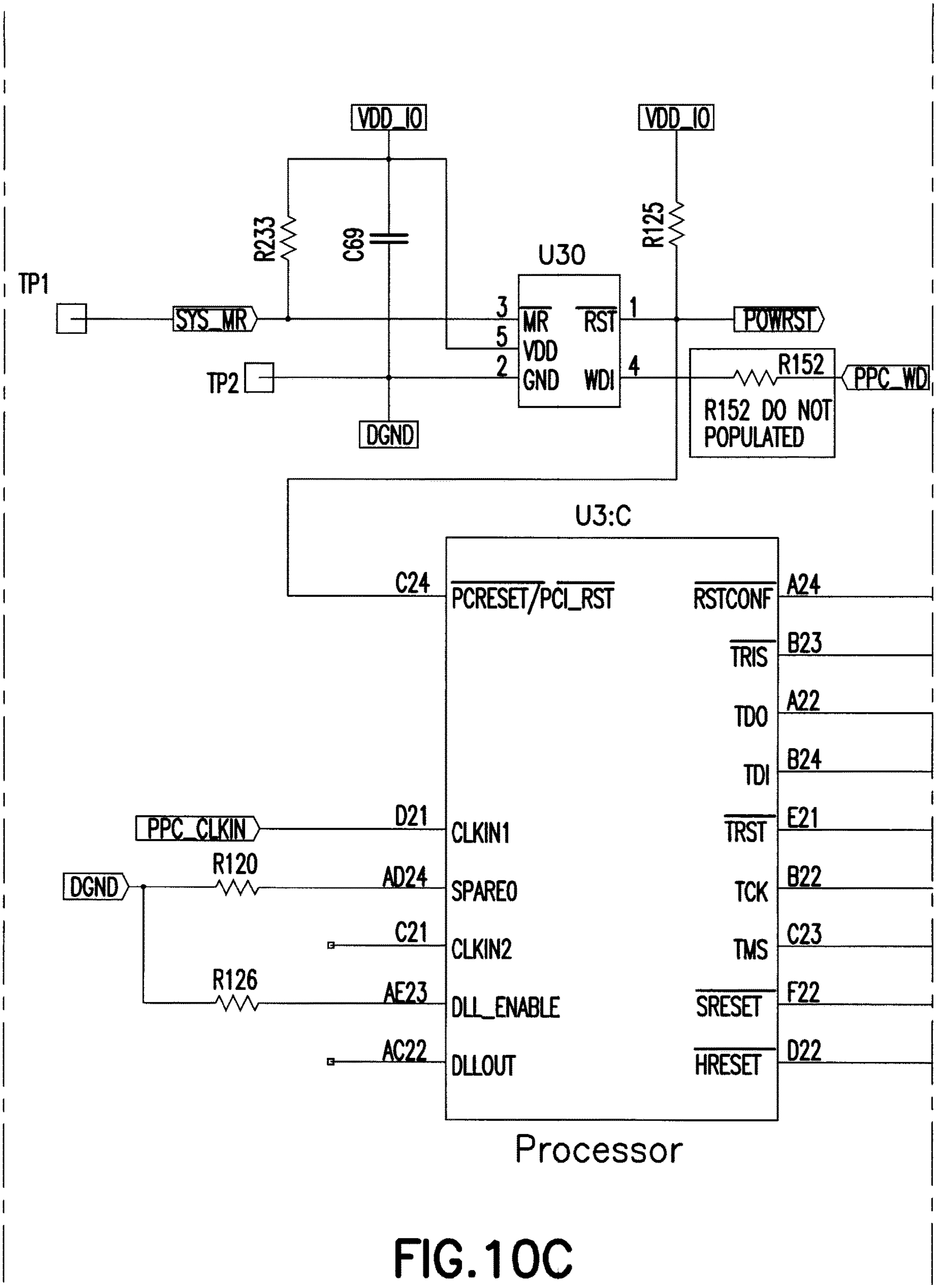
Figure 10D:
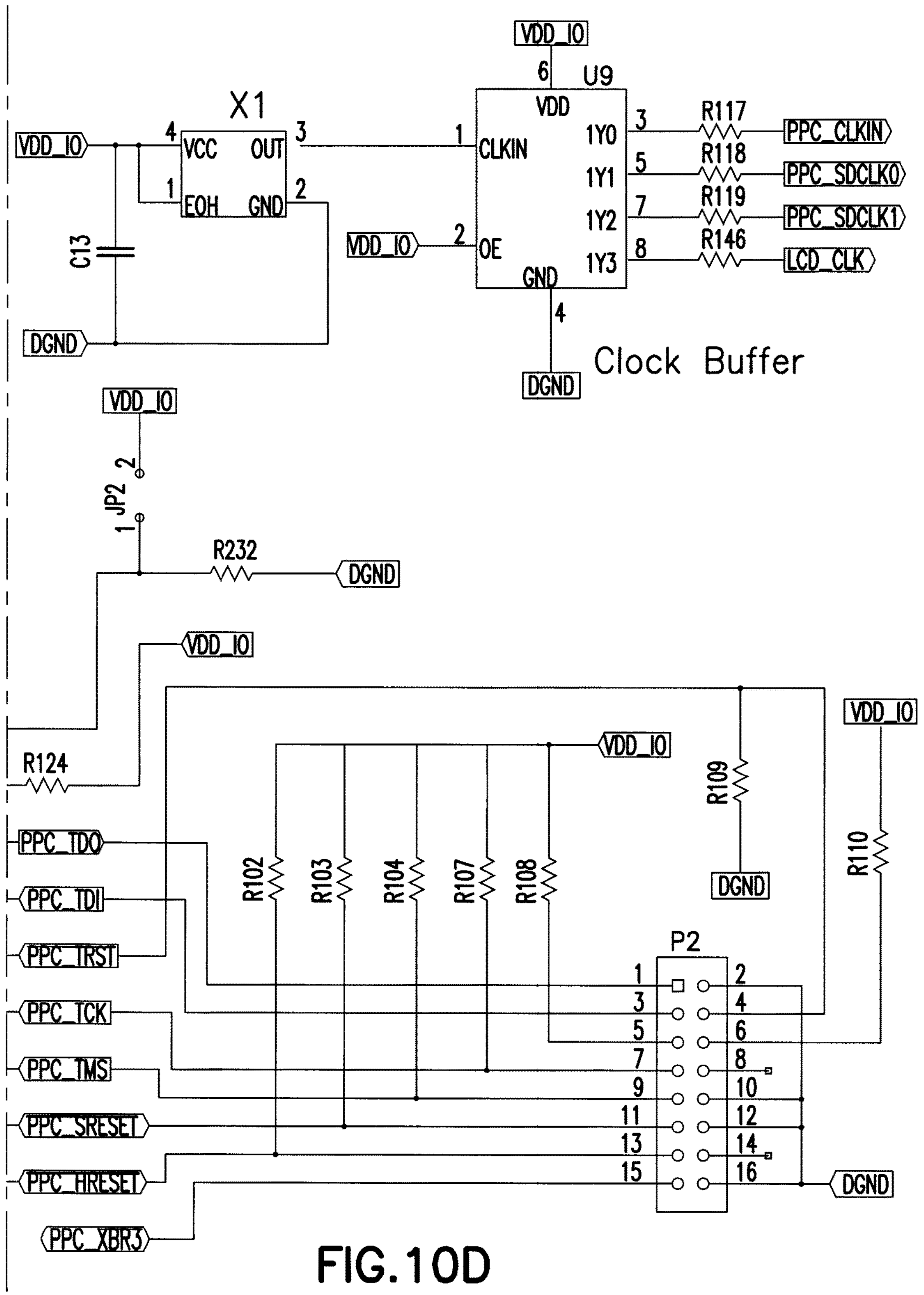
Figure 10E:
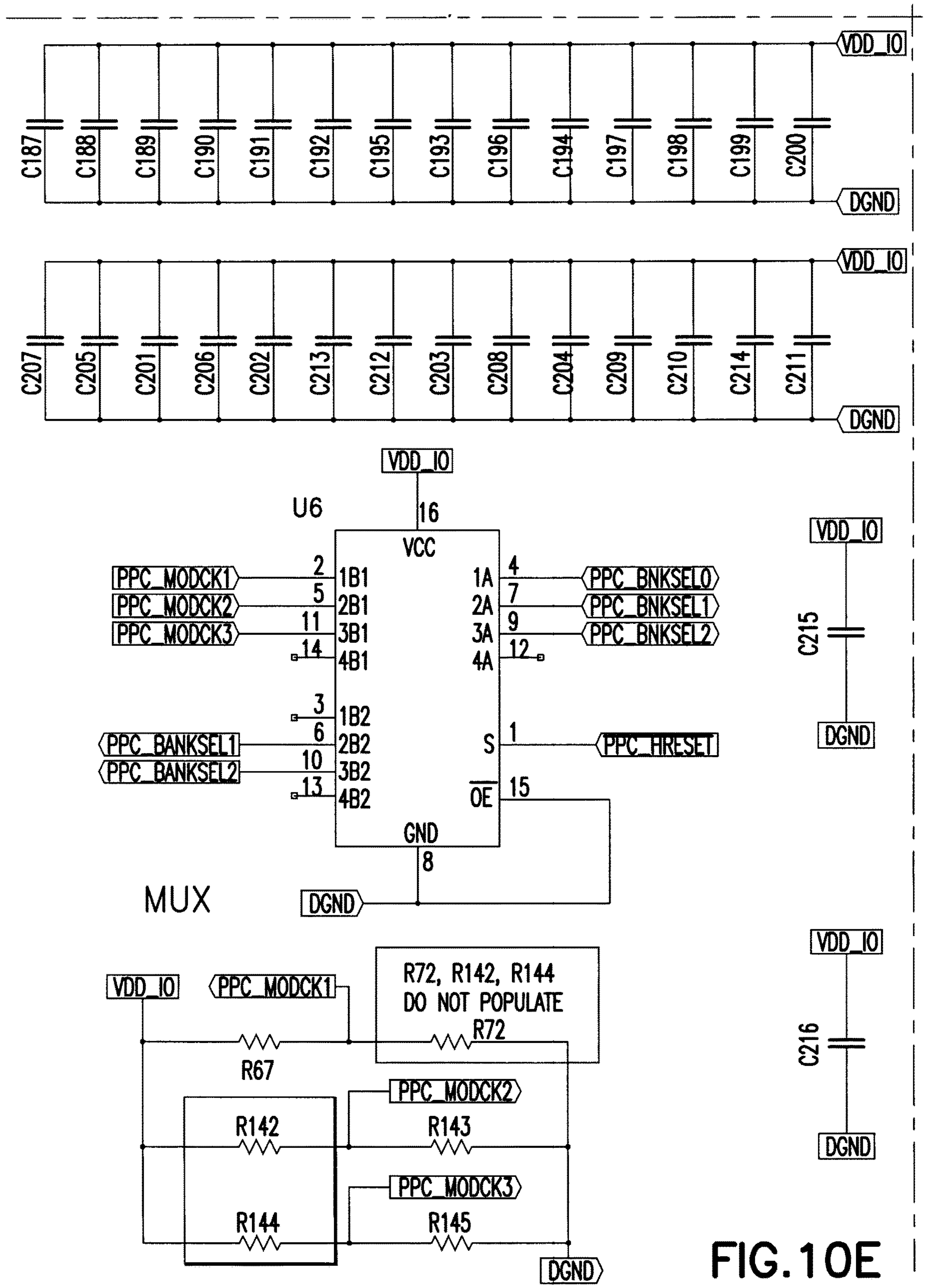
Figures 10, 10F:
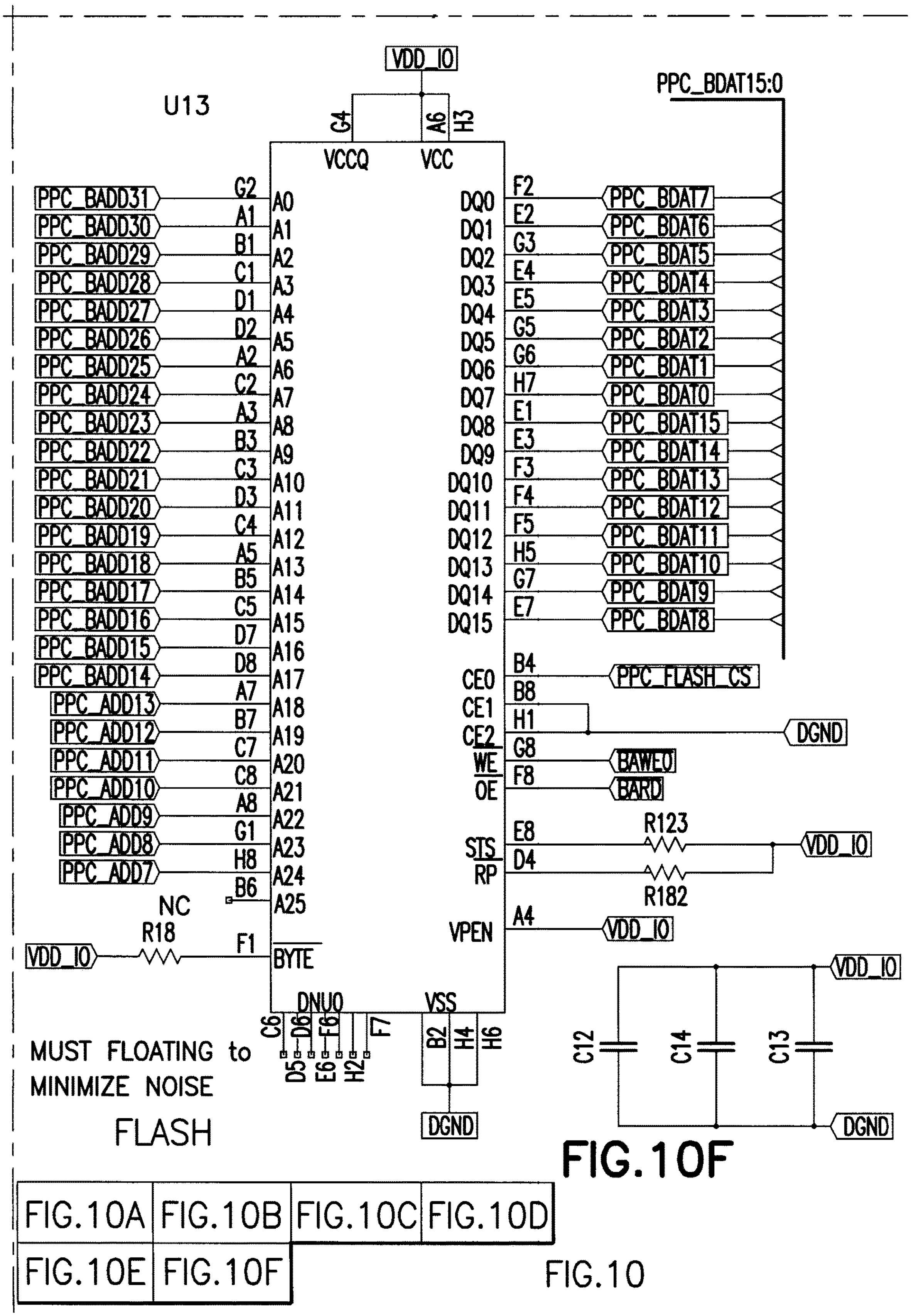

FIG. 10A of FIG. 10 shows the RAM memory of the CPU.

FIGS. 10B and 10C of FIG. 10 shows the JTAG interface to the CPU and shows power on reset controller.

FIGS. 10E and 10F of FIG. 10 together show the programmable flash memory for the CPU.

FIG. 10D of FIG. 10 shows the CPU clock buffers, mode select logic for the CPU and the clock oscillator for the CPU.

Figure 11A:
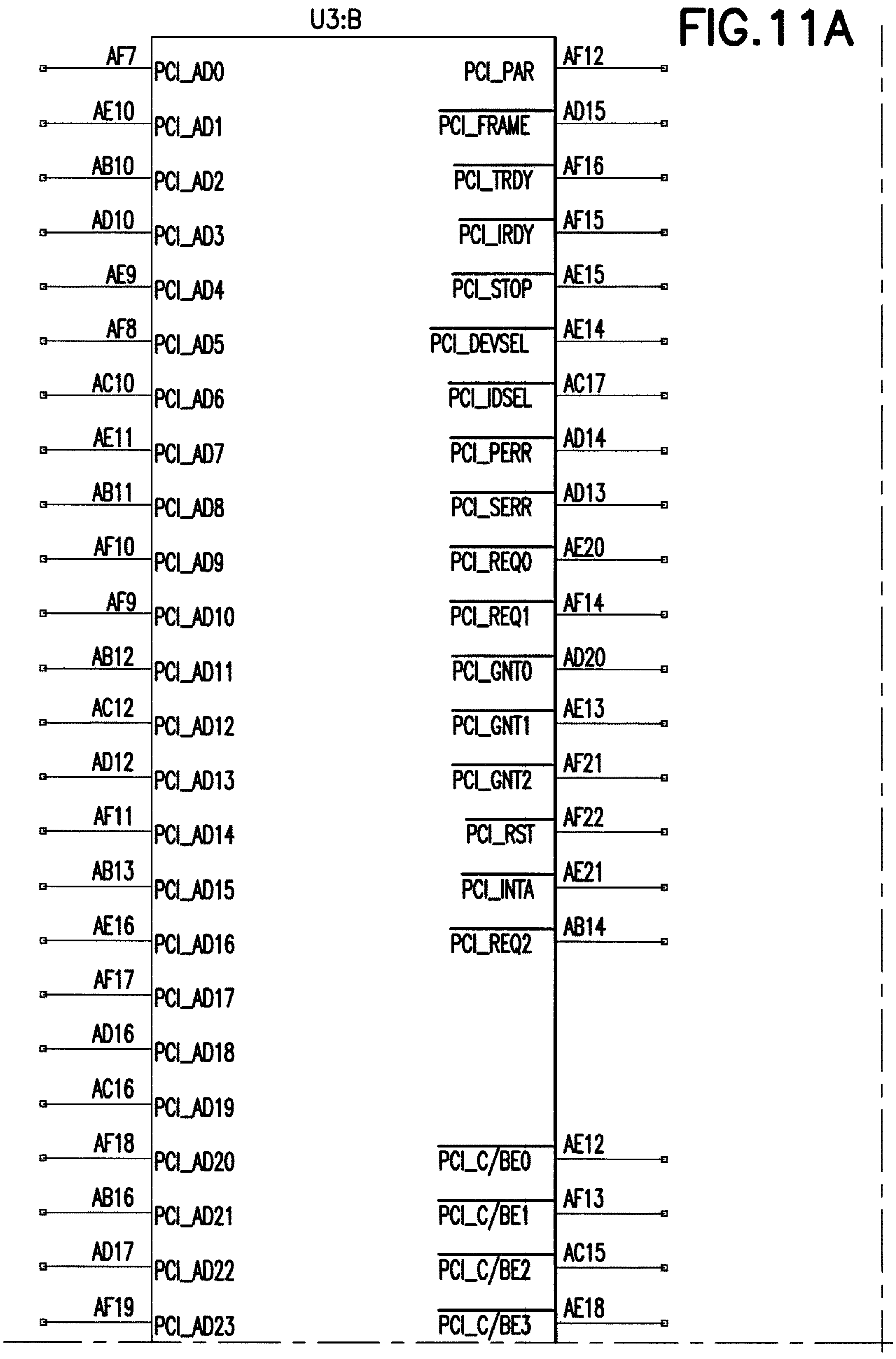
FIG. 11 illustrates how FIGS. 11A, 11B, 11C, 11D, 11E, 11F and 11G would fit together in order to form a single view of a schematic drawing of a portion of an IED of the present disclosure.
Figure 11B:
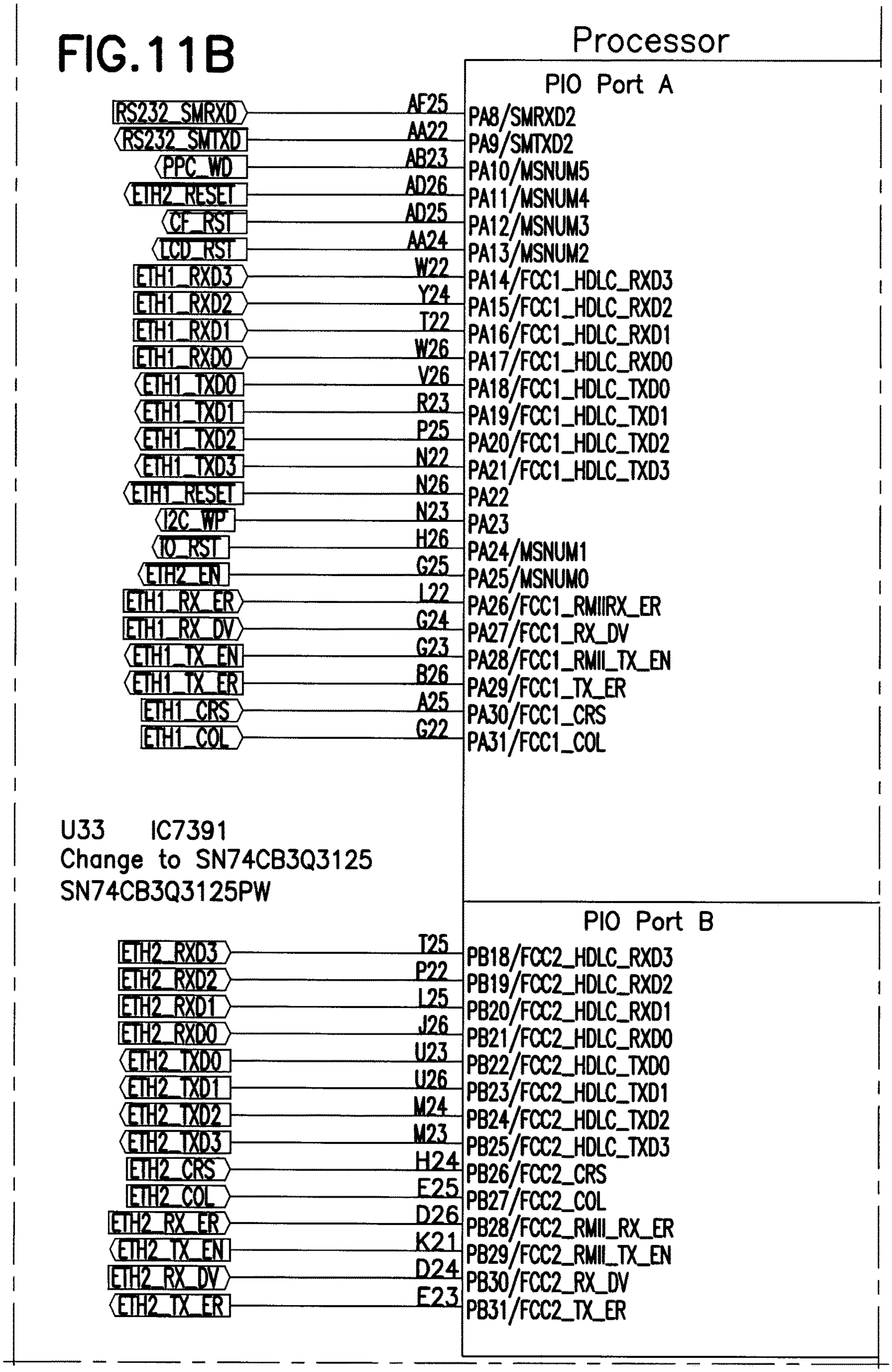
Figure 11D:
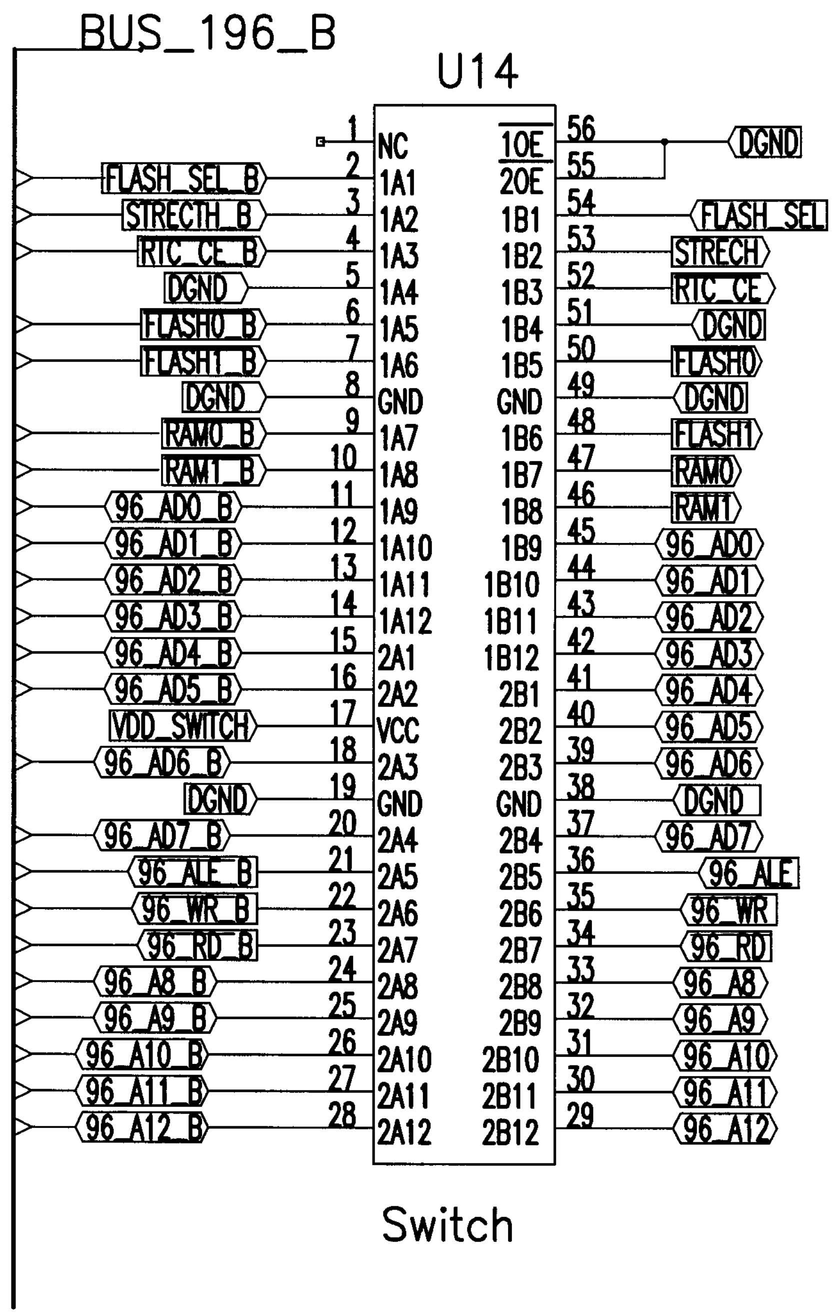
Figure 11E:
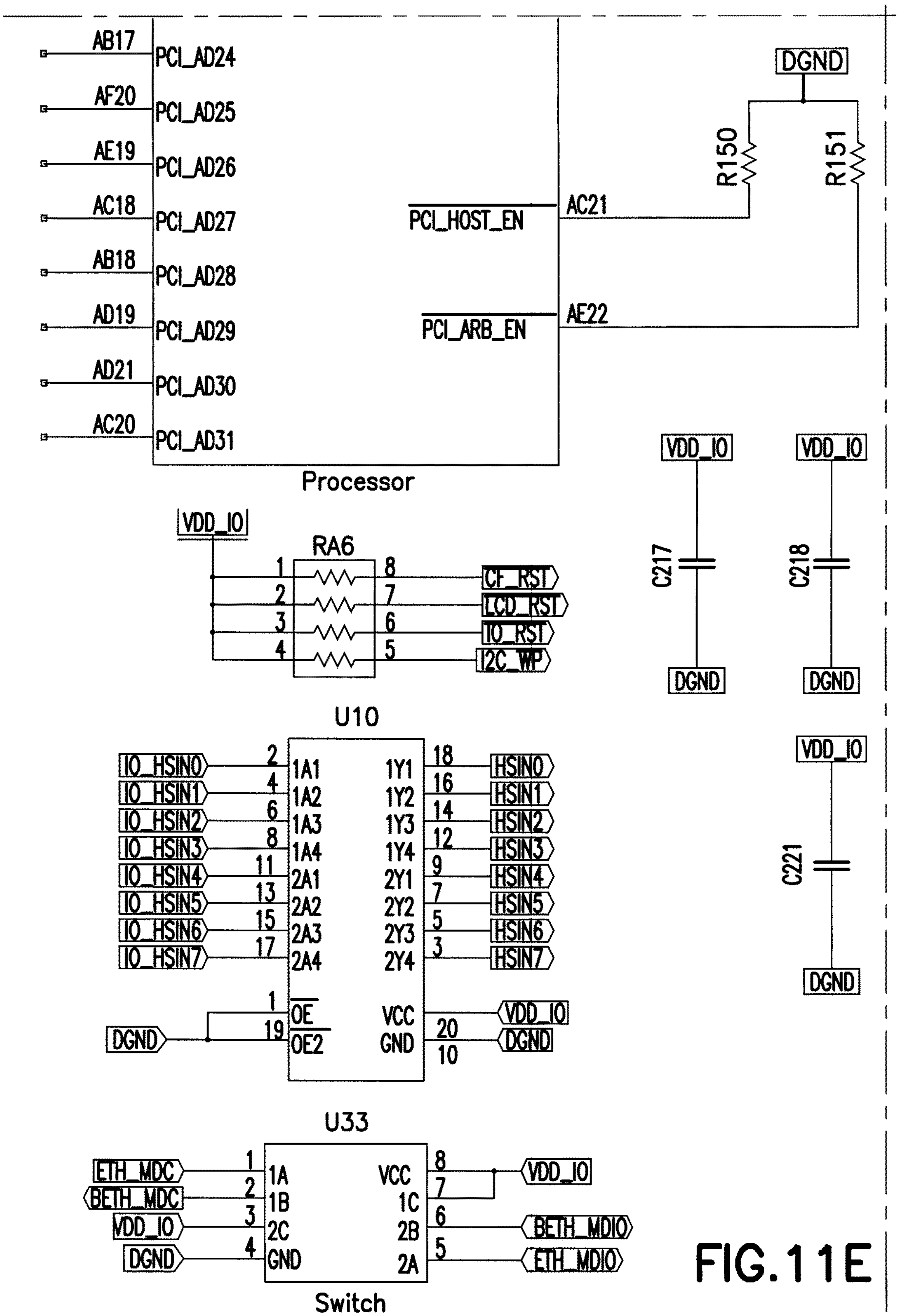
Figure 11F:
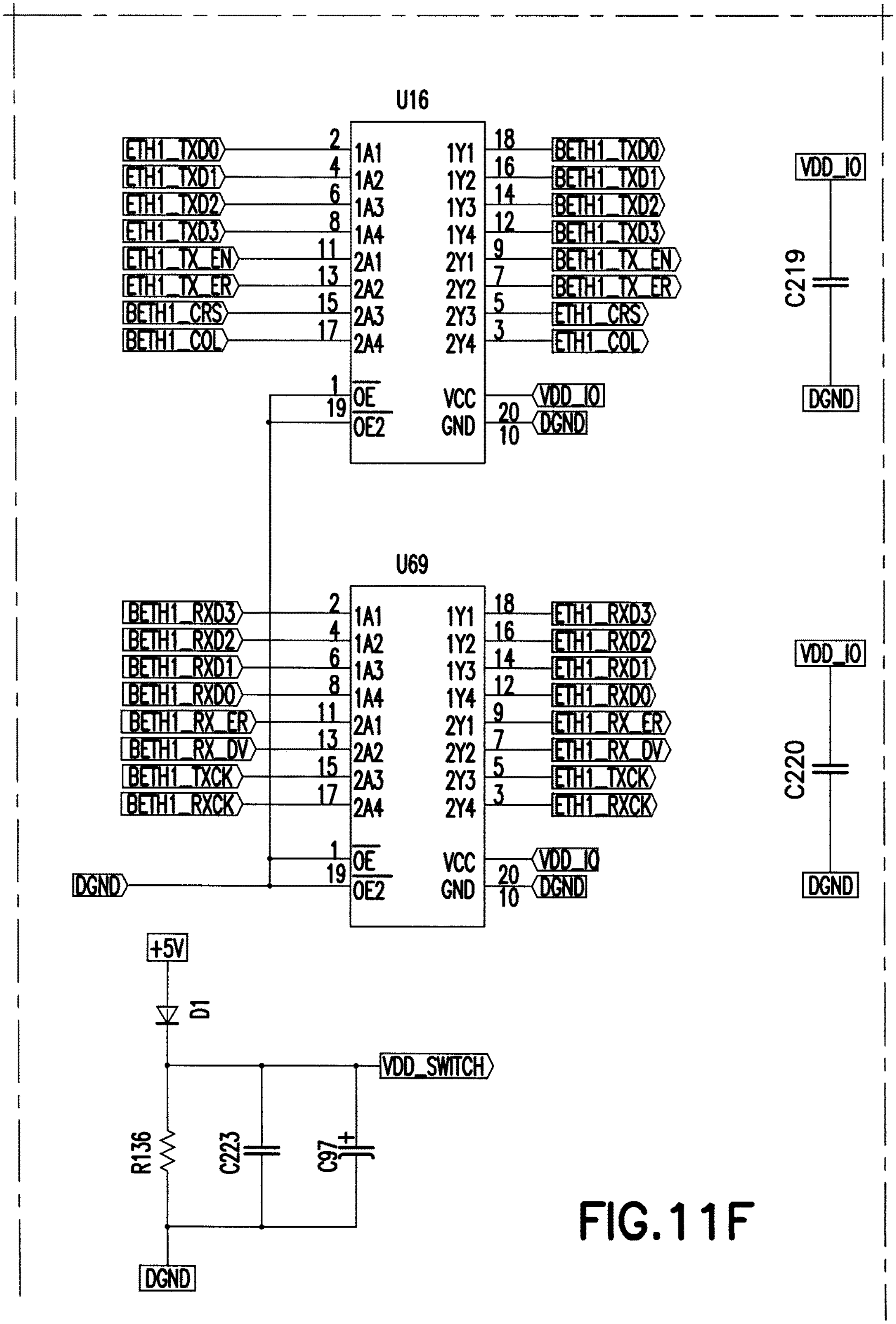
Figures 11, 11G:
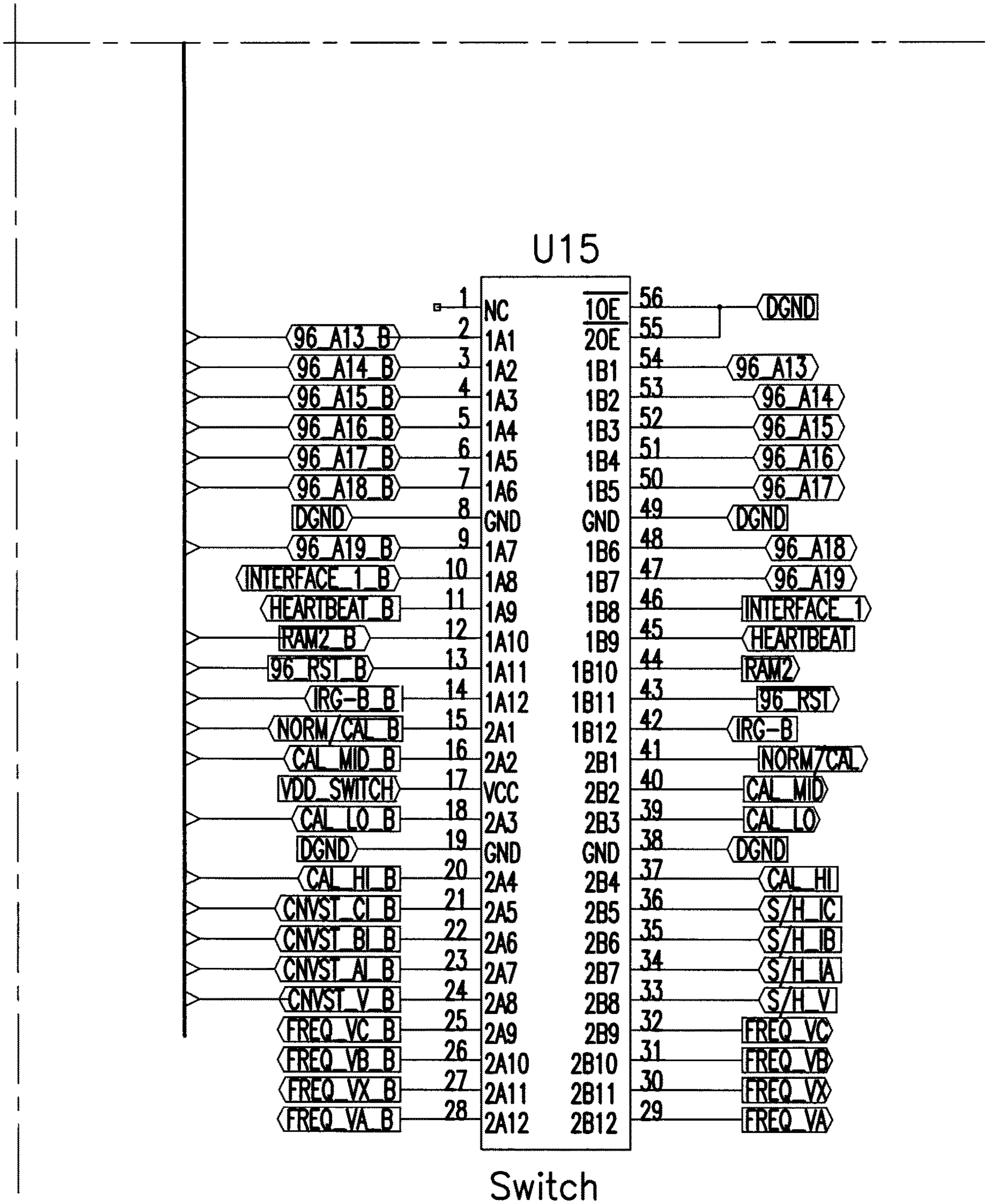

FIGS. 11A and 11B of FIG. 11 shows the CPU Bus control logic and CPU I/O ports.

FIGS. 11C and 11D of FIG. 11 shows additional CPU I/O ports and shows interface logic between the CPU and the DSP Processor 60 (or whichever processor the firmware for the DSP Processor 60 resides).

FIG. 11G of FIG. 11 shows the Ethernet buffer between the CPU and the I/O cards and additional logic interface signal between the CPU and the DSP Processor 60 (or whichever processor the firmware for the DSP Processor 60 resides).

FIGS. 11E and 11F of FIG. 11 shows additional CPU Bus control logic signals and CPU Ethernet control signals and Ethernet buffers between the CPU and the I/O Board and the Digital input signals to the CPU.

Figure 12A:
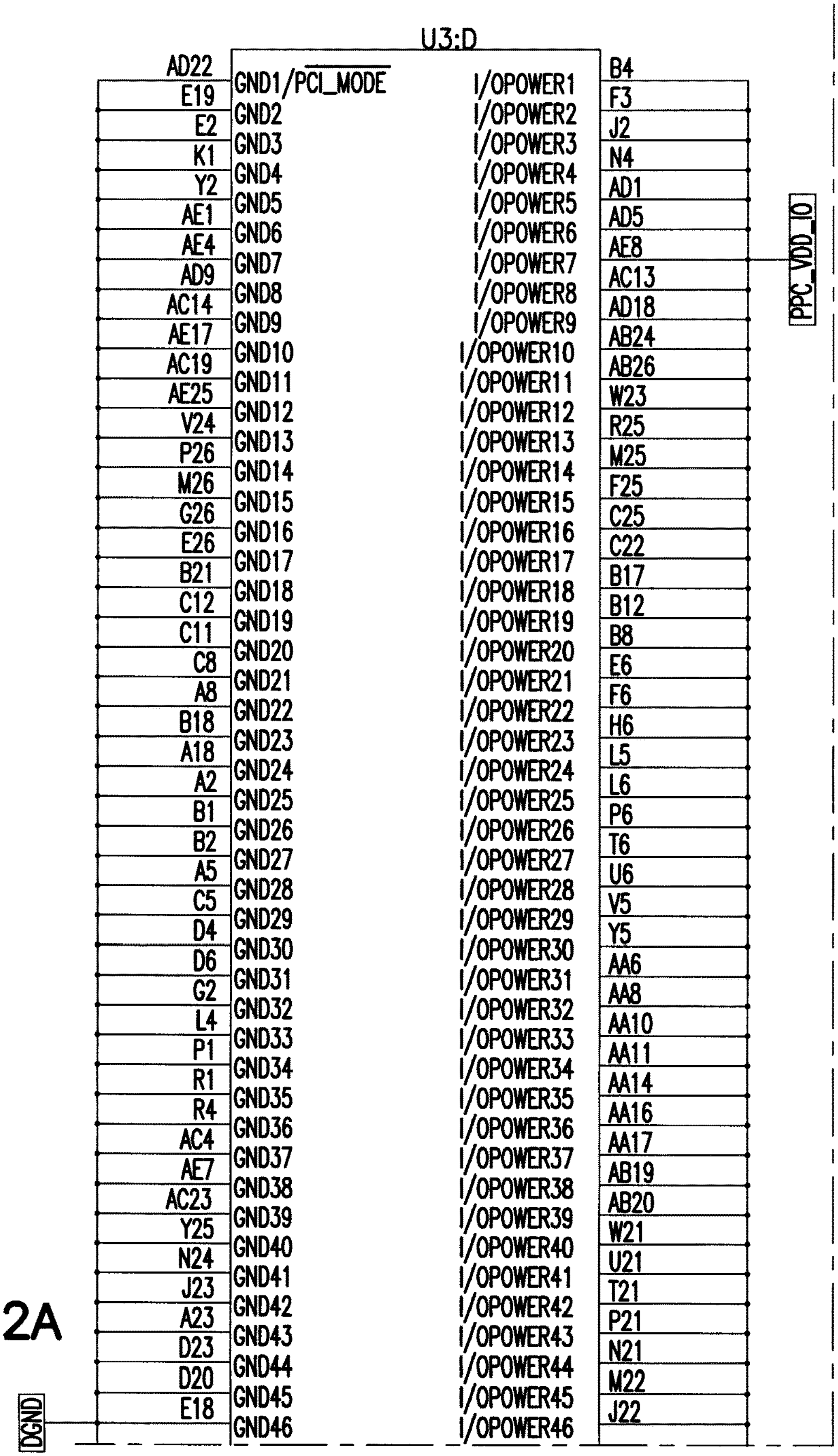
FIG. 12 illustrates how FIGS. 12A, 12B, 12C, 12D, 12E and 12F would fit together in order to form a single view of a schematic drawing of a portion of an IED of the present disclosure.
Figure 12B:
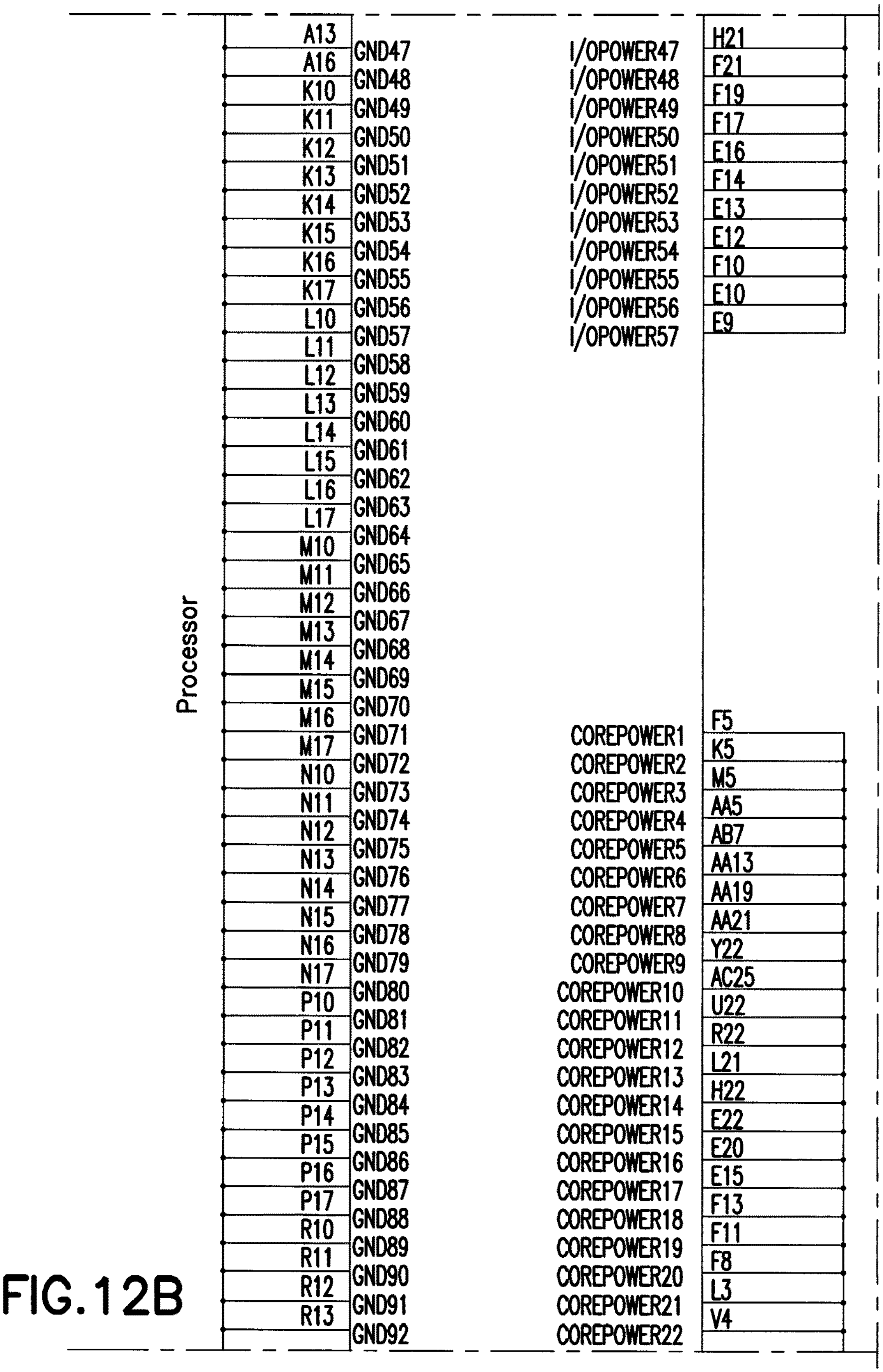
Figure 12C:
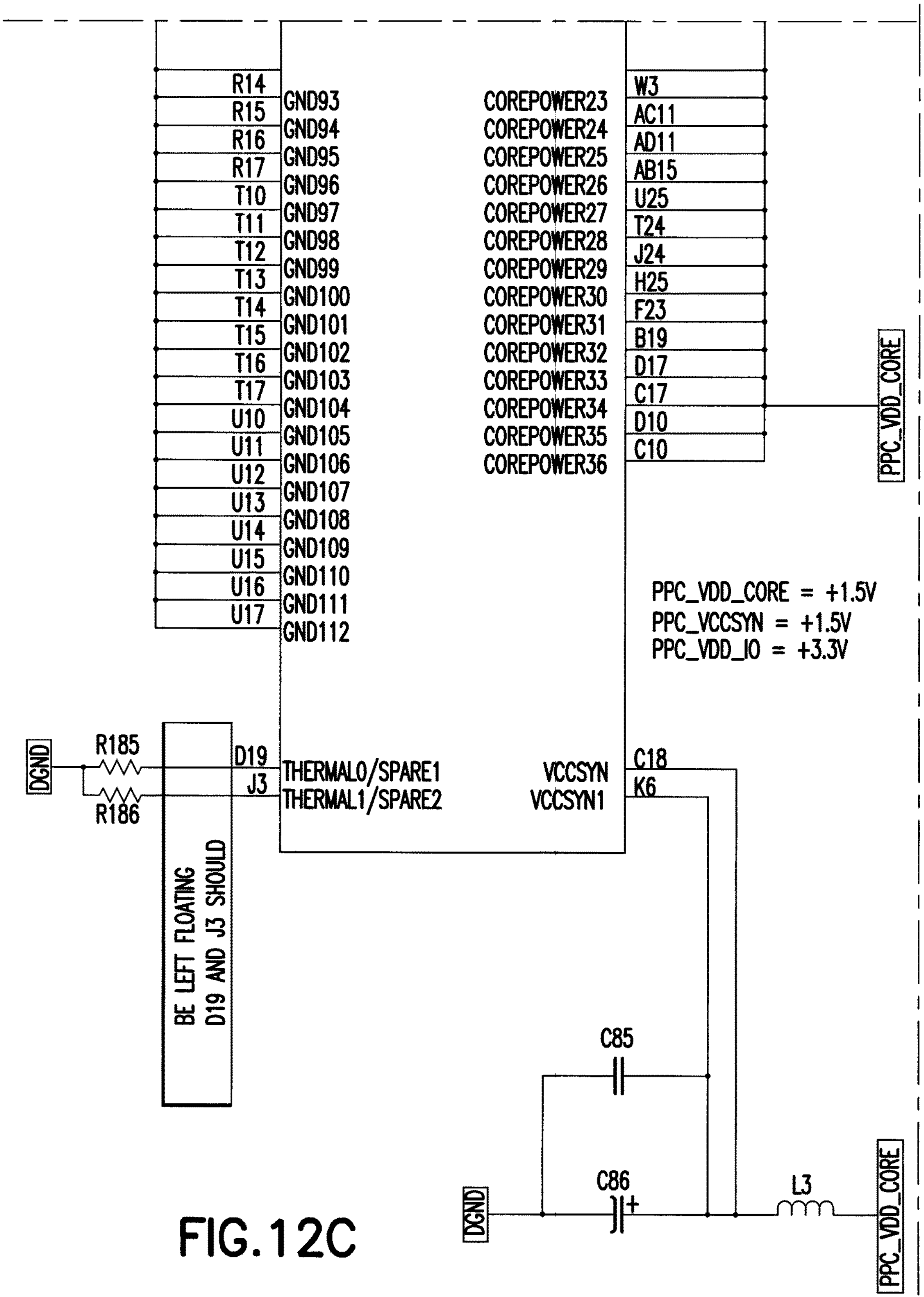
Figure 12D:
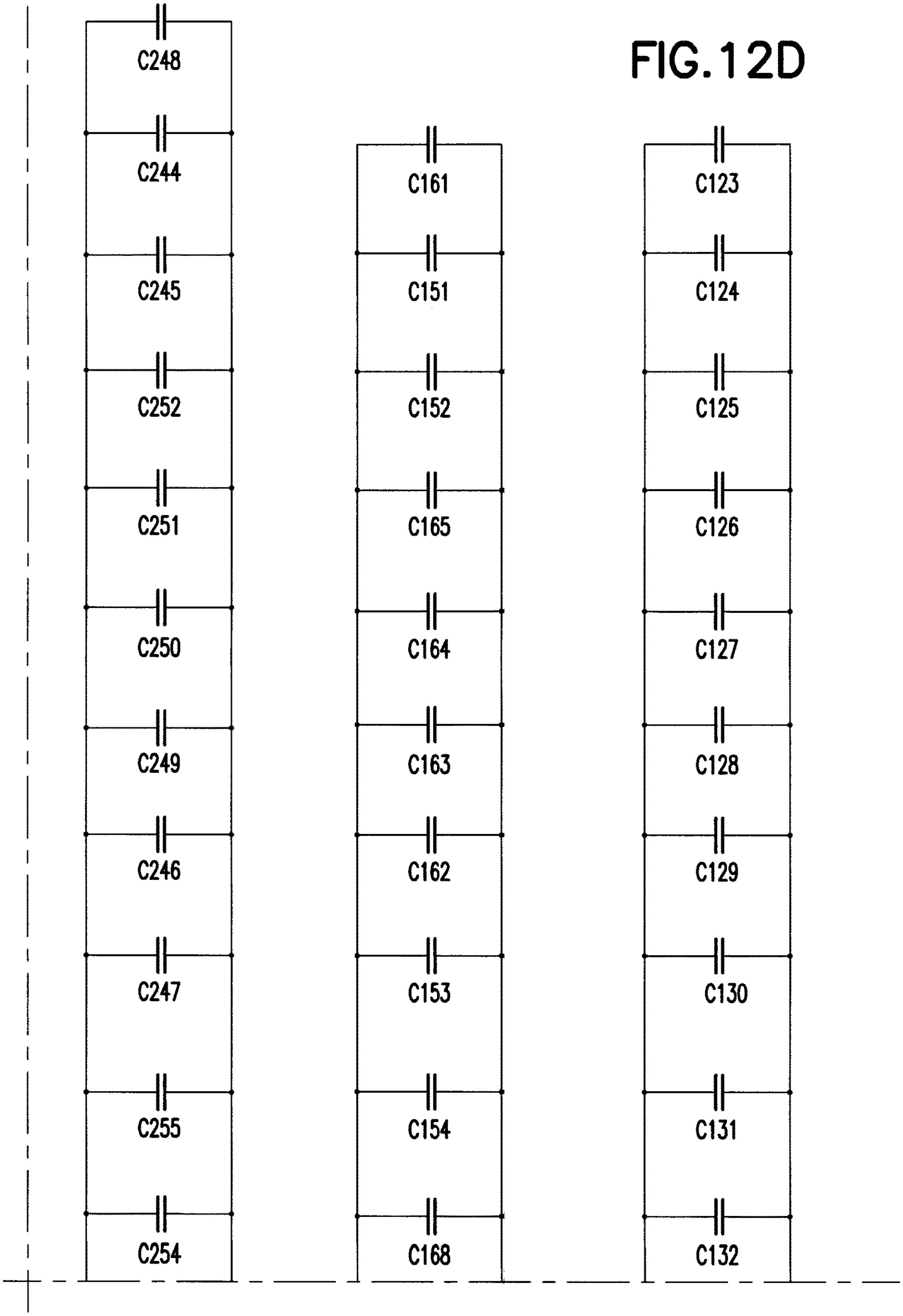
Figure 12E:
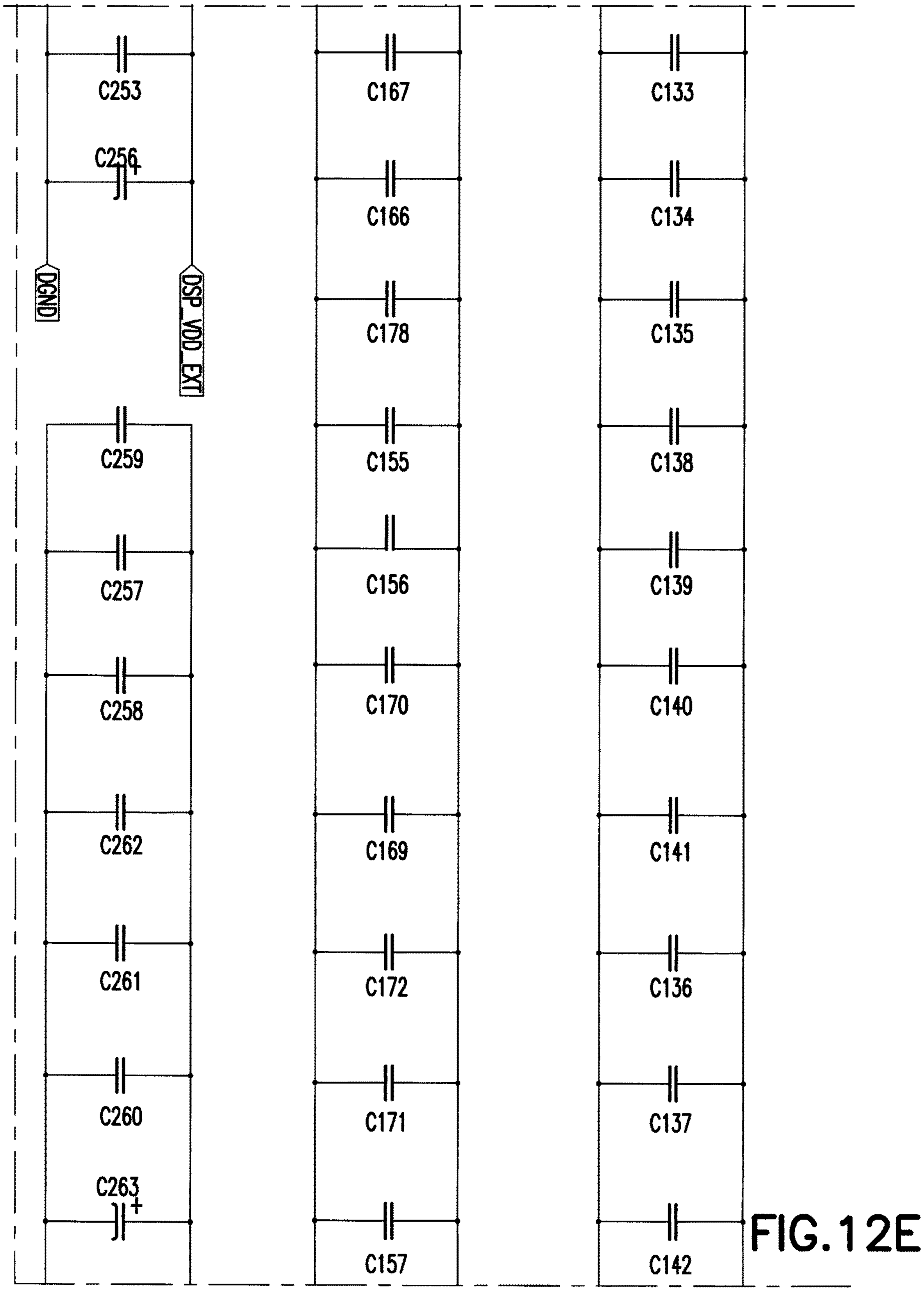
Figures 12, 12F:
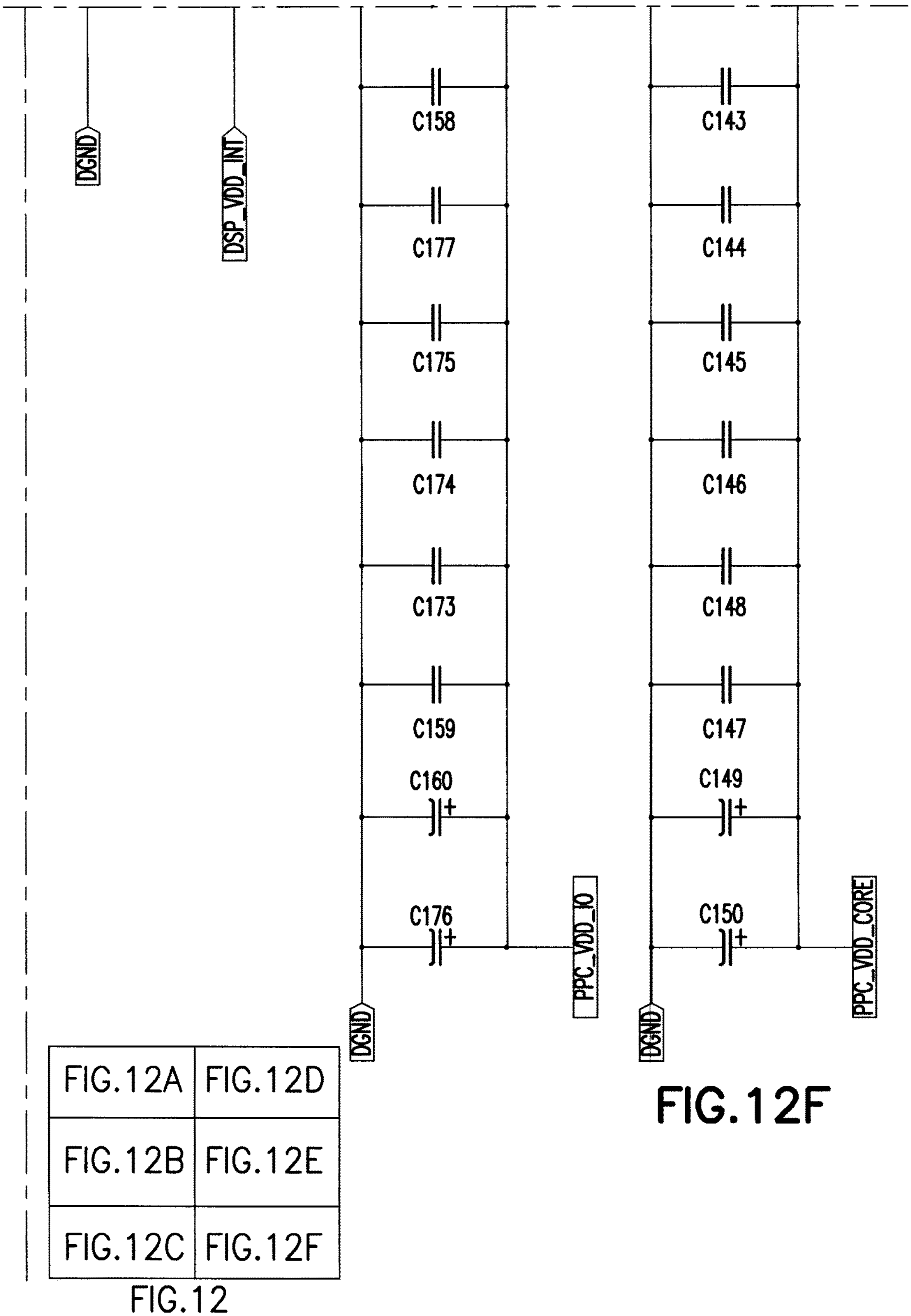

FIG. 12A of FIG. 12 shows power and ground to the CPU.

FIGS. 12B and 12C of FIG. 12 shows power and ground to the CPU.

FIGS. 12E and 12F of FIG. 12 shows voltage decoupling circuit for CPU and for the DSP Processor 70.

FIG. 12D of FIG. 12 shows more voltage decoupling circuitry for CPU and the DSP Processor 70.

Figure 13A:
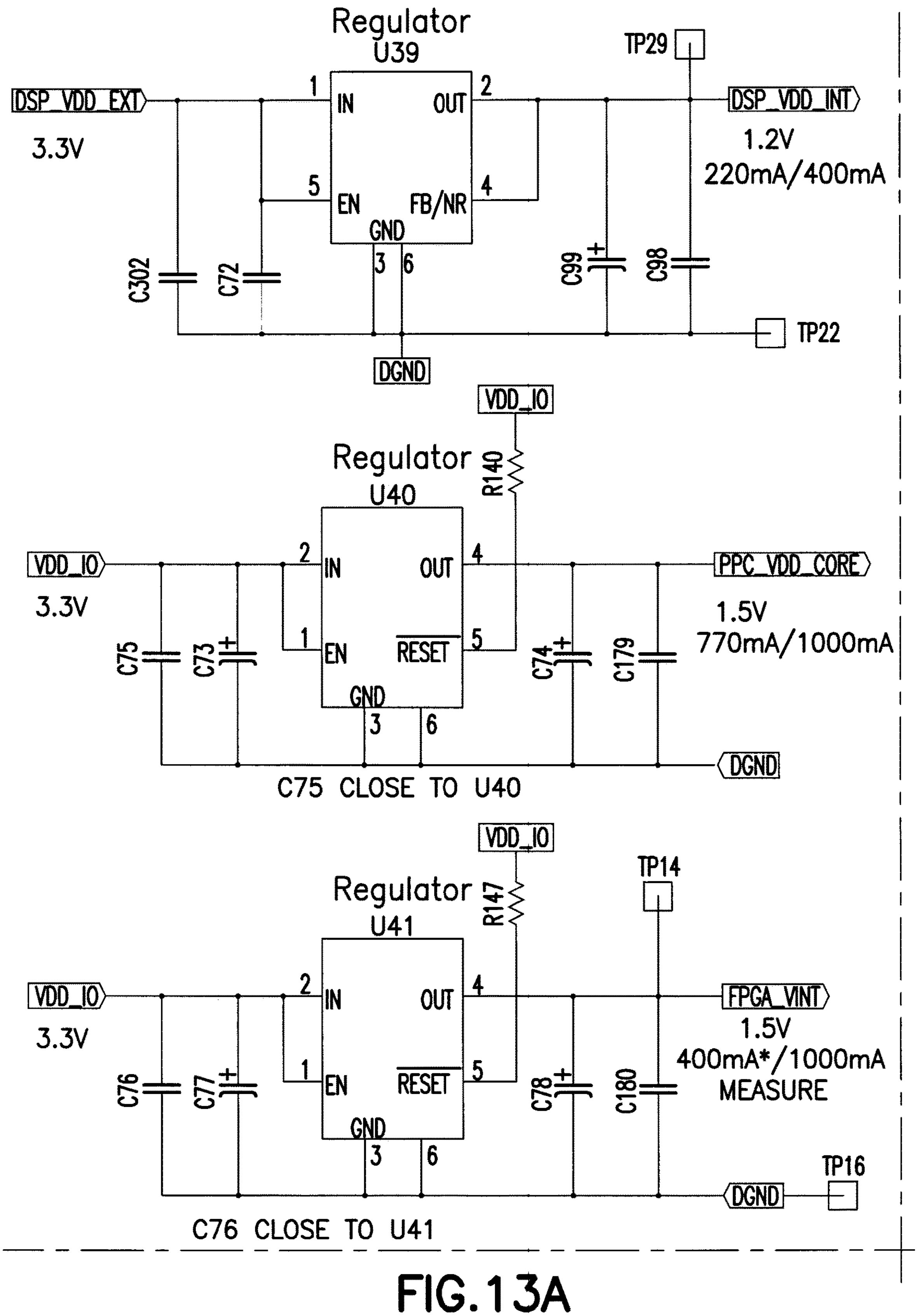
FIG. 13 illustrates how FIGS. 13A, 13B, 13C, 13D, 13E and 13F would fit together in order to form a single view of a schematic drawing of a portion of an IED of the present disclosure.
Figure 13B:
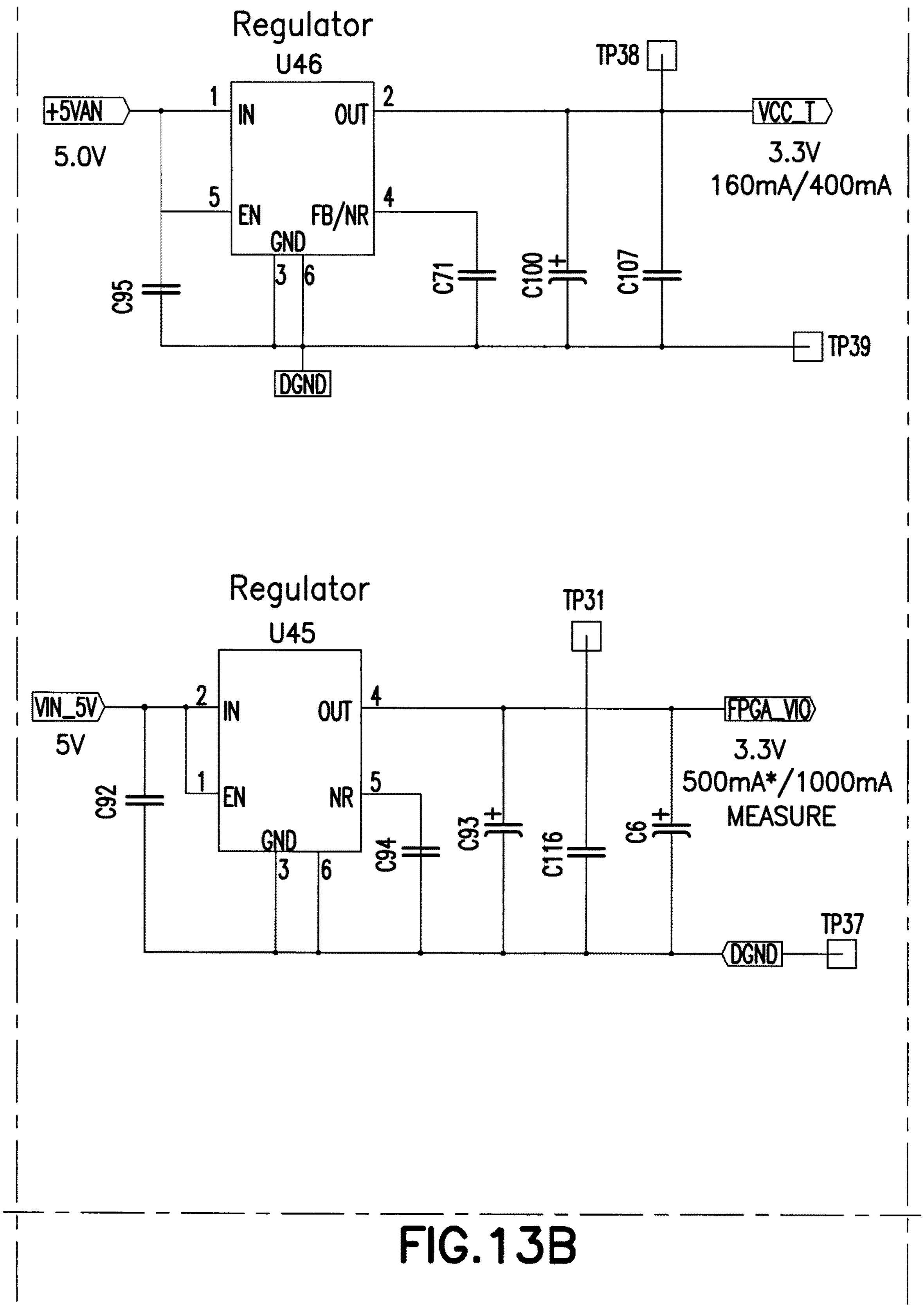
Figure 13C:
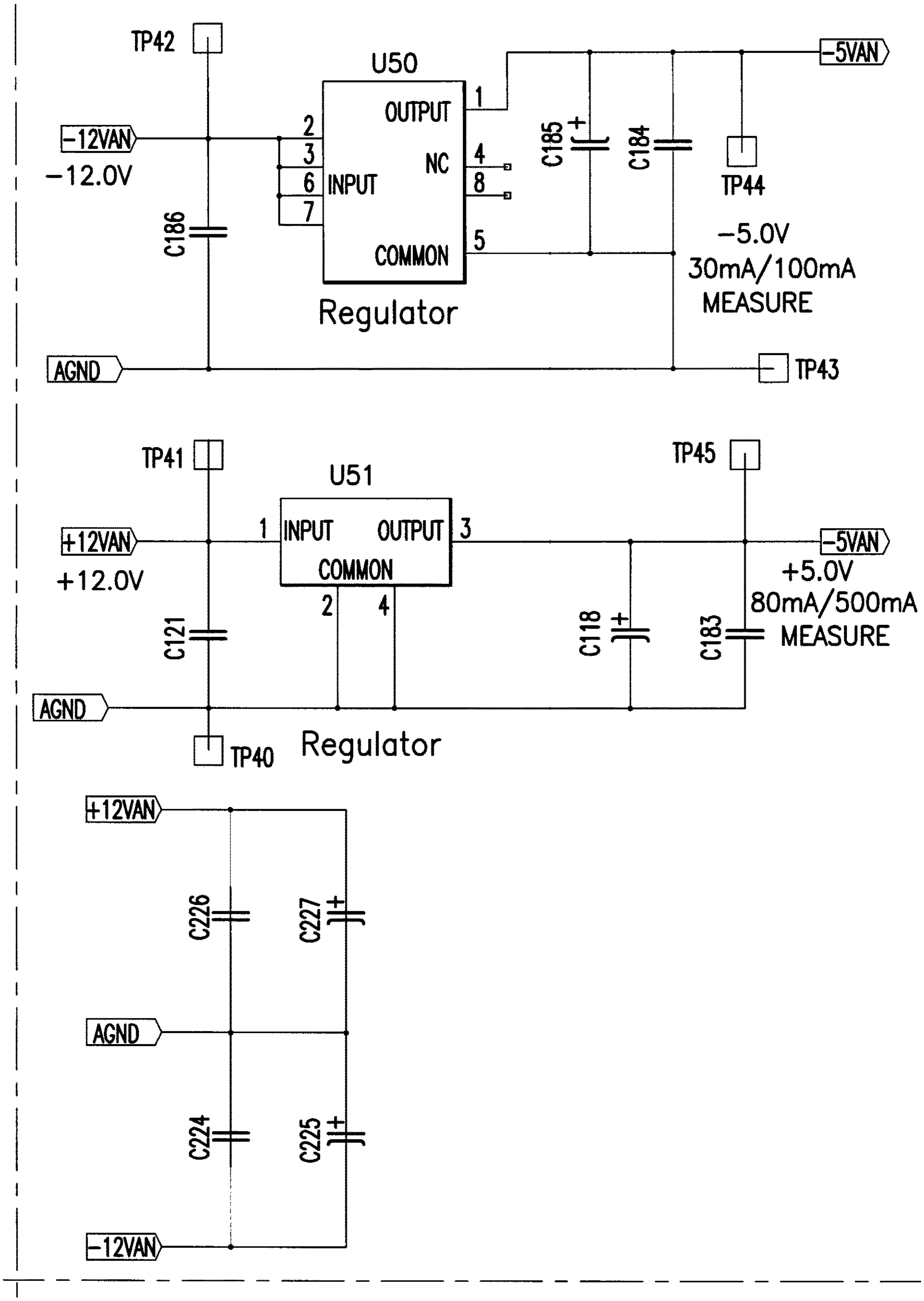
Figure 13D:
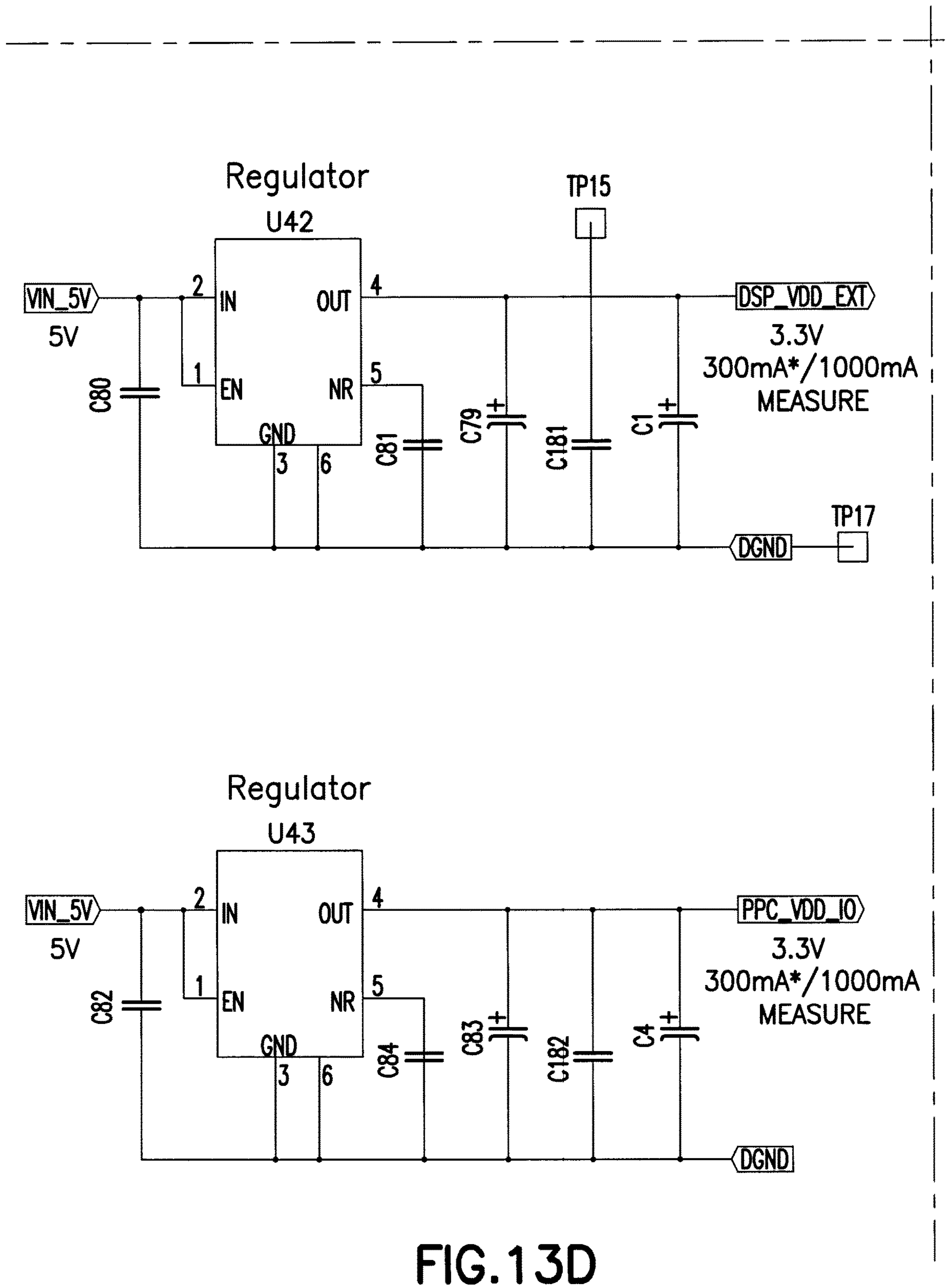
Figure 13E:
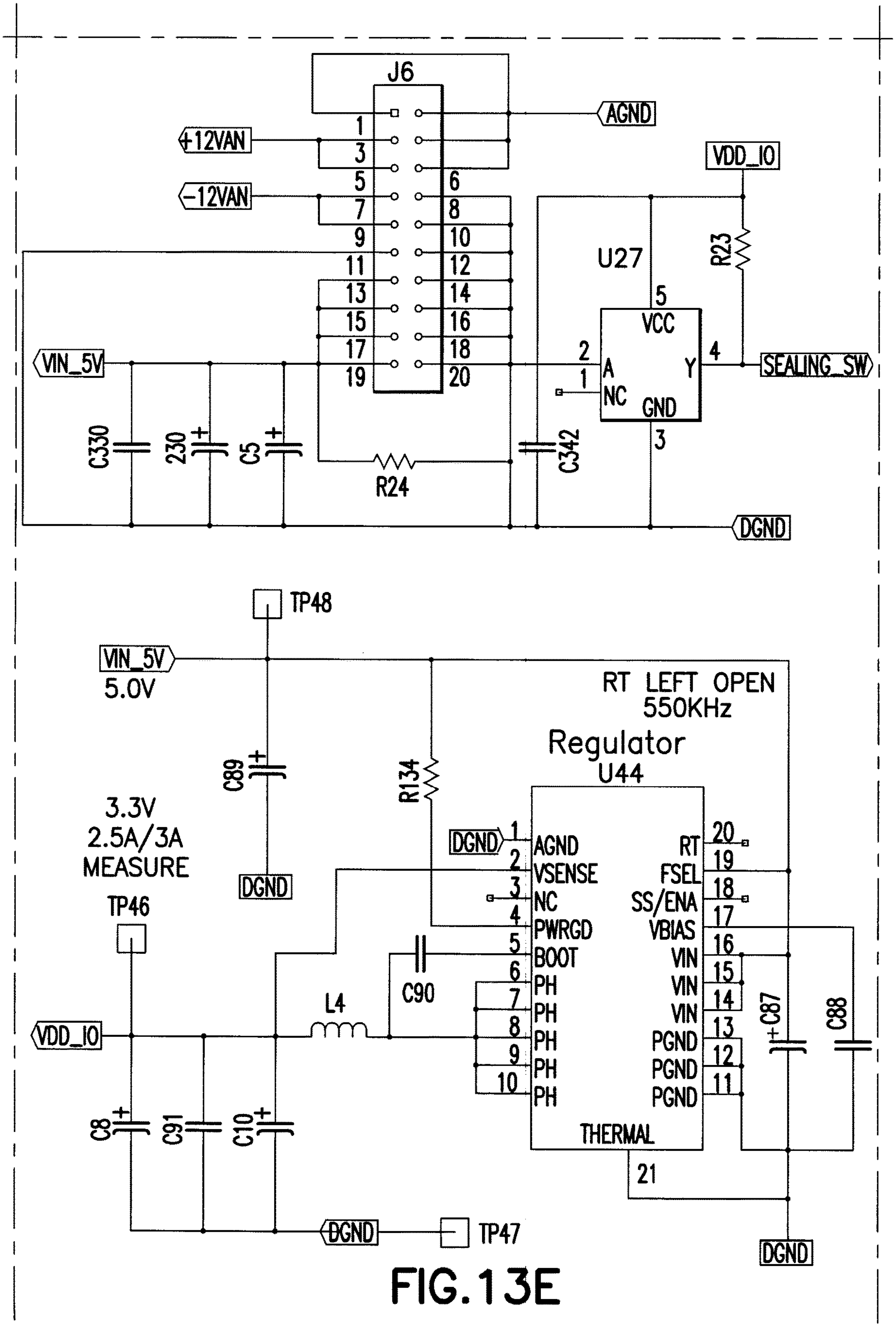
Figures 13, 13F:
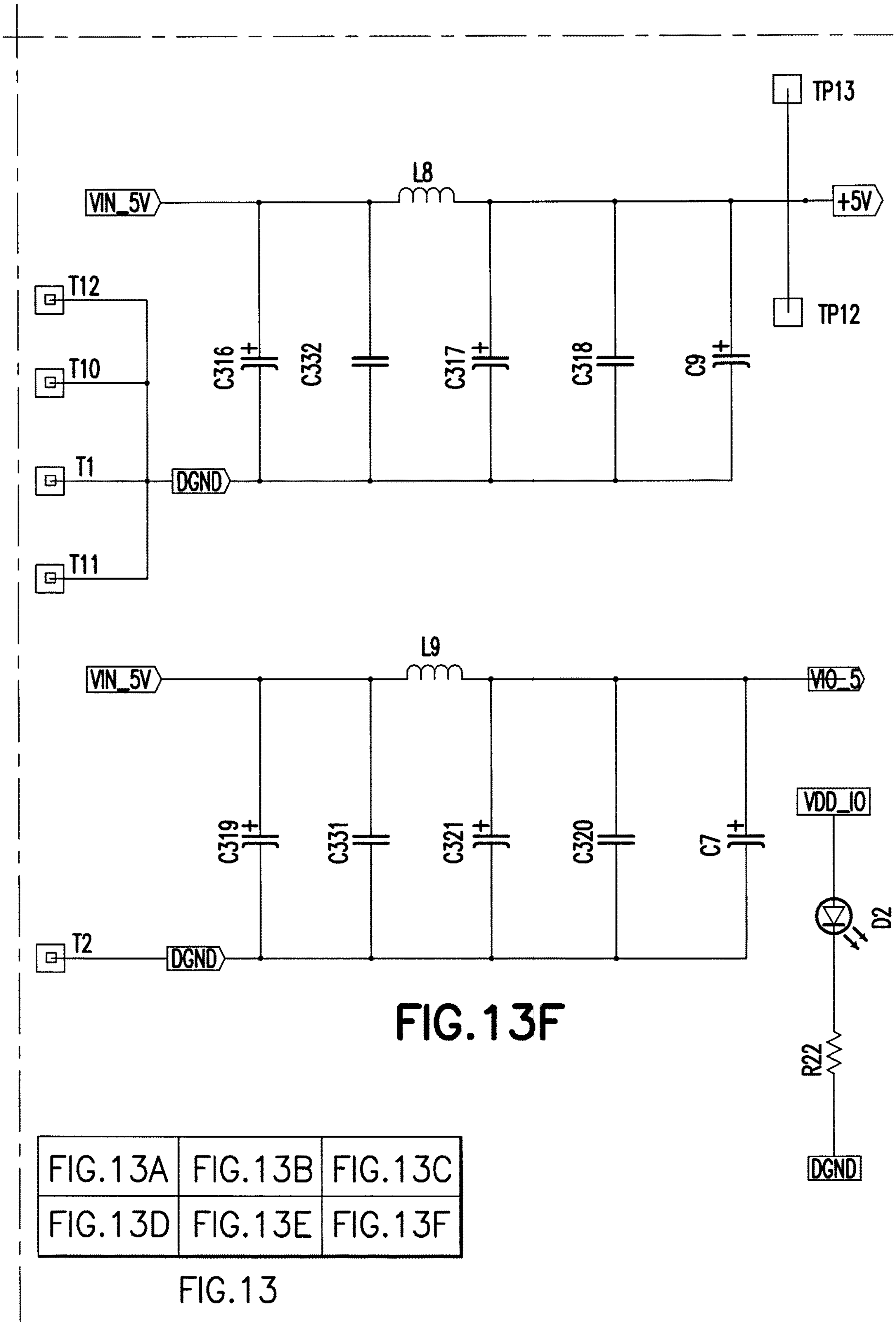

FIGS. 13A and 13B of FIG. 13 shows voltage regulator for DSP Processor 70, CPU, FPGA and voltage regulator for transient capture A/D converters.

FIG. 13C of FIG. 13 Voltage regulator for transient detection circuitry and voltage decoupling capacitors and also shows DSP Processor 60 (or whichever processor the firmware for the DSP Processor 60 resides) voltage decoupling circuits.

FIGS. 13E and 13F of FIG. 13 Voltage regulator for miscellaneous digital logic and shows voltage decoupling capacitors.

FIG. 13D of FIG. 13 shows voltage regulator for CPU and voltage regulator for DSP Processor 70.

Figures 14, 14A:
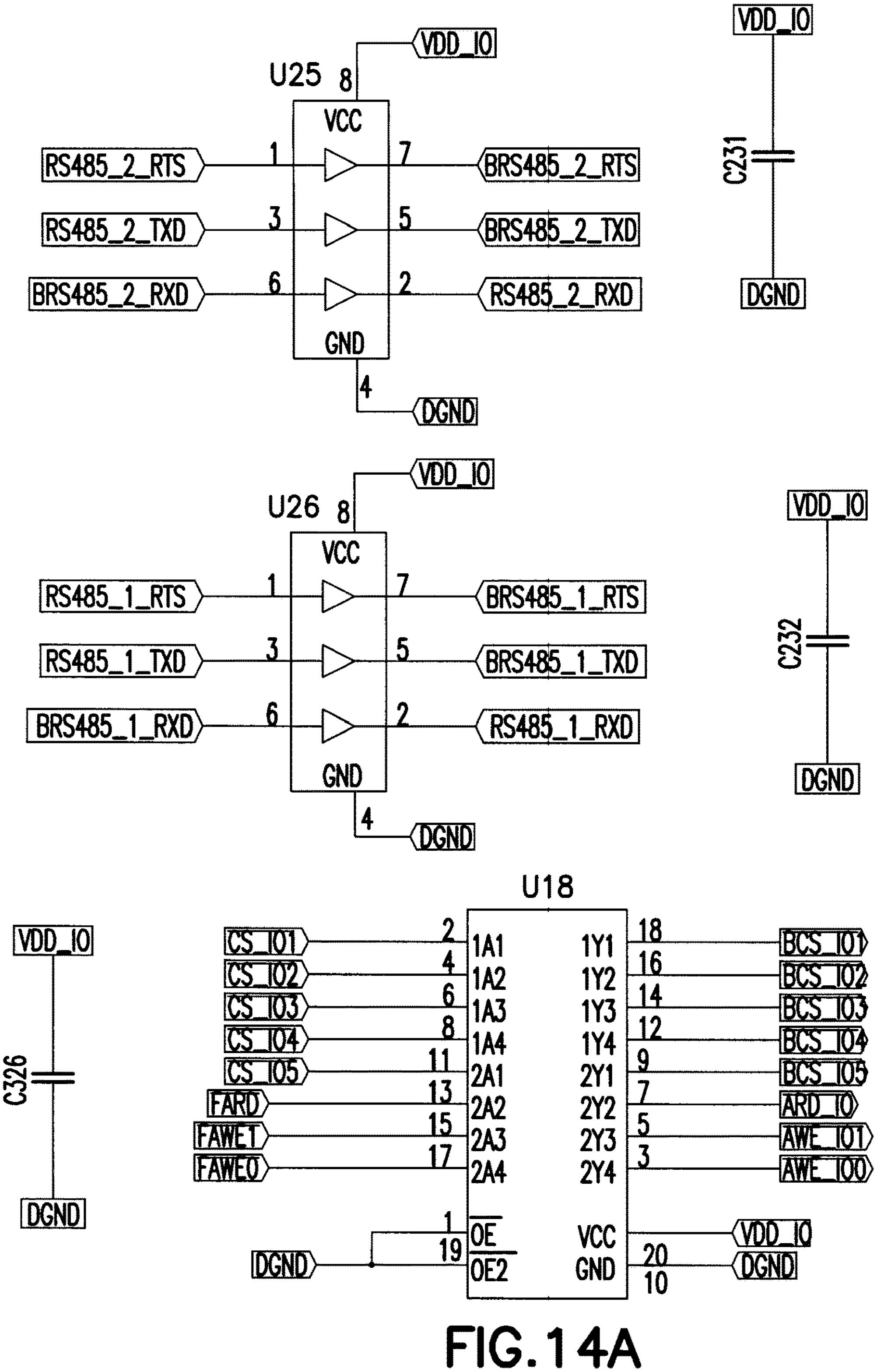
FIG. 14 illustrates how FIGS. 14A, 14B, 14C, 14D and 14E would fit together in order to form a single view of a schematic drawing of a portion of an IED of the present disclosure.
Figure 14B:
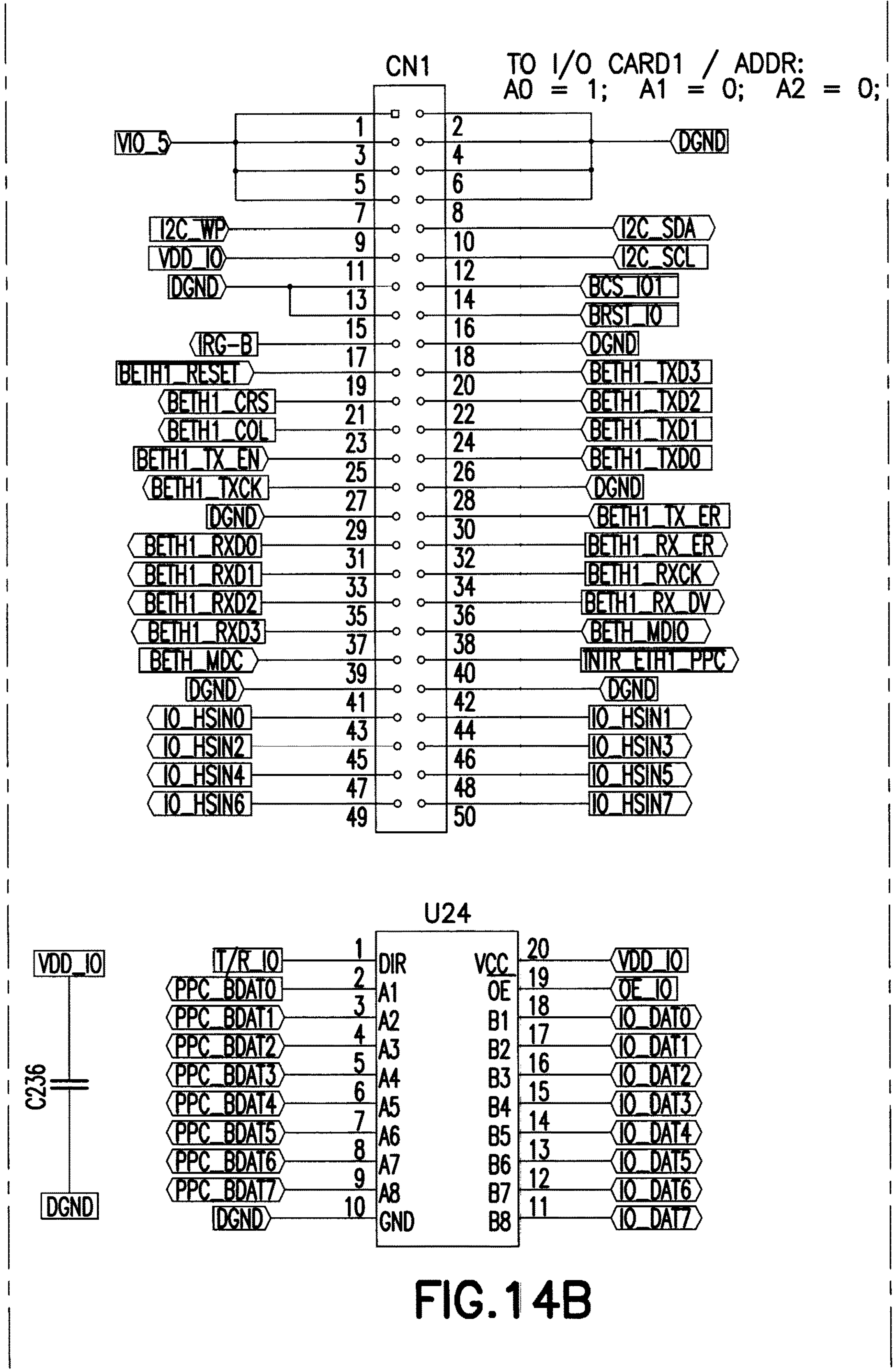

FIGS. 14A and 14B of FIG. 14 shows buffers for I/O cards and I/O card 1 connector and signals.

Figure 14C:
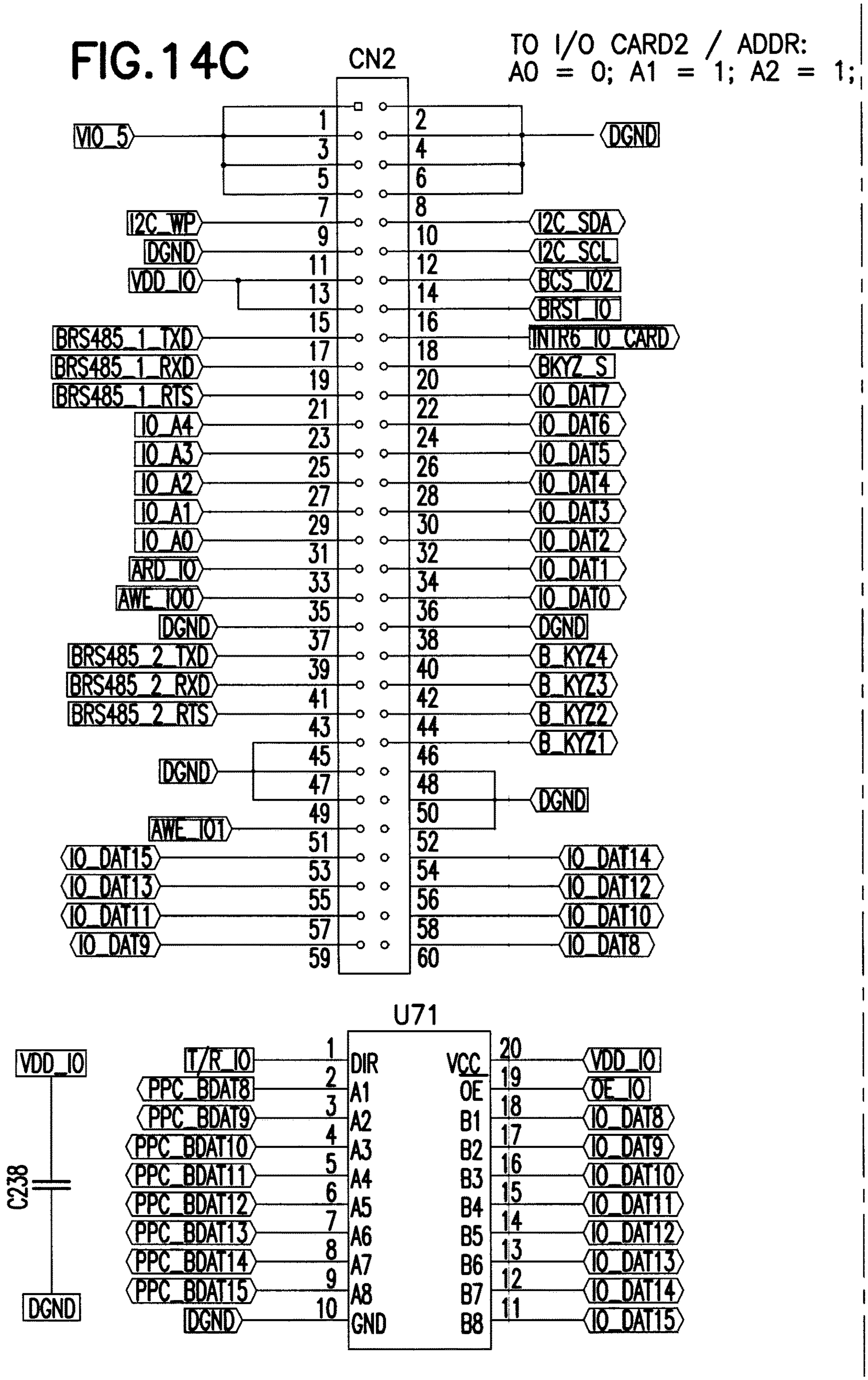
Figure 14D:
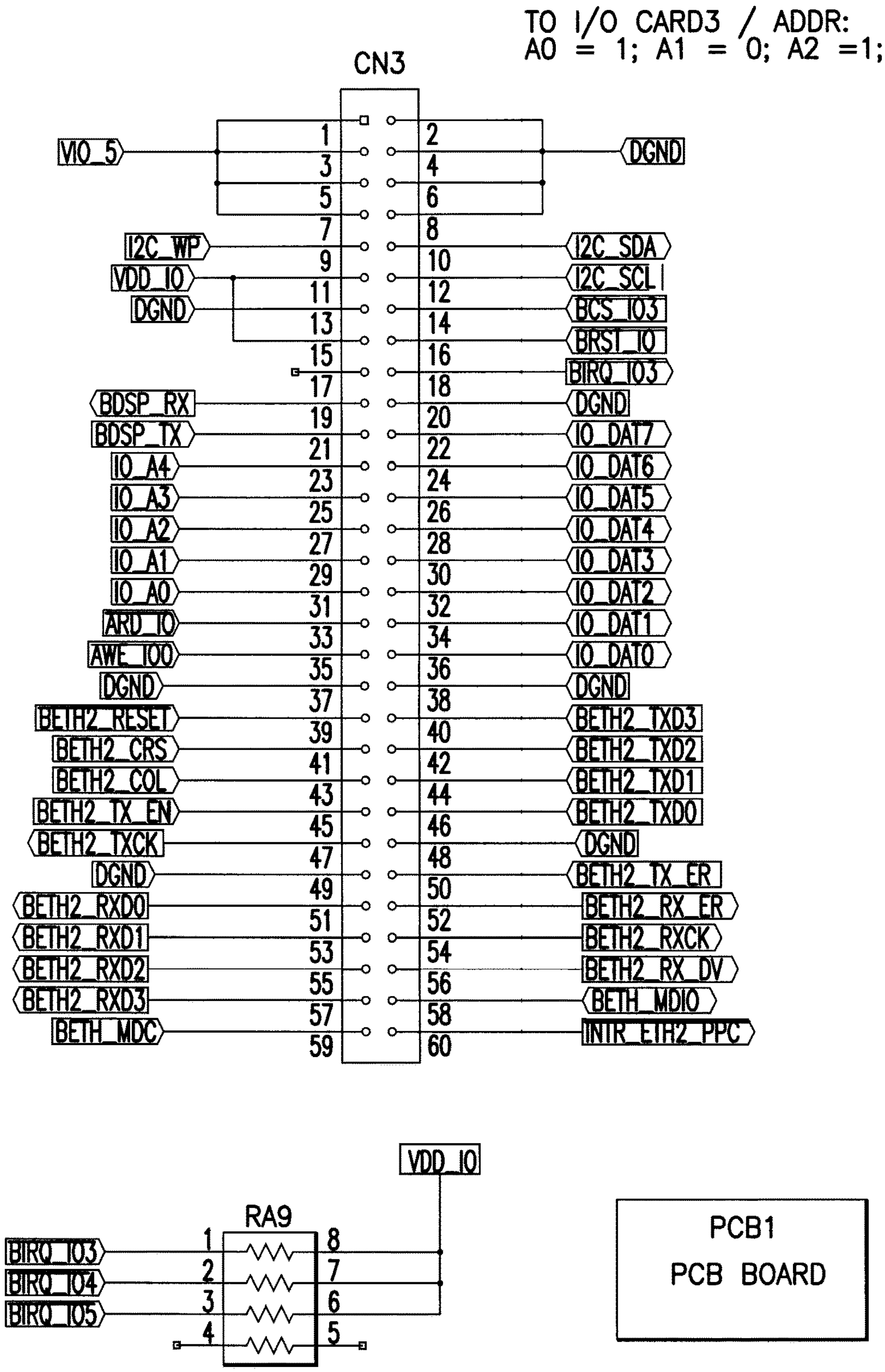

FIGS. 14C and 14D of FIG. 14 shows I/O card 2 and I/O card 3 connectors and I/O signals.

Figure 14E:
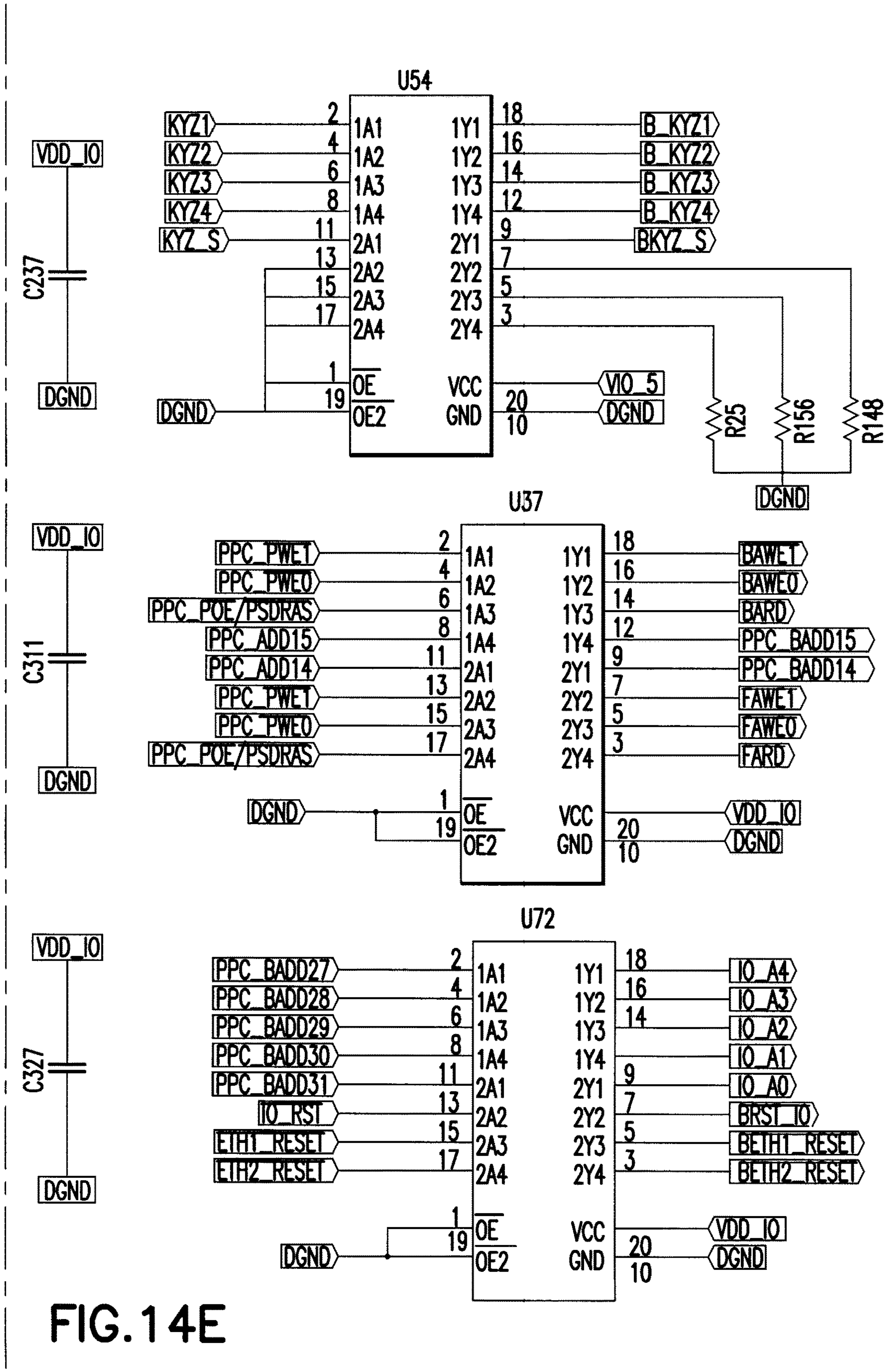

FIG. 14E of FIG. 14 shows VO card buffers.

Figures 15, 15A:
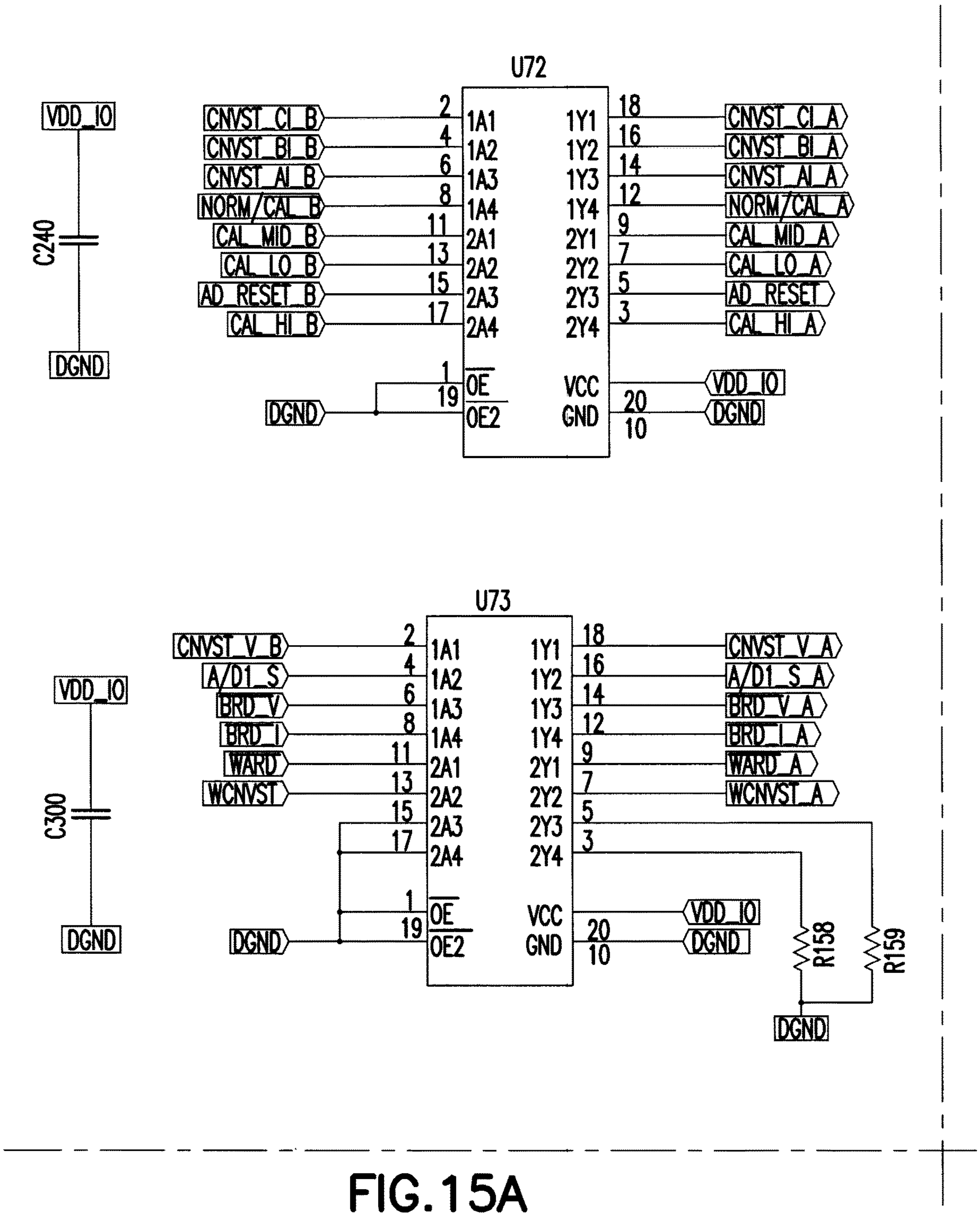
FIG. 15 illustrates how FIGS. 15A, 15B, 15C, 15D, 15E, 15F and 15G would fit together in order to form a single view of a schematic drawing of a portion of an IED of the present disclosure.
Figure 15B:
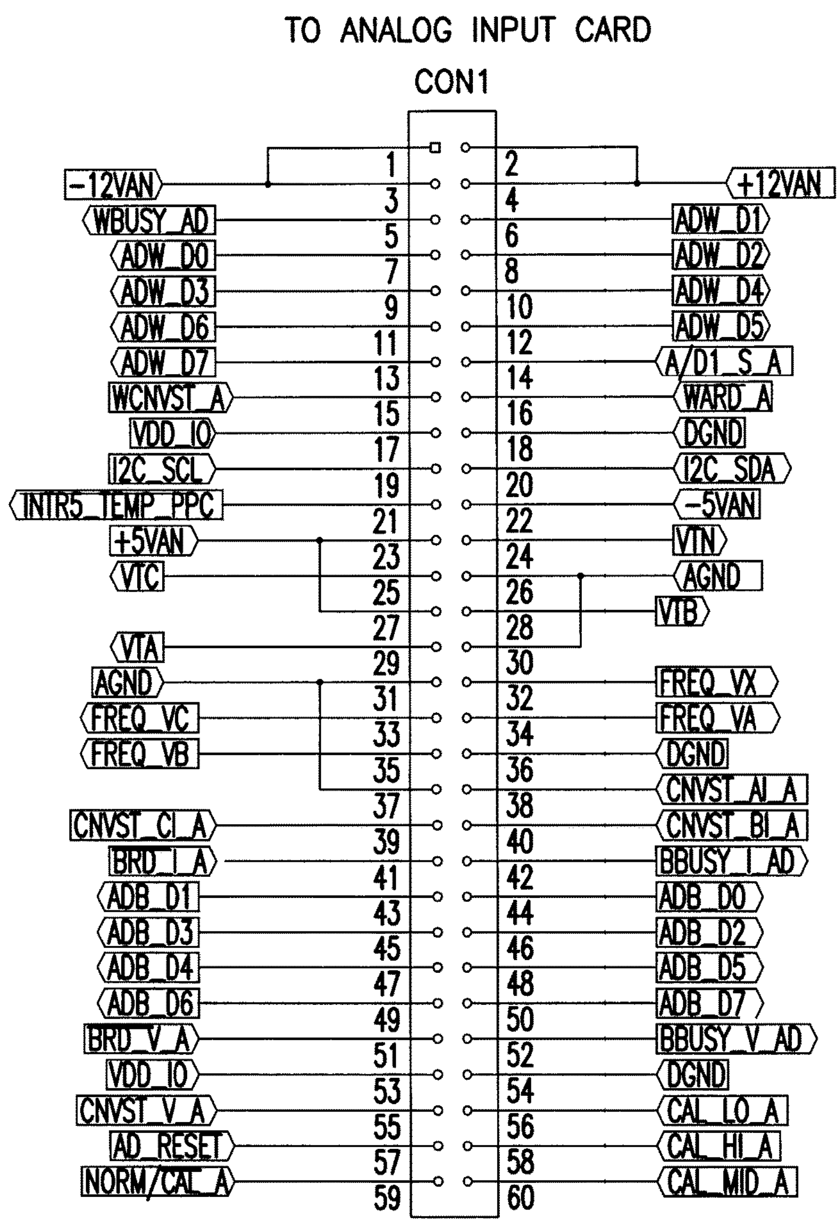

FIGS. 15A and 15B of FIG. 15 shows I/O card buffers and analog input card connector and signals.

Figure 15C:
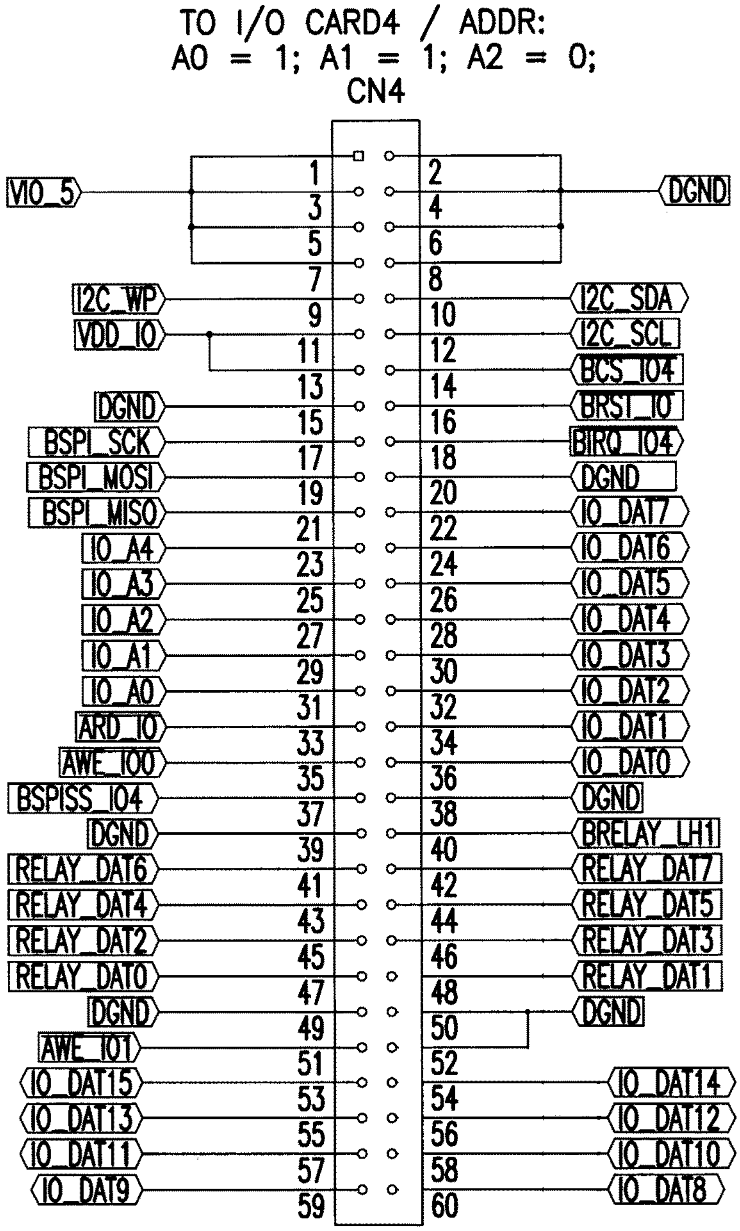
Figure 15D:
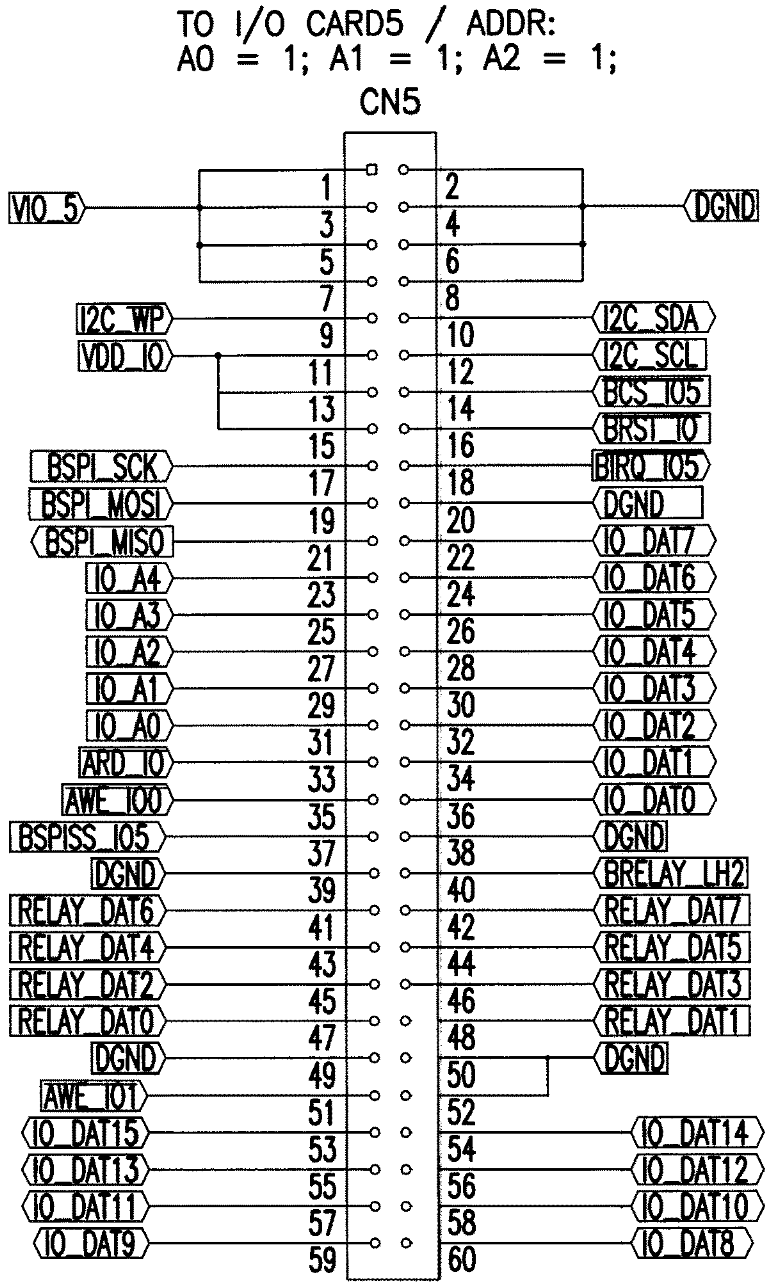

FIGS. 15C and 15D of FIG. 15 shows I/O card 4 and I/O card 5 connectors and I/O signals.

Figure 15E:
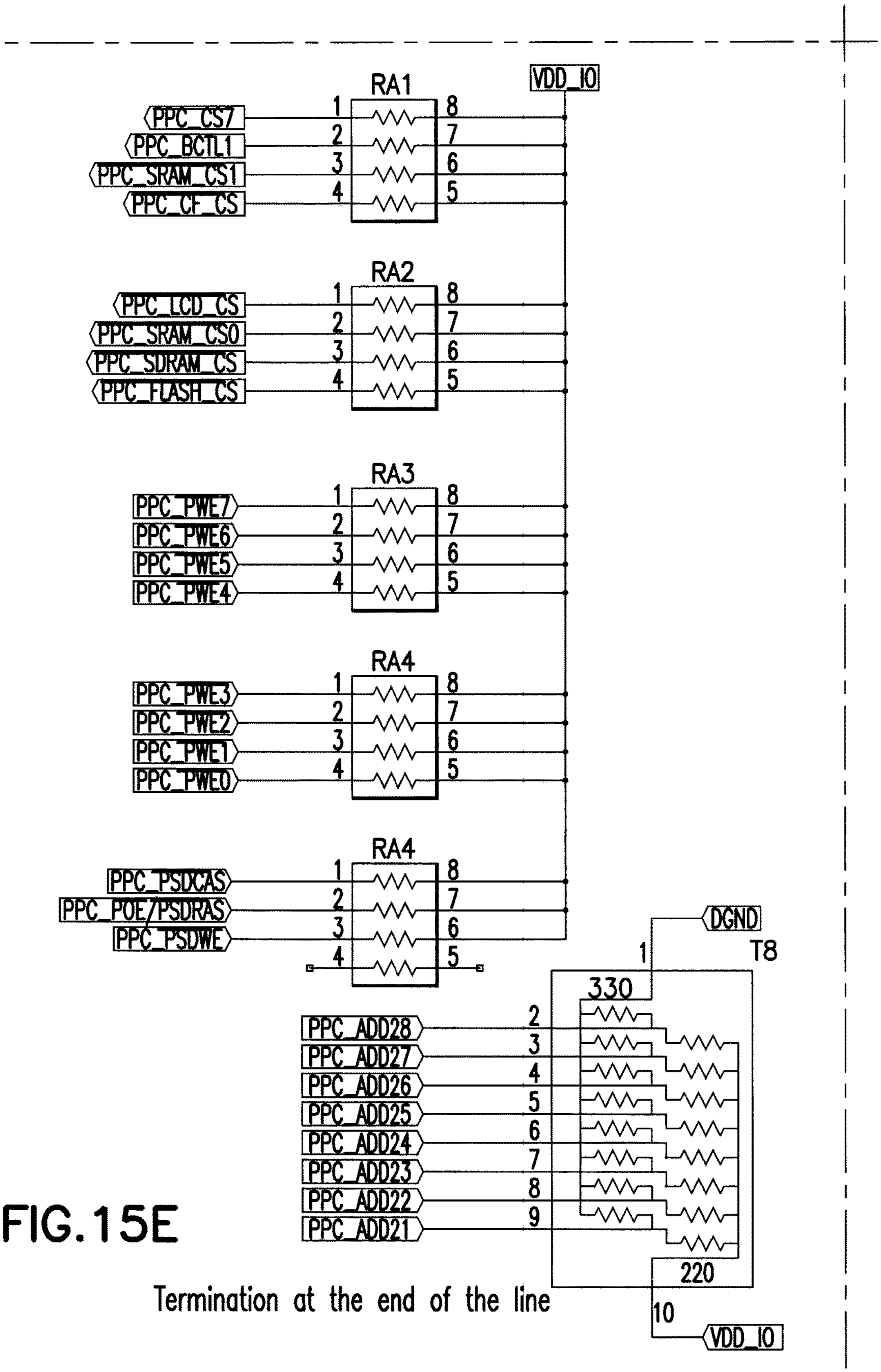
Figure 15F:
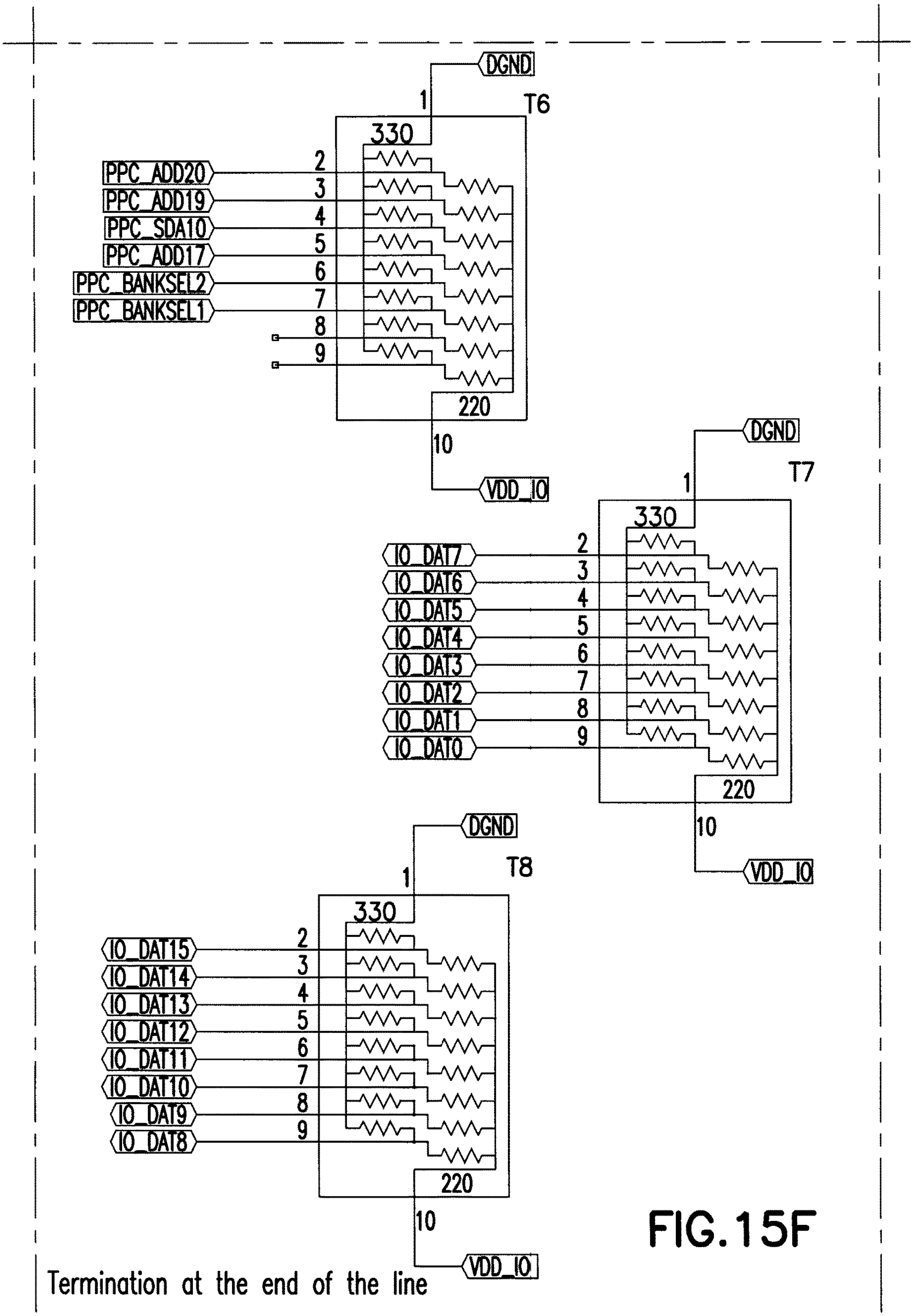
Figure 15G:
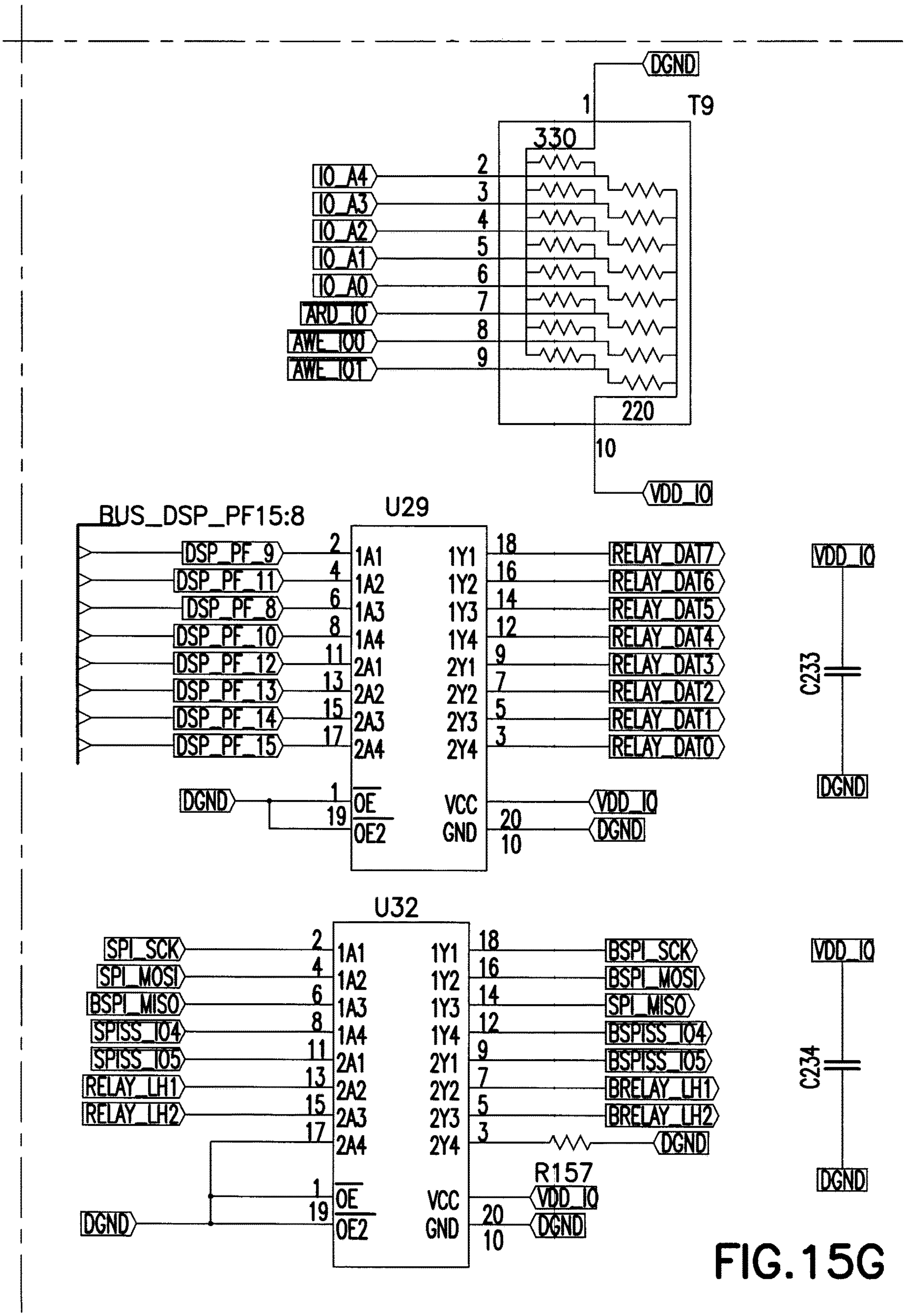

FIG. 15G of FIG. 15 shows I/O card buffers and termination resistors.

FIGS. 15E and 15F of FIG. 15 shows I/O card termination resistors and CPU termination resistors.

Figure 16A:
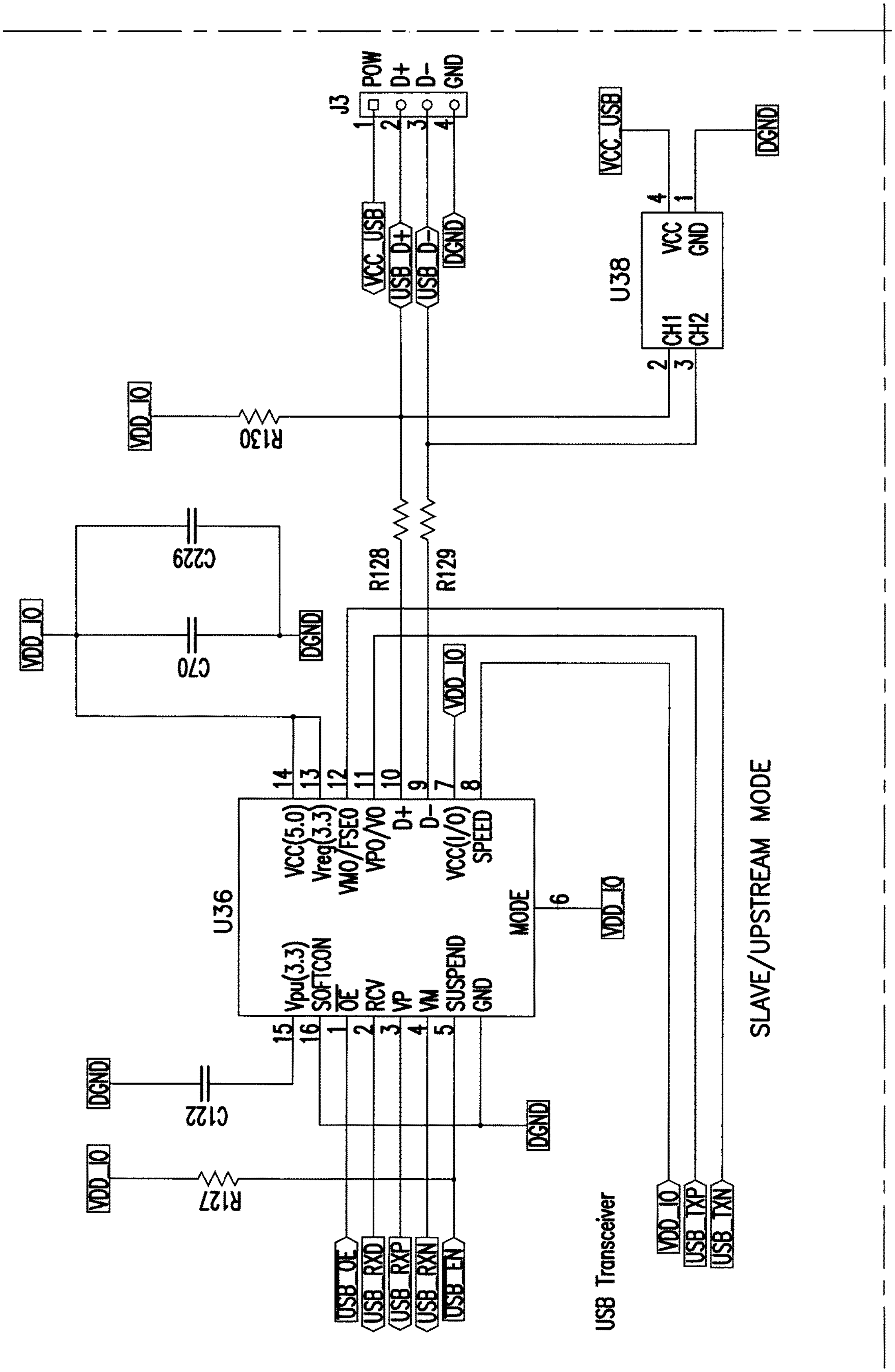
FIG. 16 illustrates how FIGS. 16A, 16B, 16C, 16D, 16E, 16F and 16G would fit together in order to form a single view of a schematic drawing of a portion of an IED of the present disclosure.
Figure 16B:
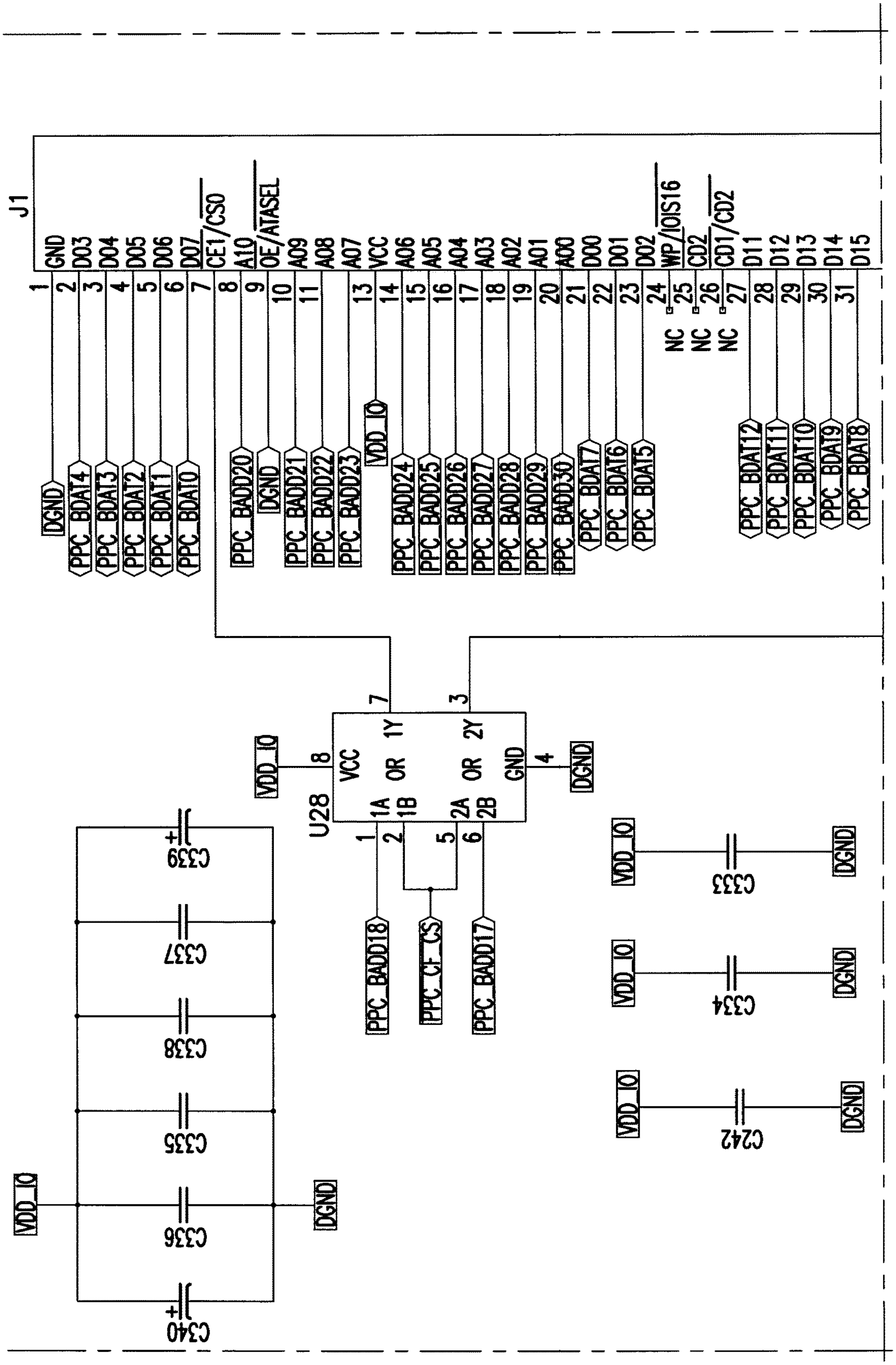
Figure 16C:
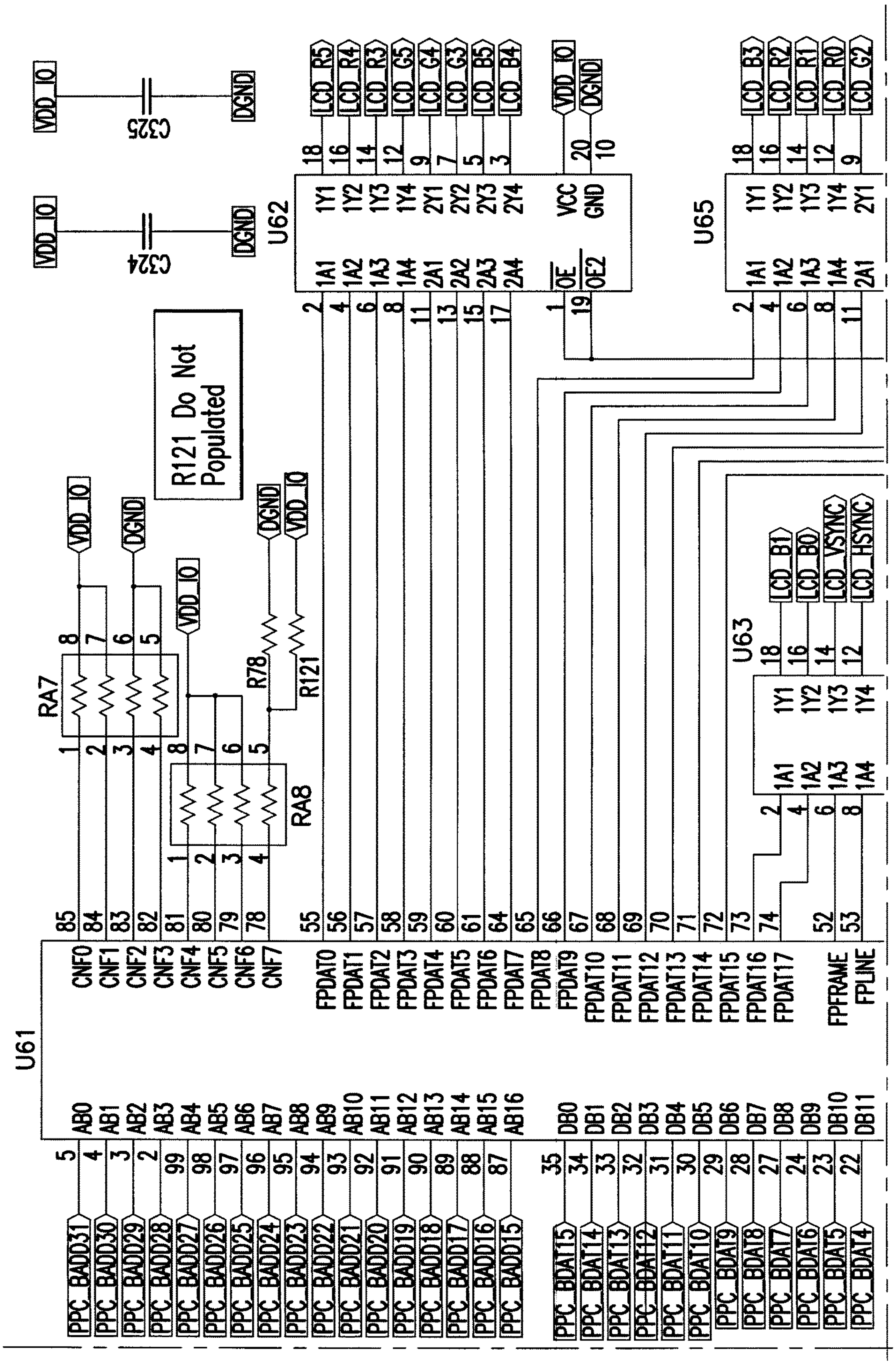

FIG. 16A of FIG. 16 shows USB transceiver and same miscellaneous signal buffers and USB clock oscillator.

FIGS. 16B and 16C and 16E and 16F of FIG. 16 show compact flash connector interface and LCD controller and LCD buffers.

Figure 16D:
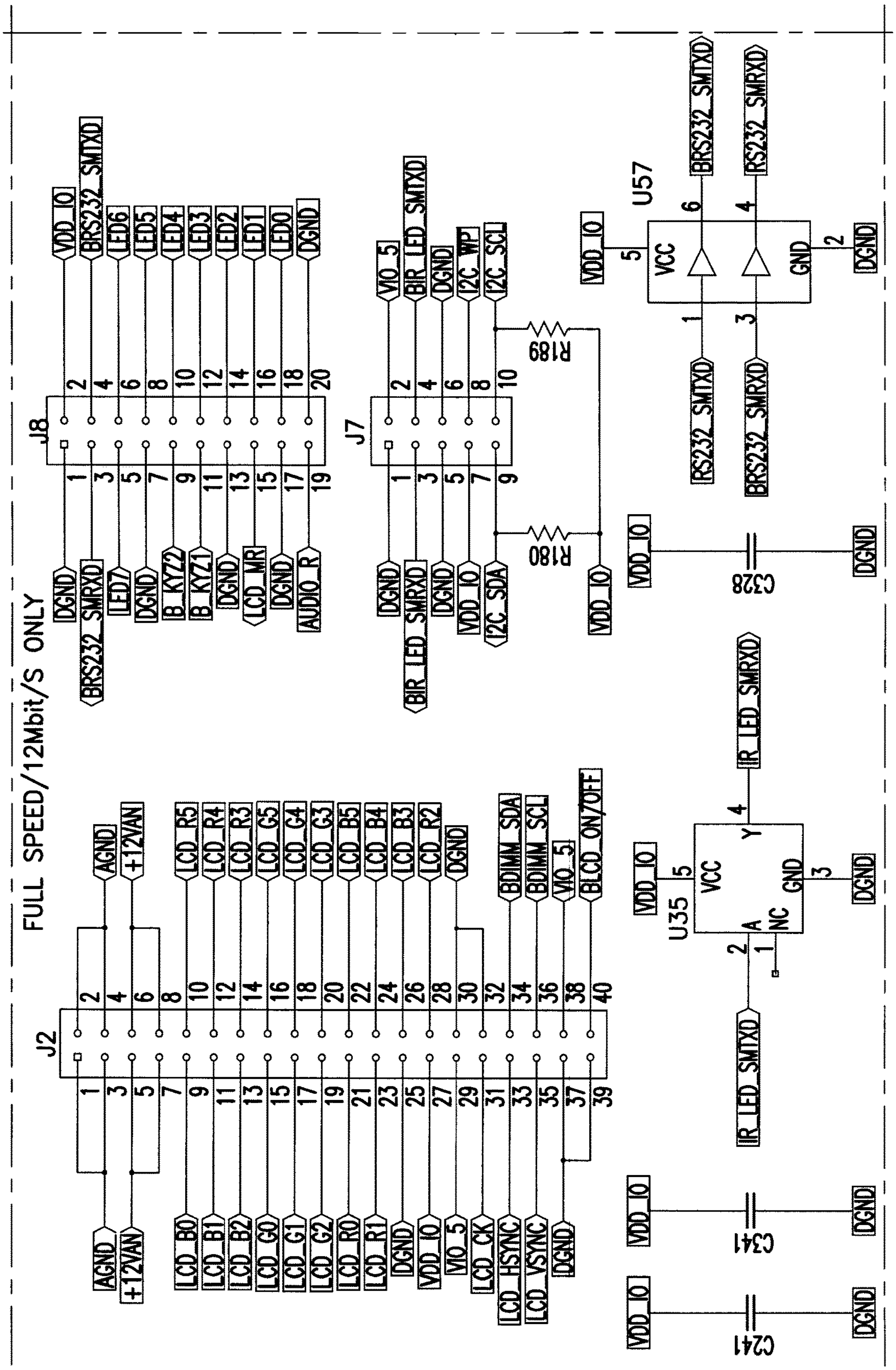
Figure 16E:
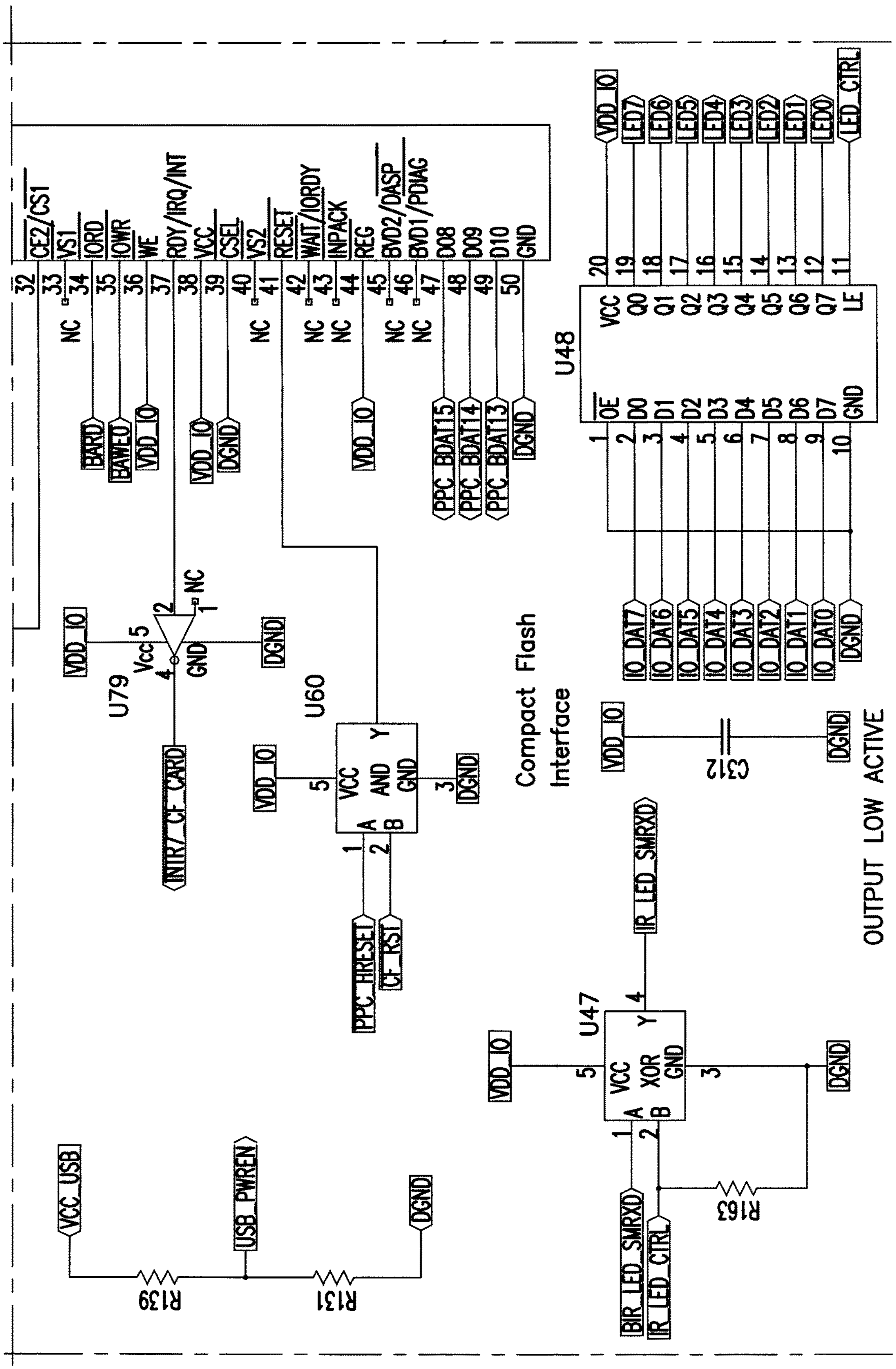
Figure 16F:
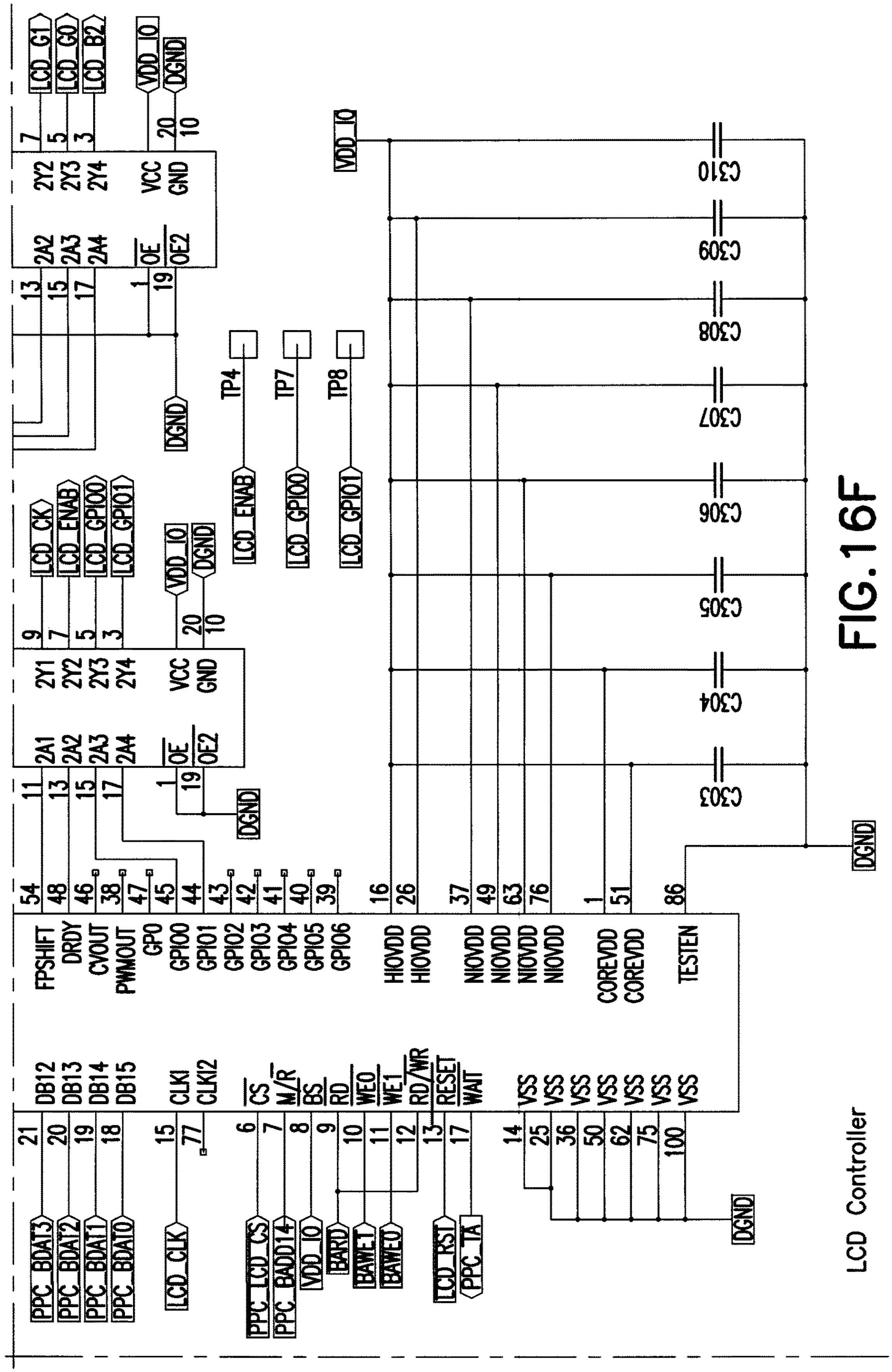
Figure 16G:
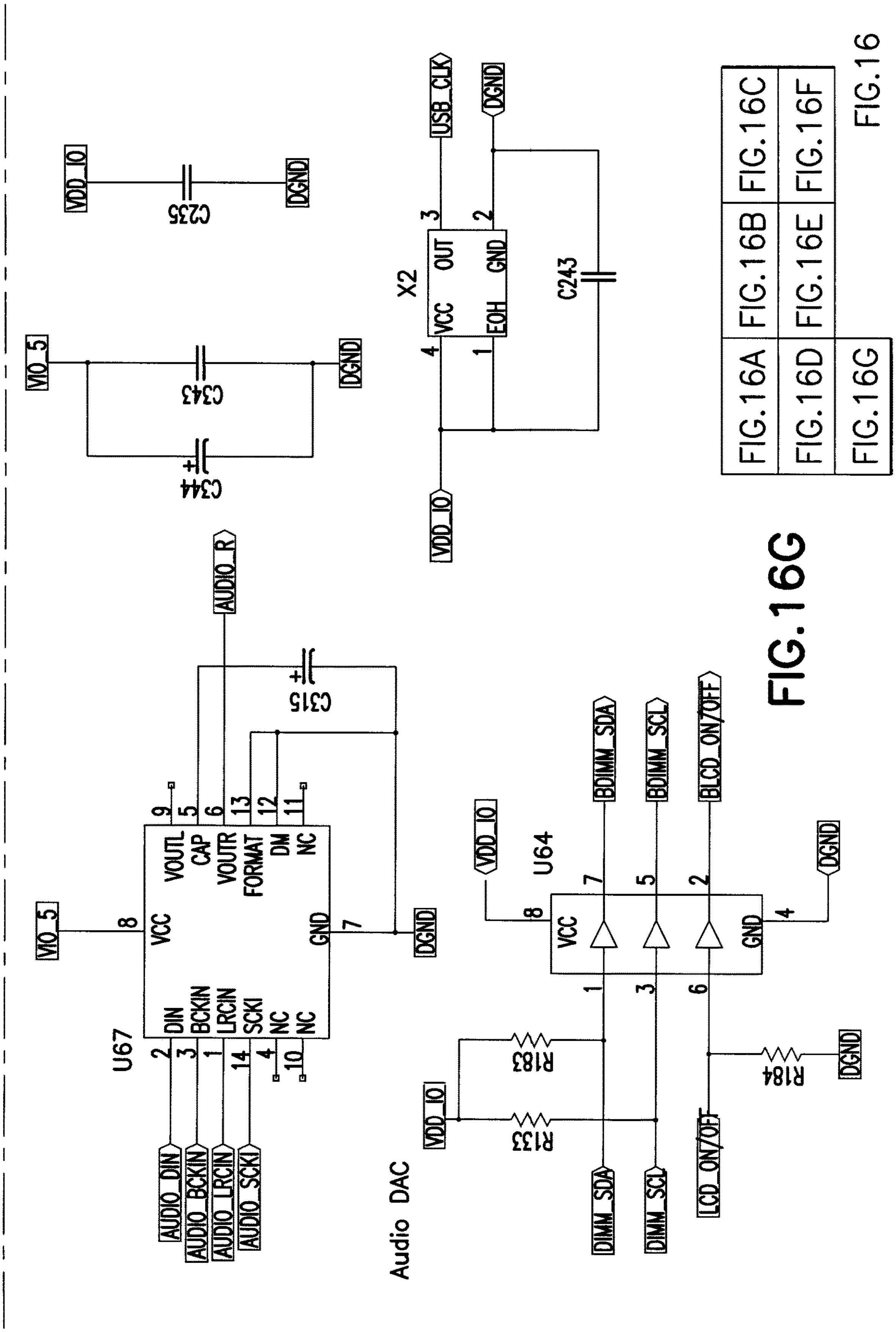

FIGS. 16D and 16G of FIG. 16 shows LCD VO connector, Audio DAC (Digital to Analog Converter) and front panel connectors and I/O Board buffers.

Figure 17A:
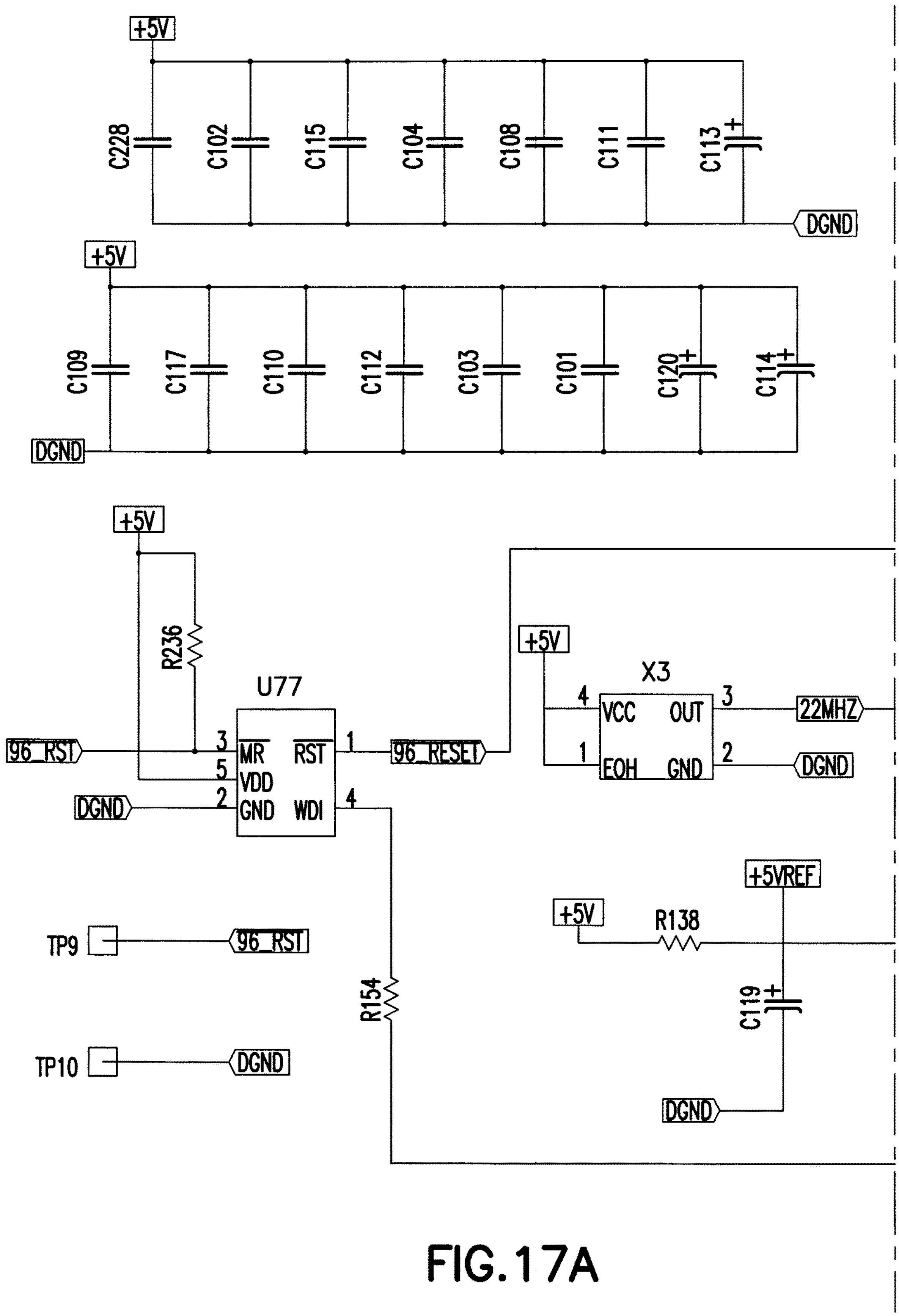
FIG. 17 illustrates how FIGS. 17A, 17B, 17C, 17D, 17E, 17F and 17G would fit together in order to form a single view of a schematic drawing of a portion of an IED of the present disclosure.
Figure 17B:
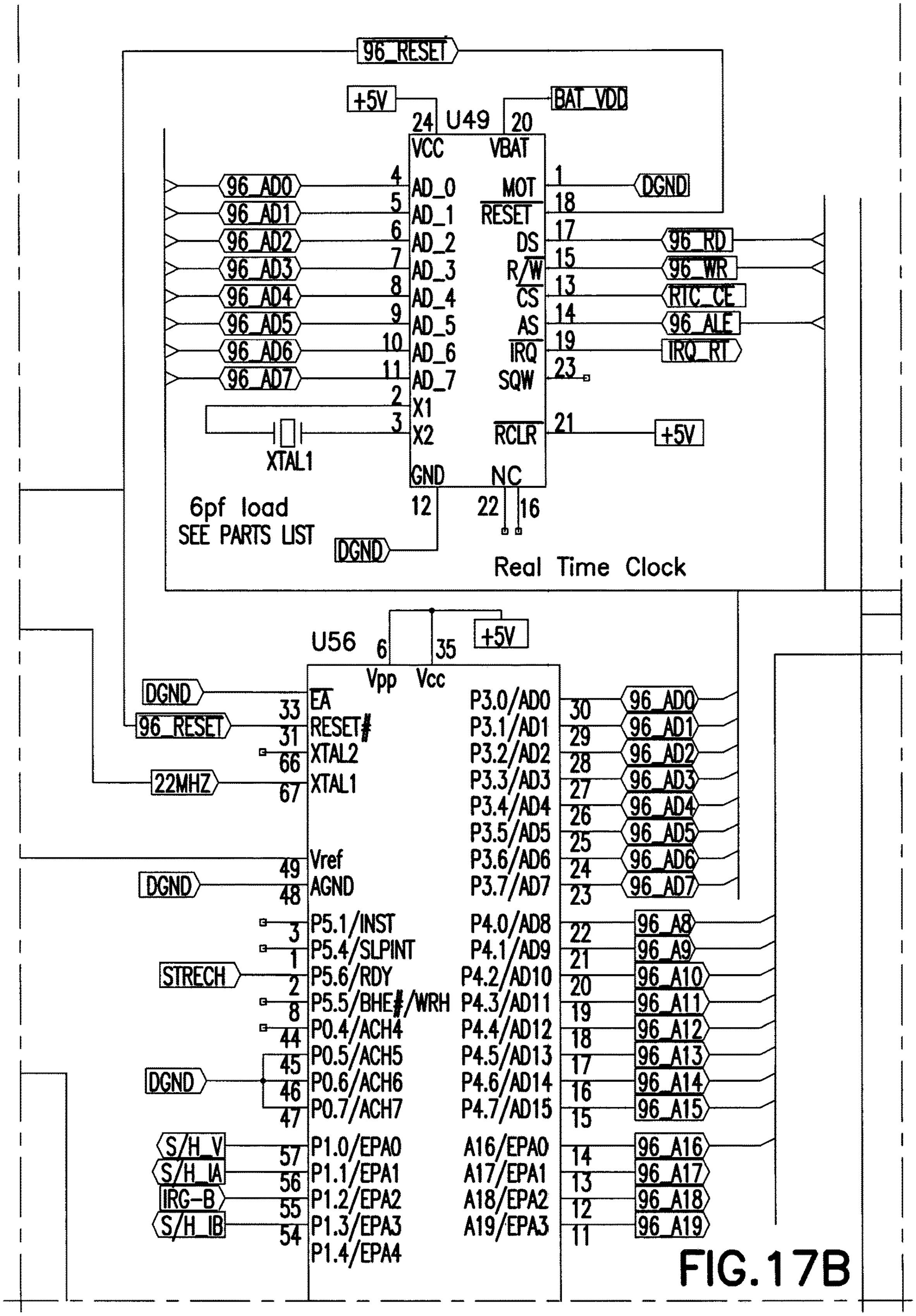
Figure 17C:
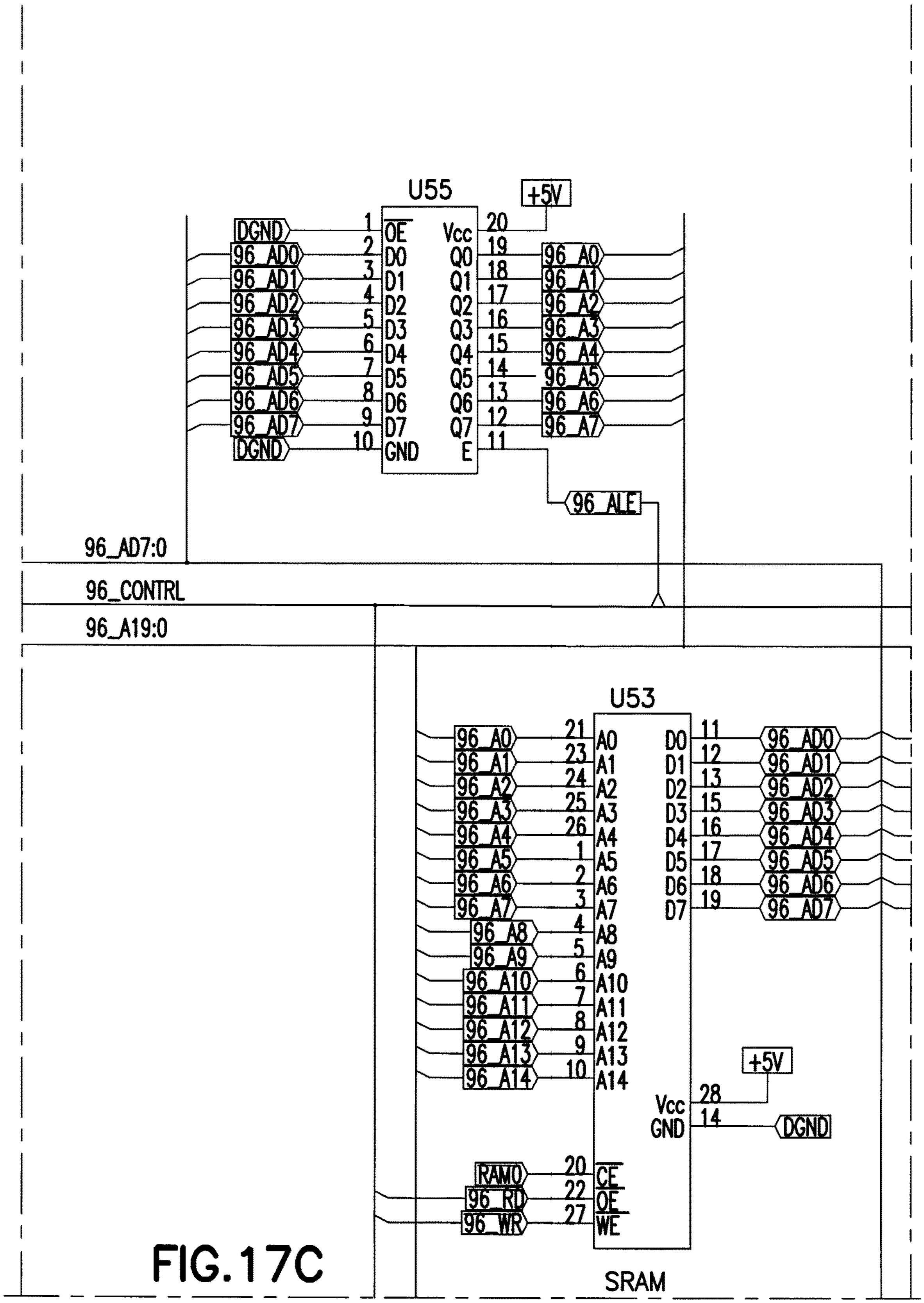
Figure 17D:
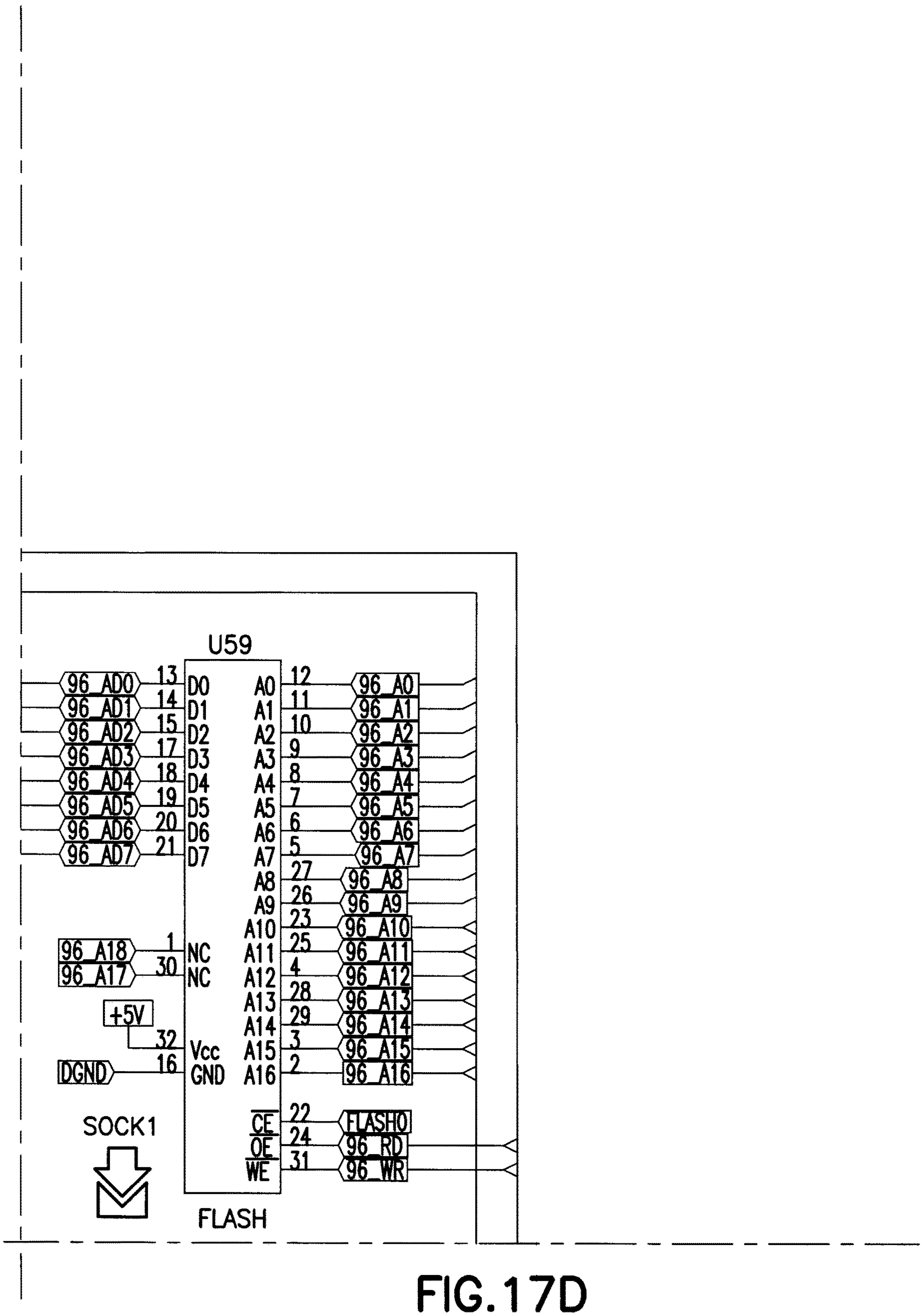
Figure 17E:
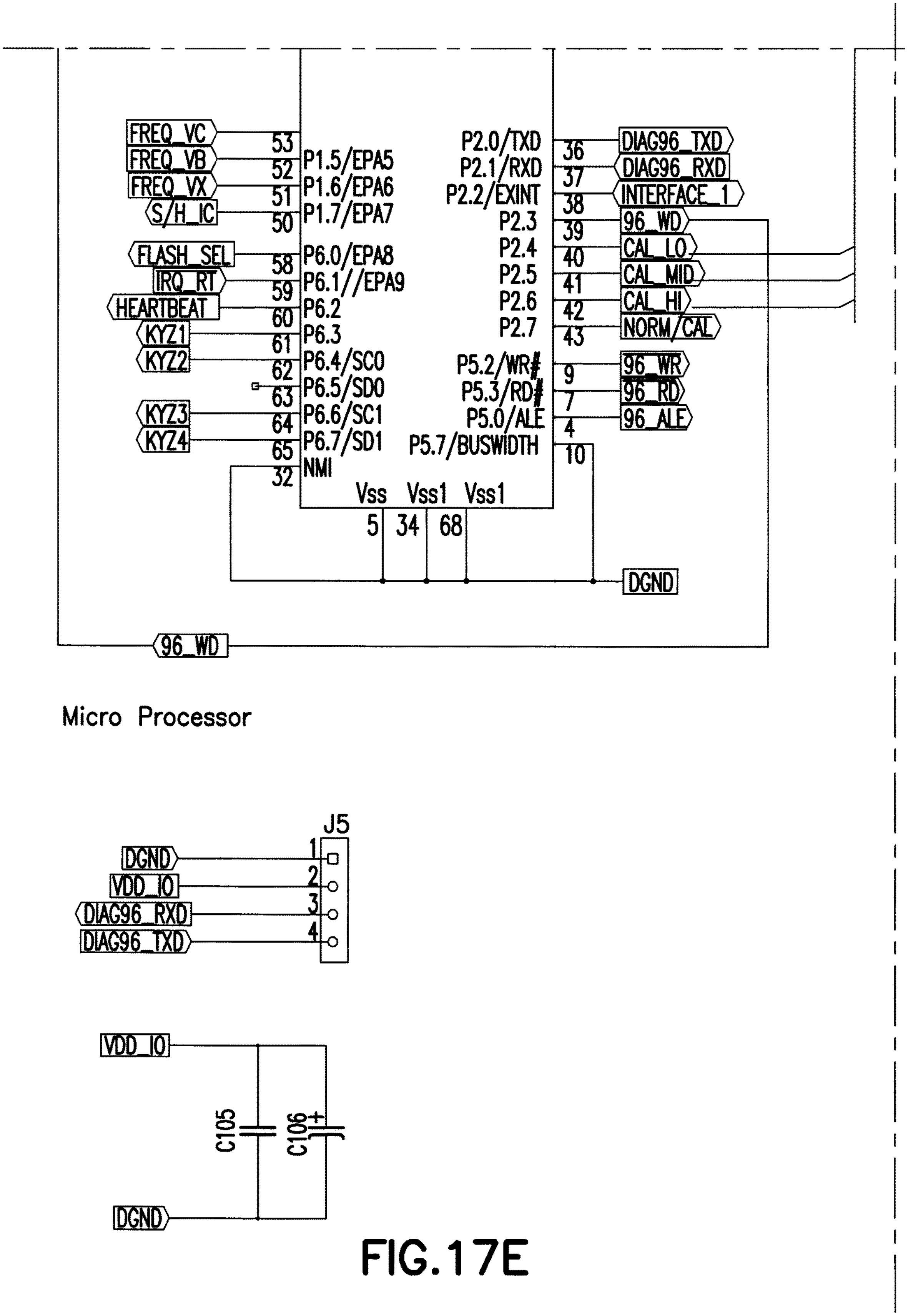
Figure 17F:
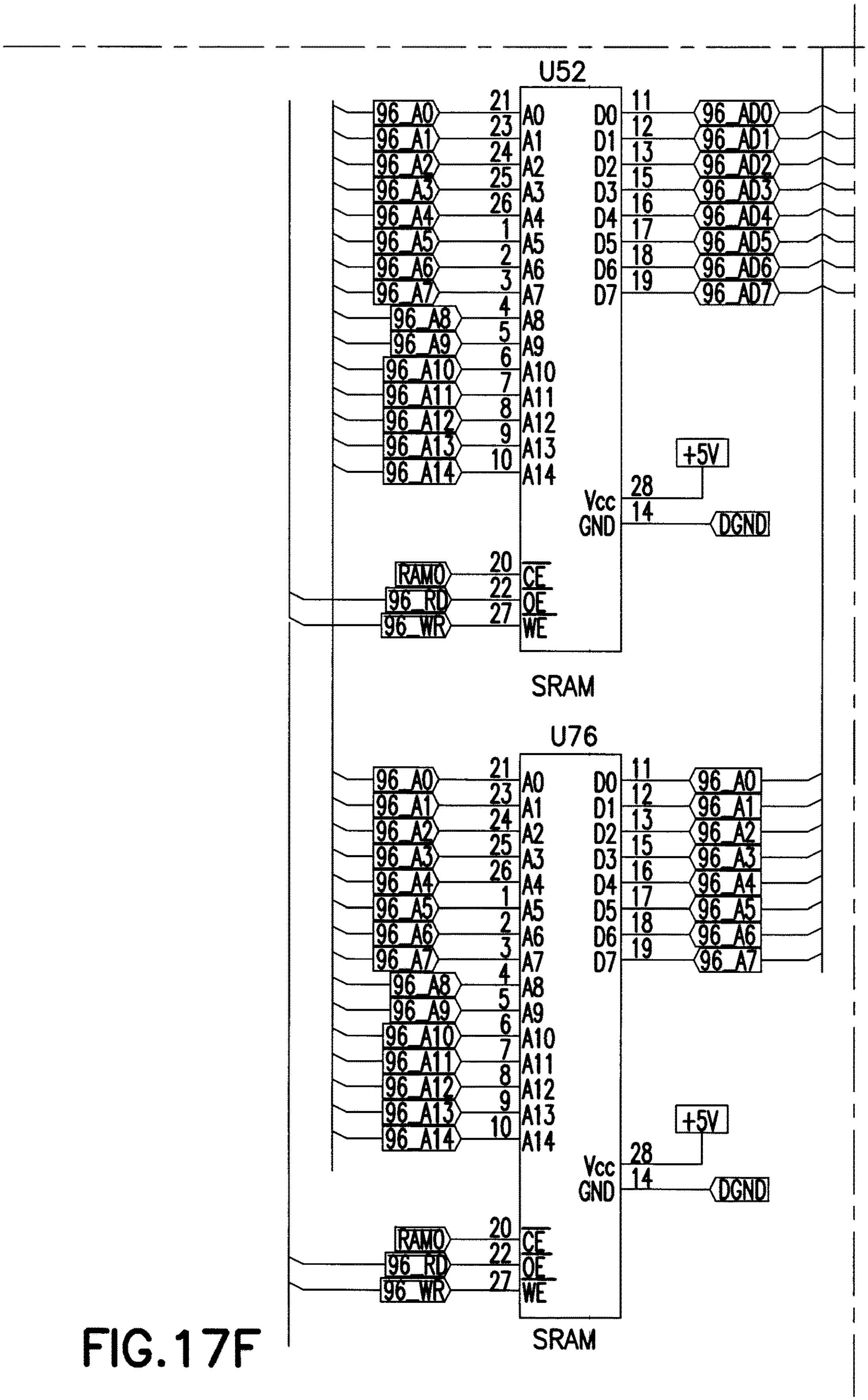
Figures 17, 17G:
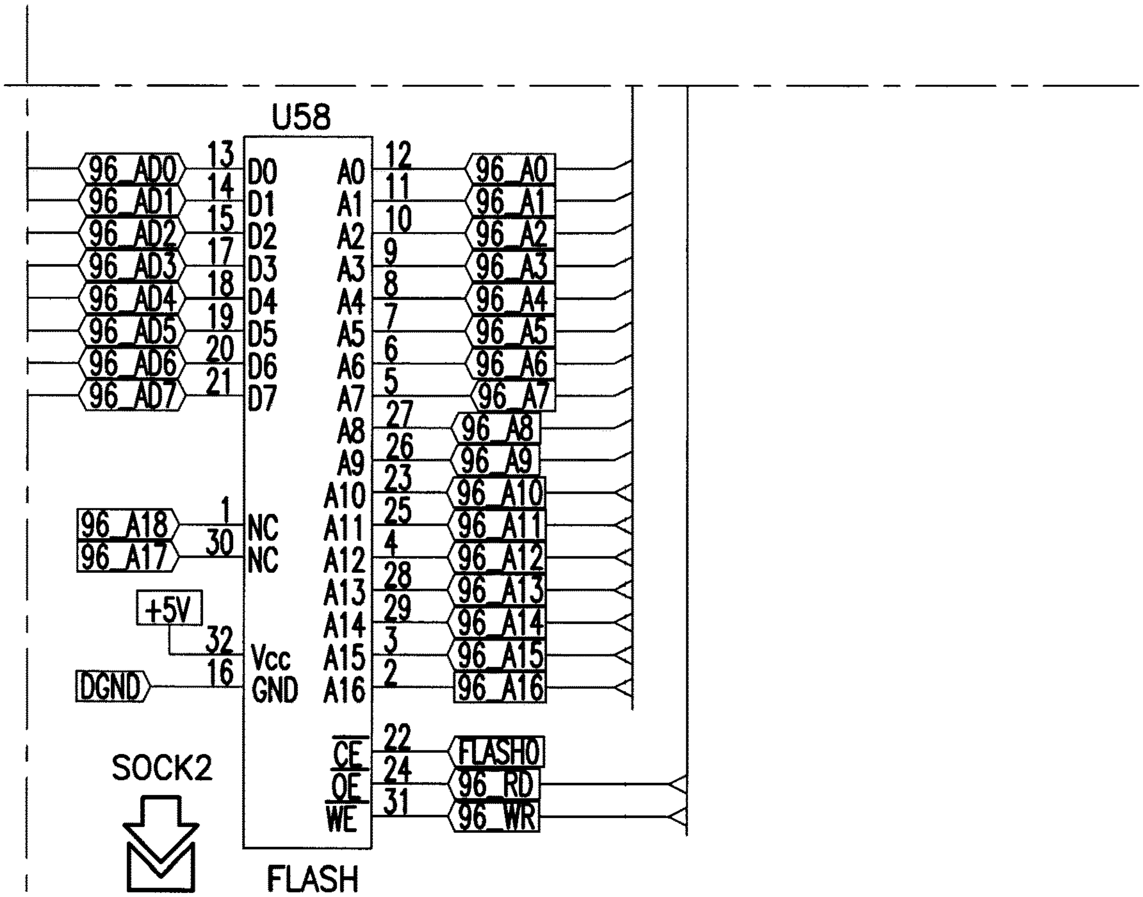

FIGS. 17A, 17B, and 17E of FIG. 17 together show real time clock, power reset controller, and DSP Processor 60 (or whichever processor the firmware for the DSP Processor 60 resides).

FIGS. 17C and 17D of FIG. 17 shows RAM and FLASH Memory and DSP Processor's 60 (or whichever processor the firmware for the DSP Processor 60 resides) address buffers.

FIGS. 17F and 17G of FIG. 17 shows additional RAM and FLASH Memory.

Figures 18, 18A:
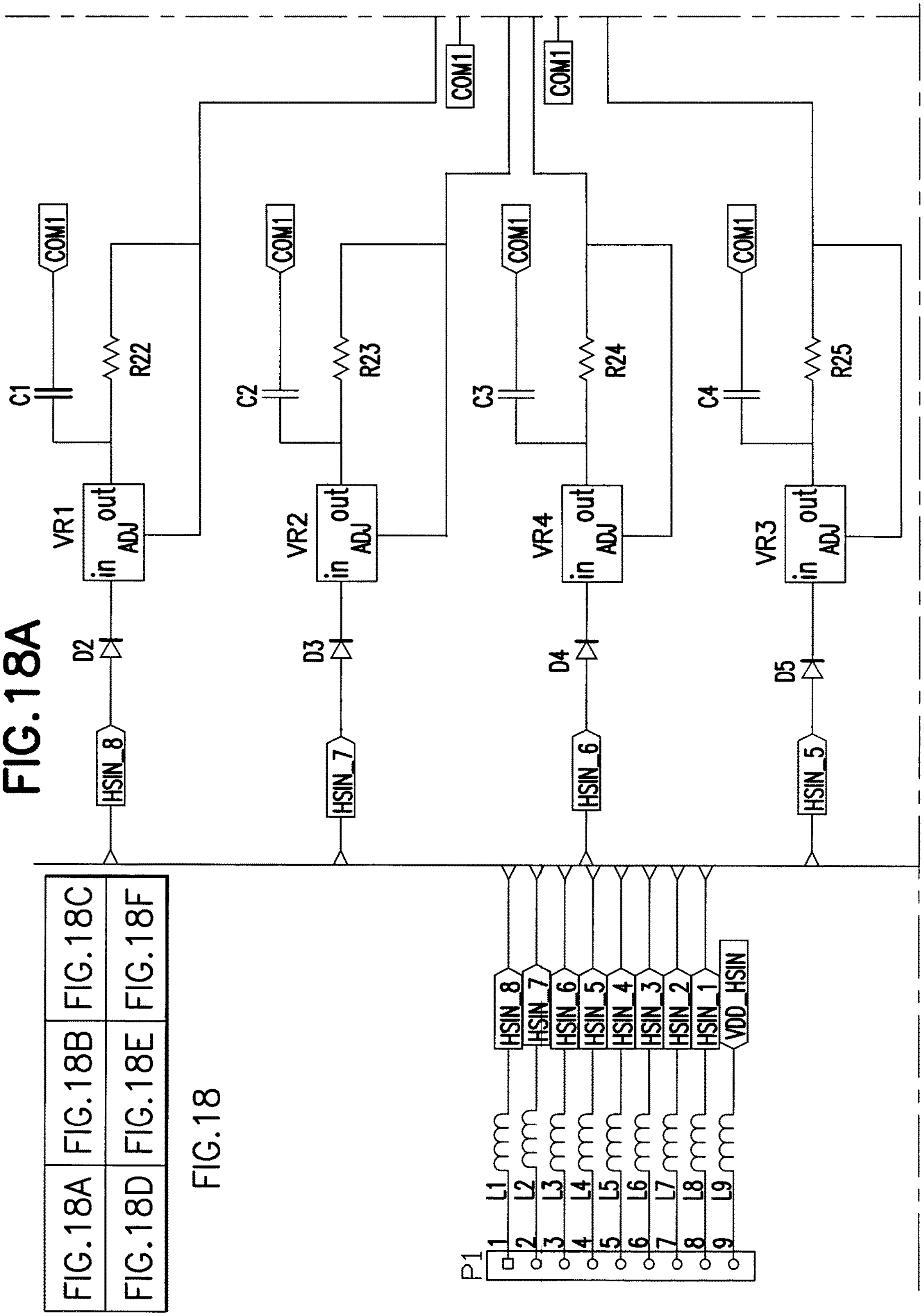
FIG. 18 illustrates how FIGS. 18A, 18B, 18C, 18D, 18E and 18F would fit together in order to form a single view of a schematic drawing of a portion of an IED of the present disclosure.
Figure 18B:
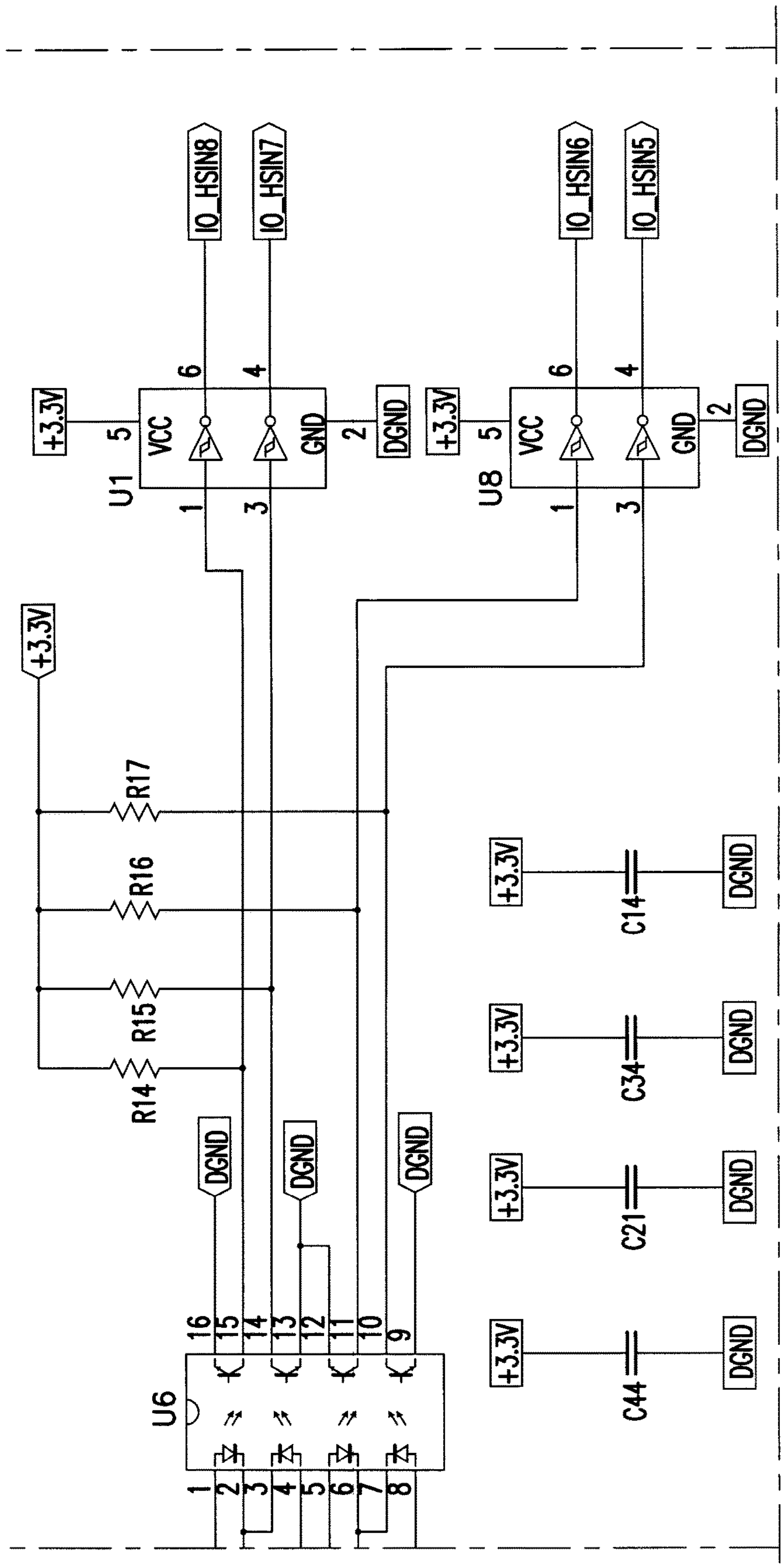
Figure 18C:
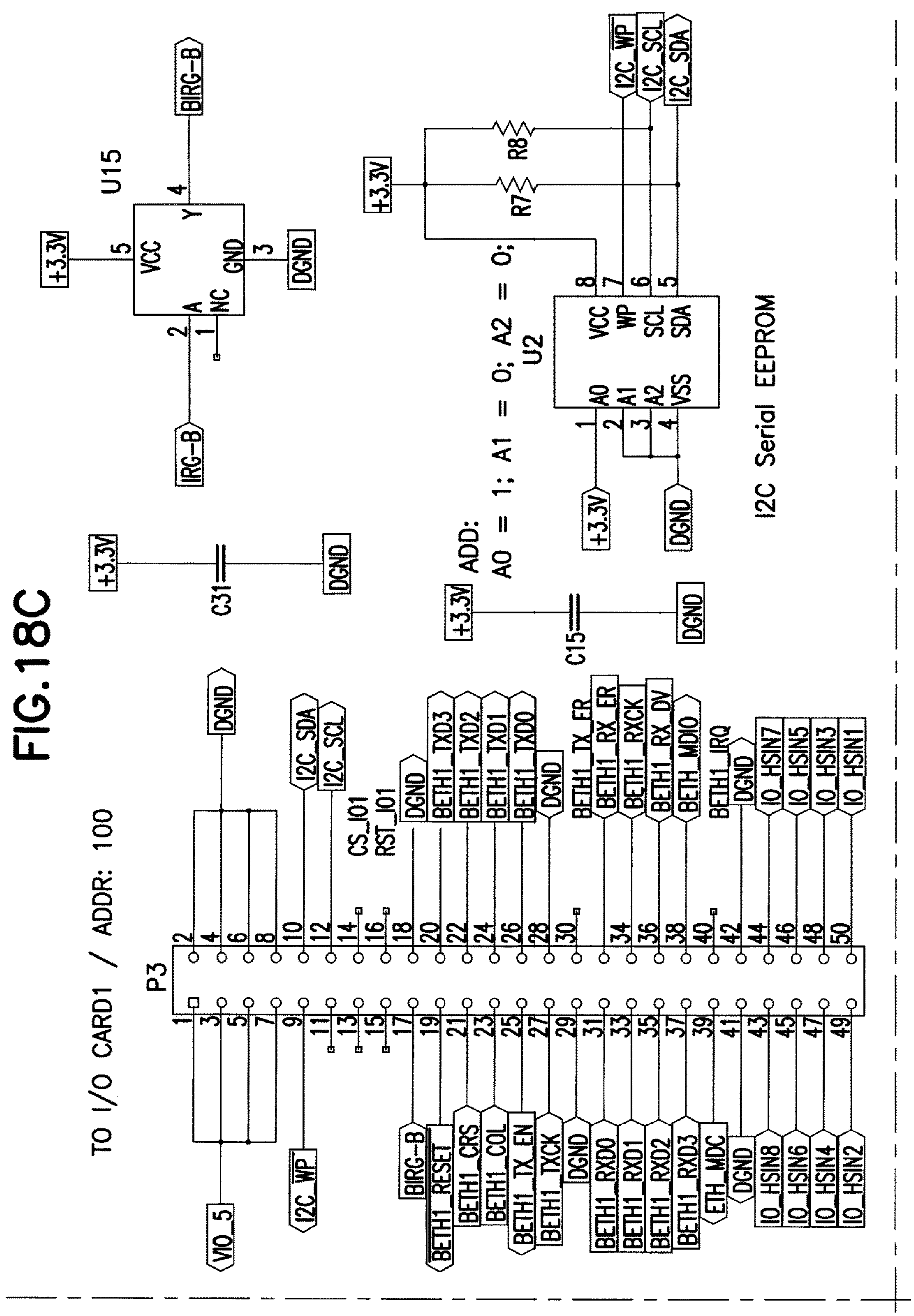
Figure 18D:
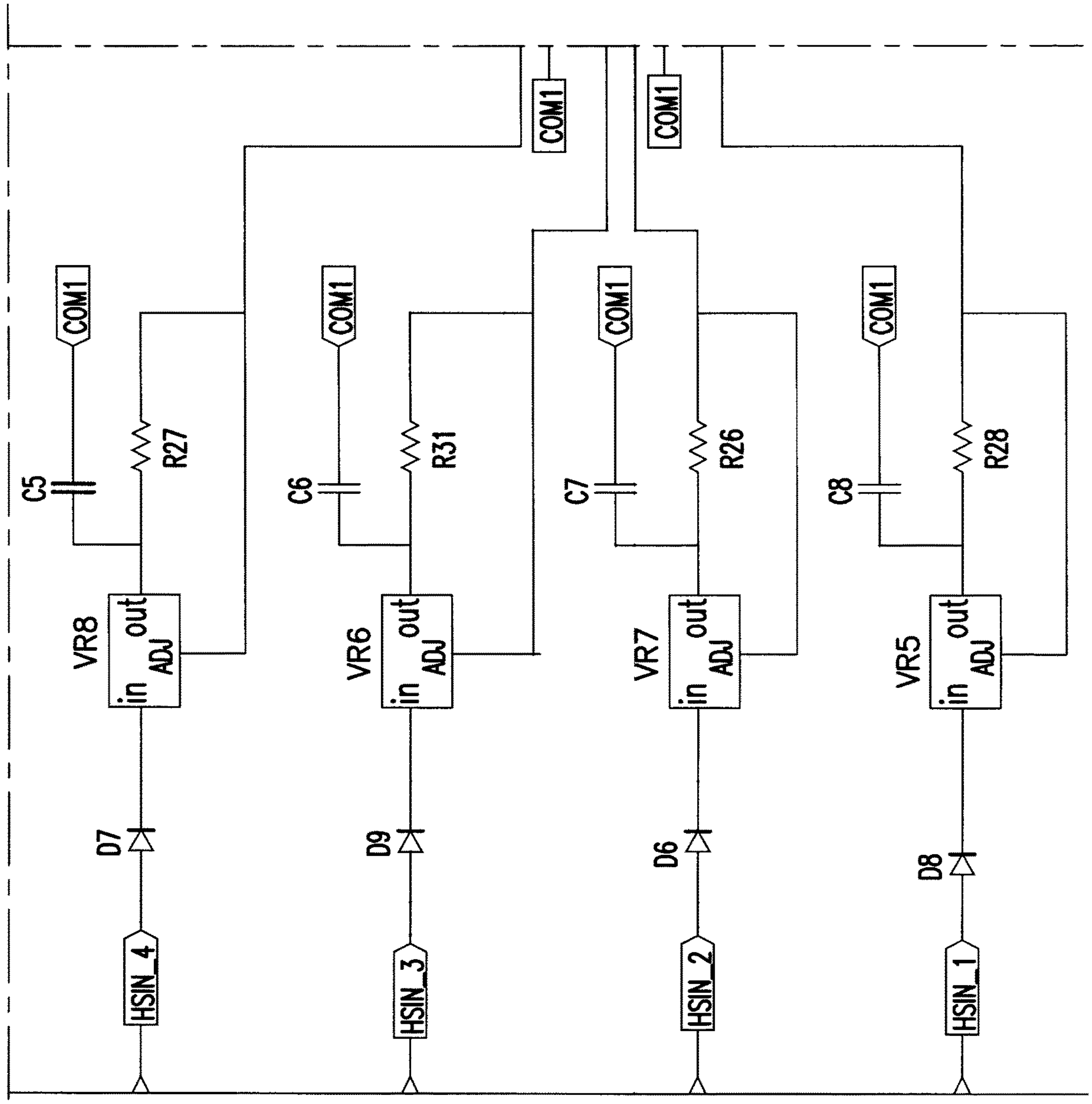
Figure 18E:
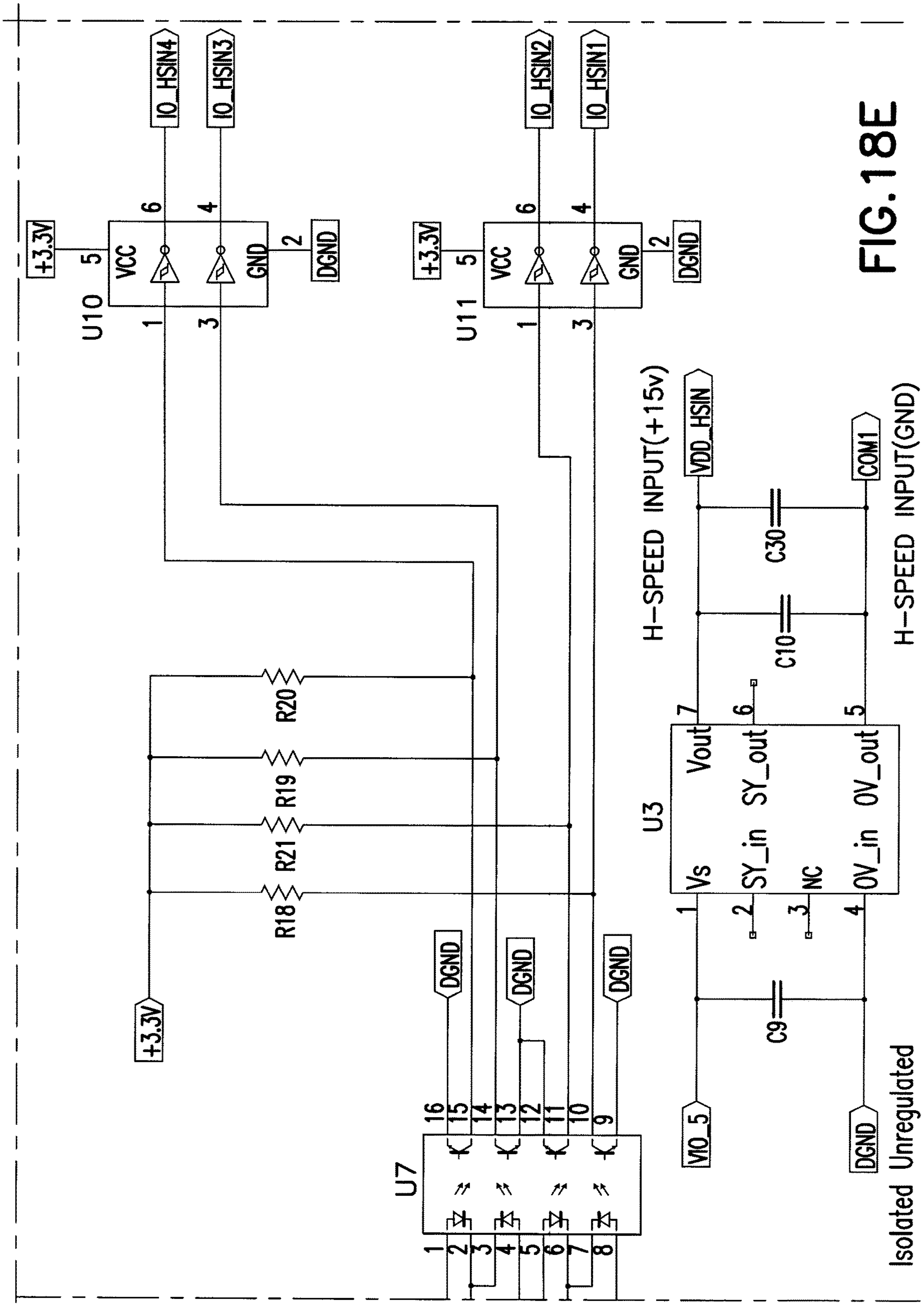
Figure 18F:
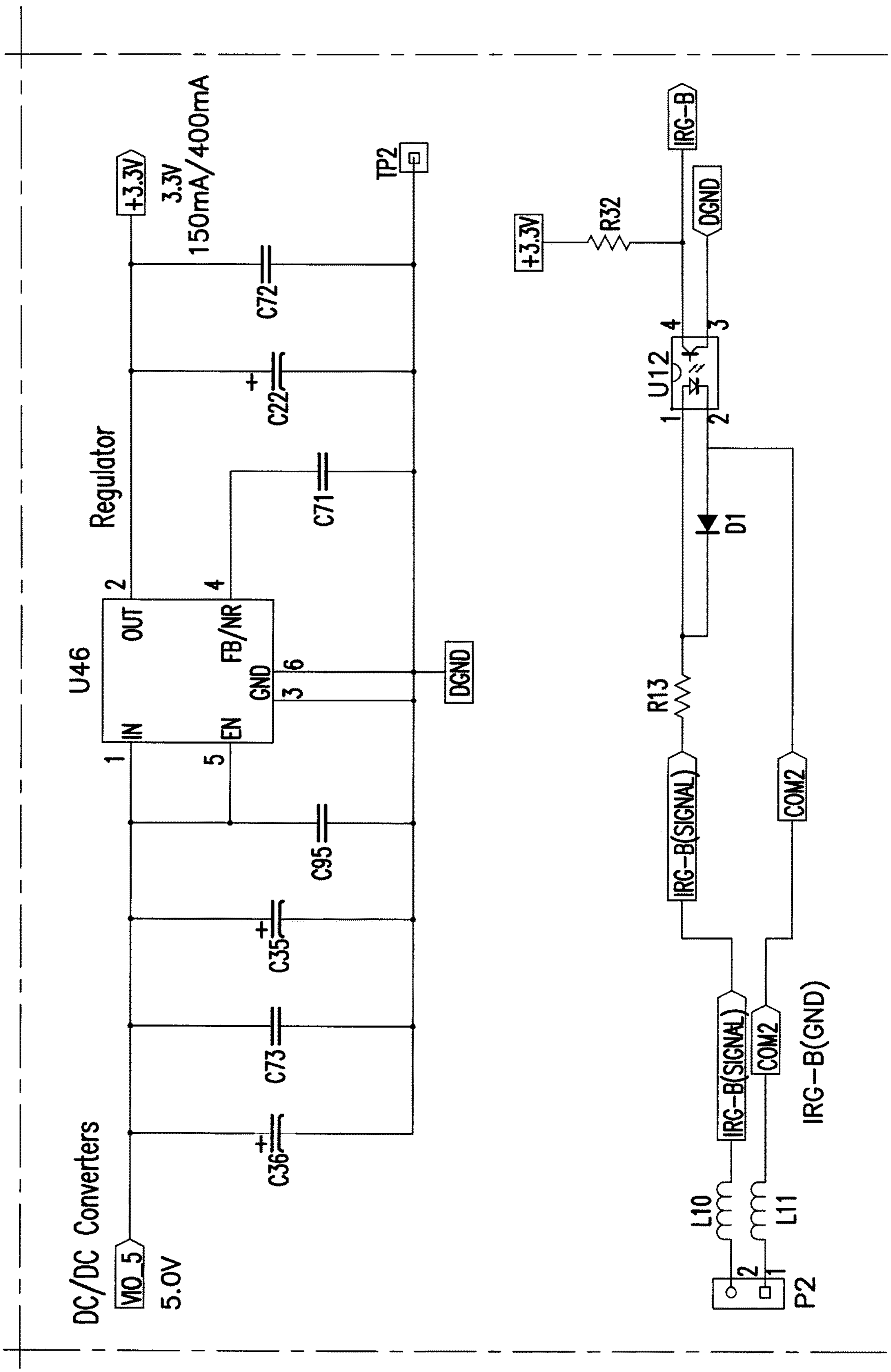
Figure 19A:
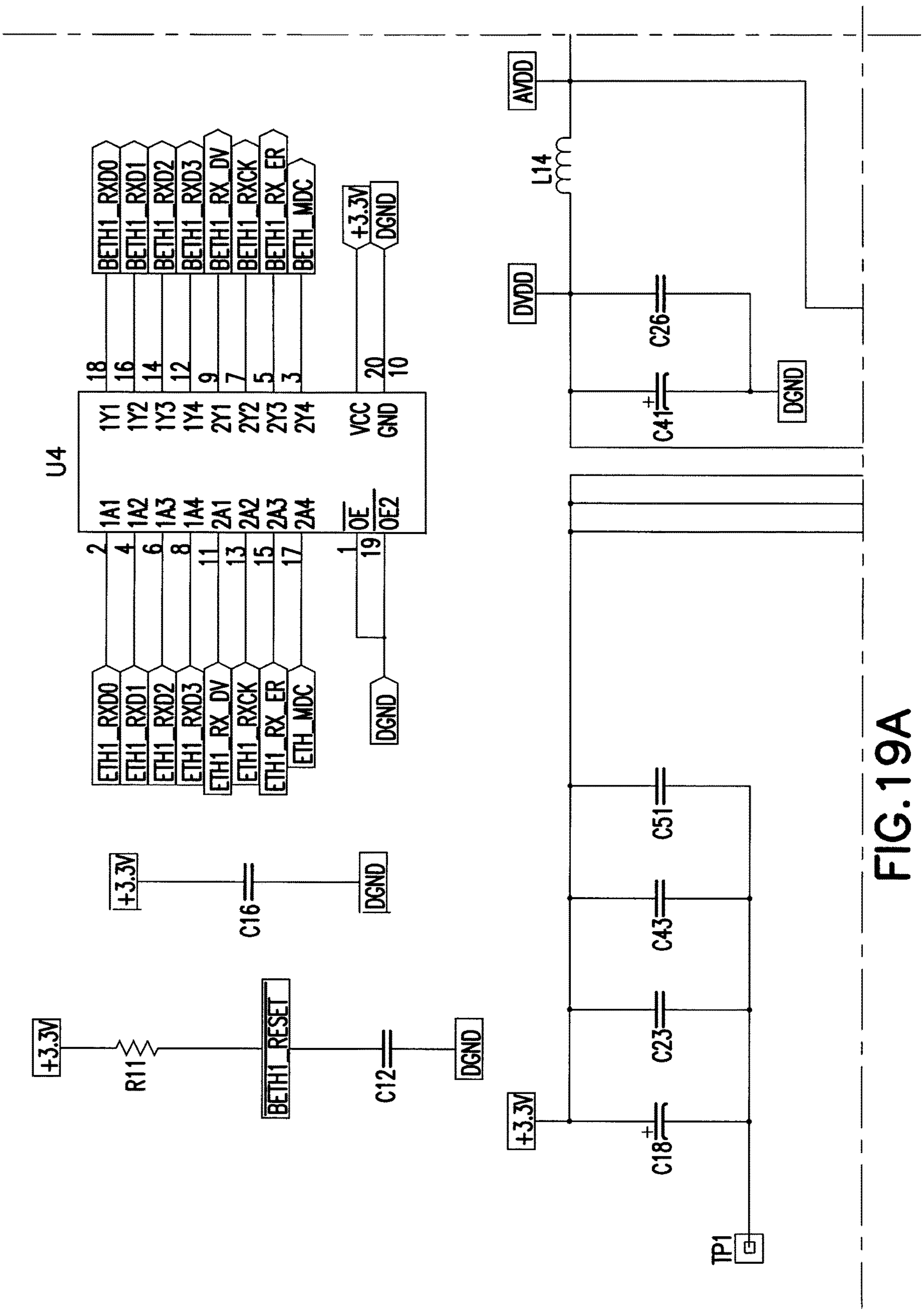
FIG. 19 illustrates how FIGS. 19A, 19B, 19C, 19D and 19E would fit together in order to form a single view of a schematic drawing of a portion of an IED of the present disclosure.
Figure 19B:
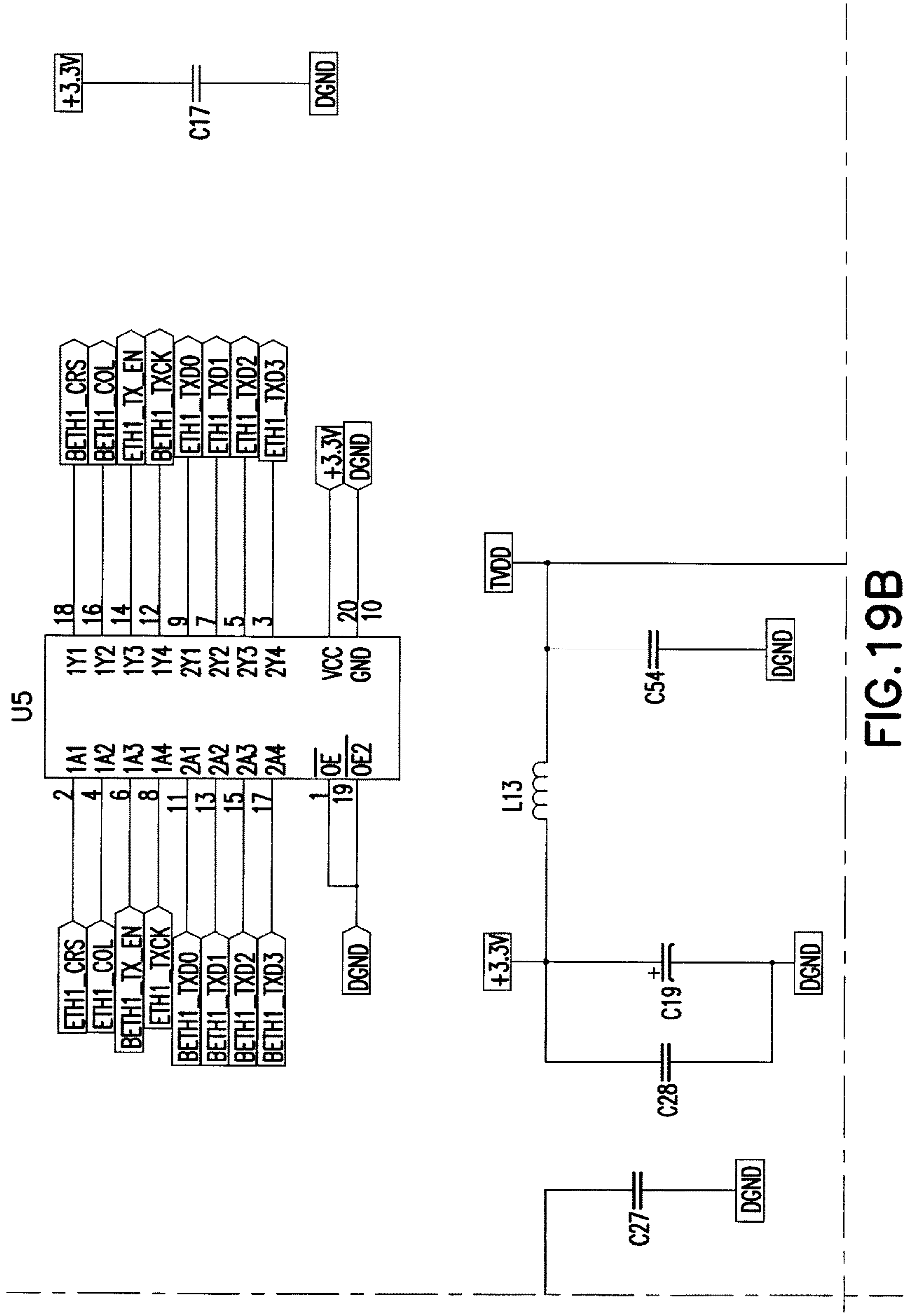
Figure 19C:
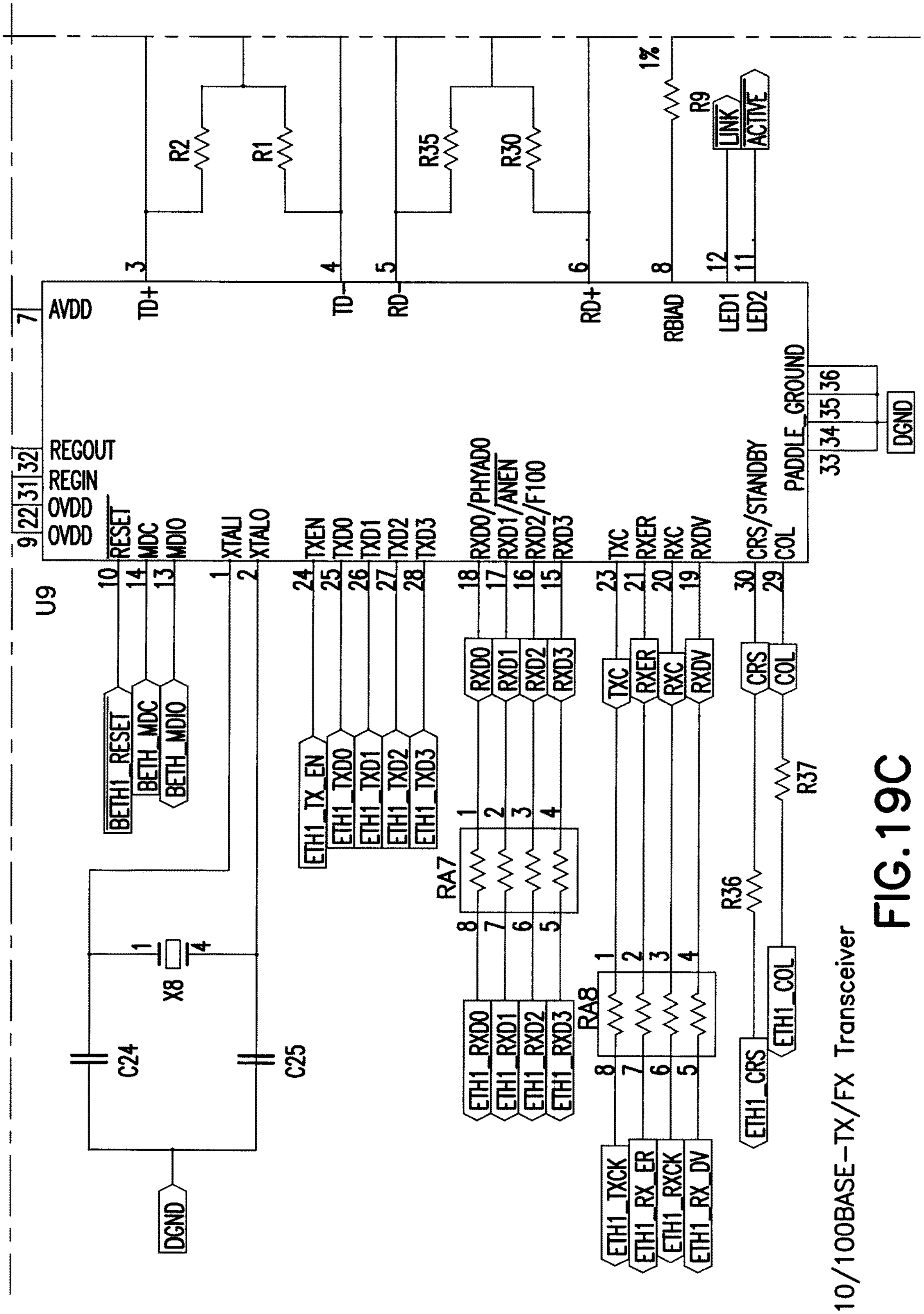
Figure 19D:
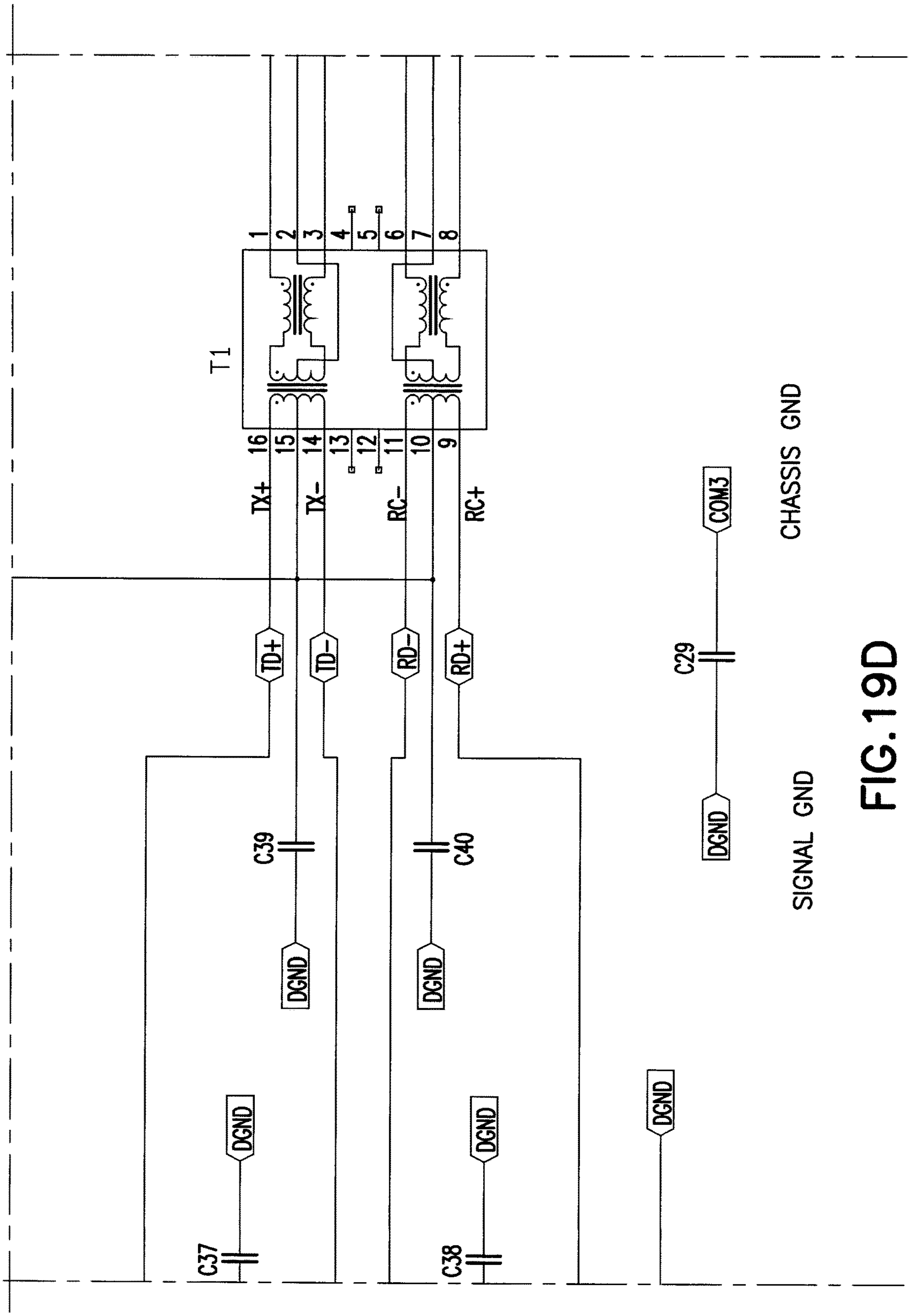
Figure 19E:
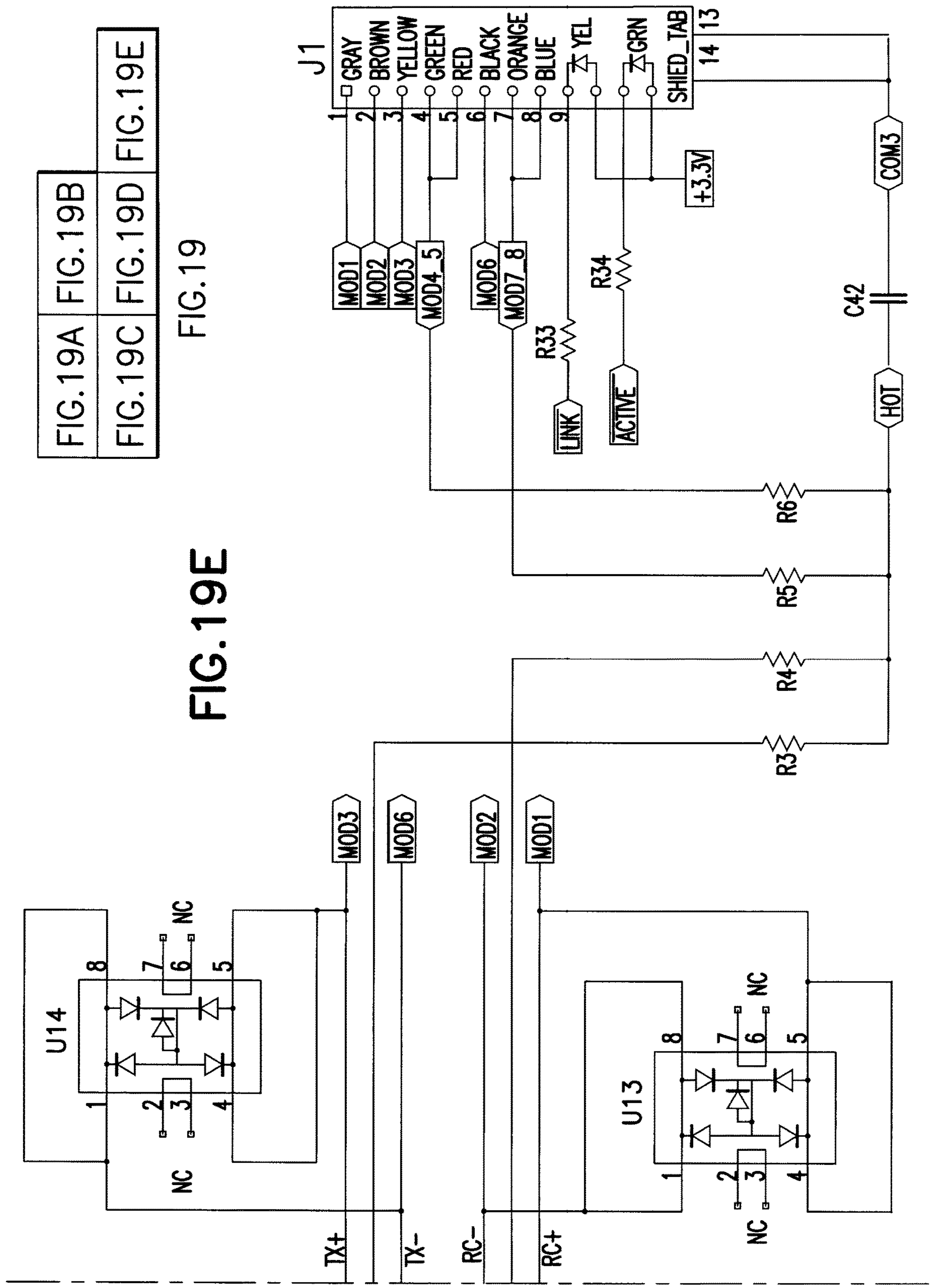

FIGS. 18A, 18B, 18C, 18D, 18E AND 18F of FIG. 18 illustrate the high speed digital input circuitry, an Ethernet connector, $I^2C$ serial EEPROM, voltage regulators and an IRIG-B interface.

Figure 2B:
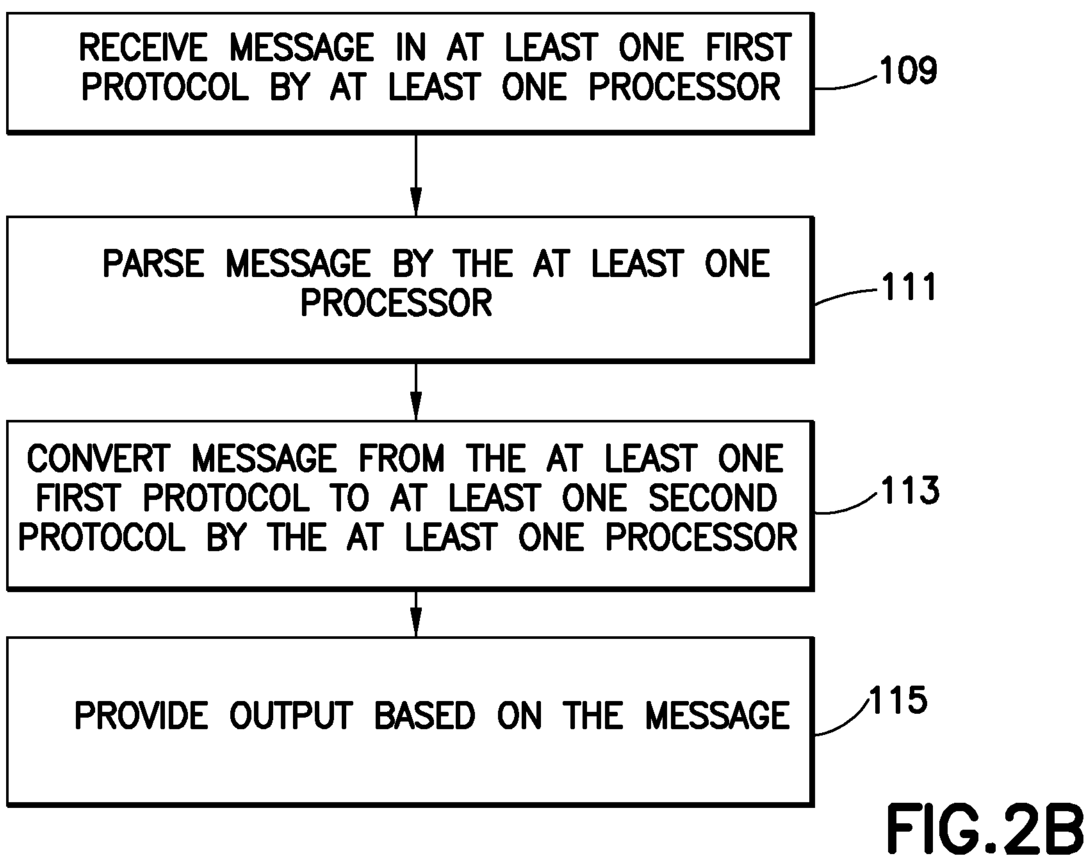
FIG. 2B is a flow chart of another method executed by the at least one processor of FIG. 2.

FIGS. 19A, 19B, 19C, 19D, and 19E of FIG. 19 illustrate Ethernet circuitry and buffers and a first 10/100 Base-TX/FX transceiver. The Ethernet circuitry allows the meter to send communications to other computers such as PCs, cell phones, building management systems, remote terminal units, other IEDs or other similar types of systems. Using the Ethernet technology, the IED will be able to send or receive emails consisting of user alarms, new firmware updates or any other desired data as attachments to the email. In addition, the Ethernet card will have capabilities of communicating data via HTTP, Modbus TCP, FTP, XML and SNMP. The SNMP allows data to be transferred to building managements systems and other types of software solutions. For example, FIG. 2B illustrates a flow chart of a method executed by at least one of the processors described above in relation to FIGS. 1 and 2 for converting data to employ the various protocols described above. In step 109, the at least one processor receives a message in at least one first protocol; parses the message, step 111; converts the message from the at least one first protocol to at least one second protocol, step 113; and provides an output based on the message, step 115.

Simple Network Management Protocol (SNMP) is a tool used to monitor any network device configured with a SNMP agent software. In this case, the SNMP protocol will be embedded into the IED and be available via the Ethernet circuitry disclosed in FIGS. 19A, 19B, 19C, 19D and 19E.

This is traditionally used for monitoring network infrastructure devices but in this case, the protocol is being adapted to utilize the existing infrastructure to allow the IED to report alarms and data via this infrastructure. The SNMP agent, which is an optional component of MICROSOFT™ Windows Server application, interacts with third-party SNMP management software to enable the flow of network status information between monitored devices and applications and the management systems that monitor them. Within this environment, the IED will report back additional data such as instantaneous readings, alarms and/or outages. Moreover, this protocol could be extended to allow a windowing of data so that actual captured waveforms, historical logs, or email messages as disclosed herein can be transferred through the SNMP architecture.

SNMP has the best utility in environments that include large networks with hundreds or thousands of nodes that would otherwise be difficult and costly to monitor. SNMP allows monitoring of network devices such as servers, workstations, printers, routers, bridges, and hubs, as well as services such as Dynamic Host Configuration Protocol (DHCP) or Windows Internet Name Service (WINS).

In addition to sending data via SNMP, the meter will also be configured to be a Modbus TCP slave device in which a client application or other software can request Modbus TCP data simultaneously. The IED will have intelligence to parse Modbus TCP commands by reading the command and interpreting the message and providing an output specific to the requested command. Utilizing this technique, the meter will be able to parse Modbus TCP on one or more open virtual channels (sockets) through the Ethernet port. Thus, multiple users can send Modbus TCP commands to the IED and the IED will be one of them separately and return the appropriate answer. Unique to the present disclosure, the meter will also be able to provide data using the SNMP architecture while continuing to communicate via Modbus TCP. This is performed utilizing software resident in at least one processor in the IED. The importance this multiplexing architecture is that it allows the meter to communicate via Modbus while sending data via SNMP. A common use for Modbus TCP is to communicate to PC software and power monitoring servers. In conventional meters not employing the techniques of the present disclosure, the IED would be required to stop communicating with one application to feed data to another. The meter of the present disclosure allows both to be accomplished simultaneously. Moreover, it is envisioned by the present disclosure that other communications may also be added to this multiplexing architecture such as emails, FTP, DNP over Ethernet, IEC 61850 or any other serial, serial encapsulated or native Ethernet protocol.

Figure 20:
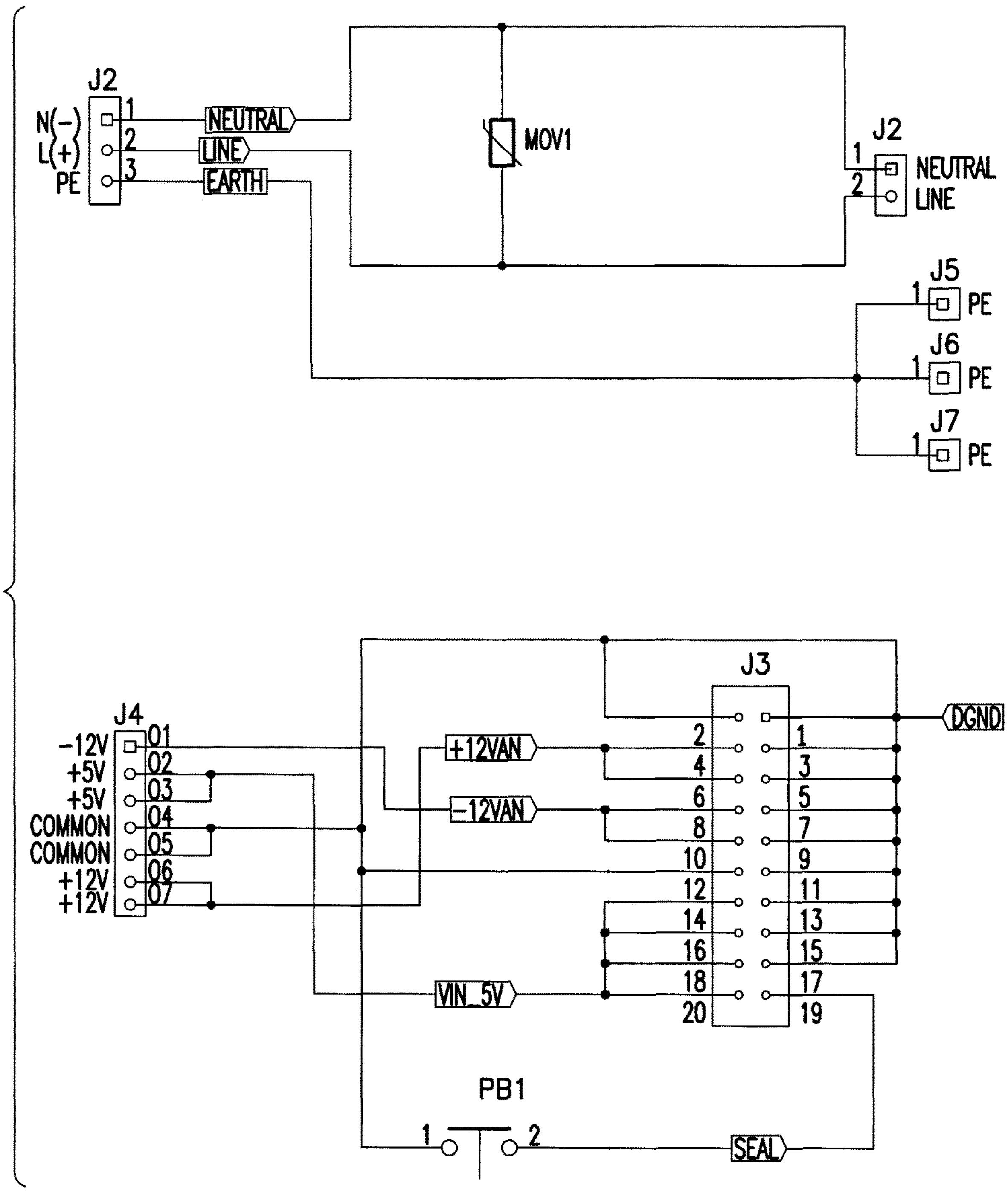
FIG. 20 illustrates a single view of a schematic drawing of a portion of an IED of the present disclosure.
Figure 21A:
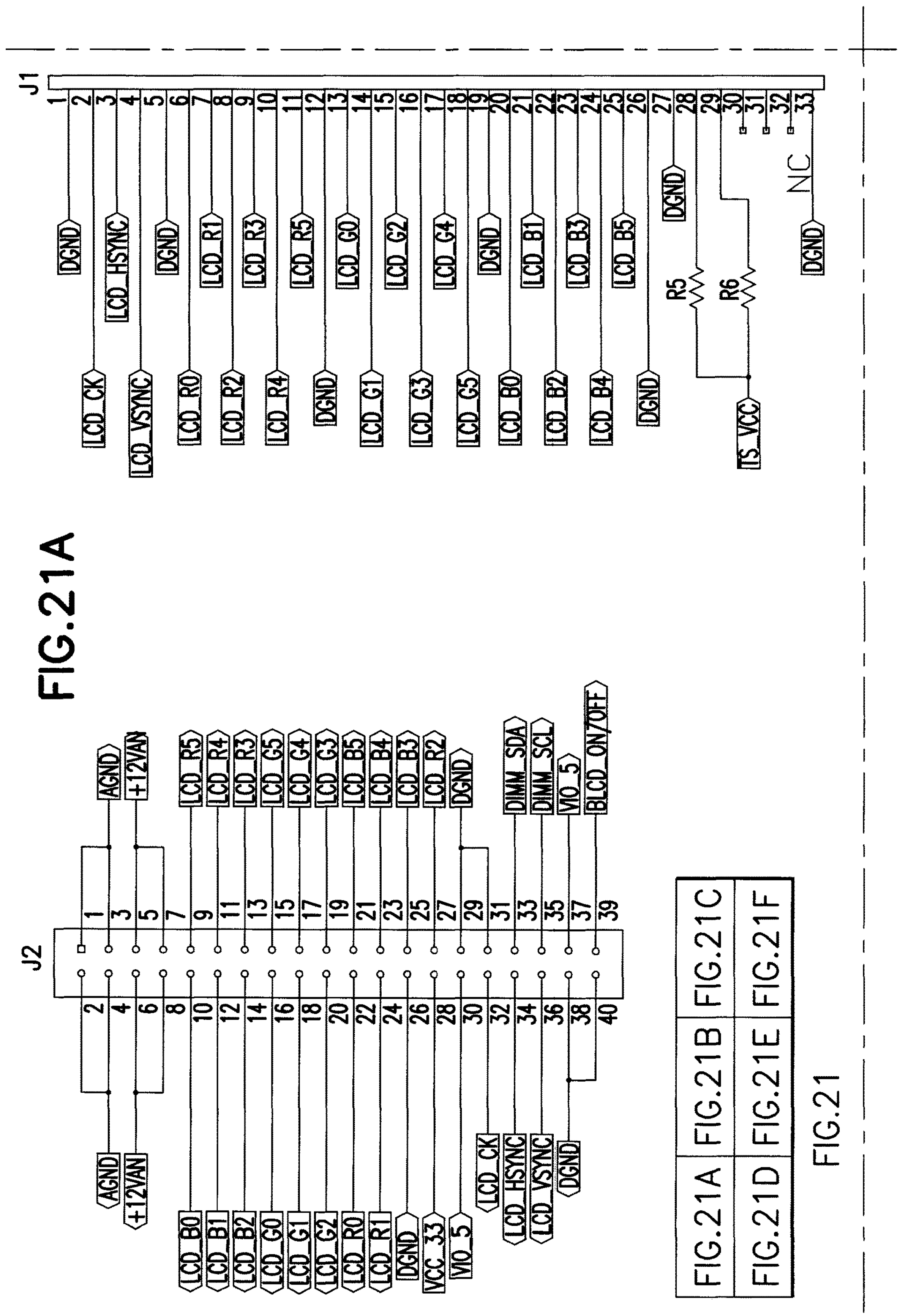
FIG. 21 illustrates how FIGS. 21A, 21B, 21C, 21D, 21E and 21F would fit together in order to form a single view of a schematic drawing of a portion of an IED of the present disclosure.
Figure 21B:
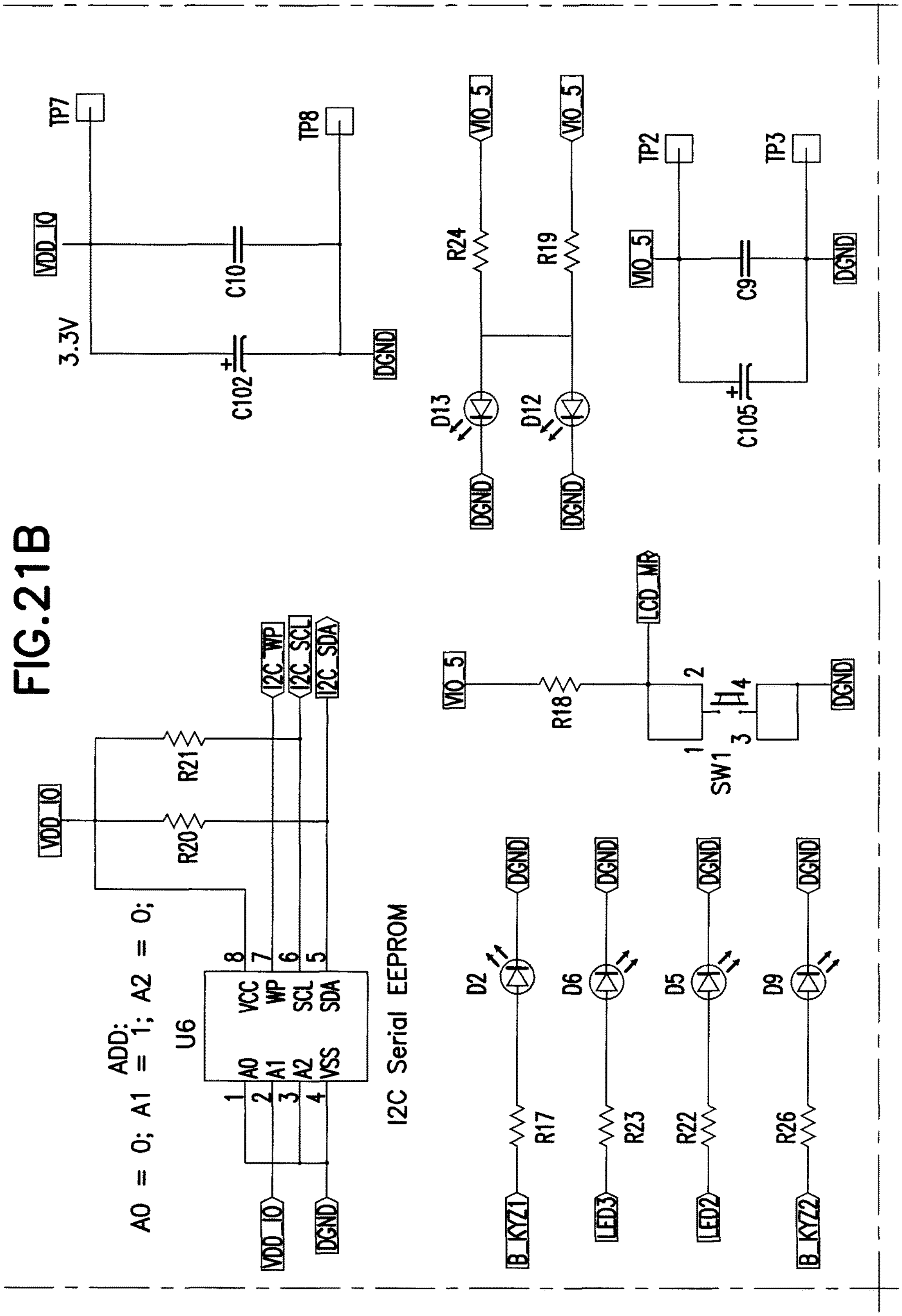
Figure 21C:
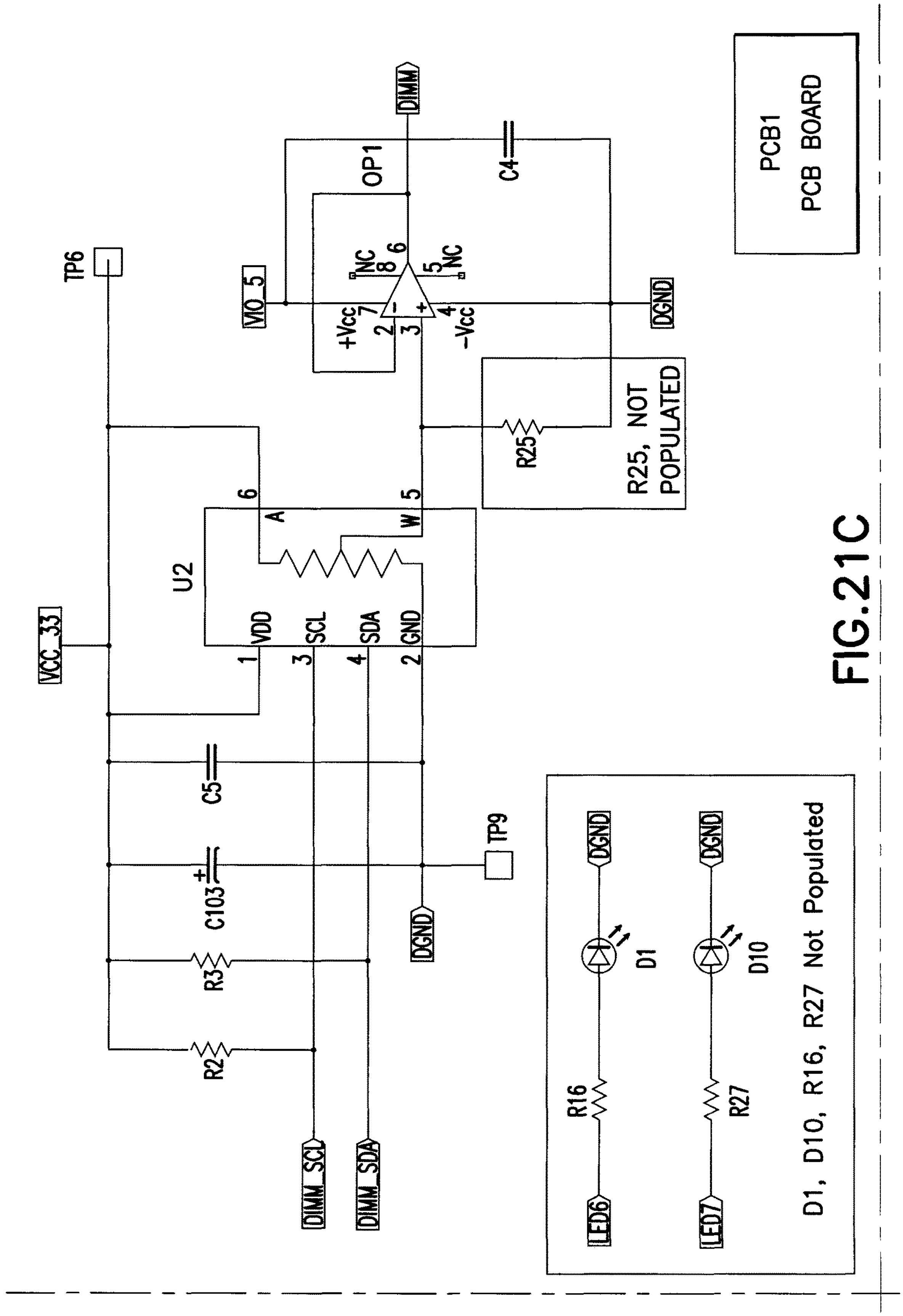
Figure 21D:
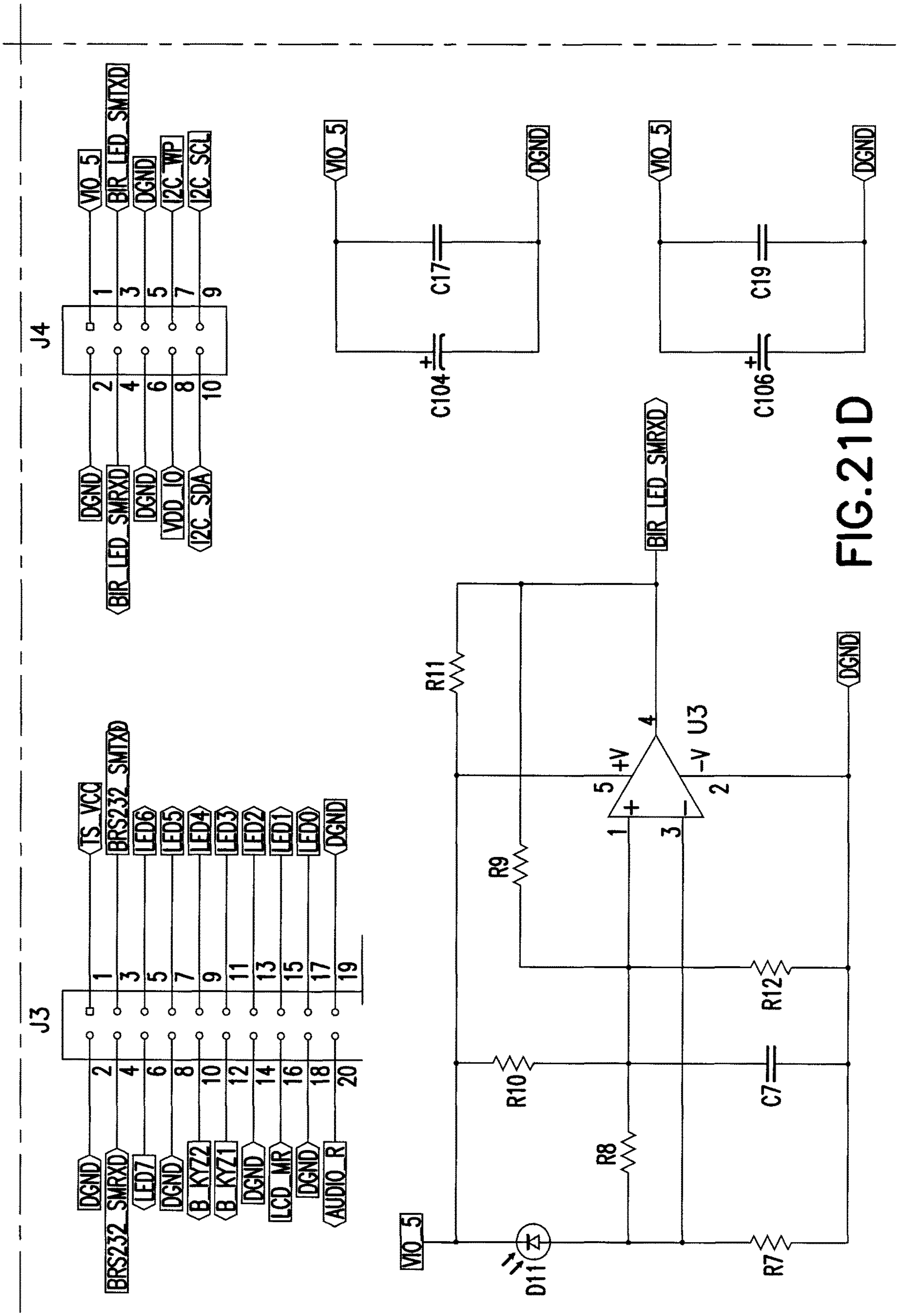
Figure 21E:
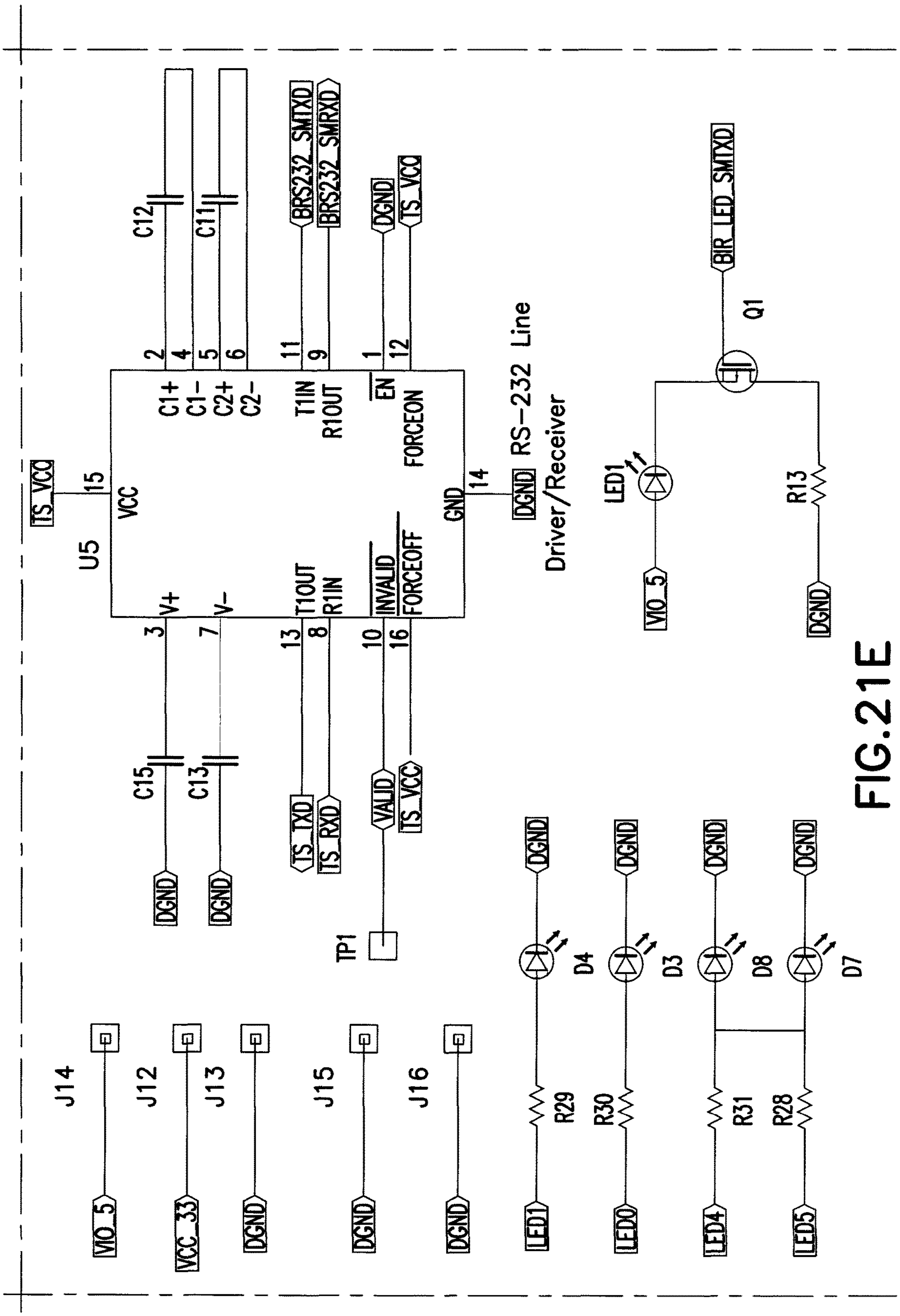
Figure 21F:
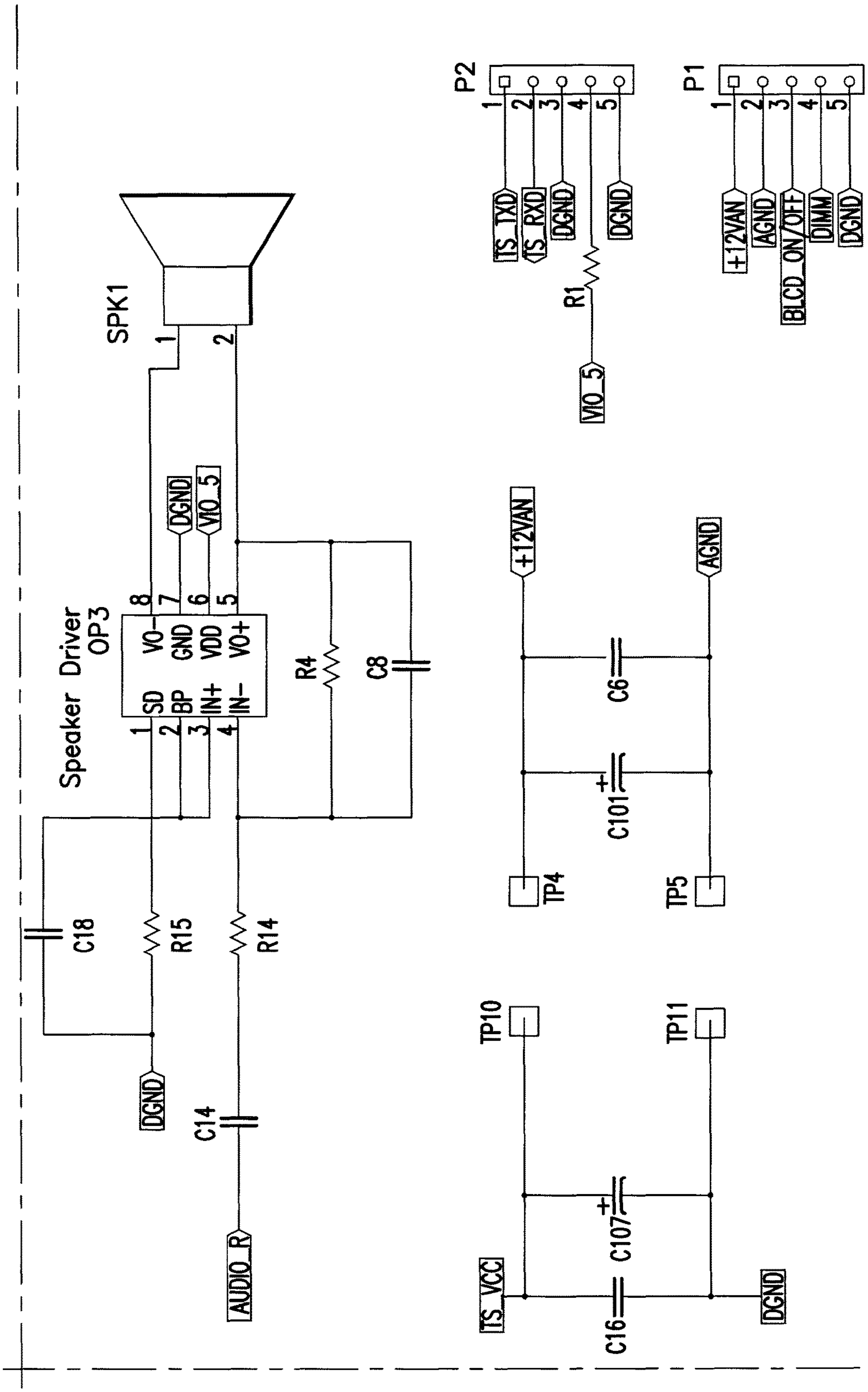

FIG. 20 illustrates a main power supply interface board.

FIGS. 21A, 21B, 21C, 21D, 21E and 21F of FIG. 21 illustrates a front panel interface board.

Figure 22A:
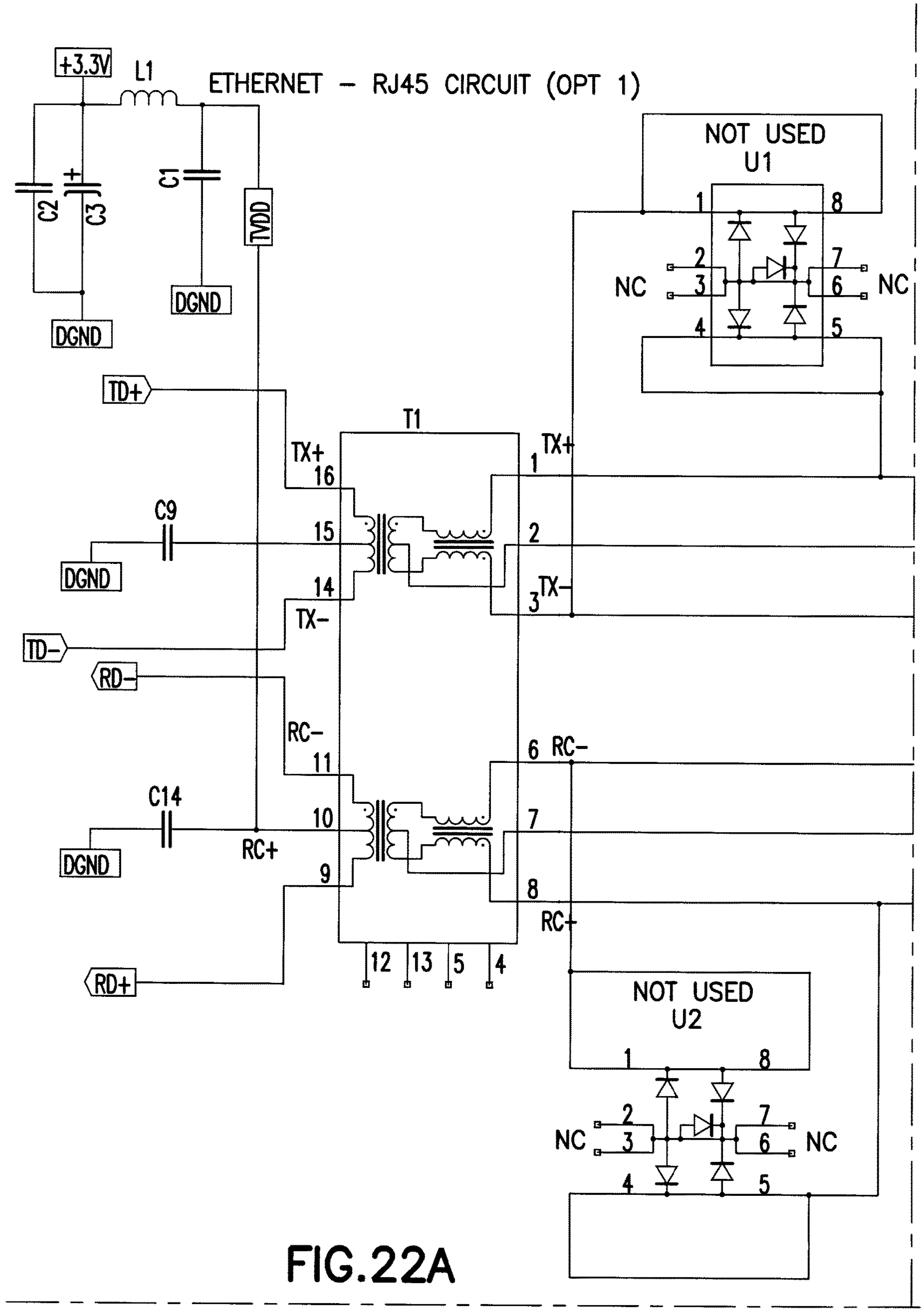
FIG. 22 illustrates how FIGS. 22A, 22B, 22C, 22D and 22E would fit together in order to form a single view of a schematic drawing of a portion of an IED of the present disclosure.
Figure 22B:
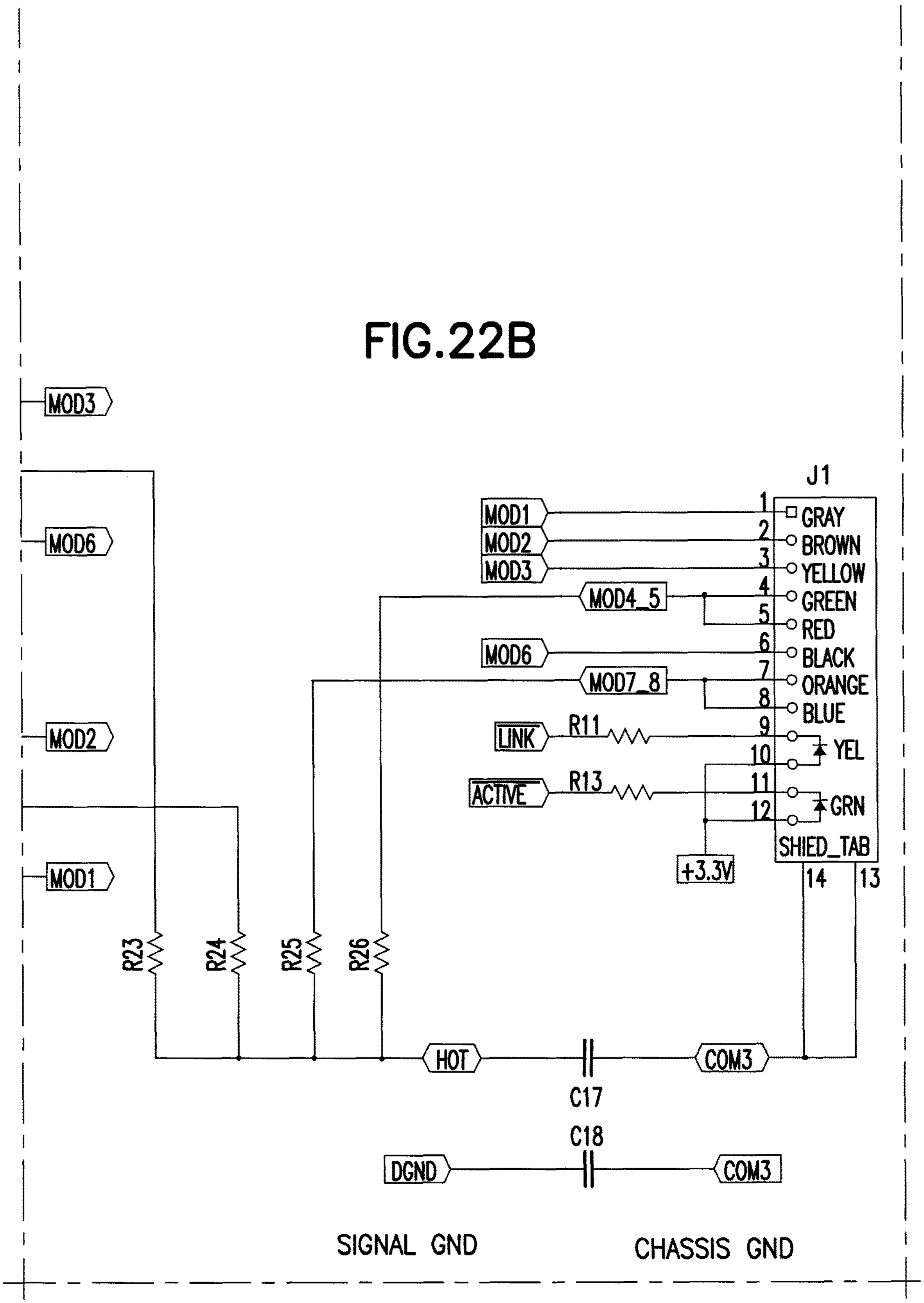
Figure 22C:
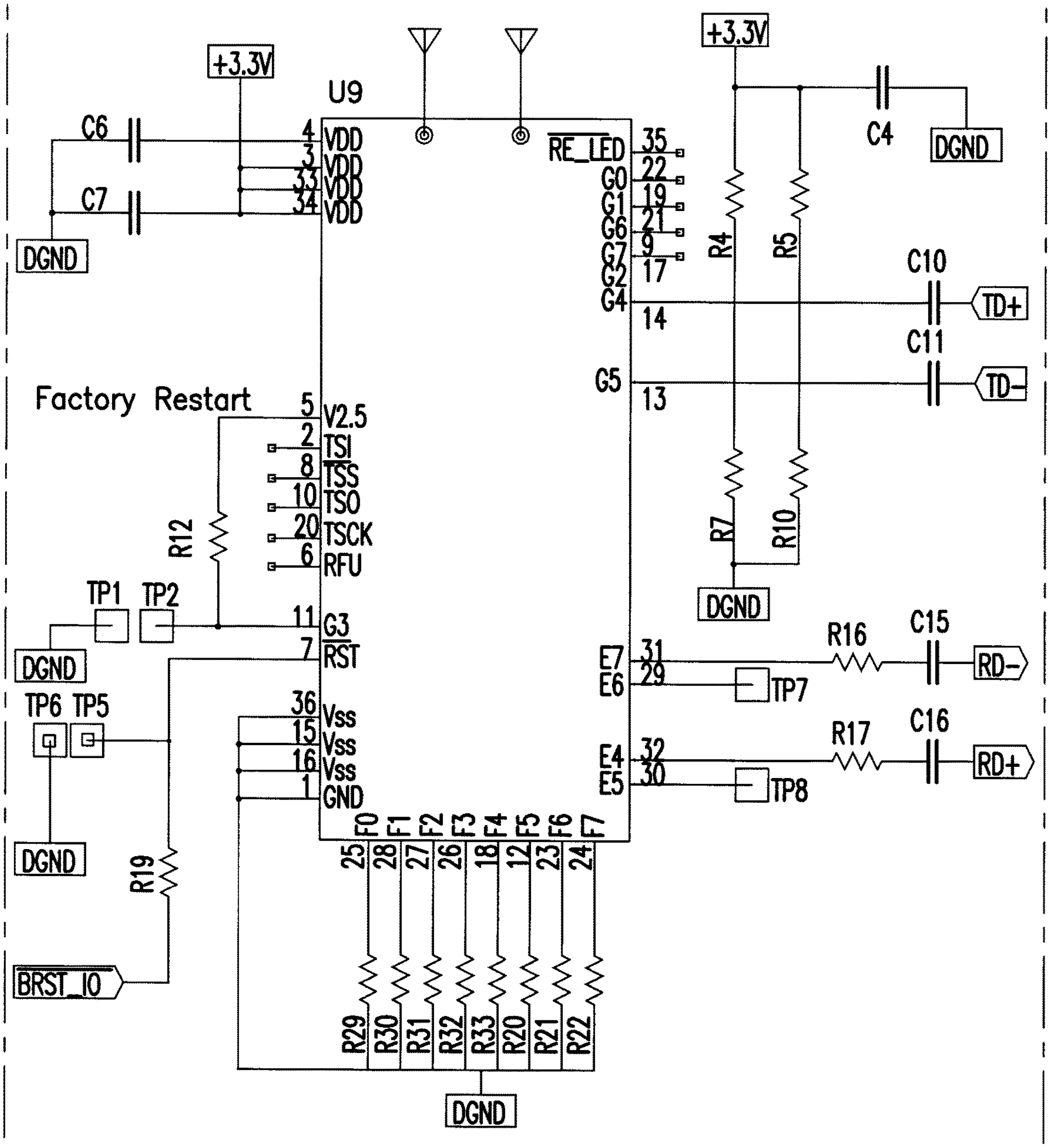
Figure 22D:
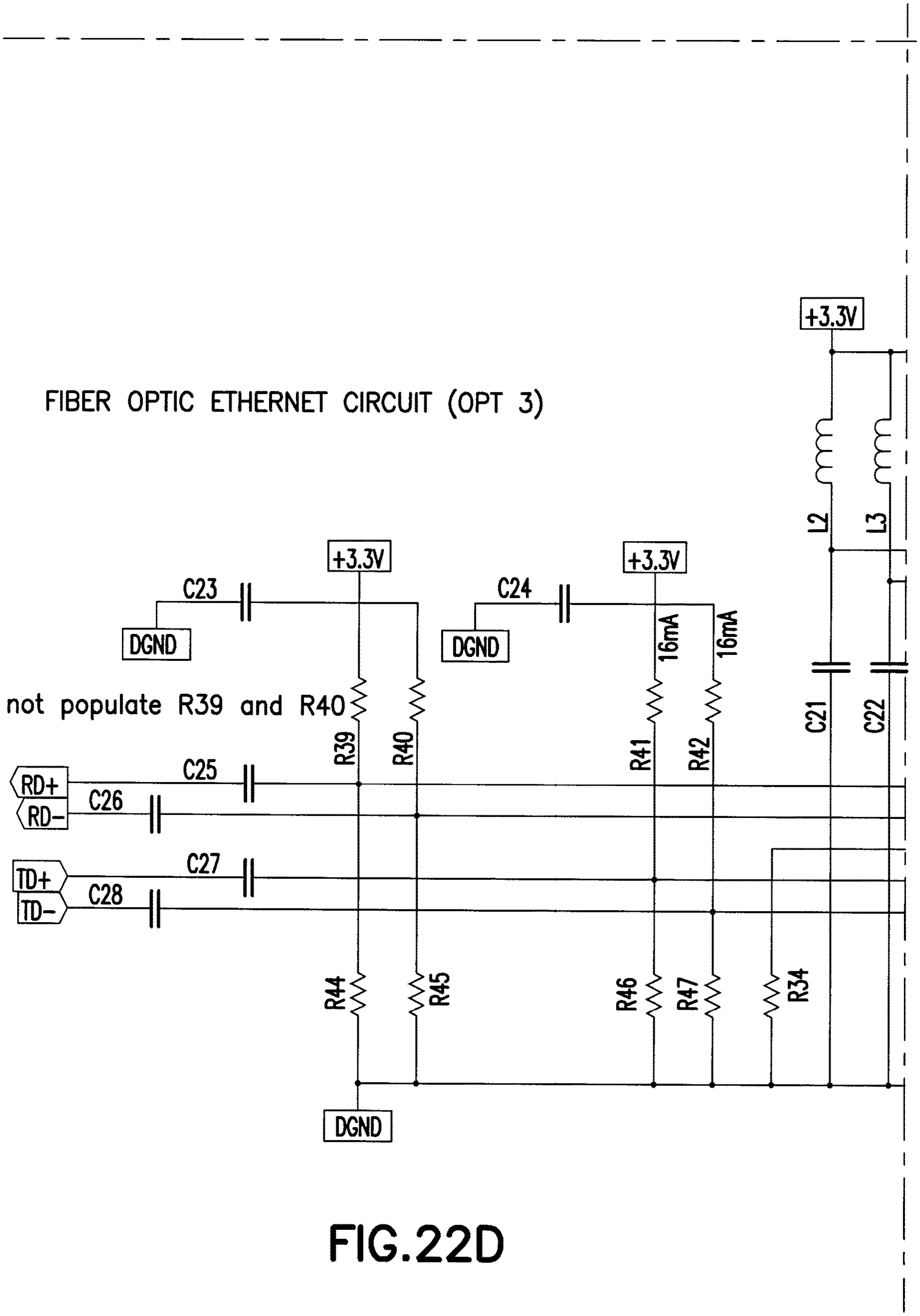
Figures 22, 22E:
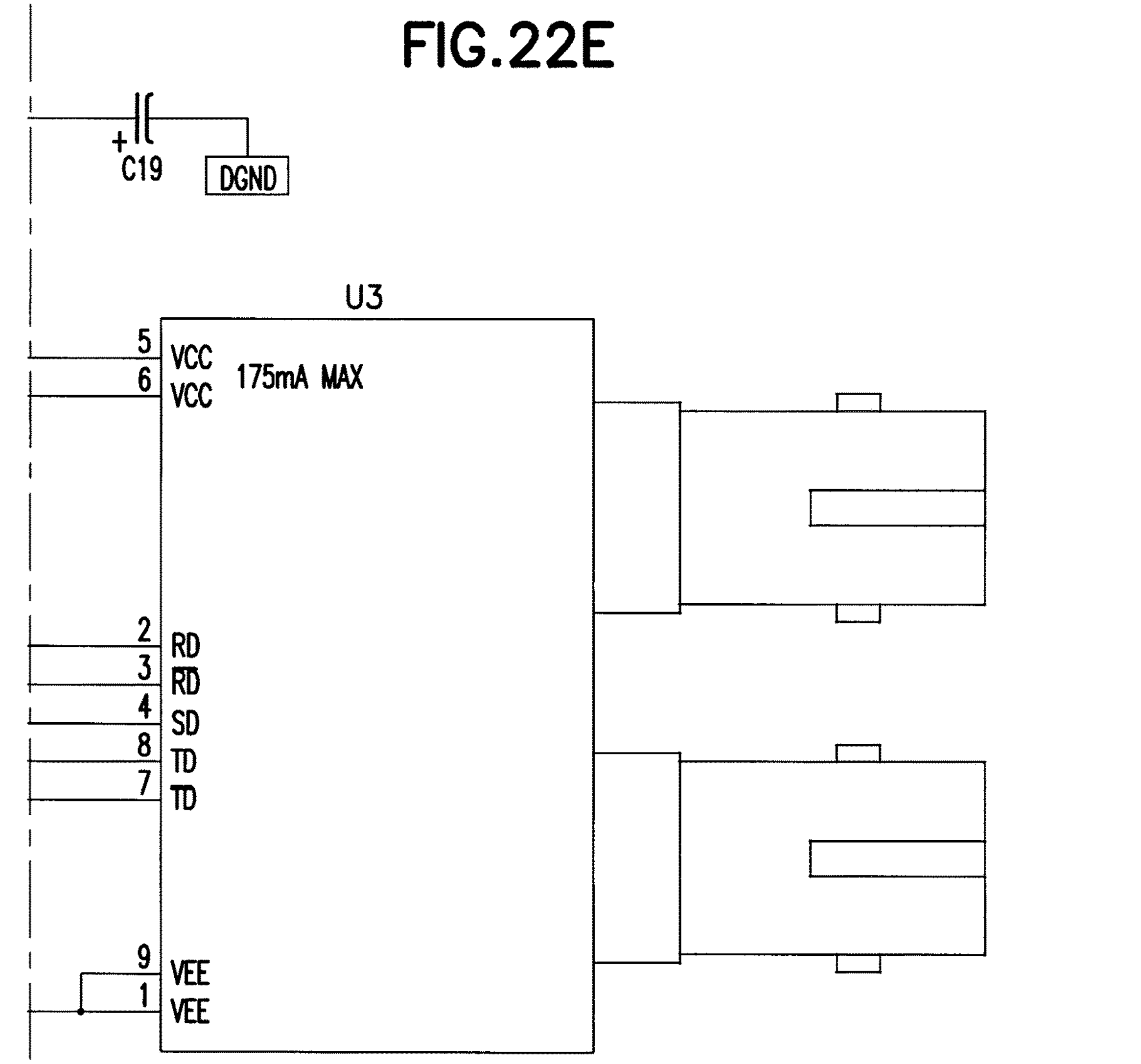

FIGS. 22A, 22B, 22C, 22D, and 22E of FIG. 22 illustrate various outputs of the network board including a RJ46 option (FIG. 22A); fiber optic options (FIGS. 22D and 22E); and a wireless option, e.g. 802.11 (FIGS. 22B and 22C).

Figures 23, 23A:
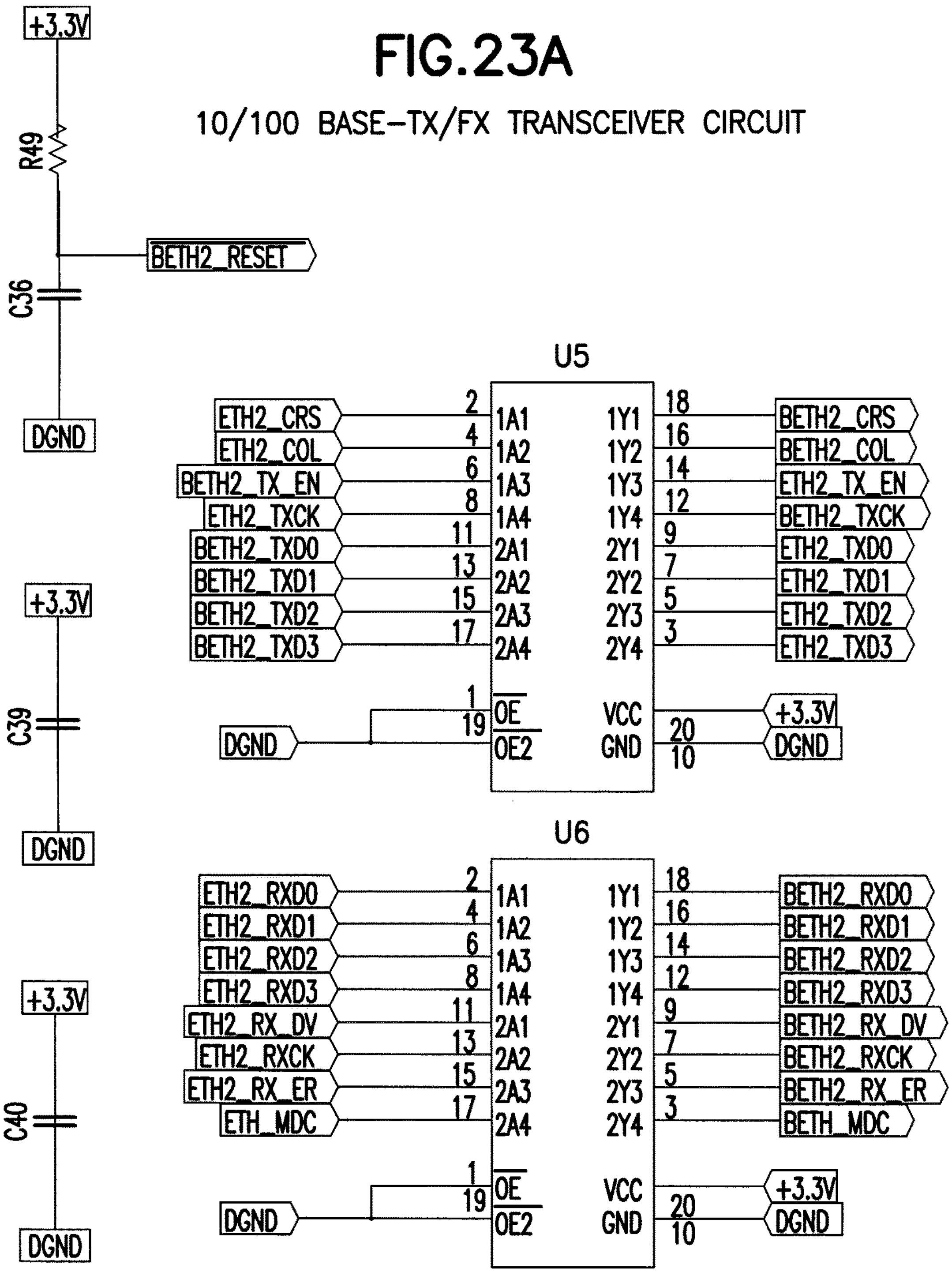
FIG. 23 illustrates how FIGS. 23A, 23B, 23C and 23D would fit together in order to form a single view of a schematic drawing of a portion of an IED of the present disclosure.
Figure 23B:
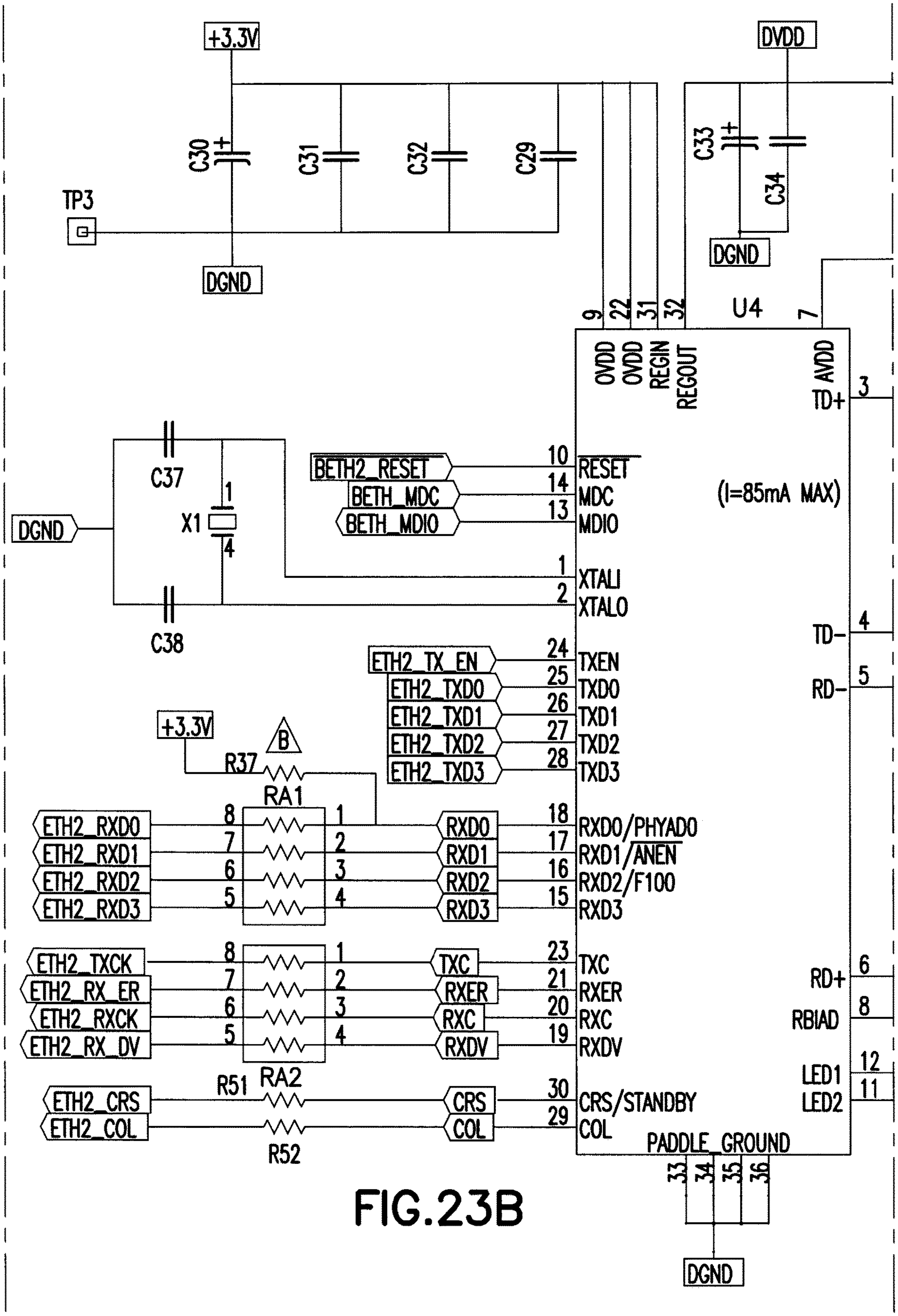
Figure 23C:
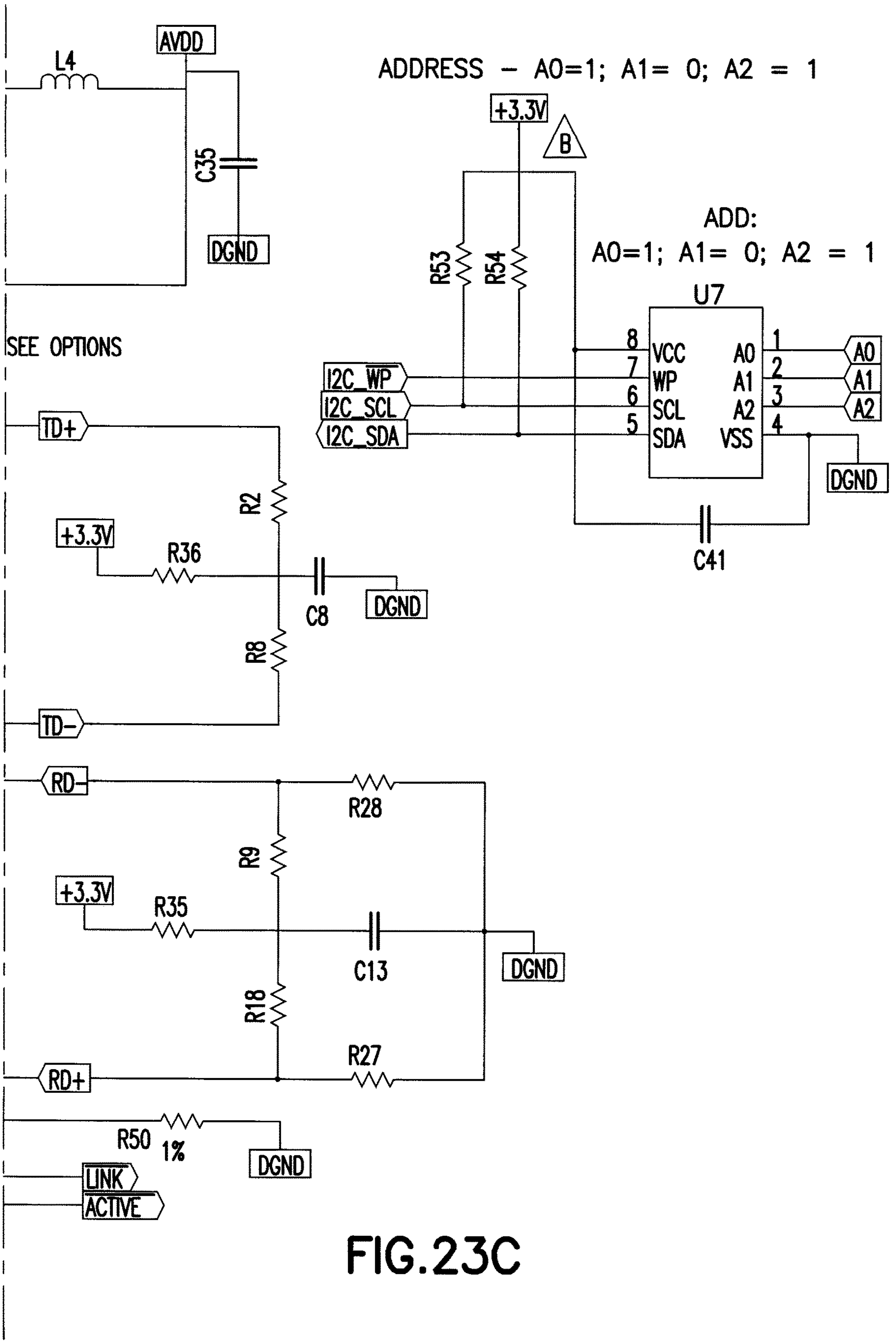
Figure 23D:
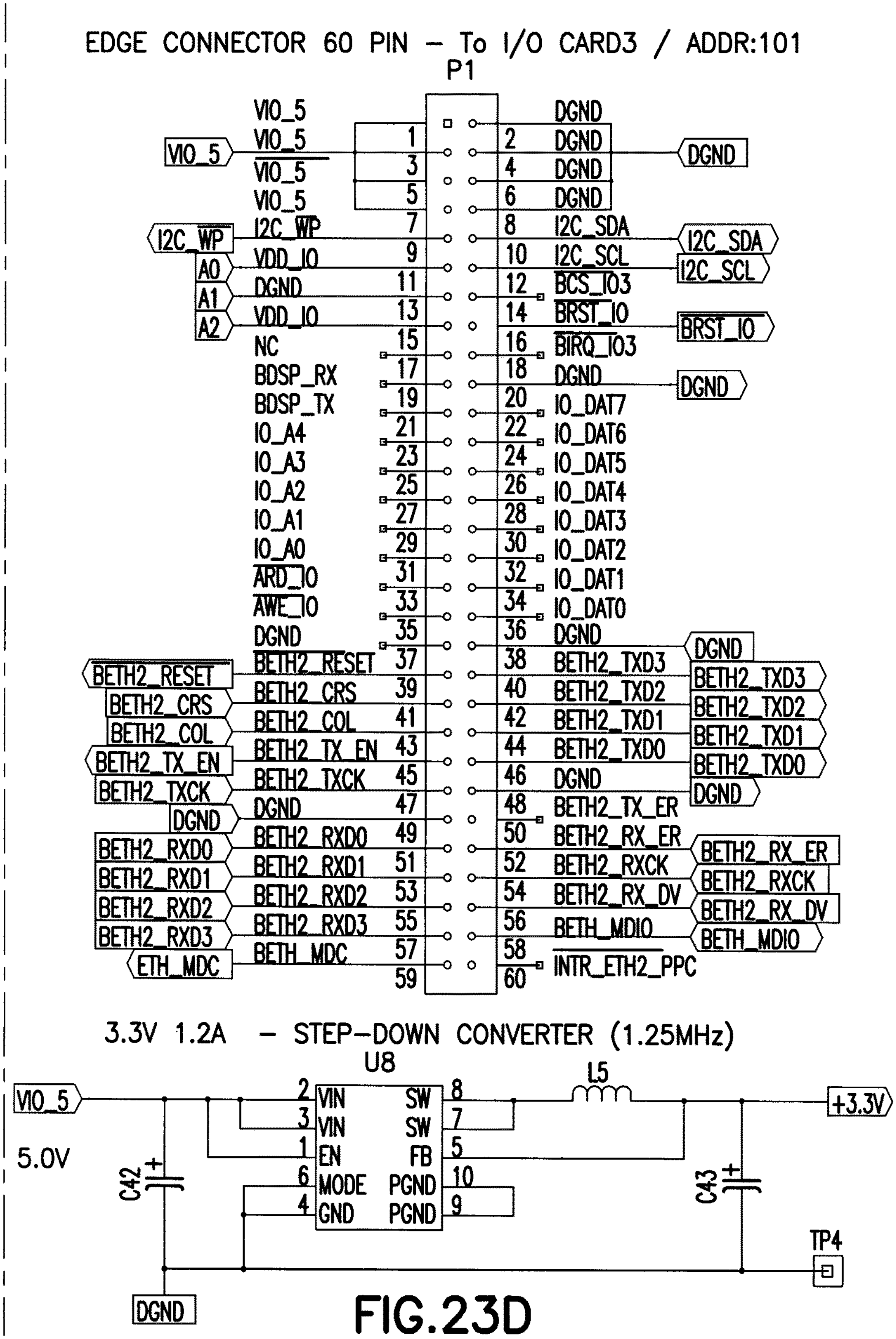
Figure 24A:
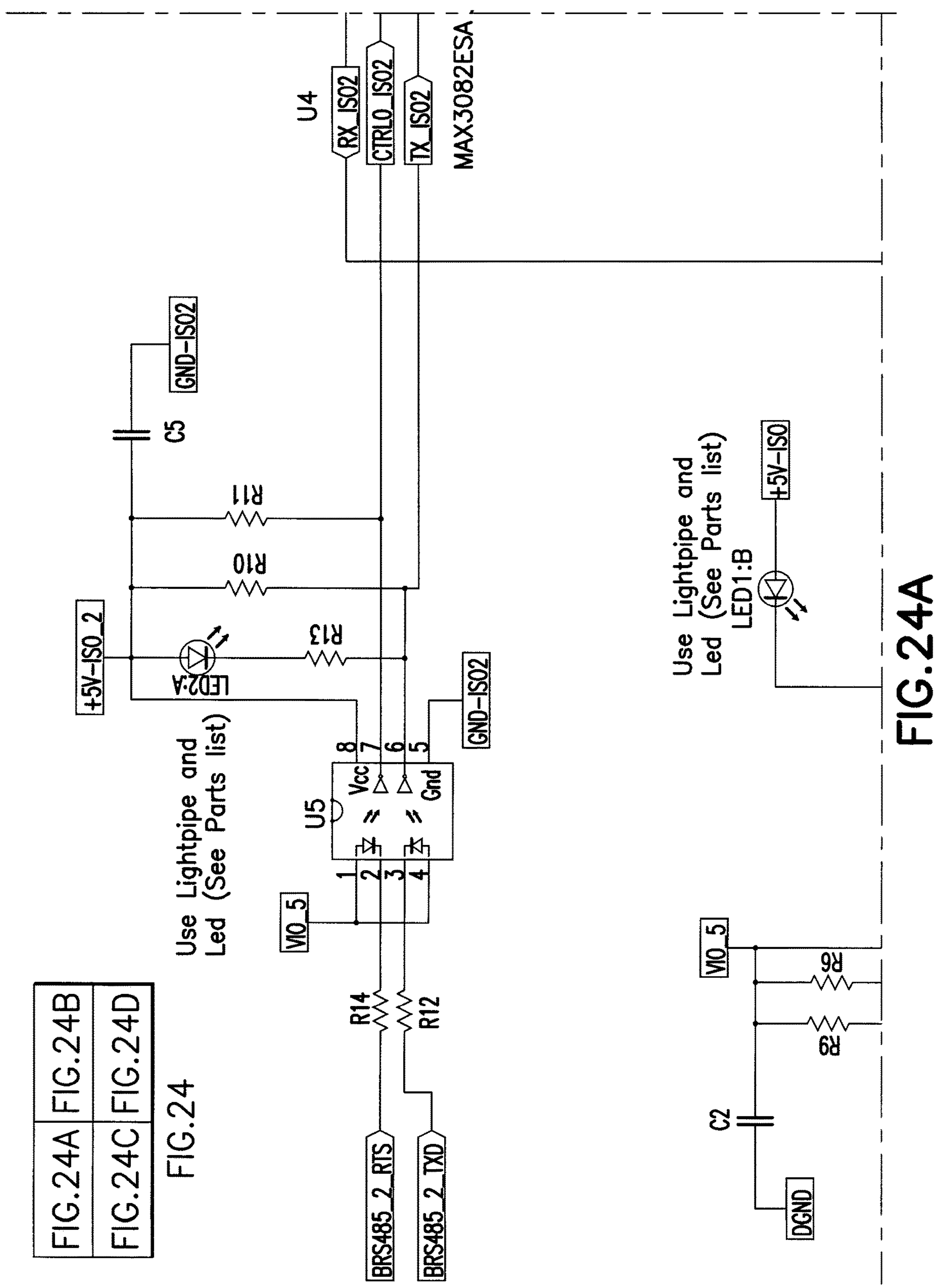
FIG. 24 illustrates how FIGS. 24A, 24B, 24C and 24D would fit together in order to form a single view of a schematic drawing of a portion of an IED of the present disclosure.
Figure 24B:
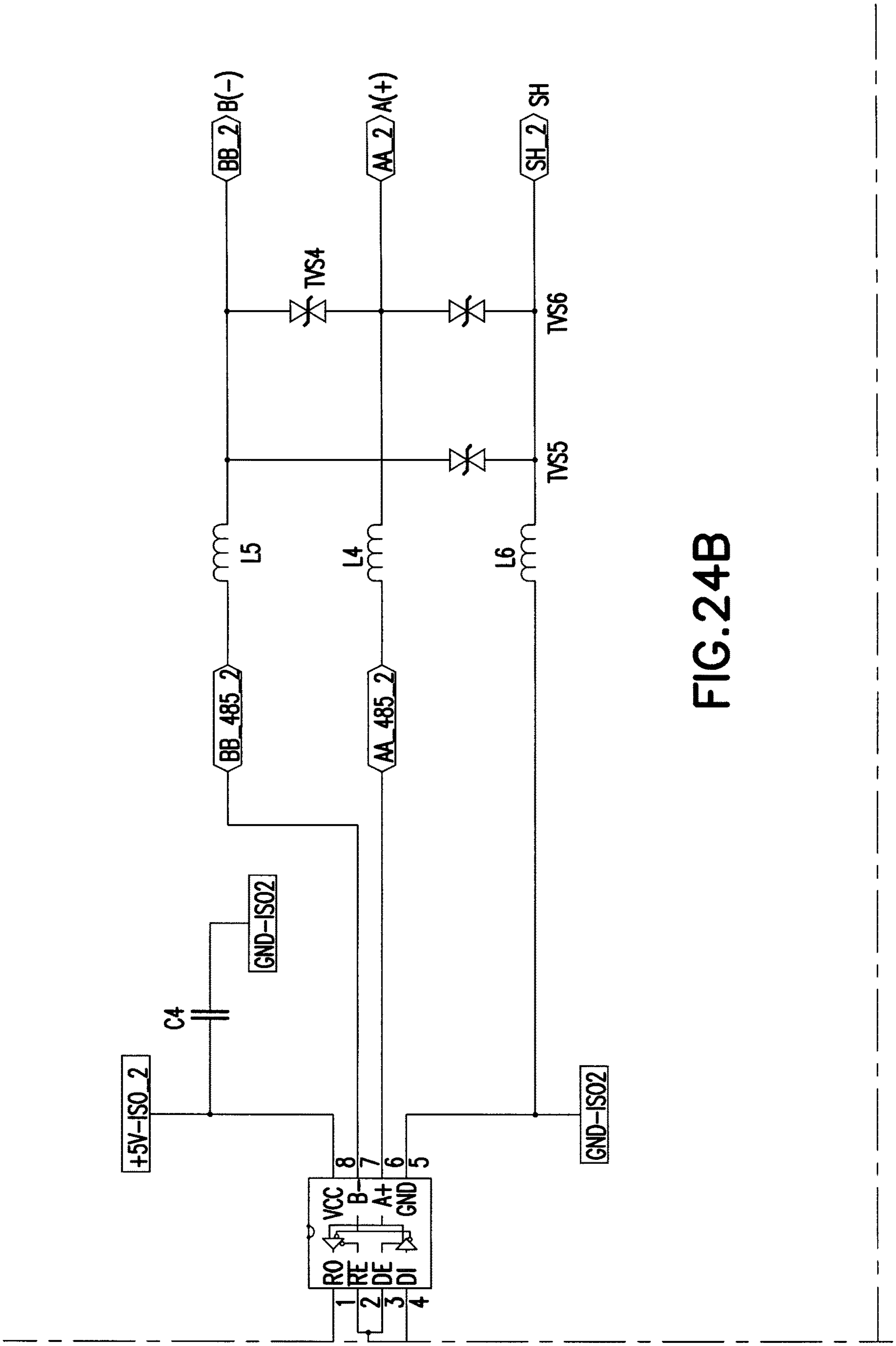
Figure 24C:
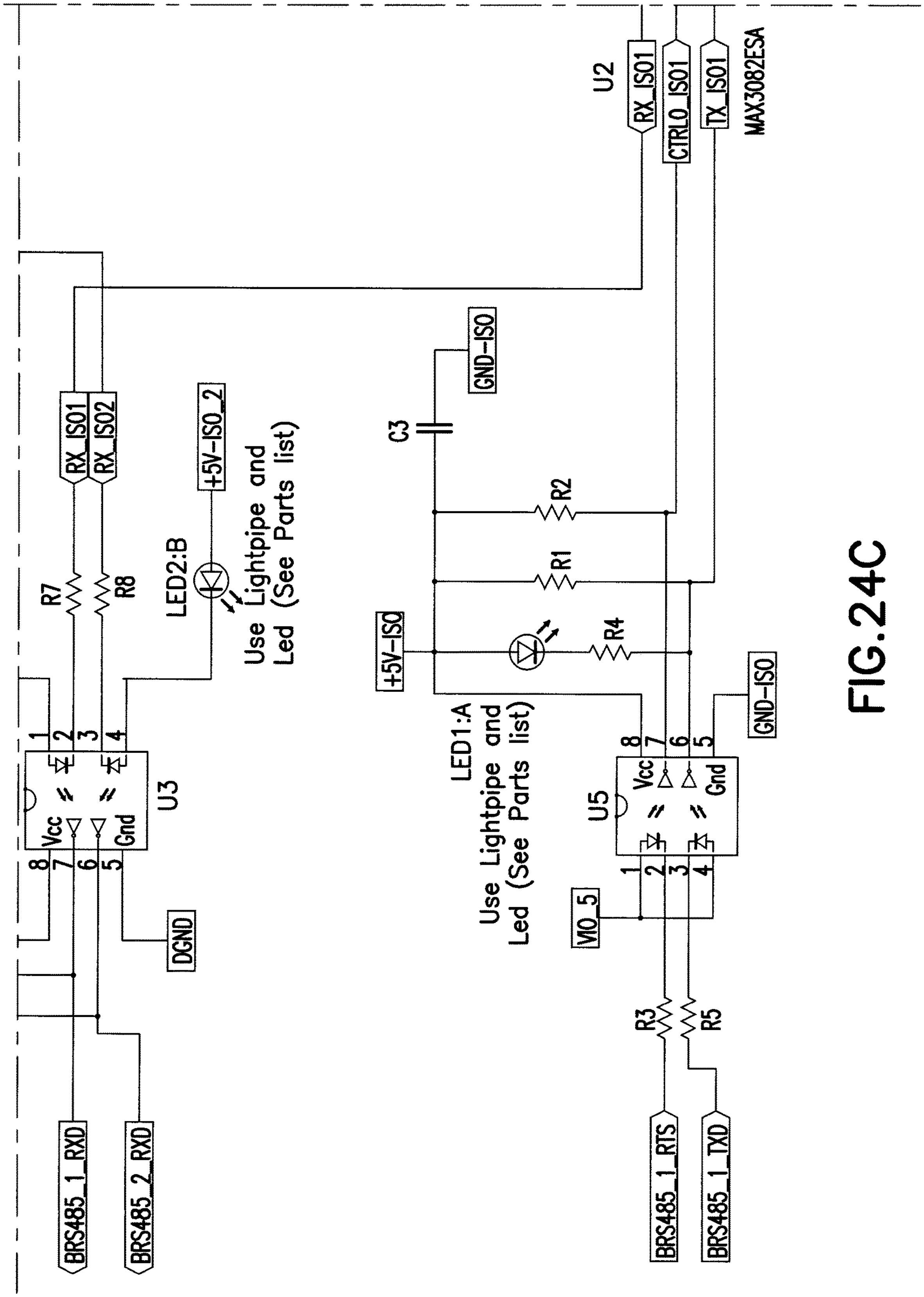
Figure 24D:
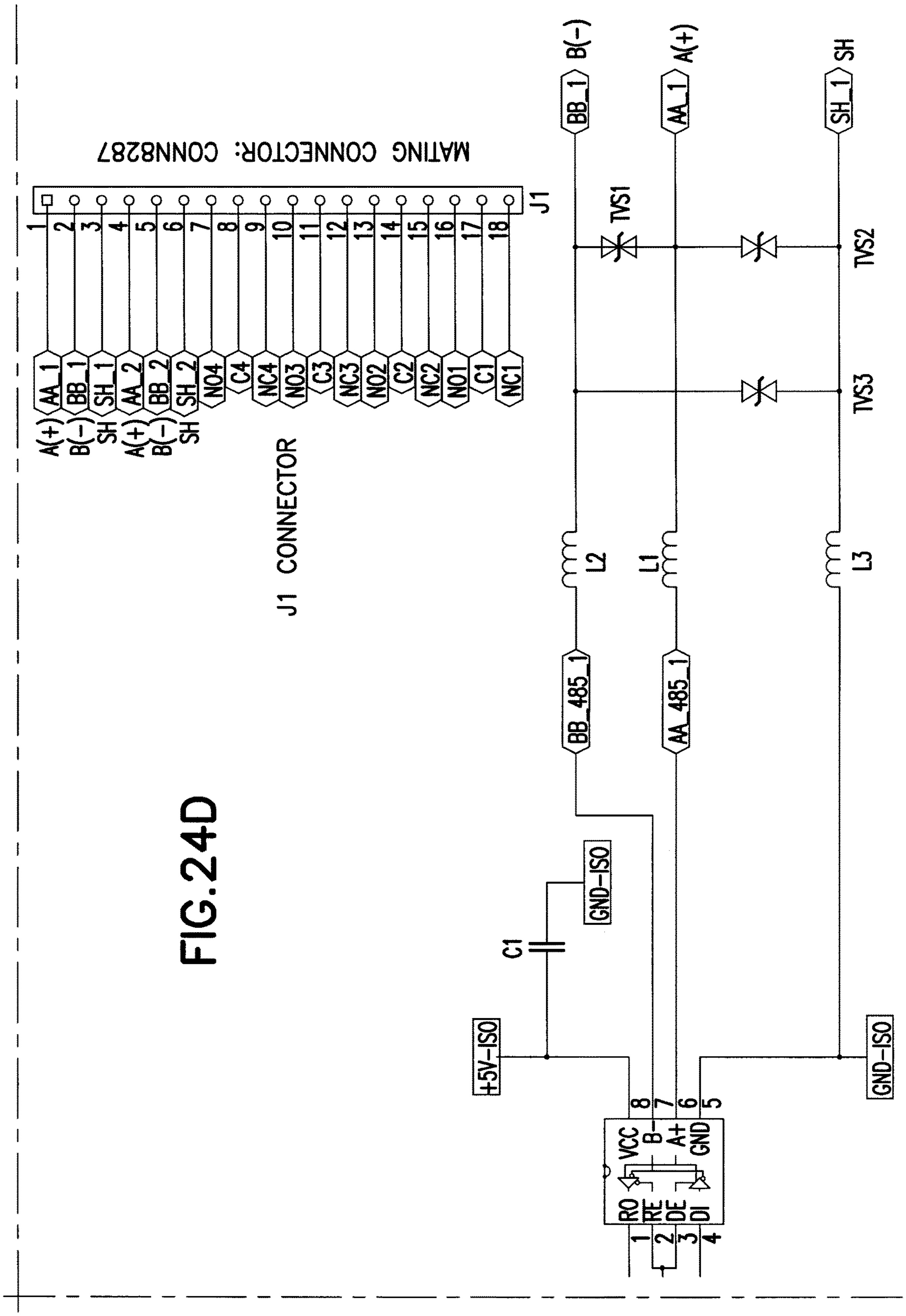

FIGS. 23A, 23B, 23C AND 23D of FIG. 23 illustrate Ethernet circuitry and buffers and a second 10/100 Base-TX/FX transceiver.

FIGS. 24A, 24B, 24C and 24D of FIG. 24 illustrate 2 channels of RS-485 communication circuitry.

Figure 25A:
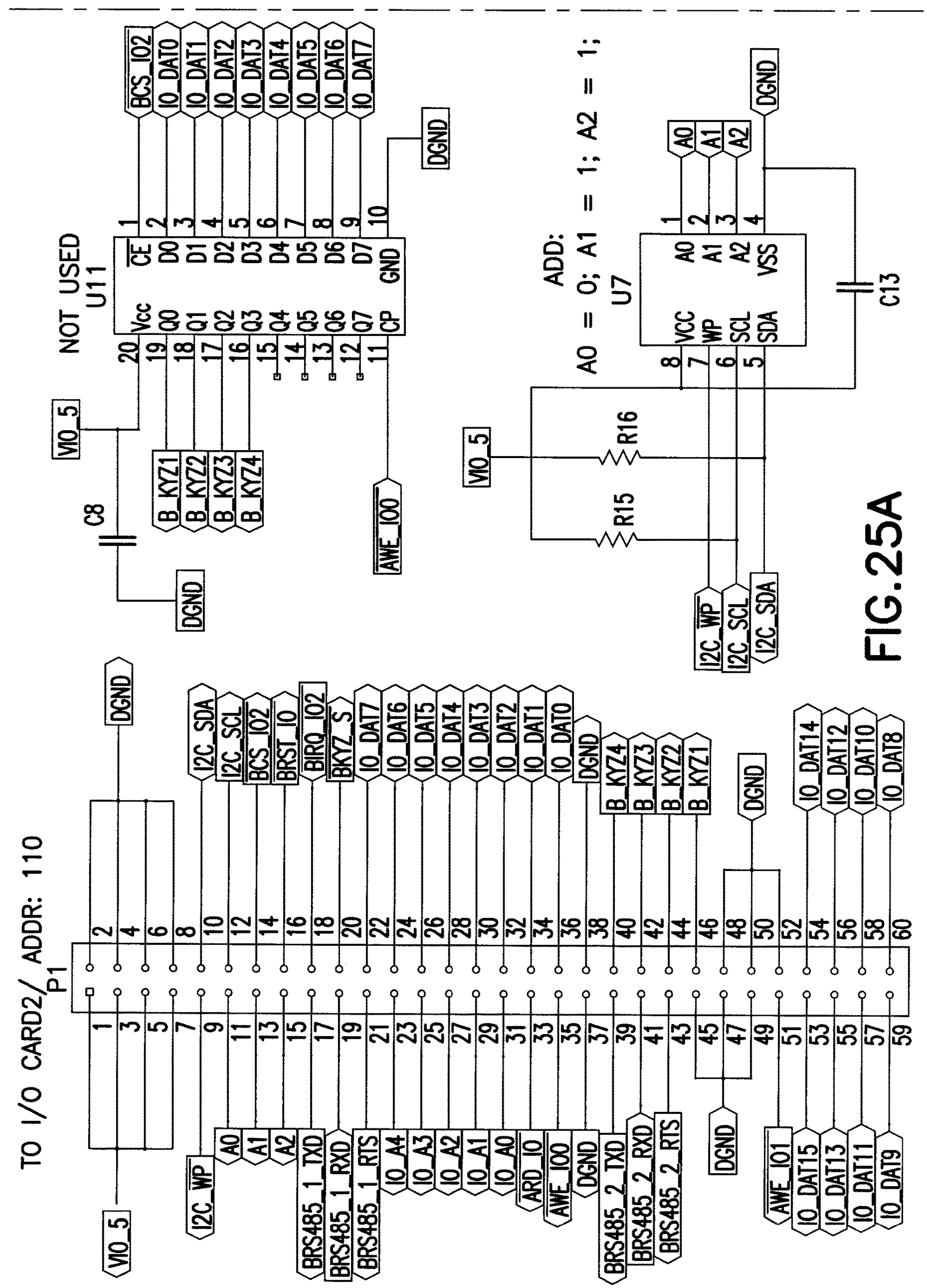
FIG. 25 illustrates how FIGS. 25A, 25B and 25C would fit together in order to form a single view of a schematic drawing of a portion of an IED of the present disclosure.
Figure 25B:
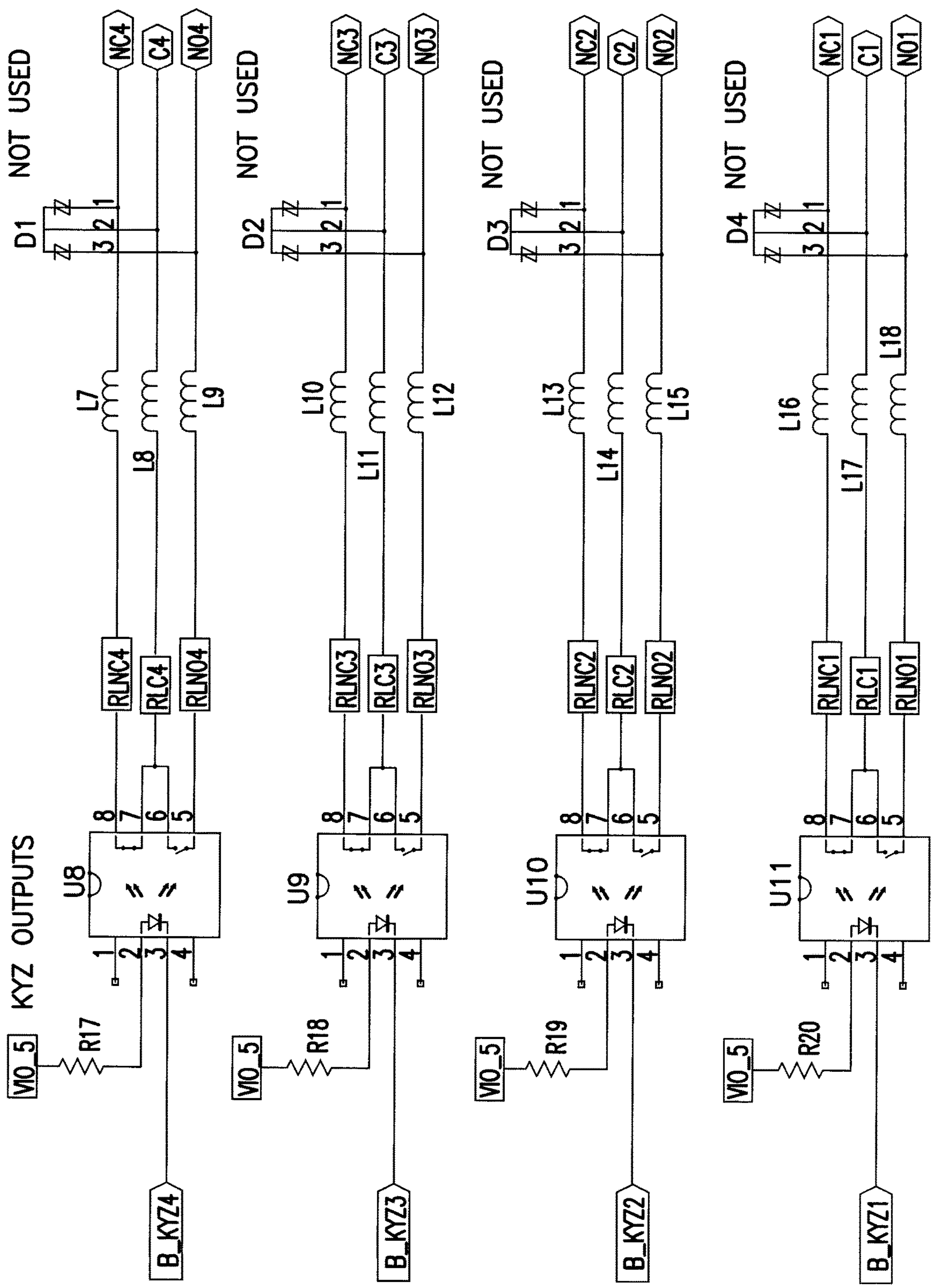
Figures 25, 25C:
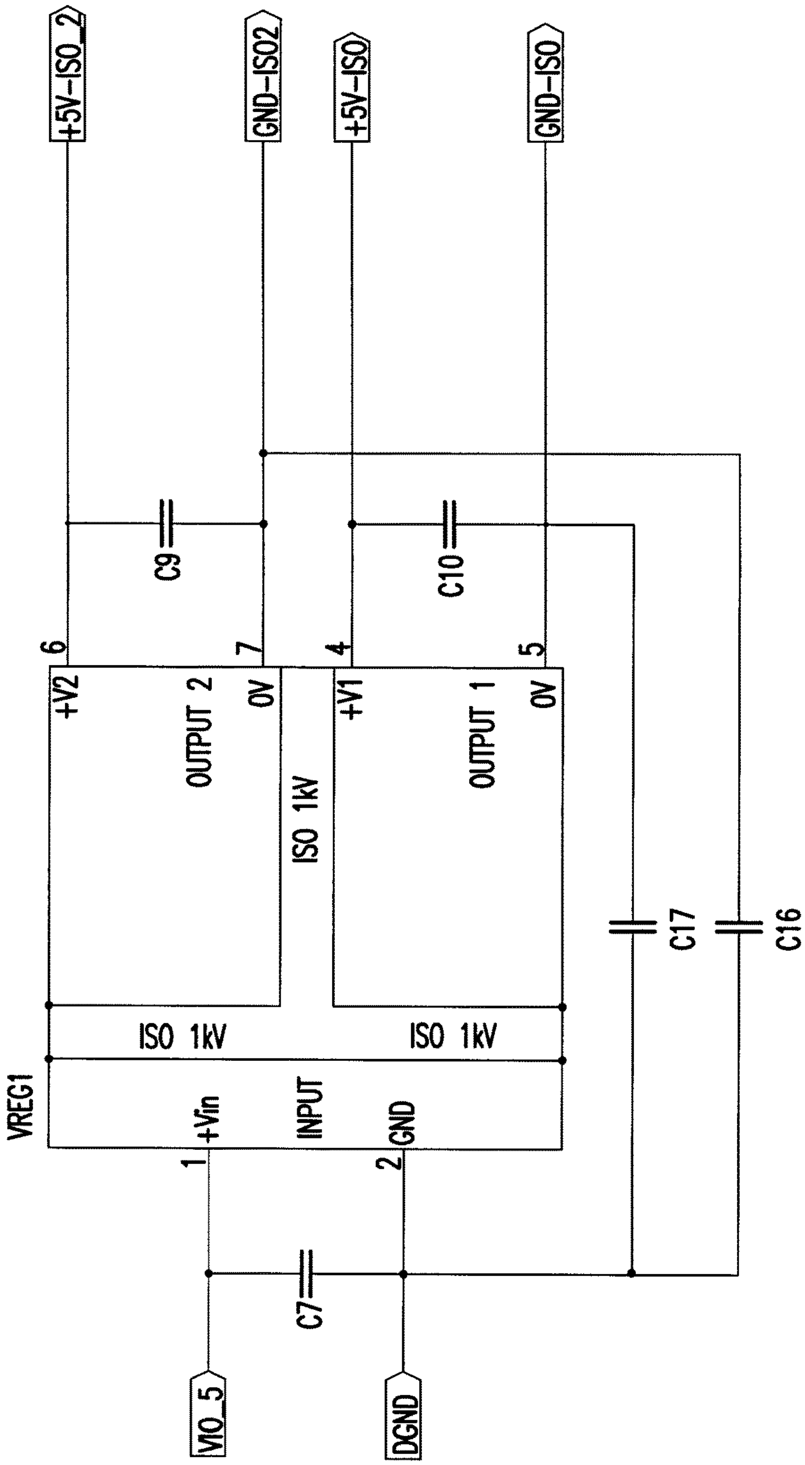

FIGS. 25A, 25B and 25C of FIG. 25 illustrate circuitry for pulsed outputs (also known as KYZ outputs).

Figures 26, 26A:
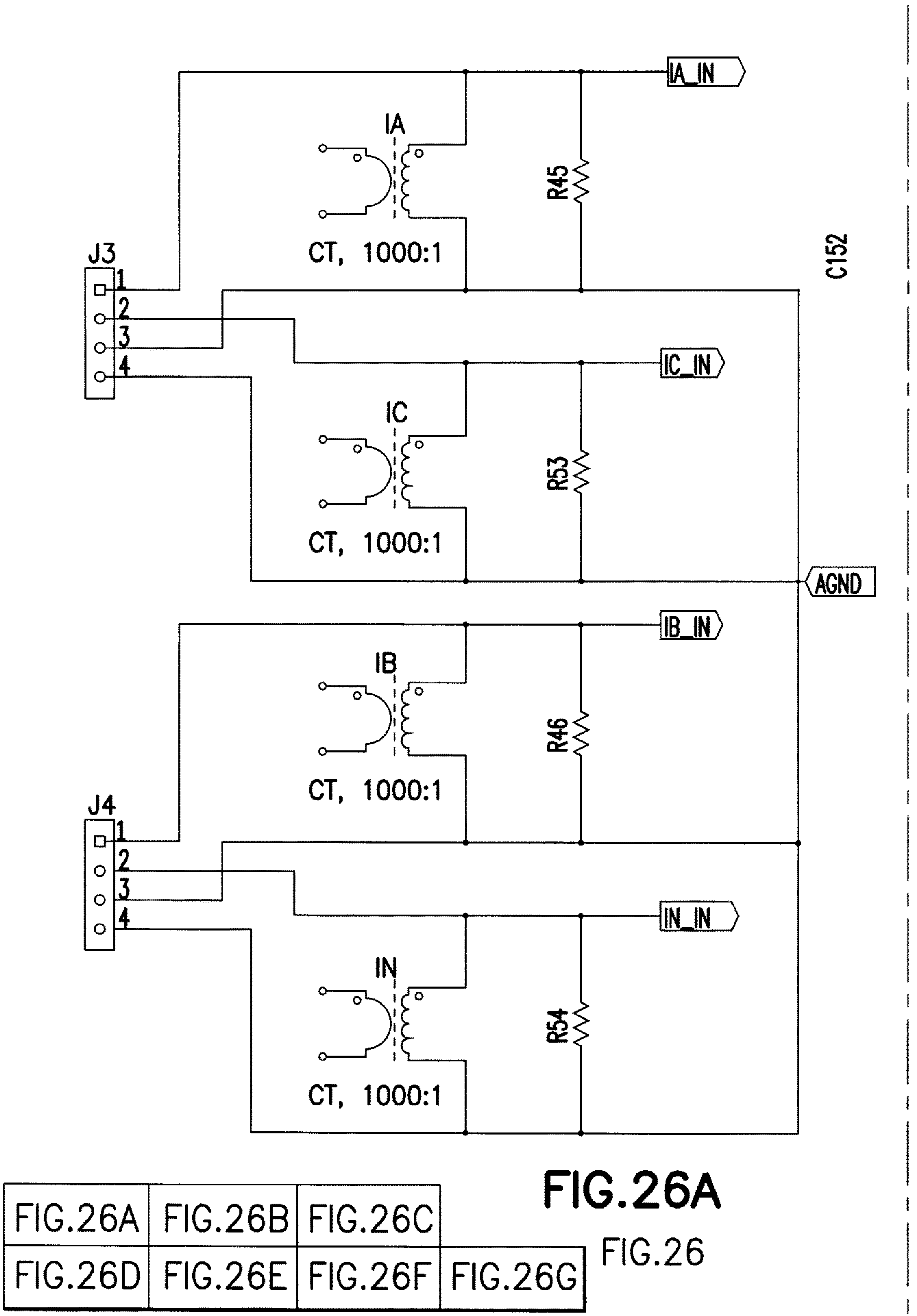
FIG. 26 illustrates how FIGS. 26A, 26B, 26C, 26D, 26E, 26F and 26G would fit together in order to form a single view of a schematic drawing of a portion of an IED of the present disclosure.

FIG. 26A of FIG. 26 illustrates the current input channels and voltage transient buffers.

Figure 26B:
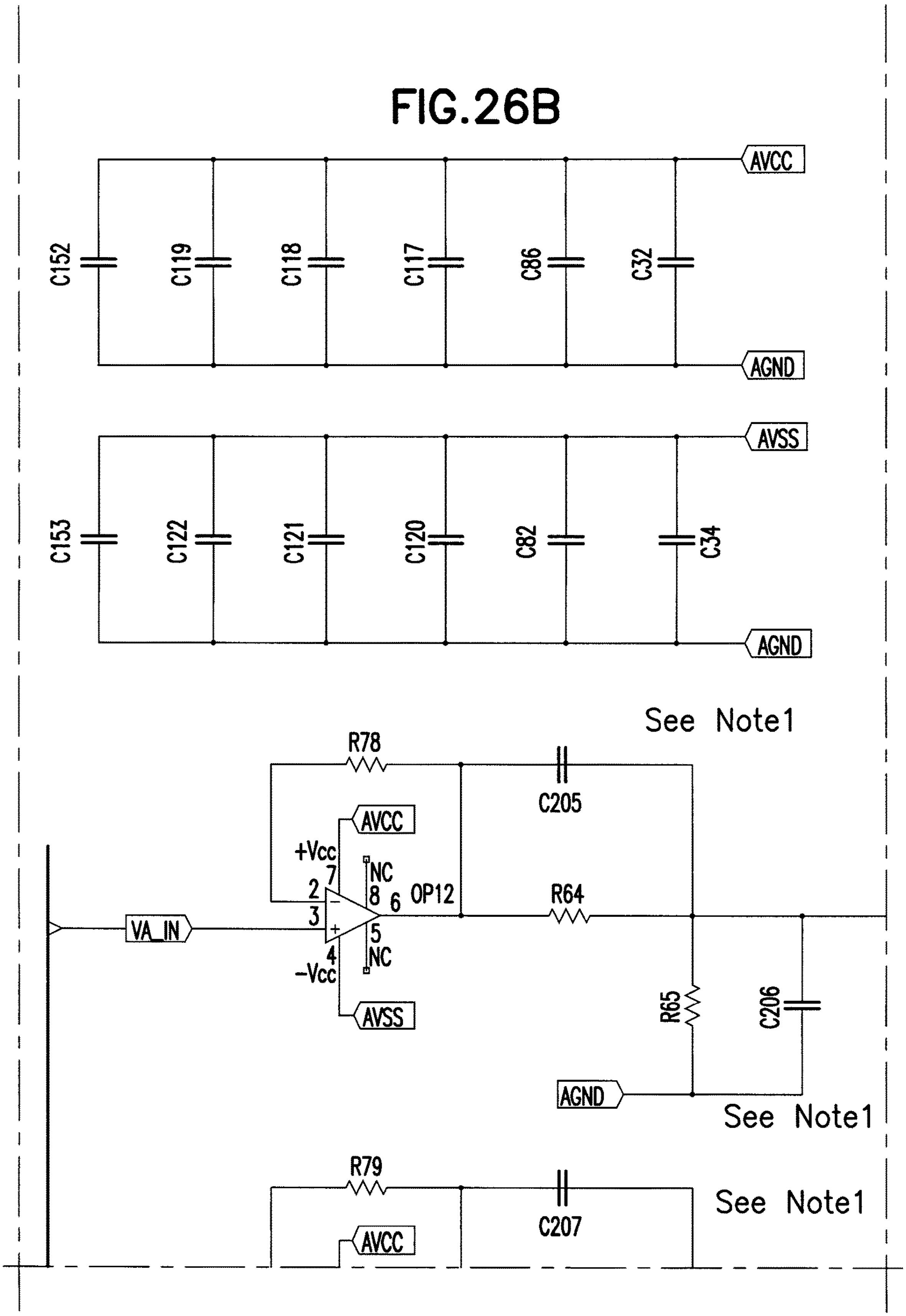
Figure 26C:
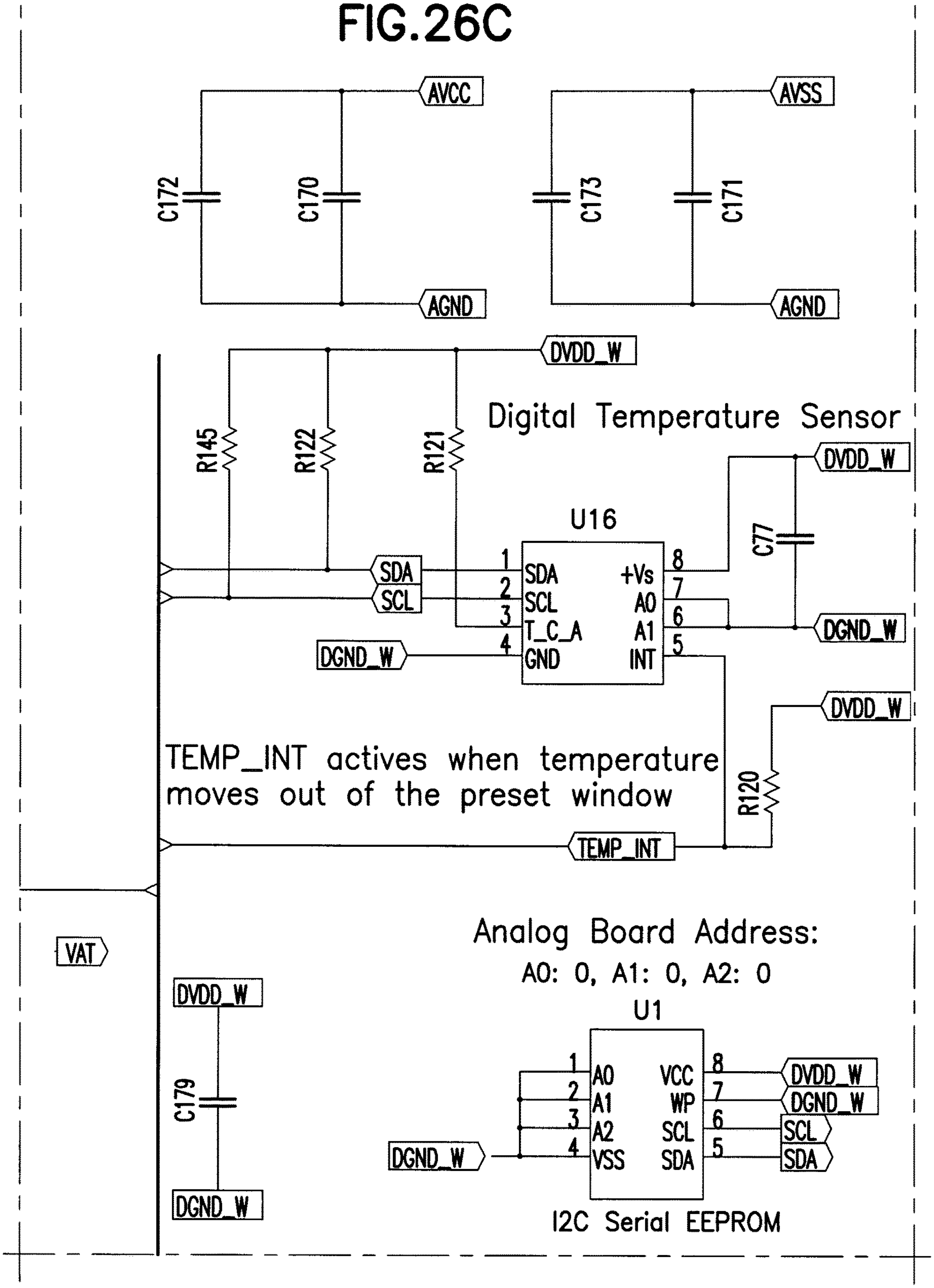
Figure 26D:
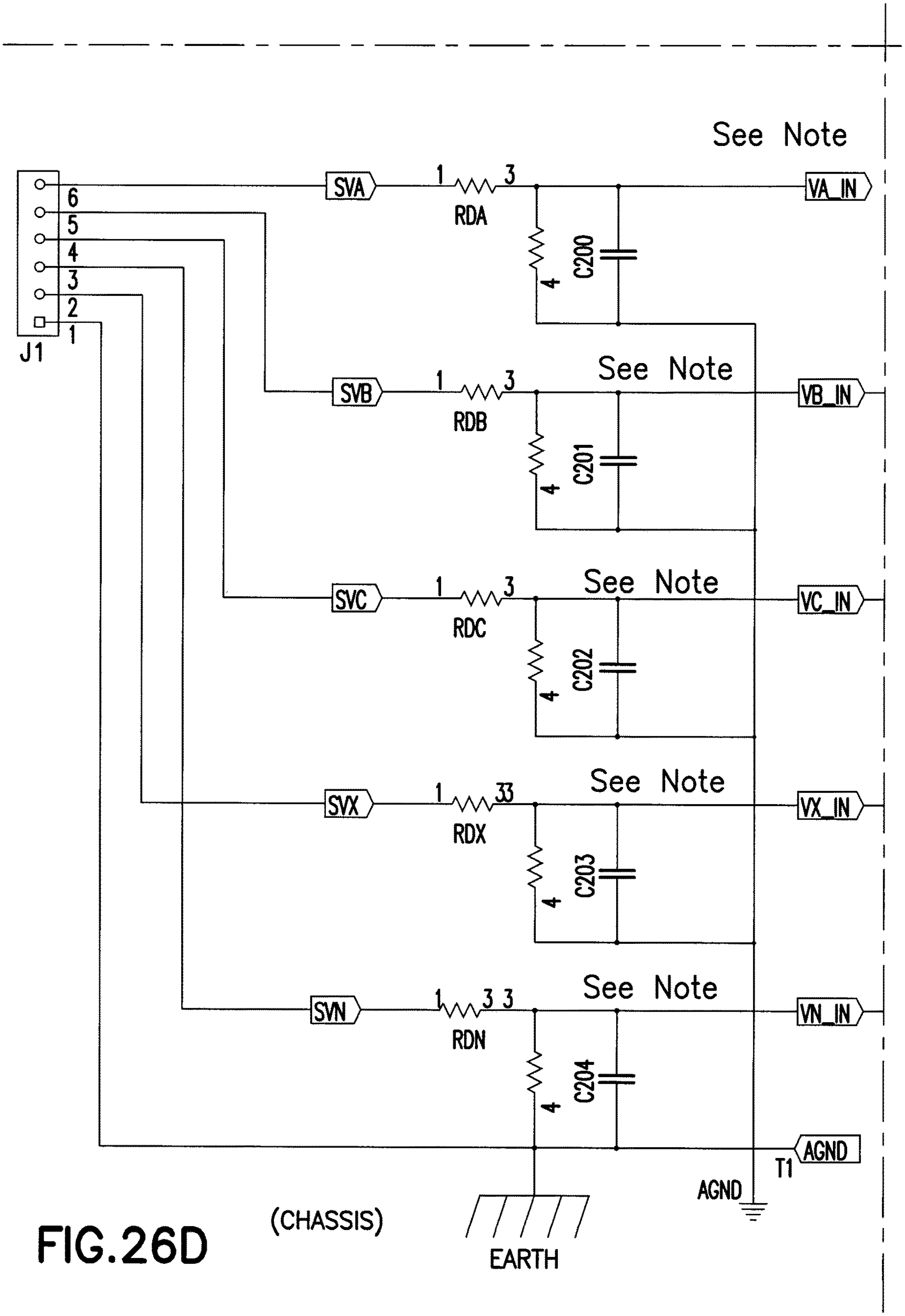

FIGS. 26B and 26D of FIG. 26 illustrate the voltage input channels and voltage transient buffers.

Figure 26E:
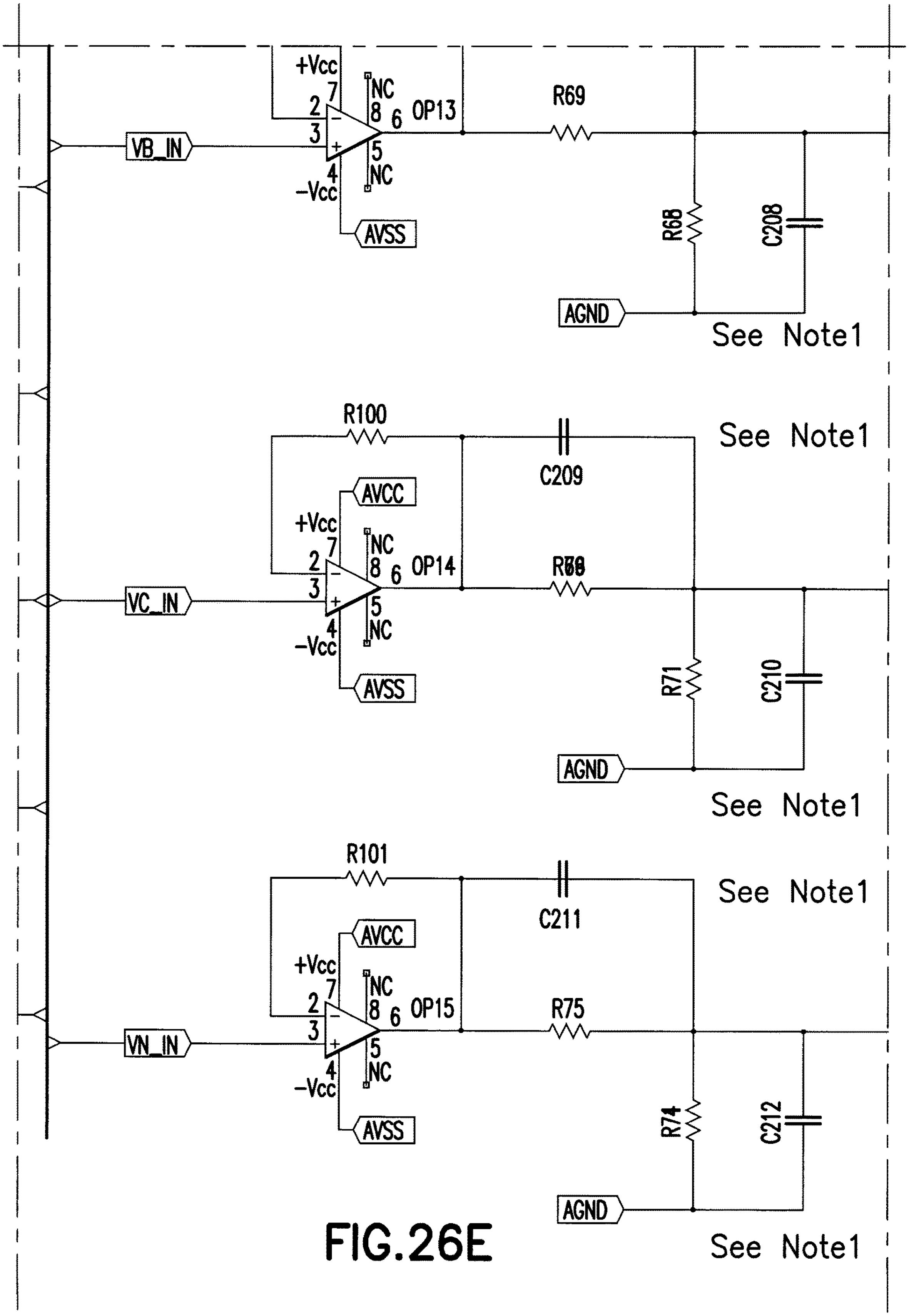
Figure 26F:
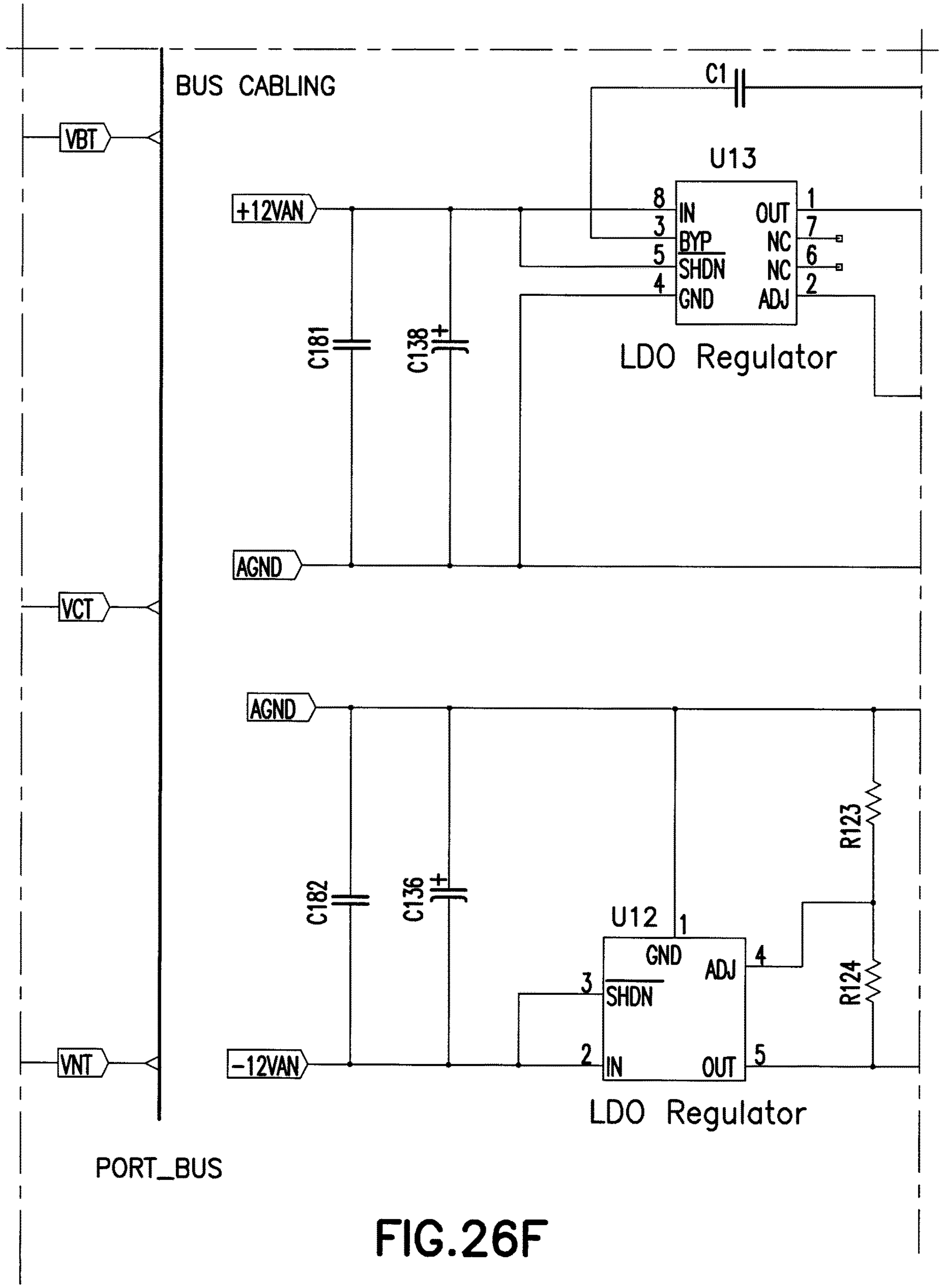
Figure 26G:
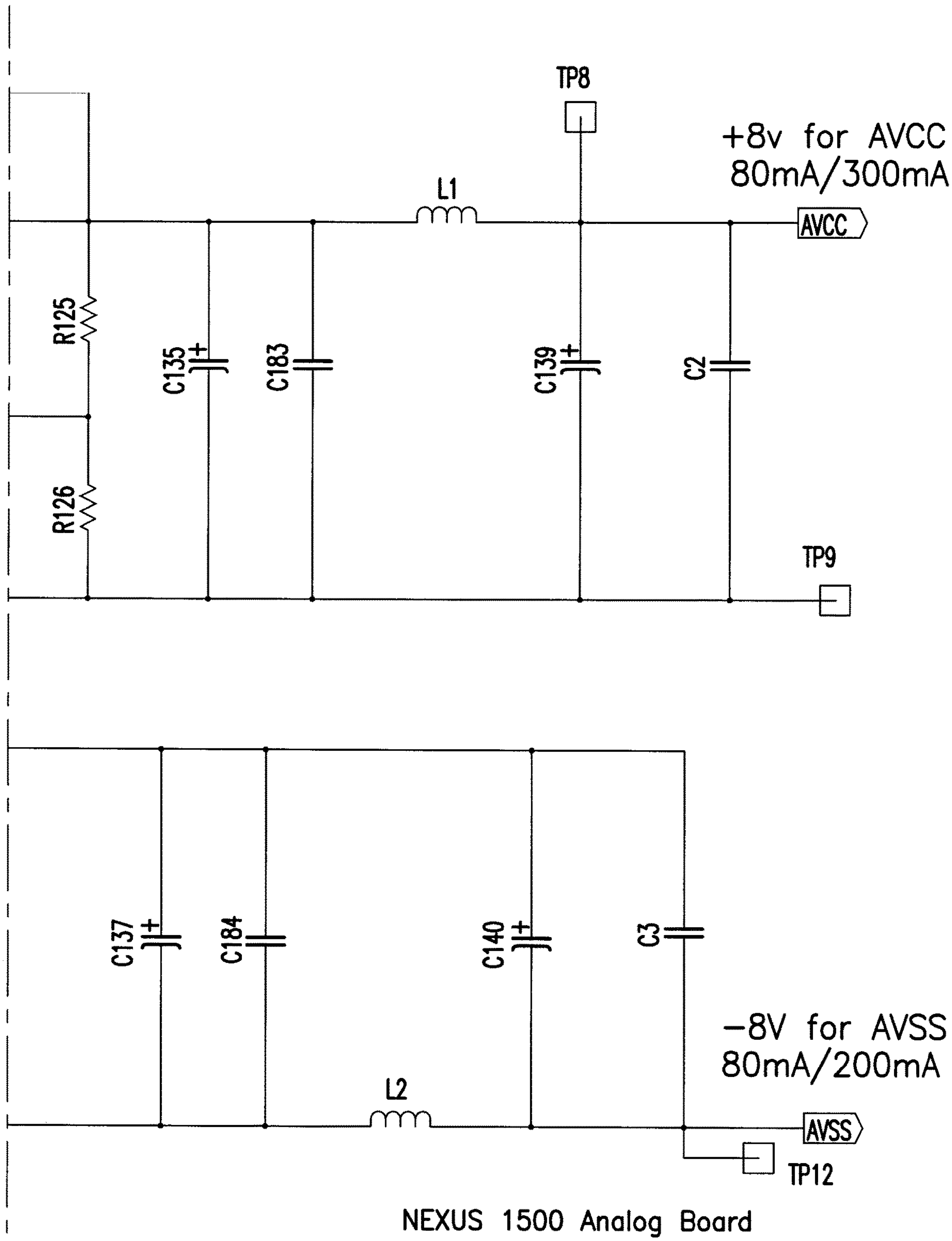

FIGS. 26E, 26F and 26G of FIG. 26 illustrates a high voltage regulator.

FIG. 26C of FIG. 26 illustrates a $I^2C$ serial EEPROM and a temperature sensing circuit employed for calibration.

Figure 27A:
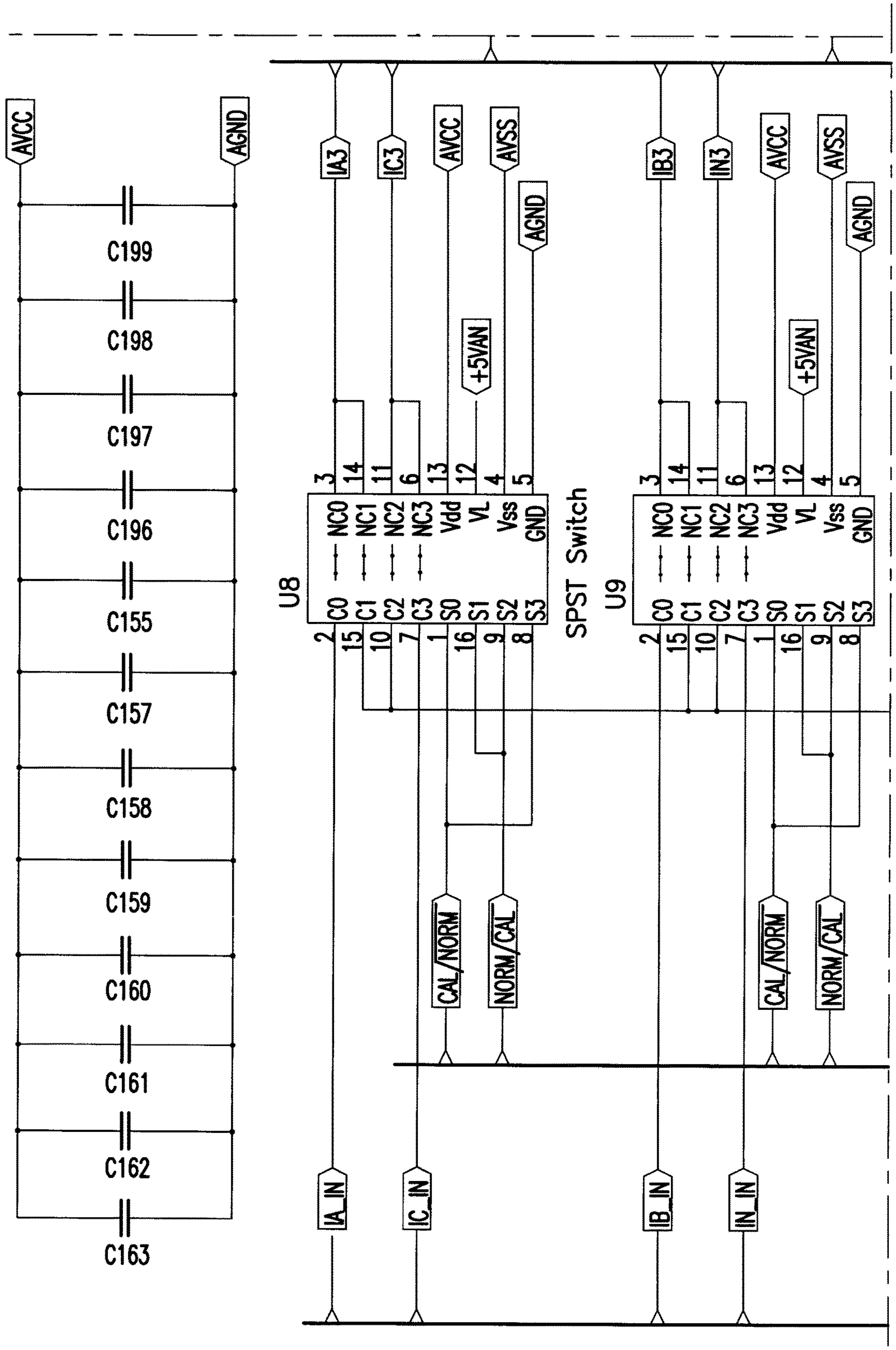
FIG. 27 illustrates how FIGS. 27A, 27B, 27C, 27D, 27E, 27F, 27G and 27H would fit together in order to form a single view of a schematic drawing of a portion of an IED of the present disclosure.
Figure 27B:
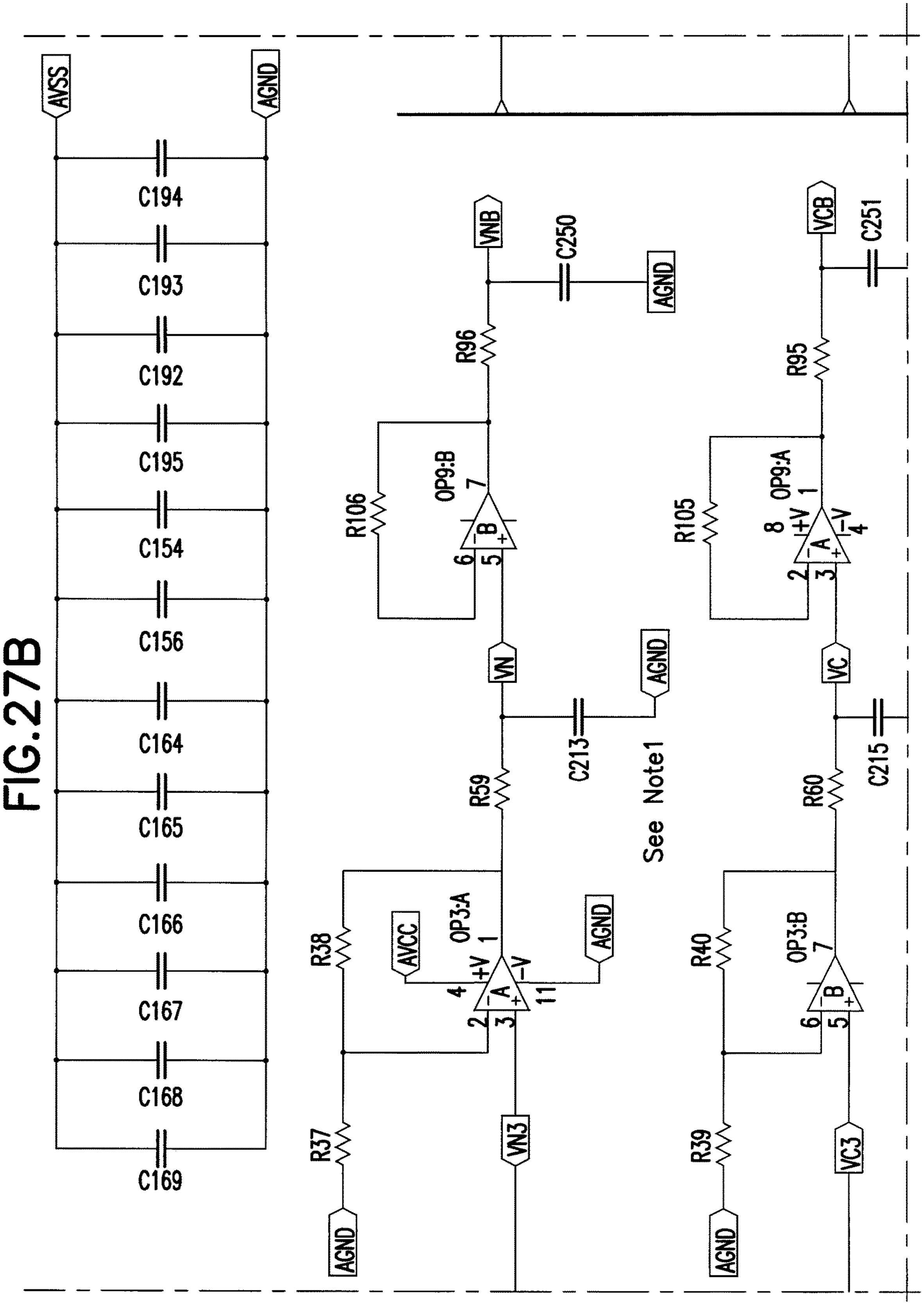
Figure 27C:
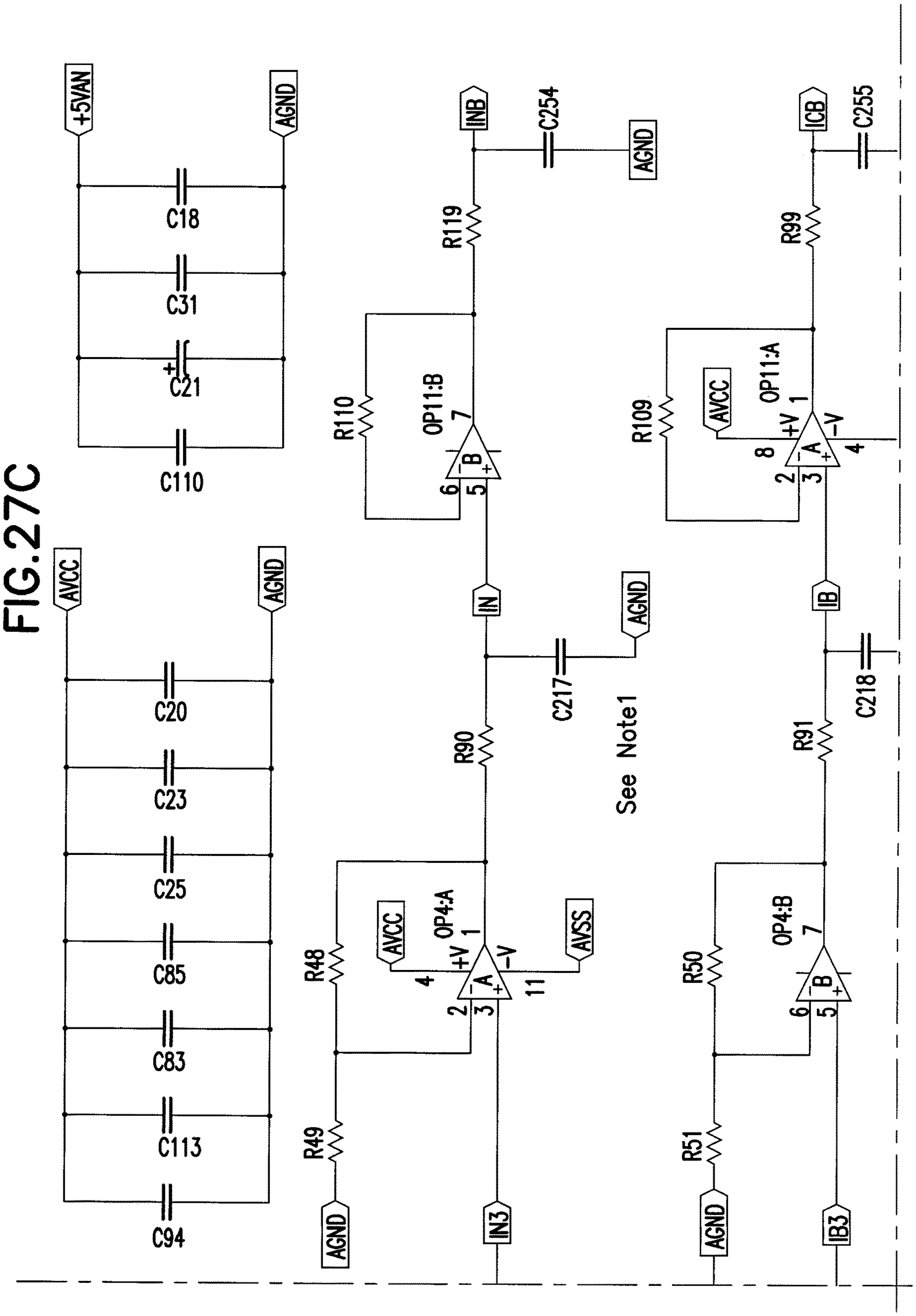
Figure 27D:
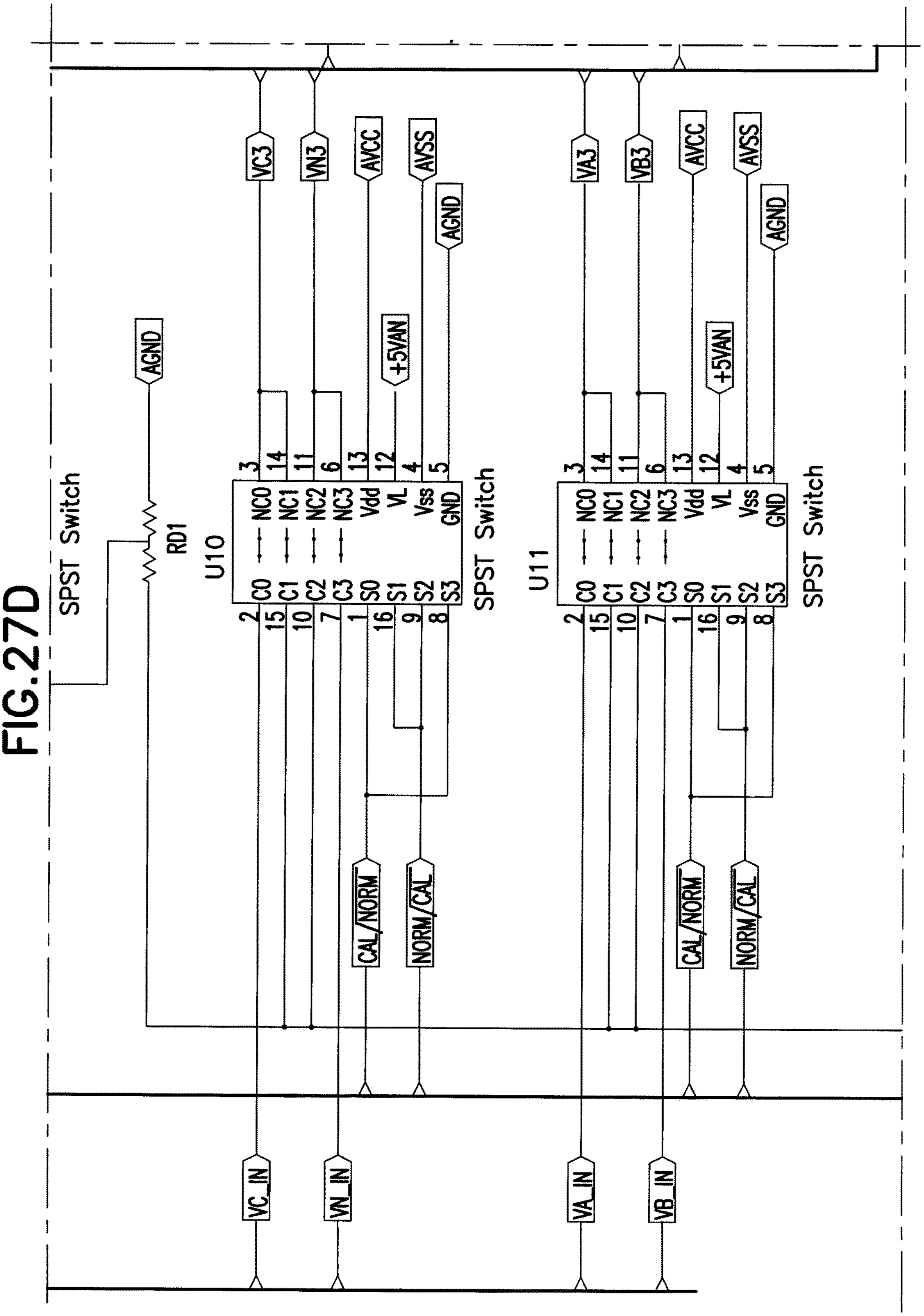
Figure 27E:
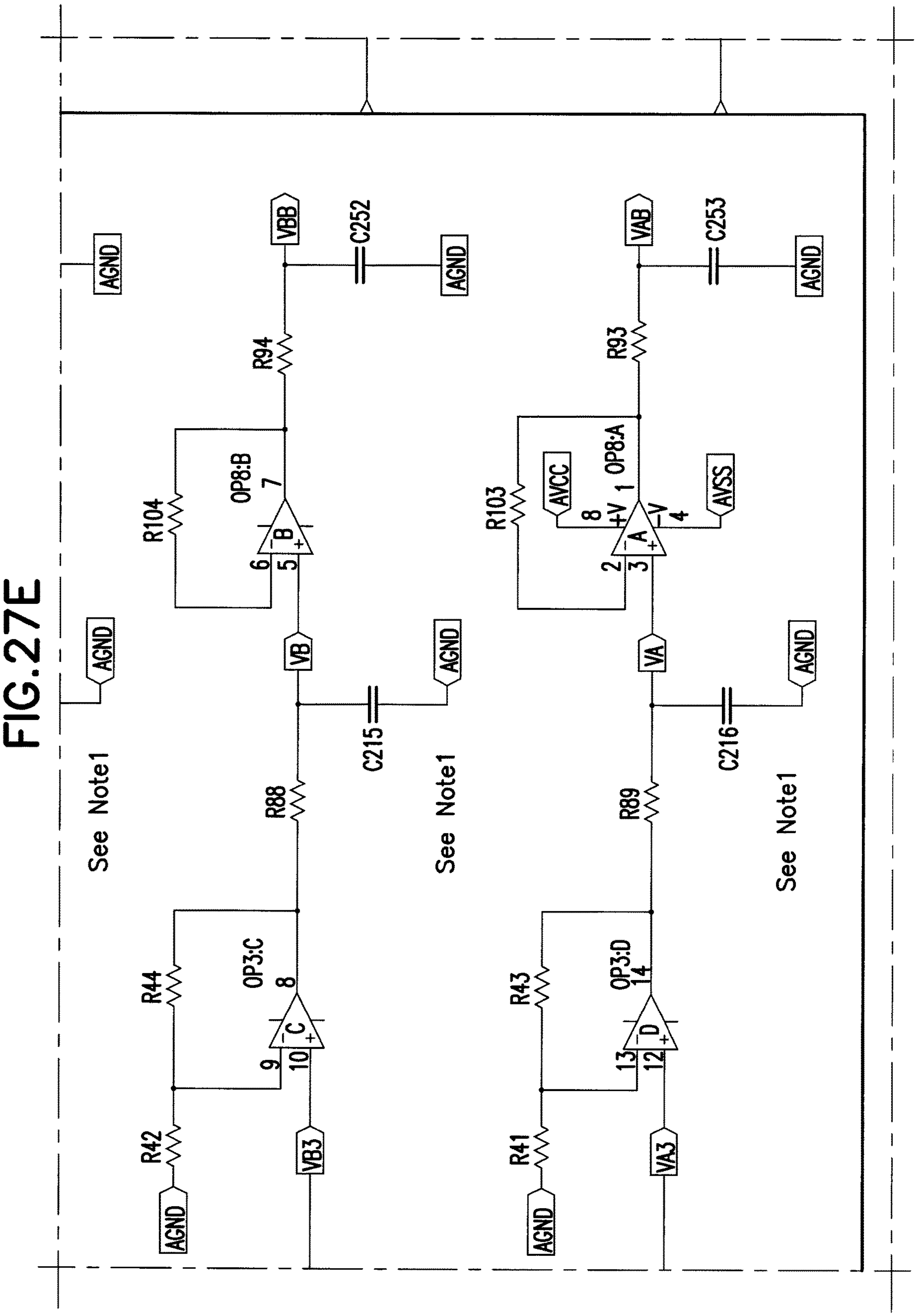
Figure 27F:
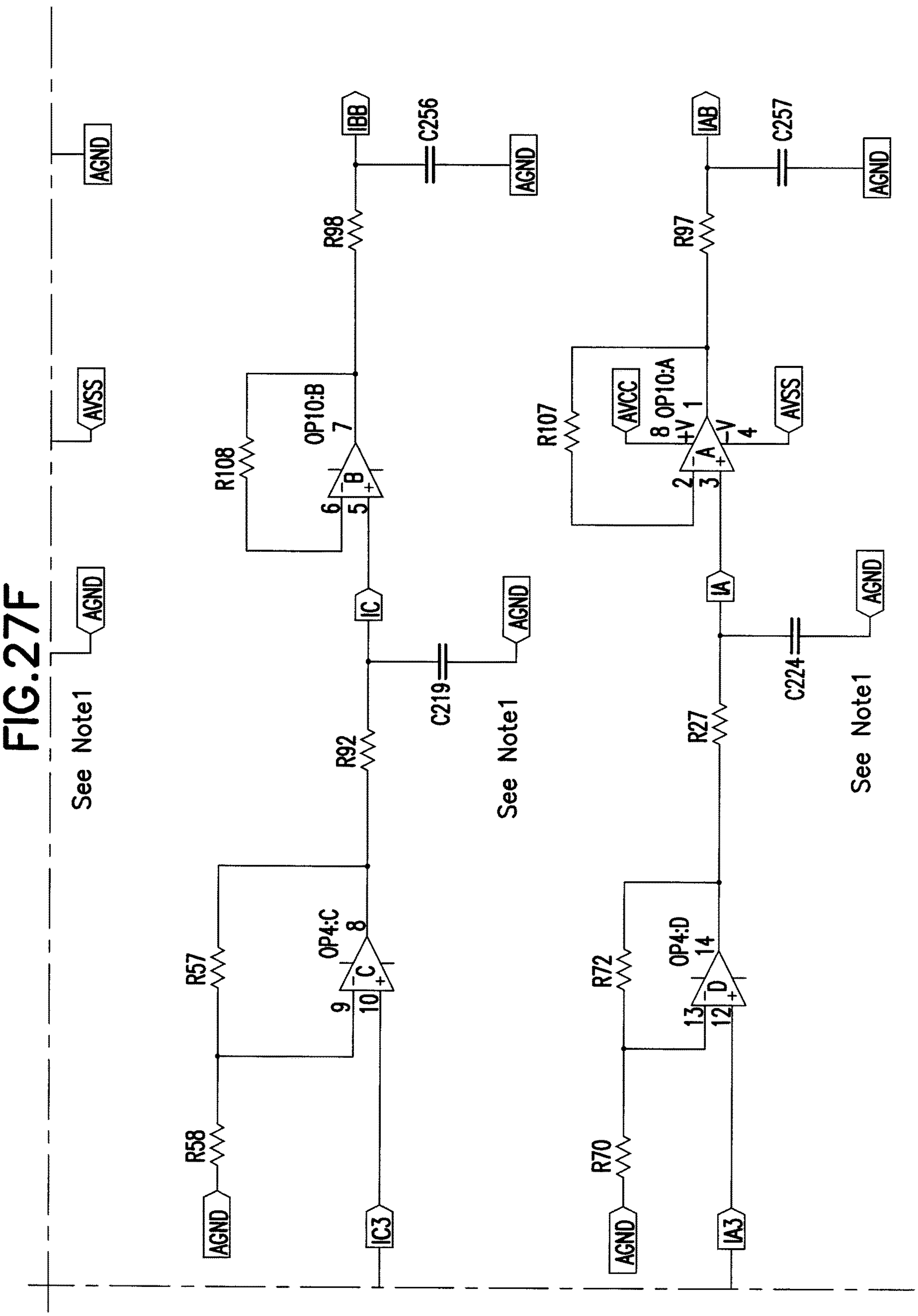
Figure 27G:
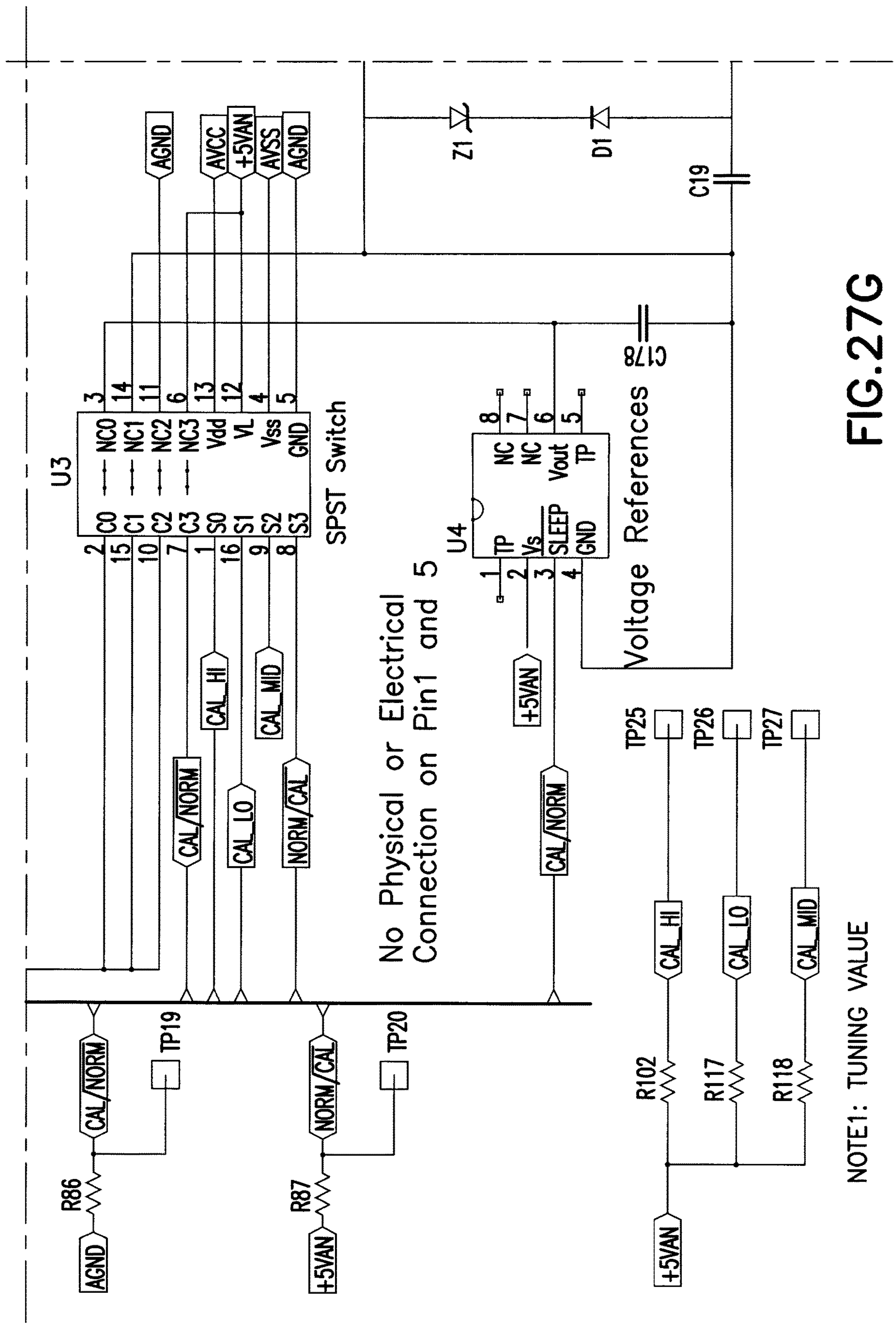
Figure 27H:
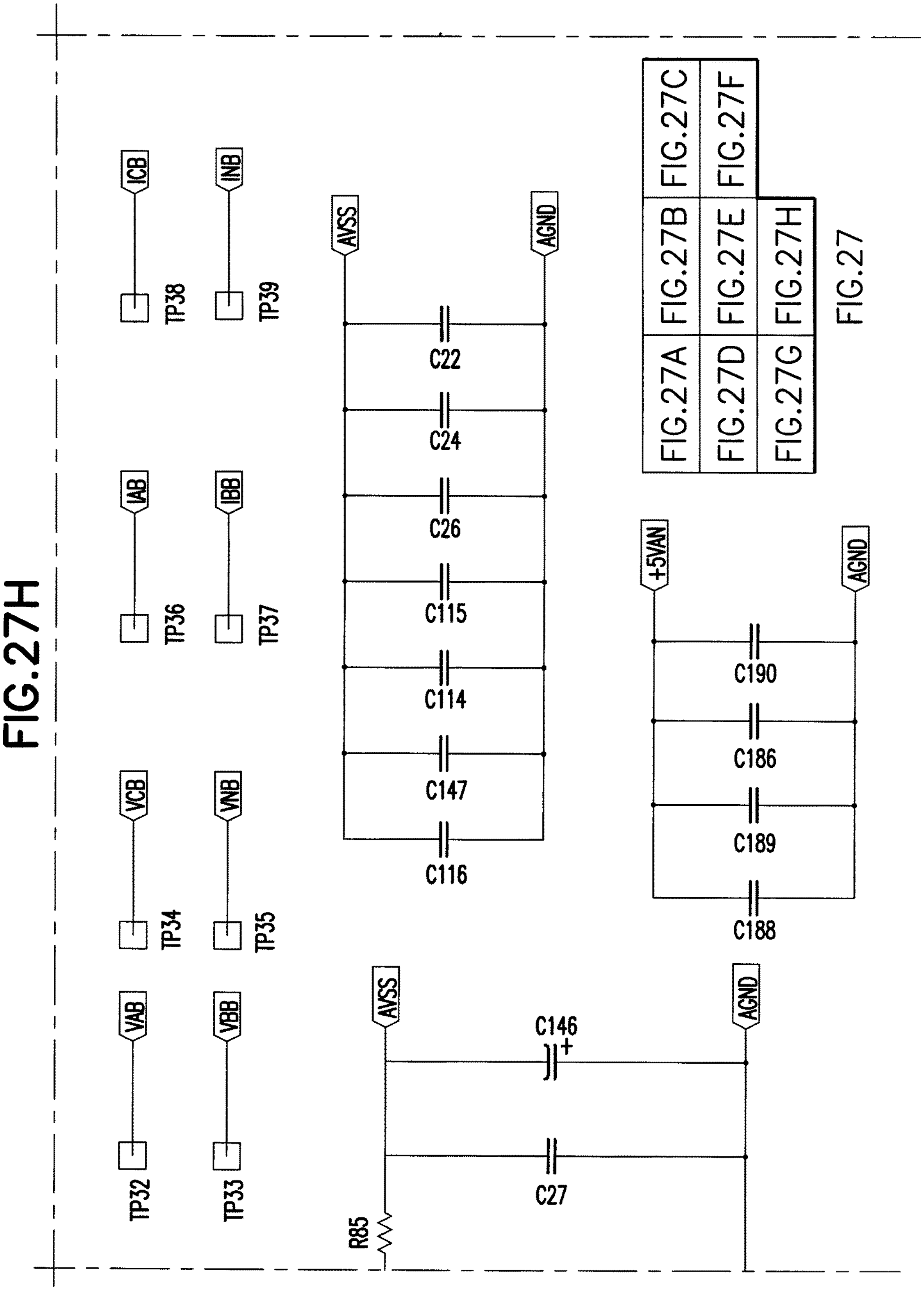

FIGS. 27A,27D and 27G of FIG. 27 illustrate calibration circuitry.

FIGS. 27B, 27C, 27E, 27F and 27H of FIG. 27 illustrate voltage and current buffers (also known as conditioning circuitry) for the revenue measuring path described above.

Figure 28A:
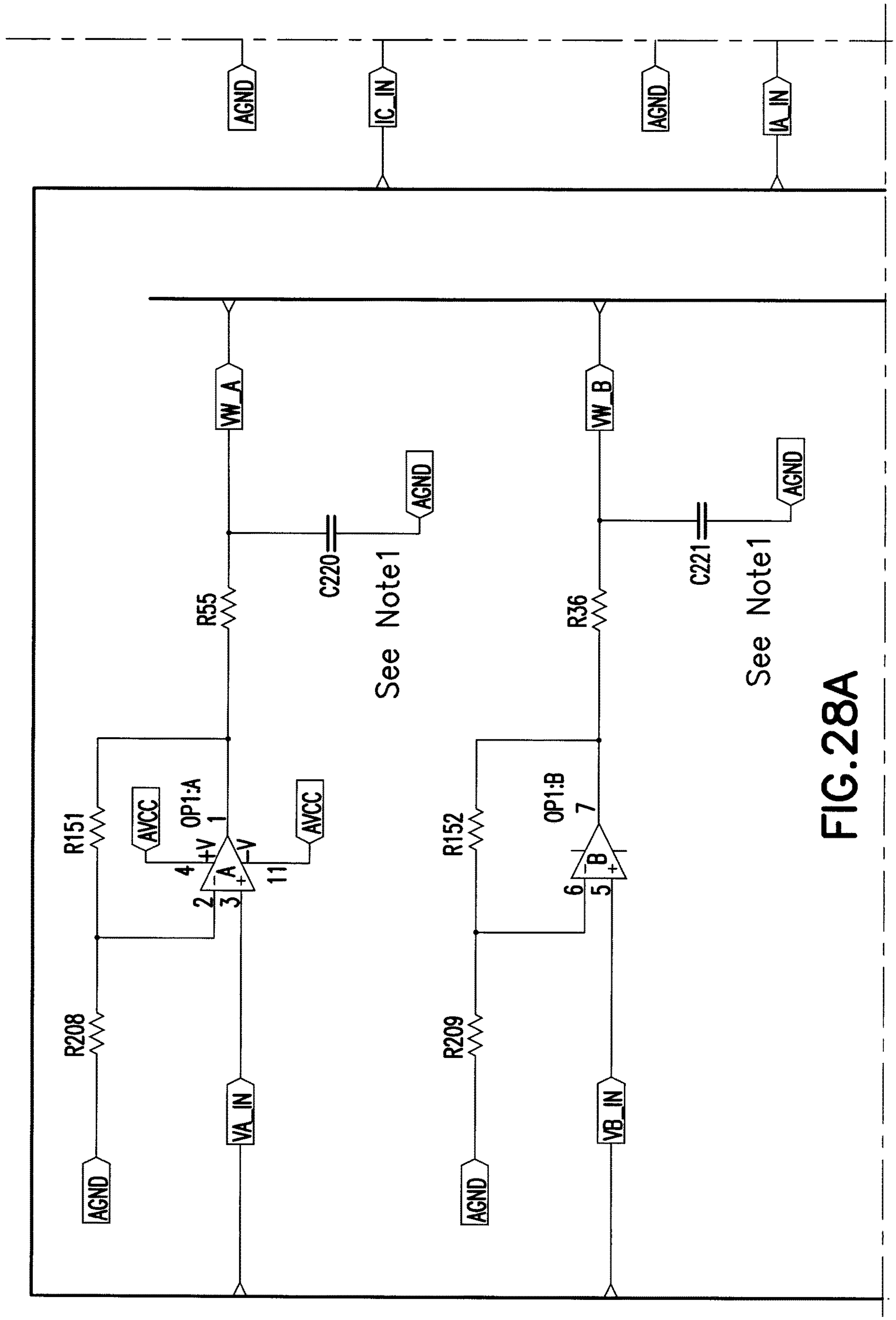
FIG. 28 illustrates how FIGS. 28A, 28B, 28C, 28D, 28E, 28F, 28G and 28H would fit together in order to form a single view of a schematic drawing of a portion of an IED of the present disclosure.

FIG. 28A of FIG. 28 shows a waveform capture voltage scaling and conditioning circuits and waveform capture current scaling and conditioning circuits.

Figure 28B:
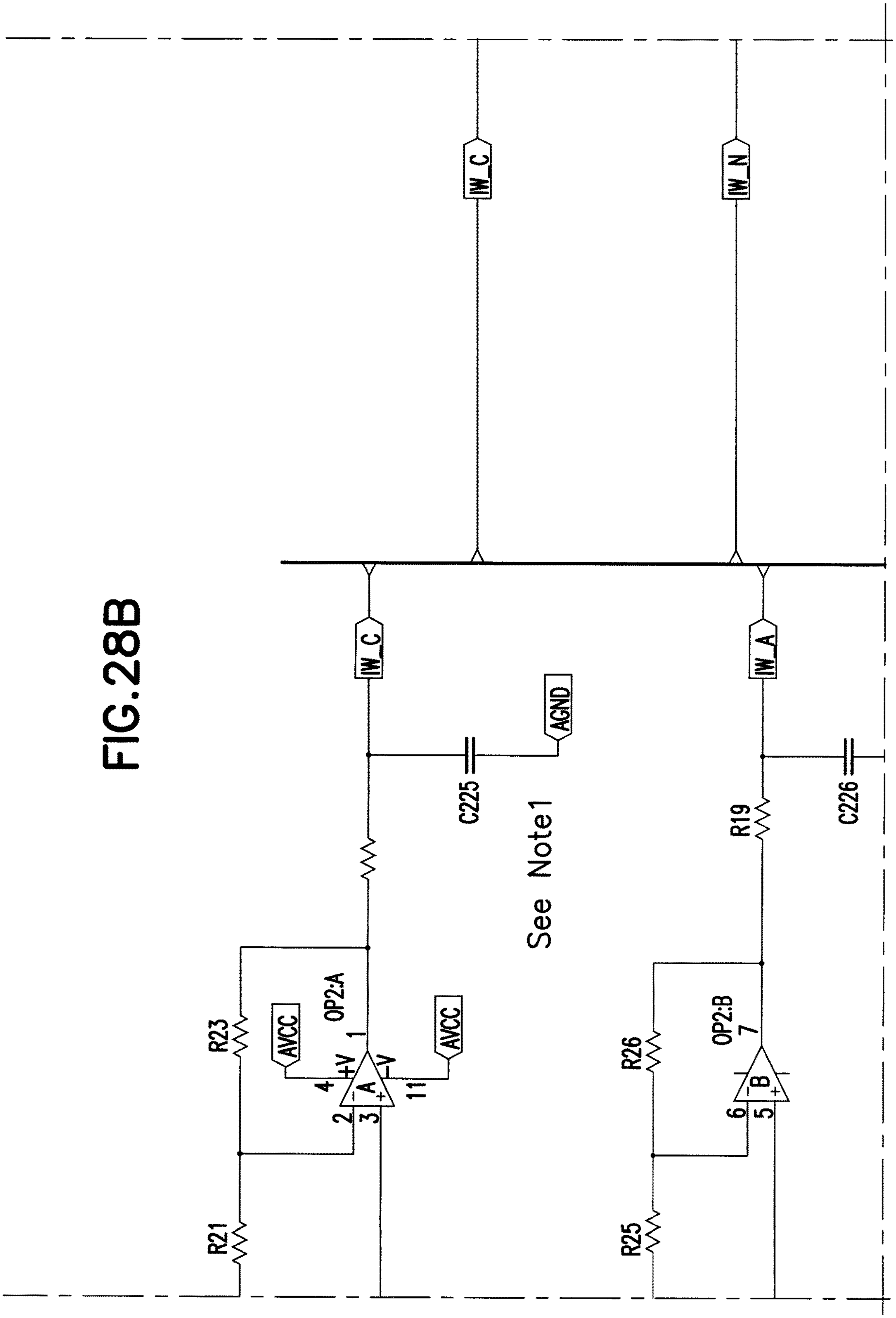
Figure 28C:
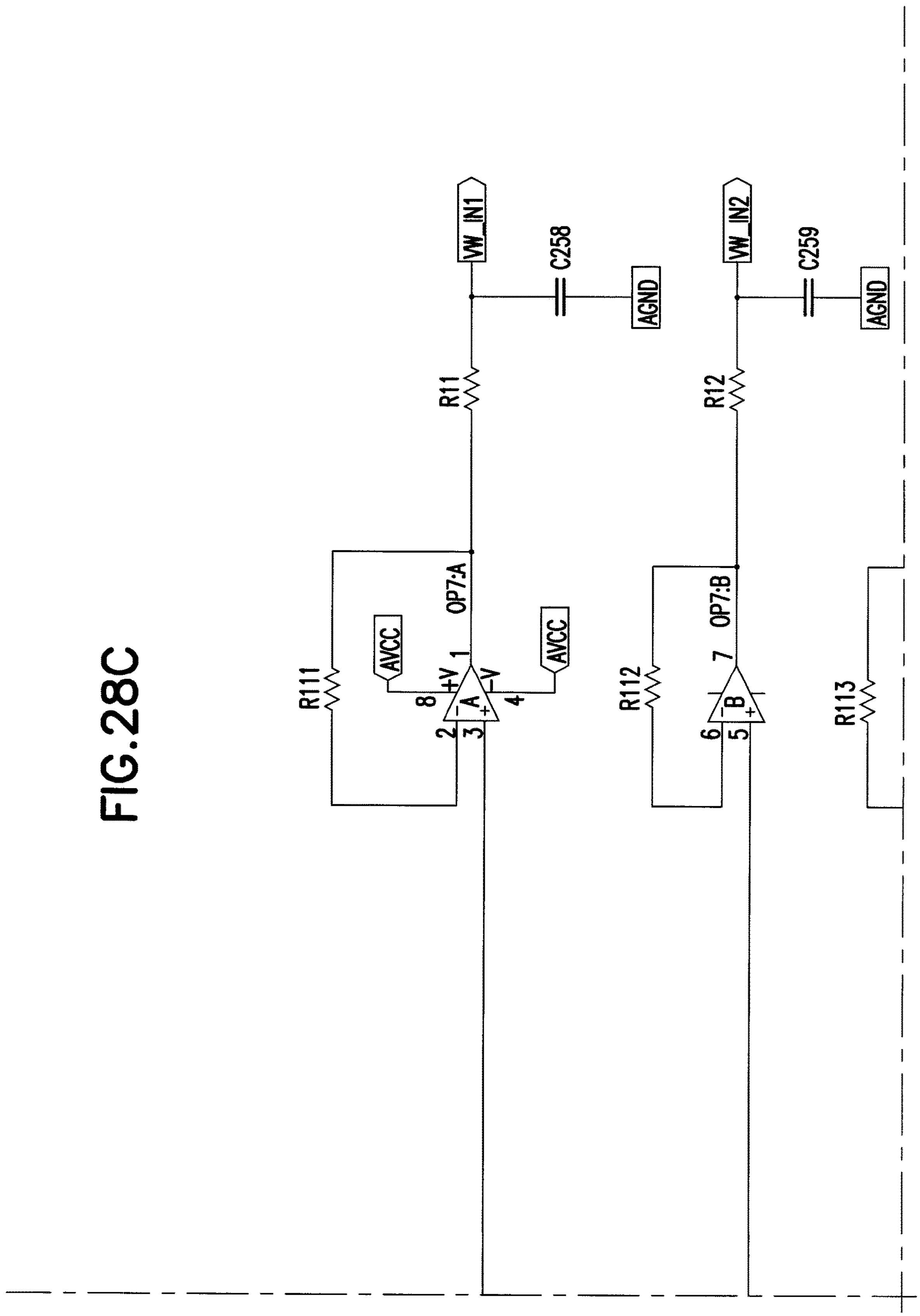
Figure 28D:
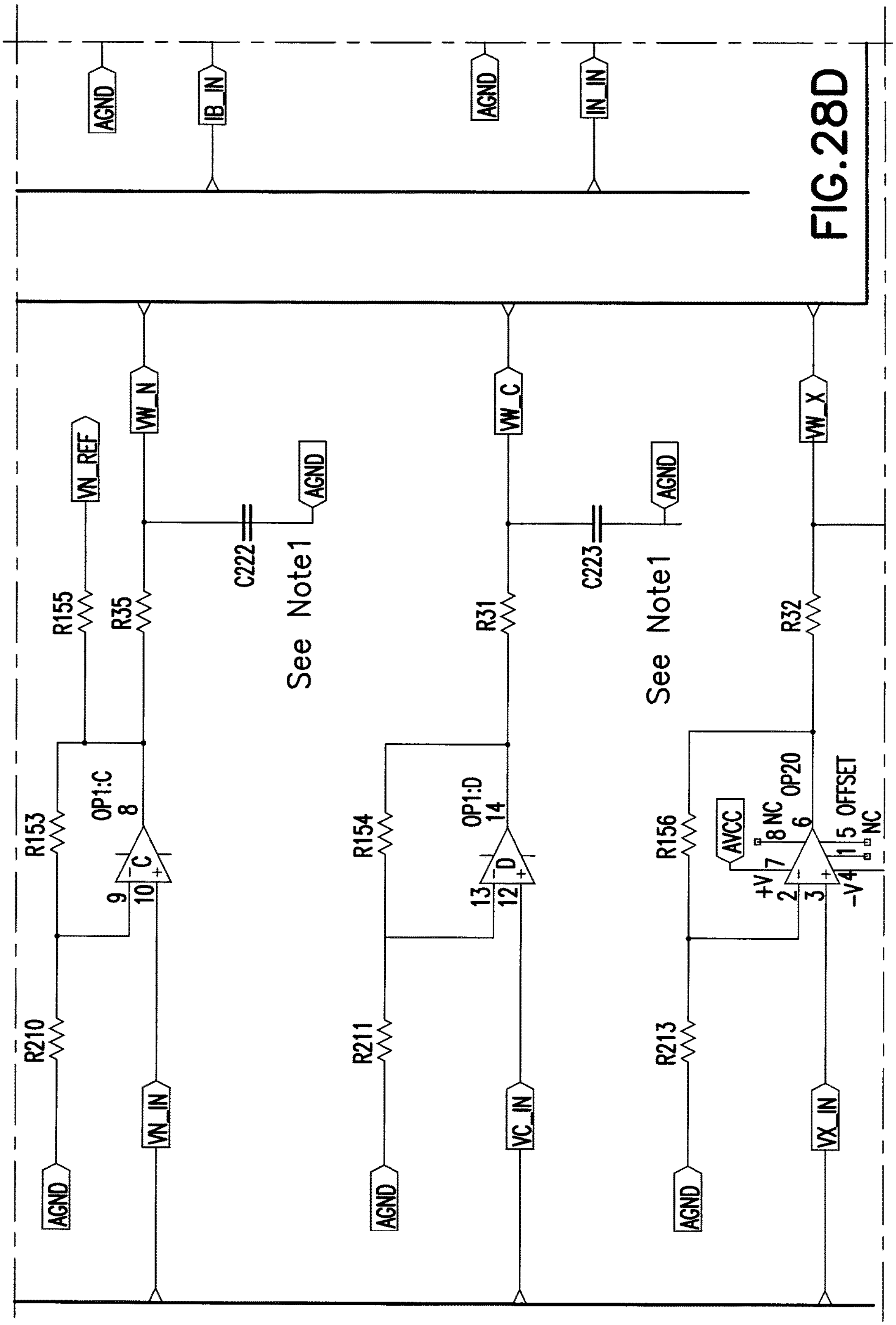
Figure 28E:
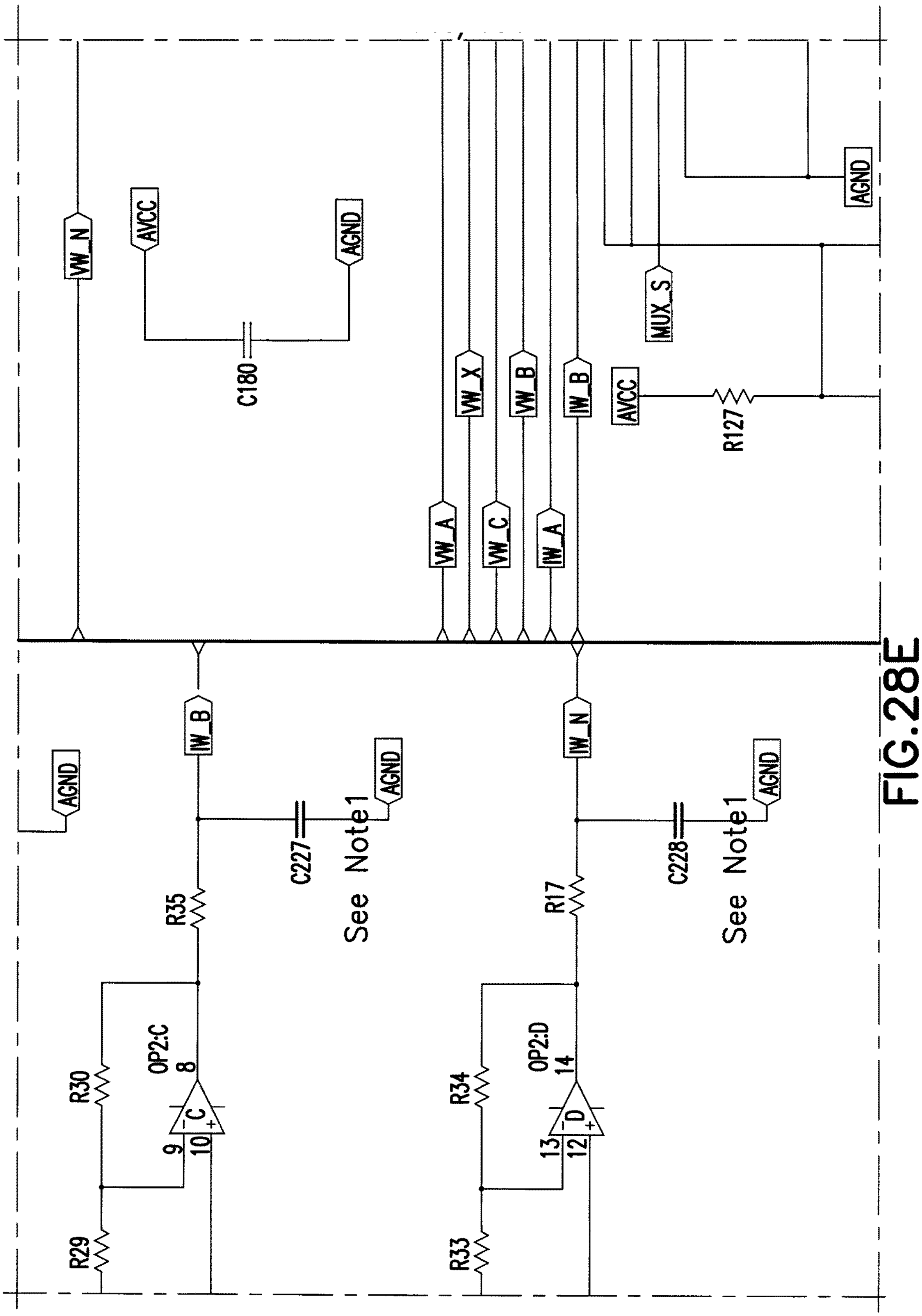
Figure 28F:
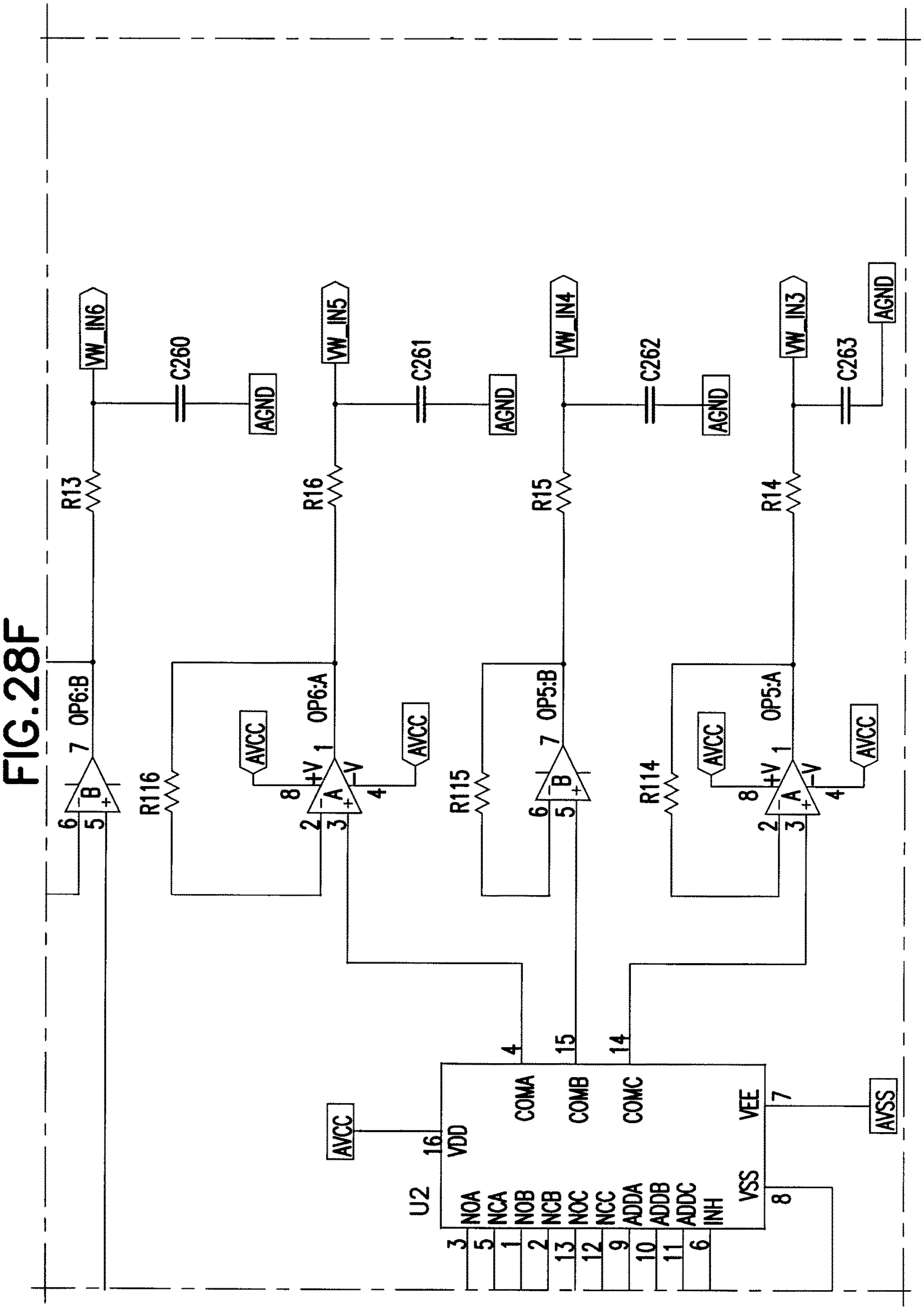
Figure 28G:
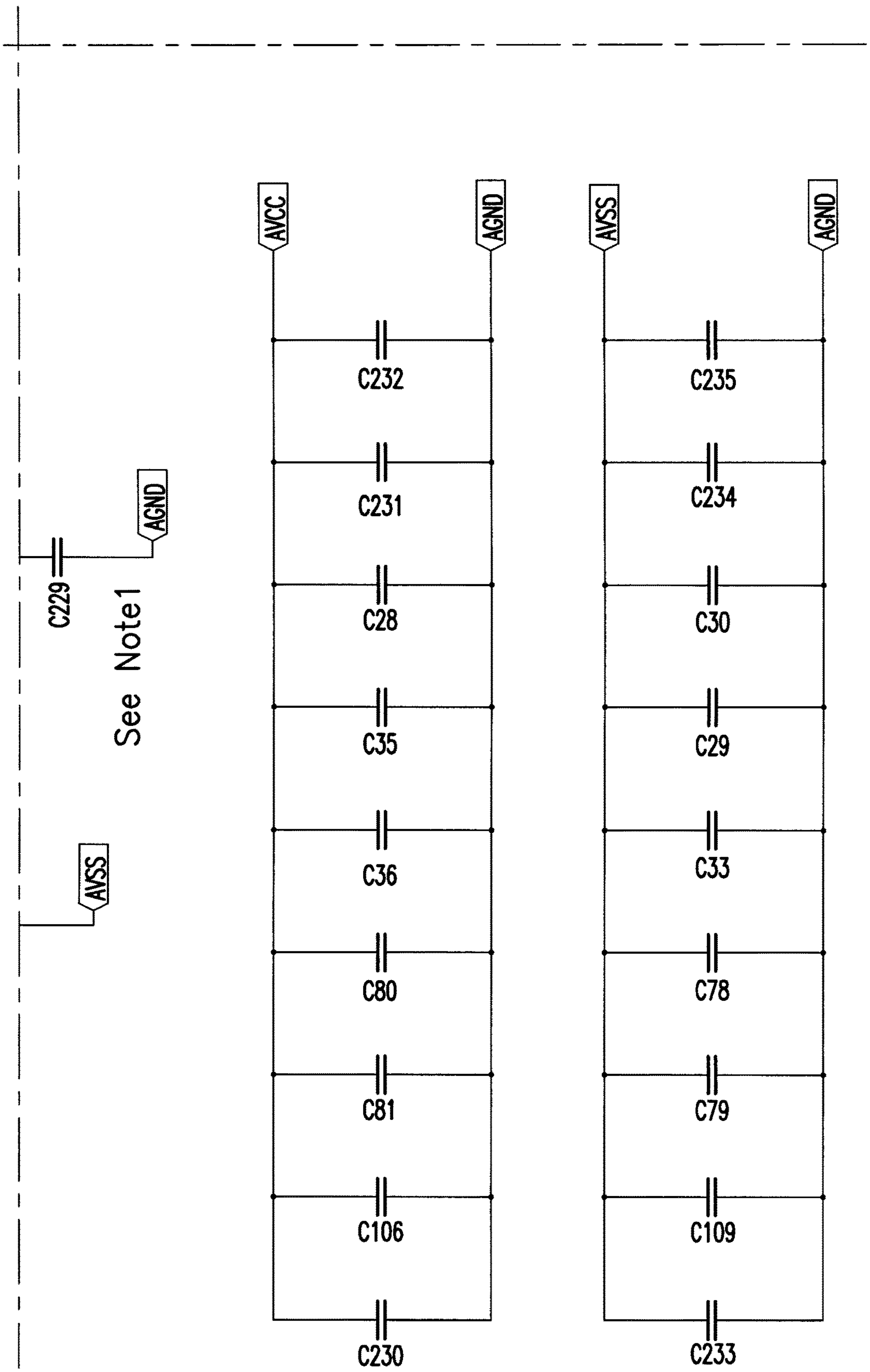

FIGS. 28D and 28G of FIG. 28 shows additional waveform capture voltage scaling and conditioning circuits and additional waveform capture current scaling and conditioning circuits.

Figure 28H:
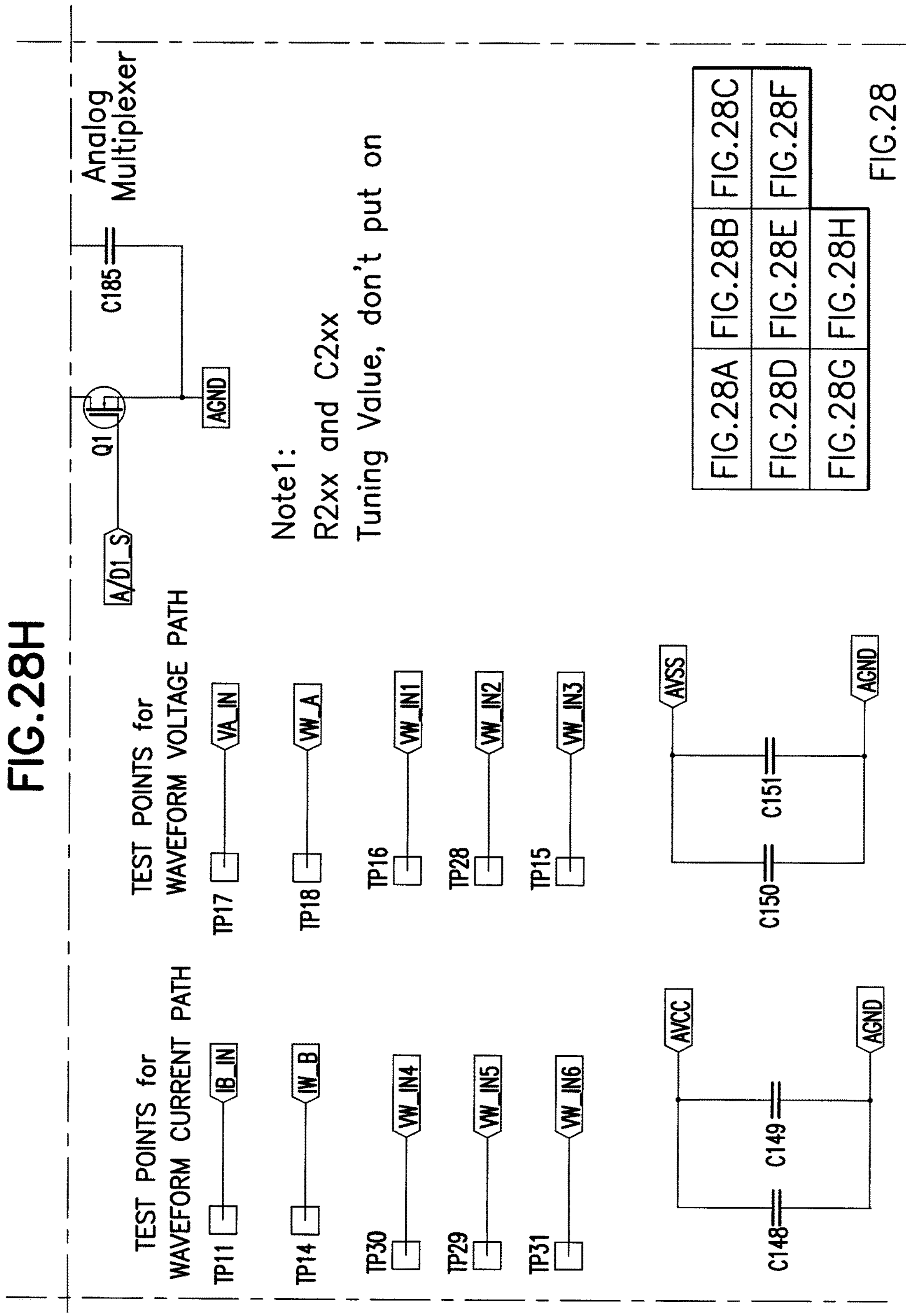

FIGS. 28E, 28F AND 28H of FIG. 28 shows signal selection for A/D inputs for waveform capture circuit and buffer for A/D inputs for waveform capture A/D.

FIGS. 28B and 28C of FIG. 28 shows additional buffer drivers to drive A/D inputs for waveform capture A/D.

Figure 29A:
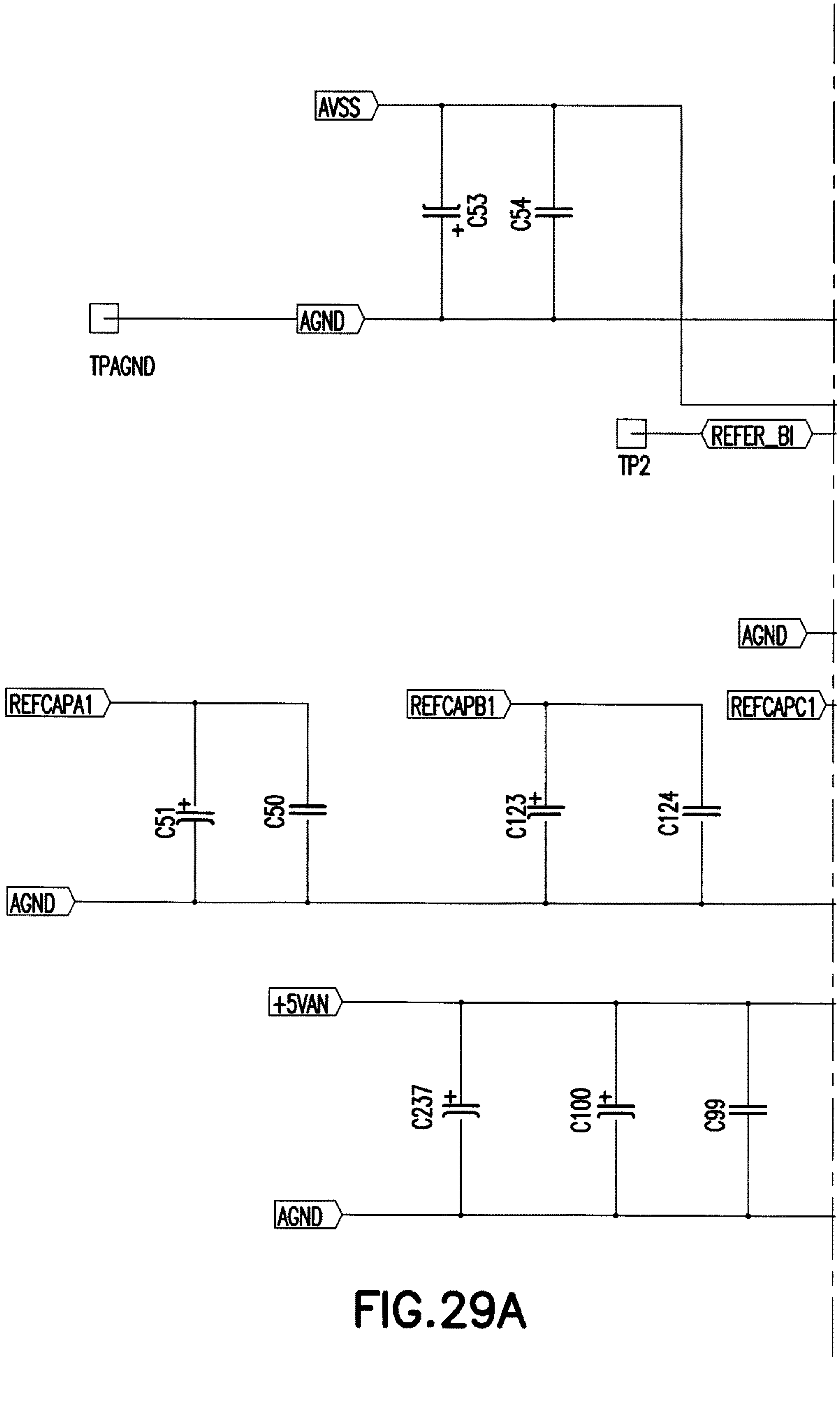
FIG. 29 illustrates how FIGS. 29A, 29B, 29C, 29D, 29E, 29F, 29G and 29H would fit together in order to form a single view of a schematic drawing of a portion of an IED of the present disclosure.
Figure 29B:
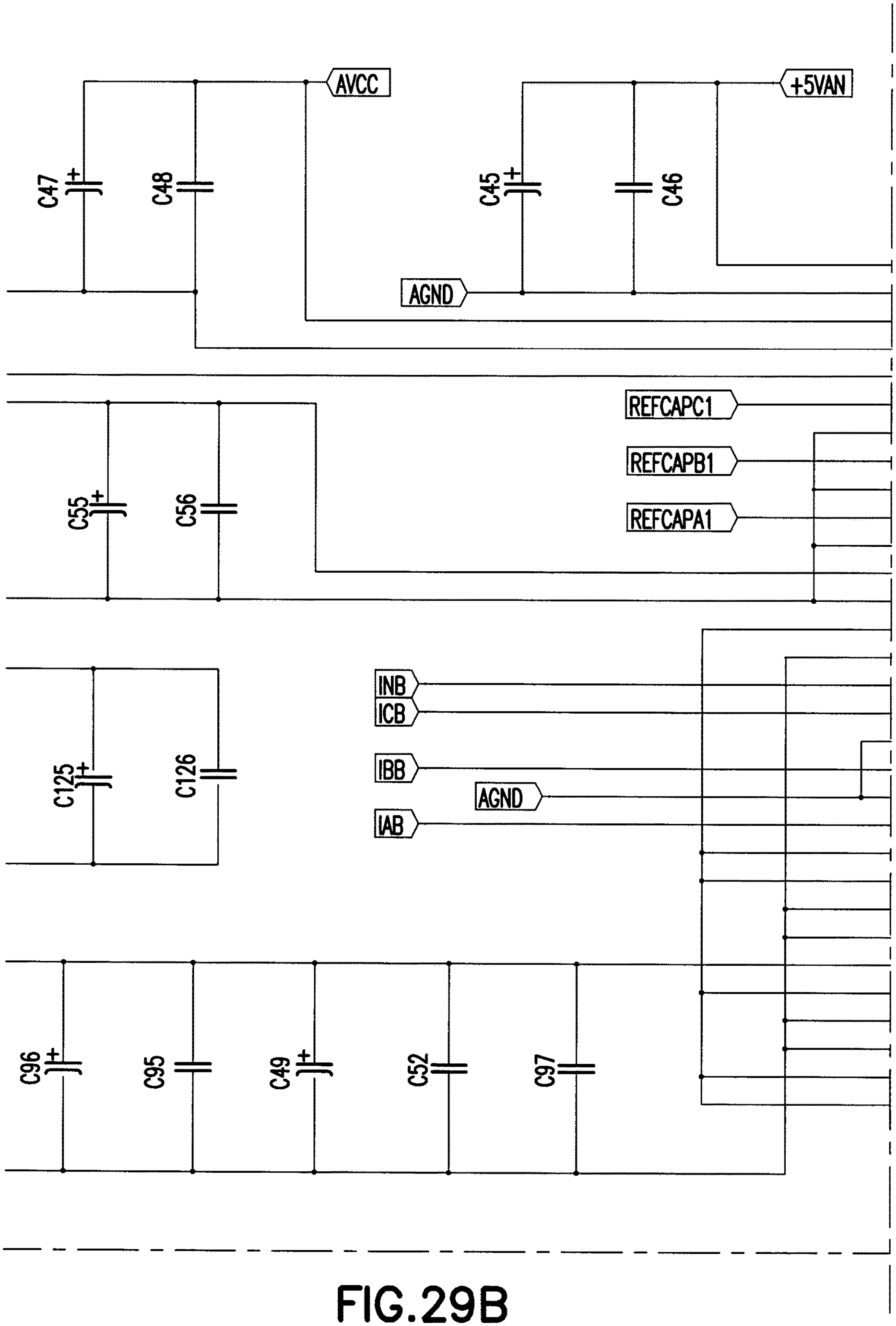
Figure 29C:
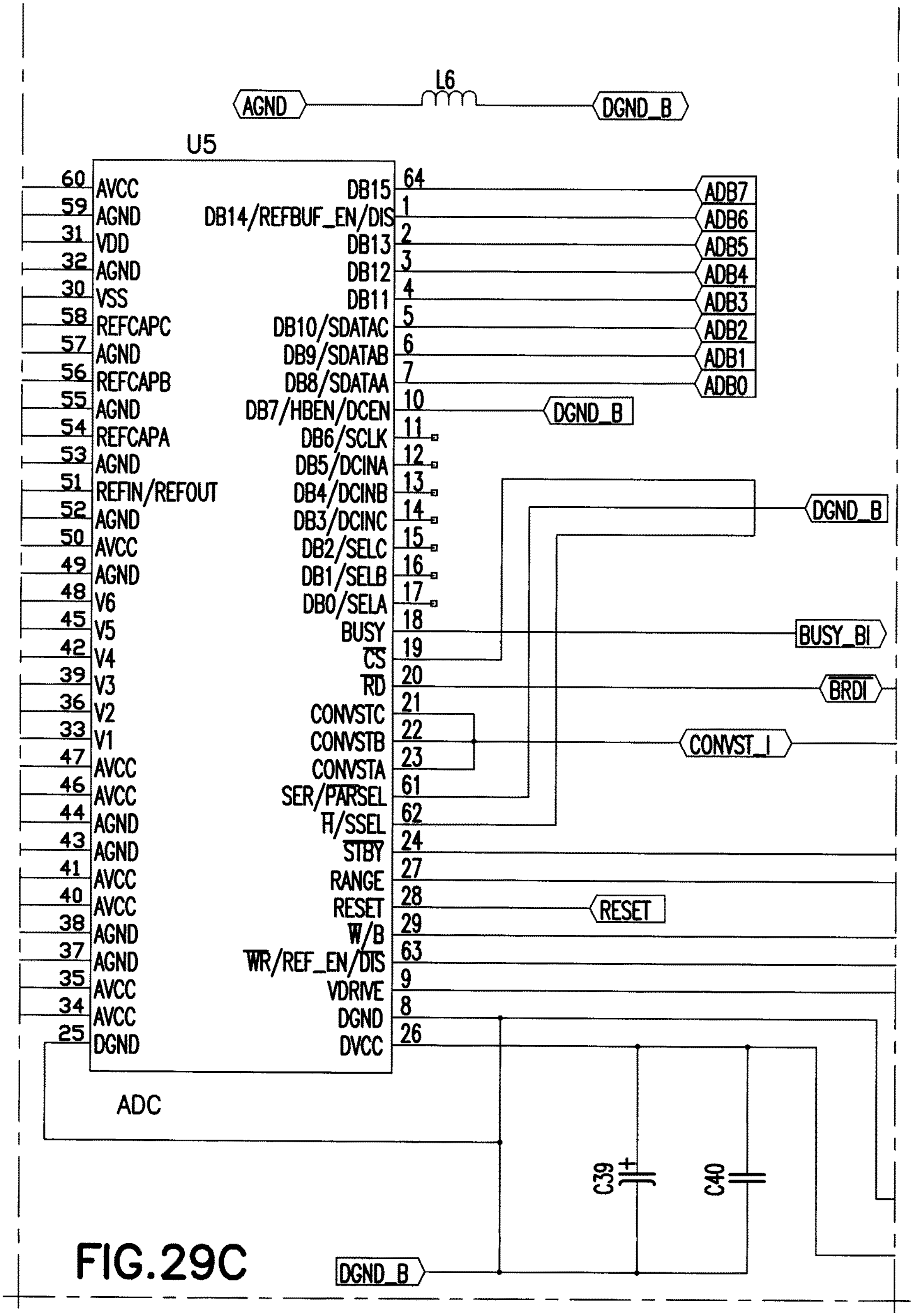
Figure 29D:
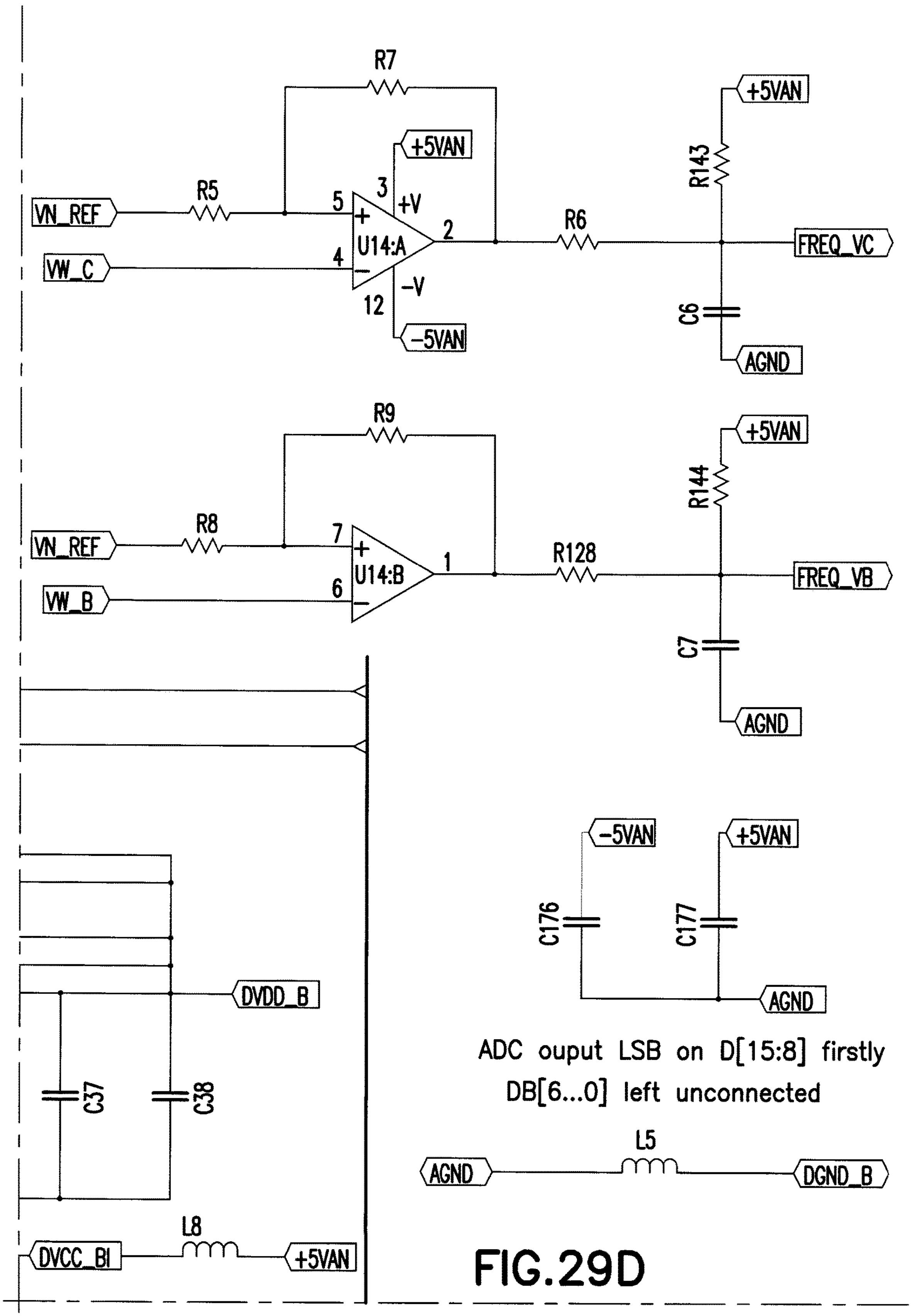
Figure 29E:
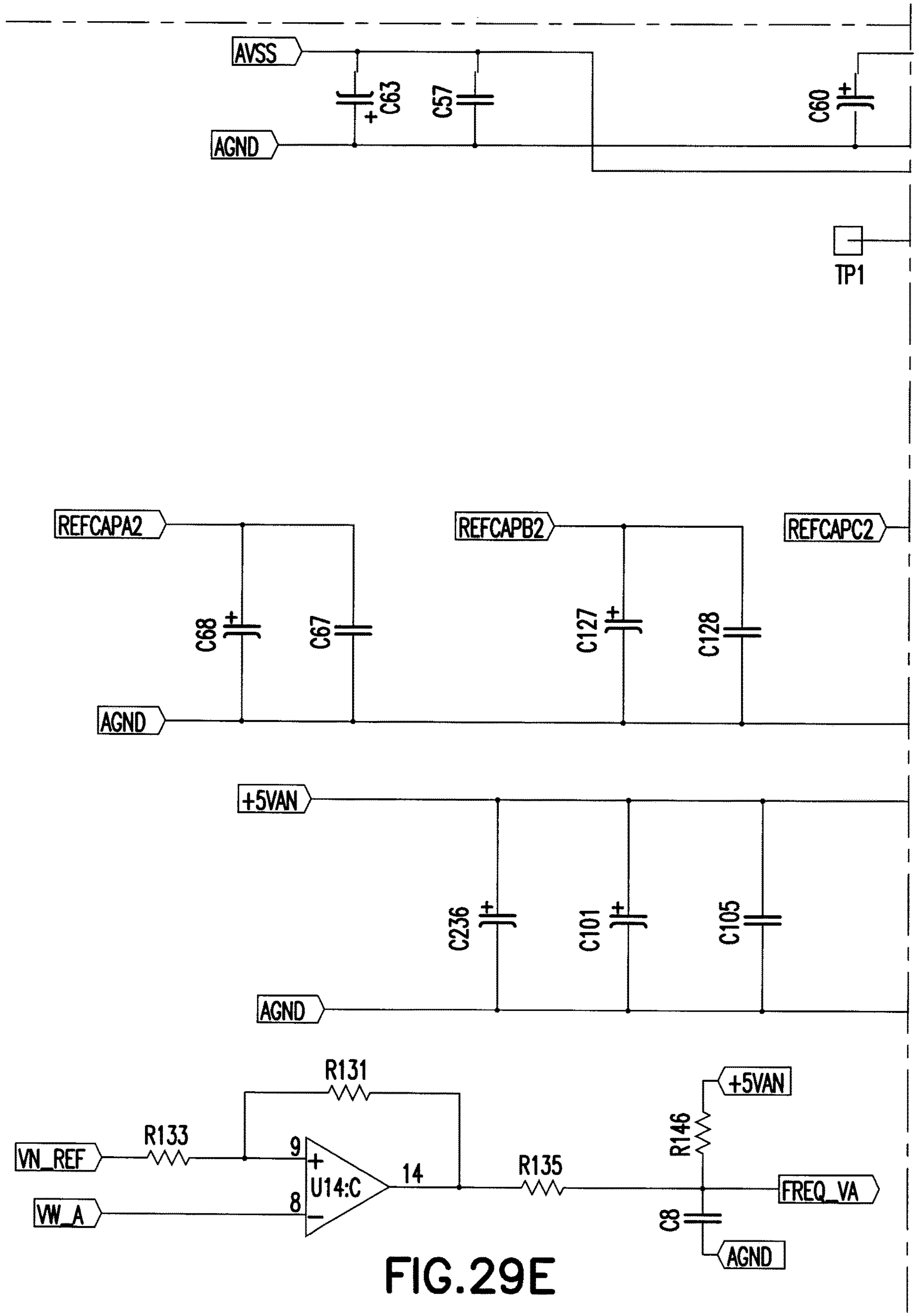
Figure 29F:
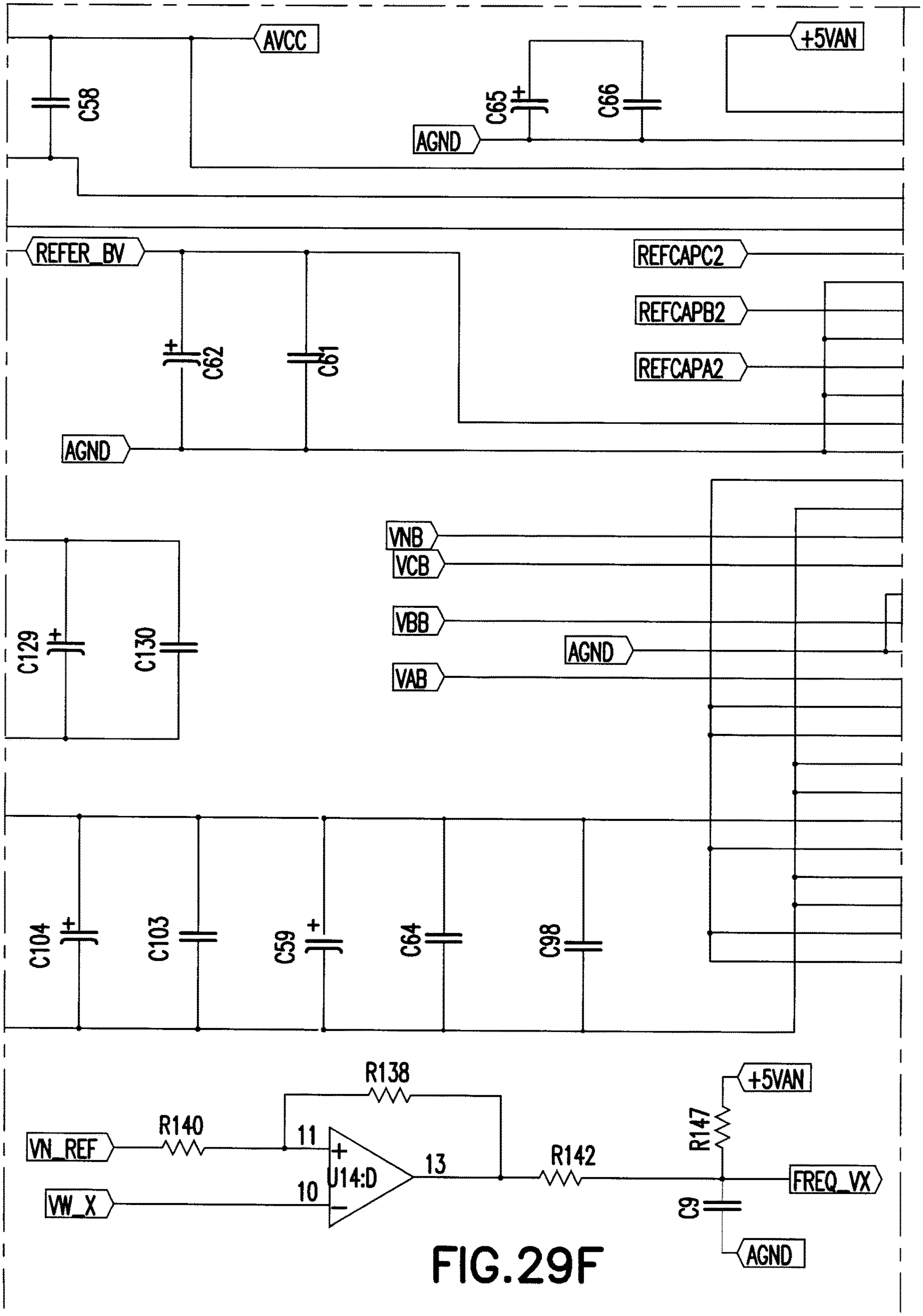
Figure 29G:
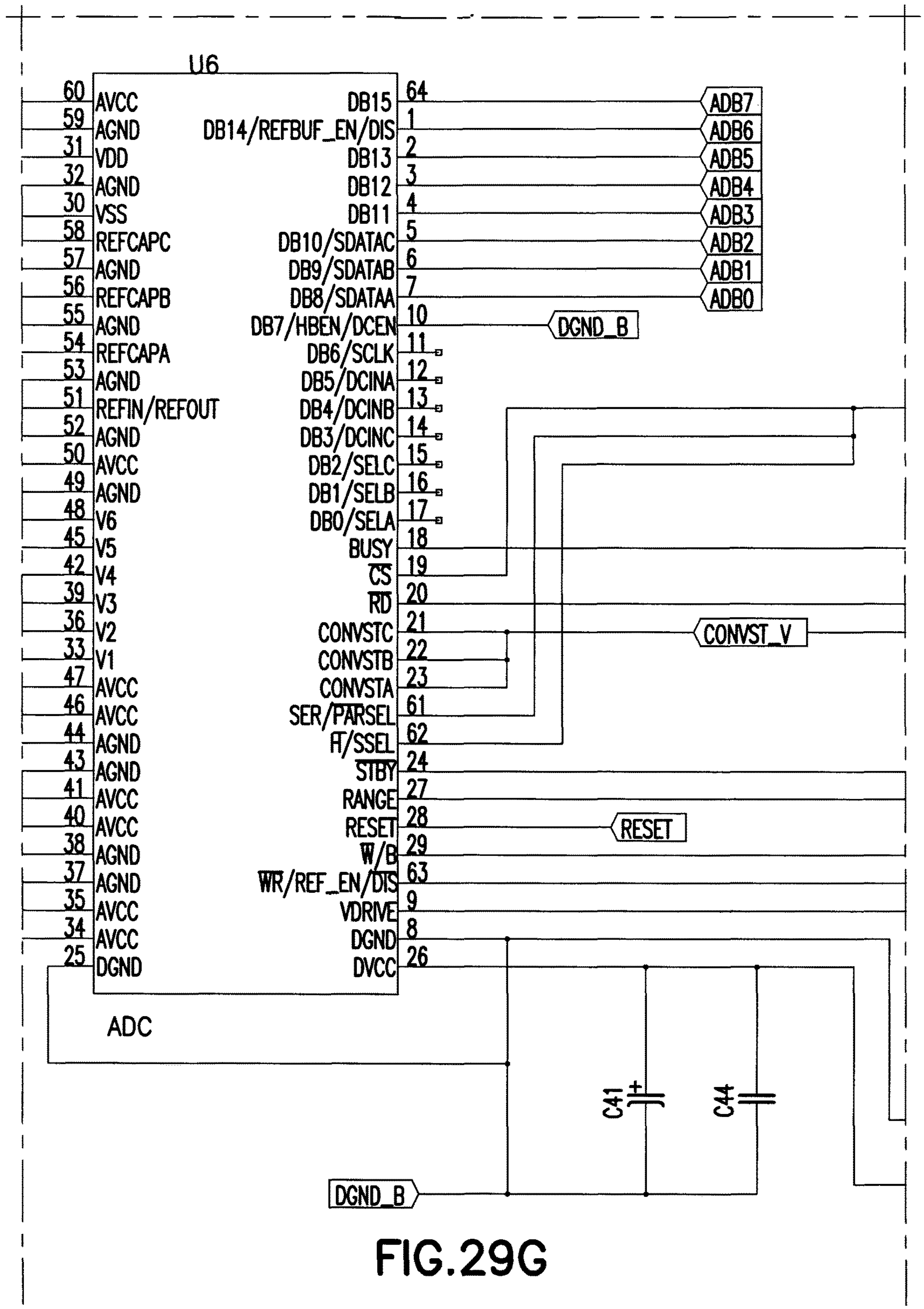
Figures 29, 29H:
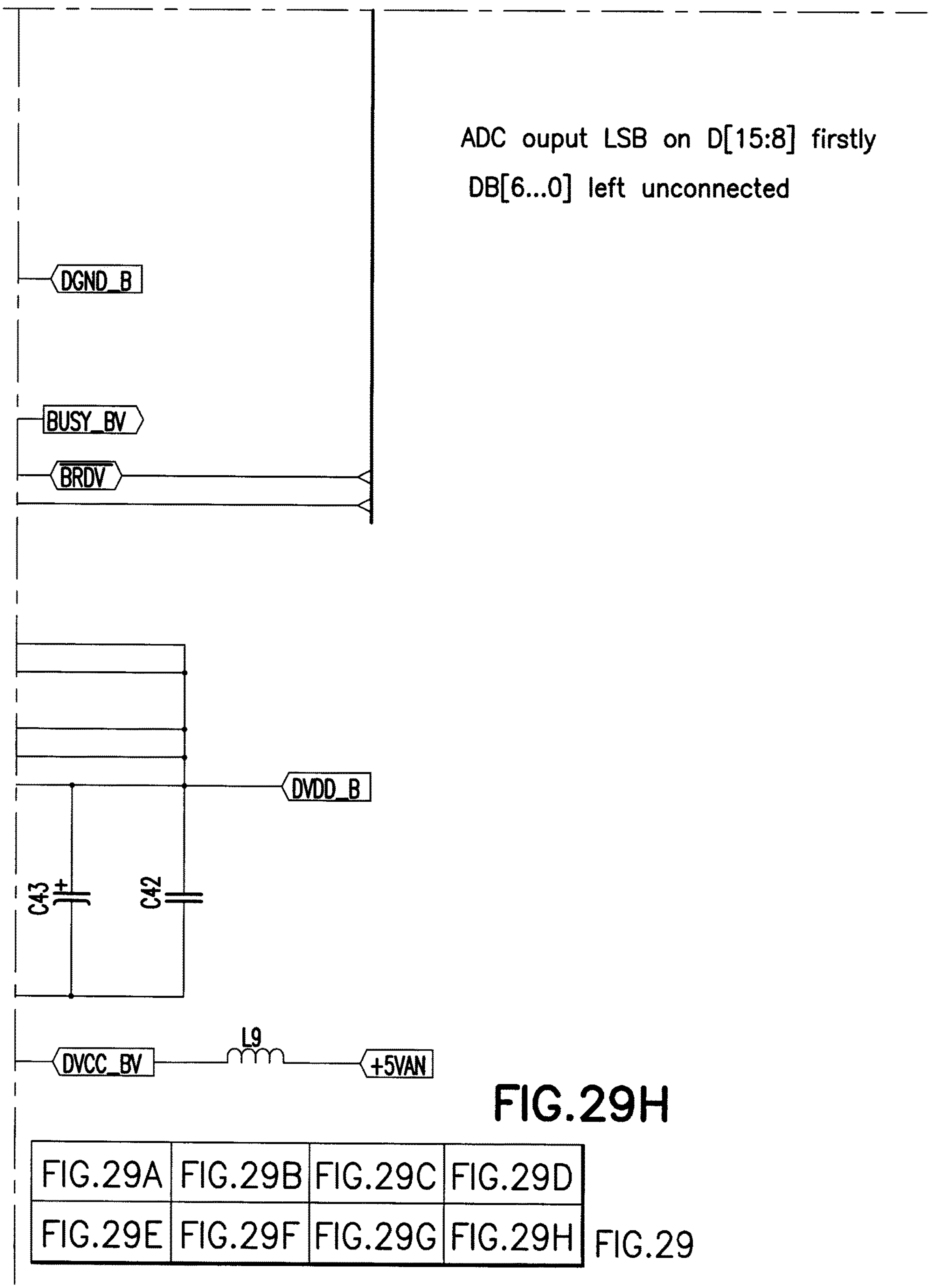

FIGS. 29A, 29B and 29C of FIG. 29 together show A/D circuit for measurement of revenue currents.

FIGS. 29D, 29E, 29F, 29G and 29H of FIG. 29 shows A/D circuit for measurement of revenue voltages and the zero crossing detection circuit.

Figures 30, 30A:
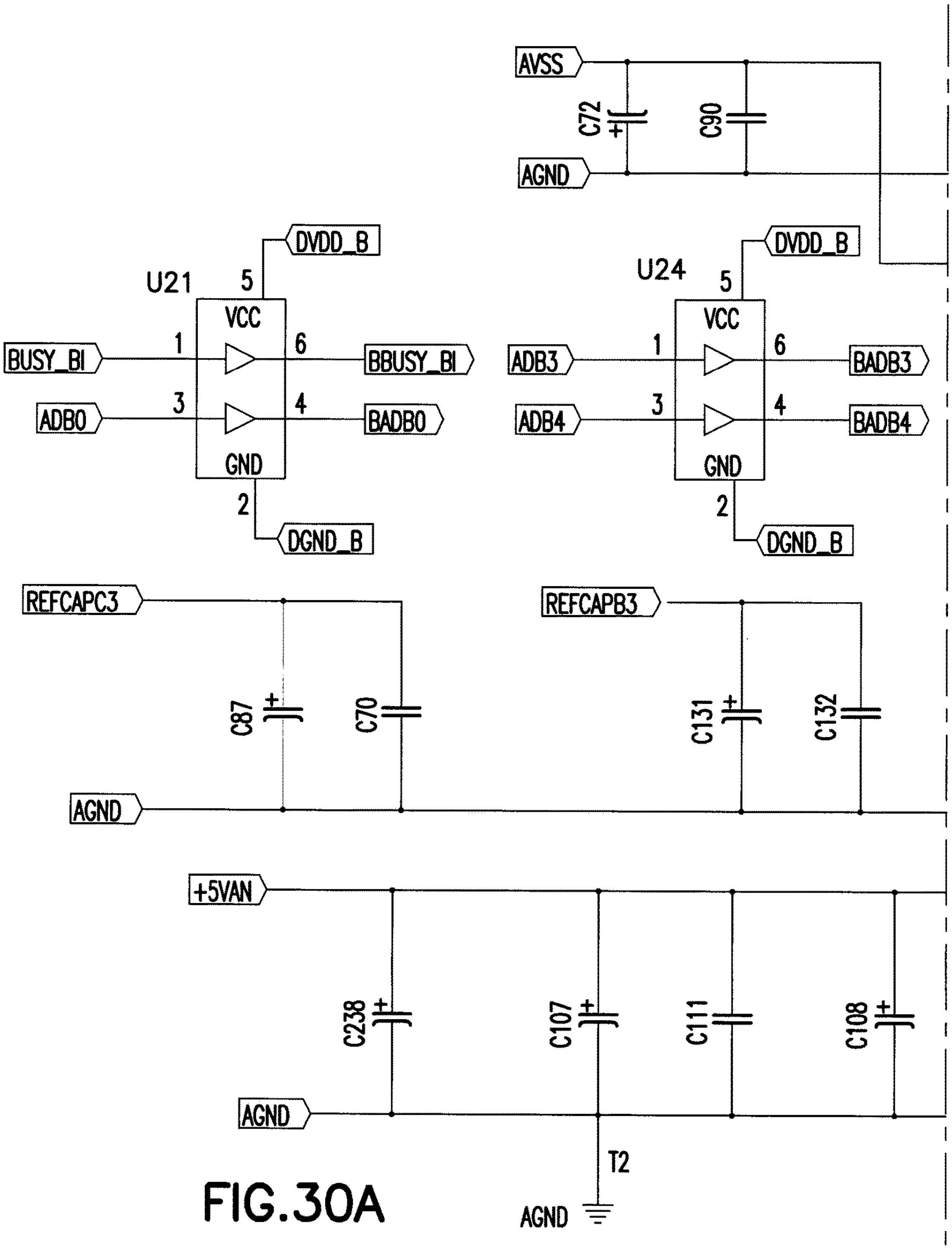
FIG. 30 illustrates how FIGS. 30A, 30B, 30C, 30D, 30E, 30F and 30G would fit together in order to form a single view of a schematic drawing of a portion of an IED of the present disclosure.
Figure 30B:
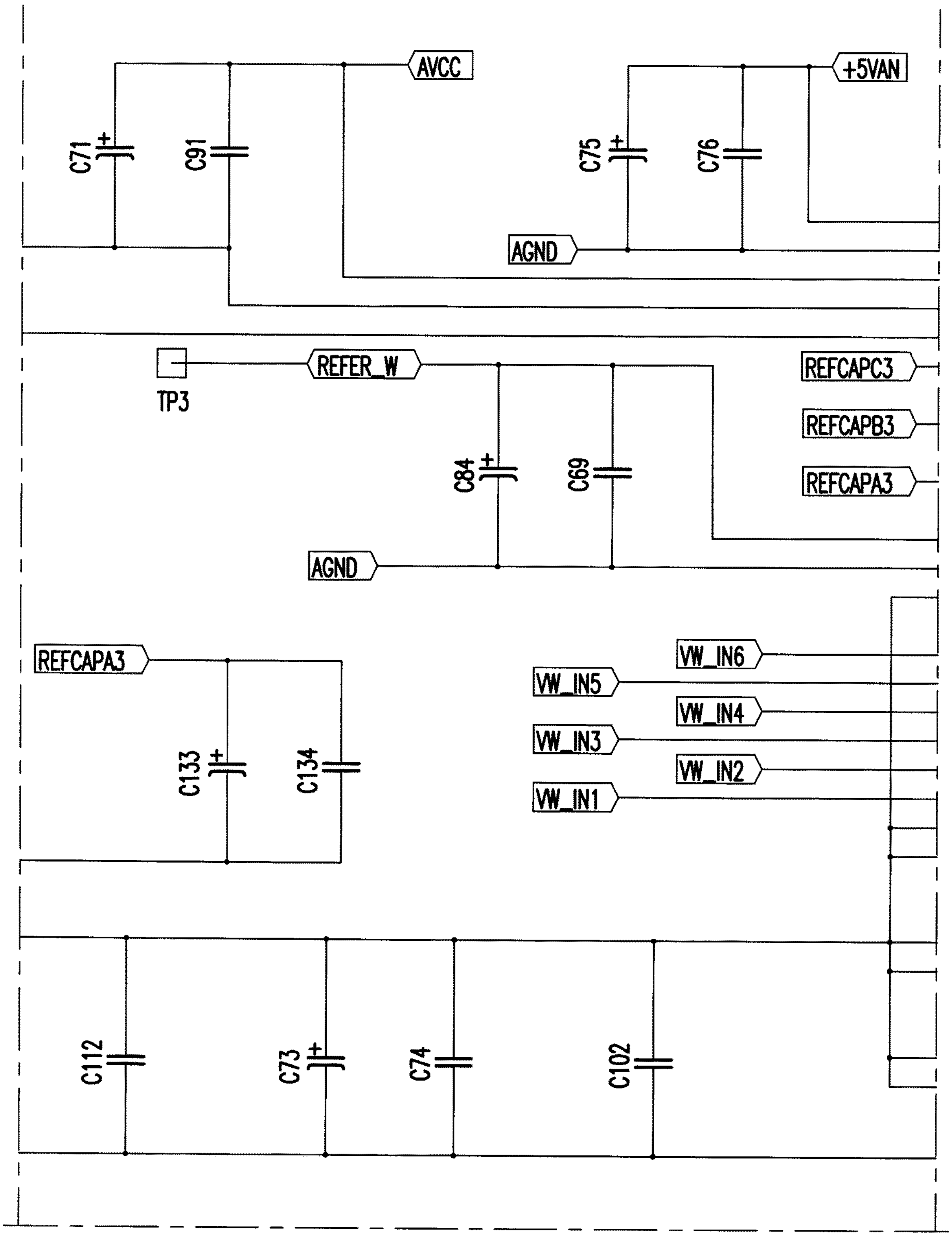

FIGS. 30A and 30B of FIG. 30 show part of voltage decoupling capacitor circuits.

Figure 30C:
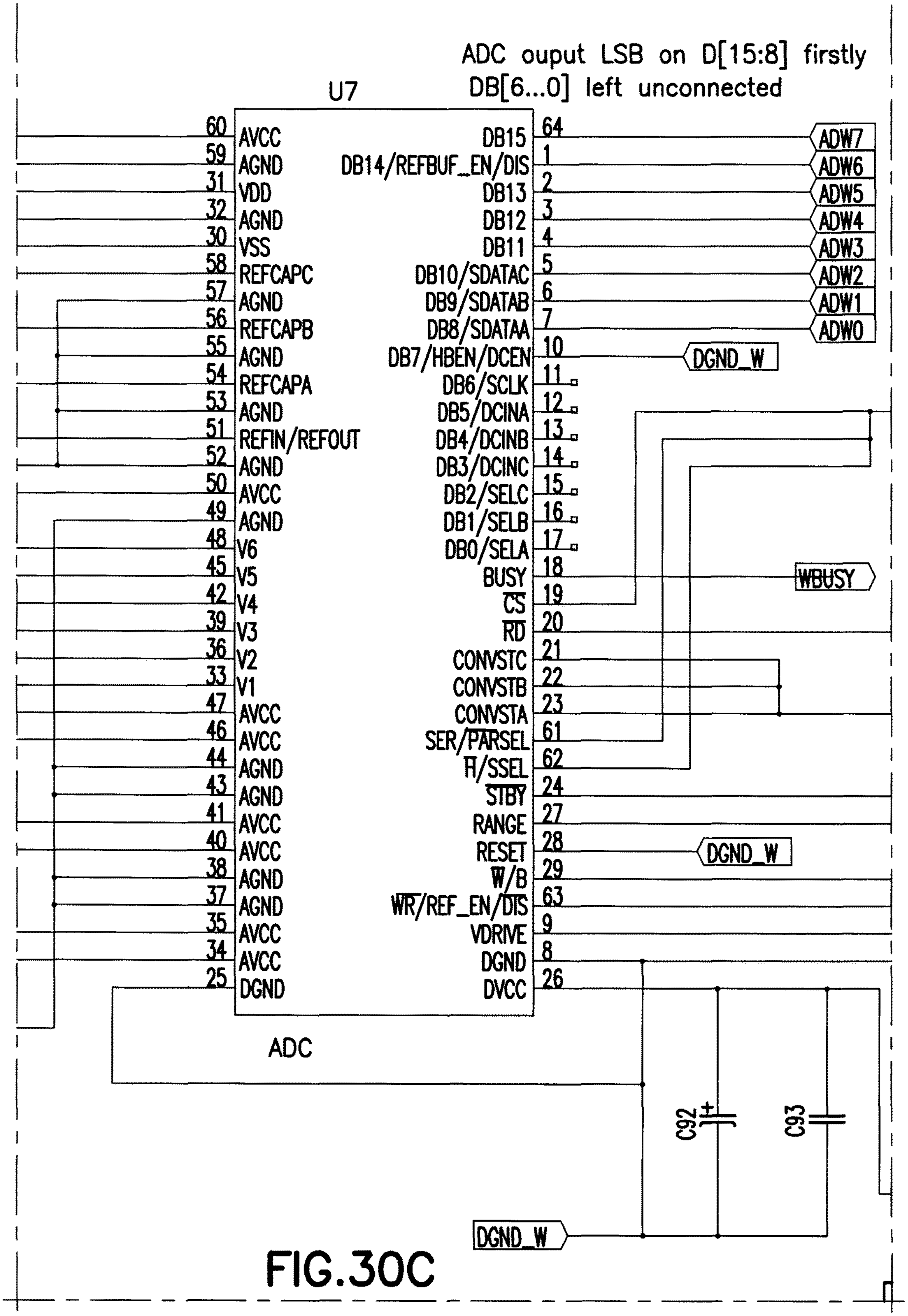
Figure 30D:
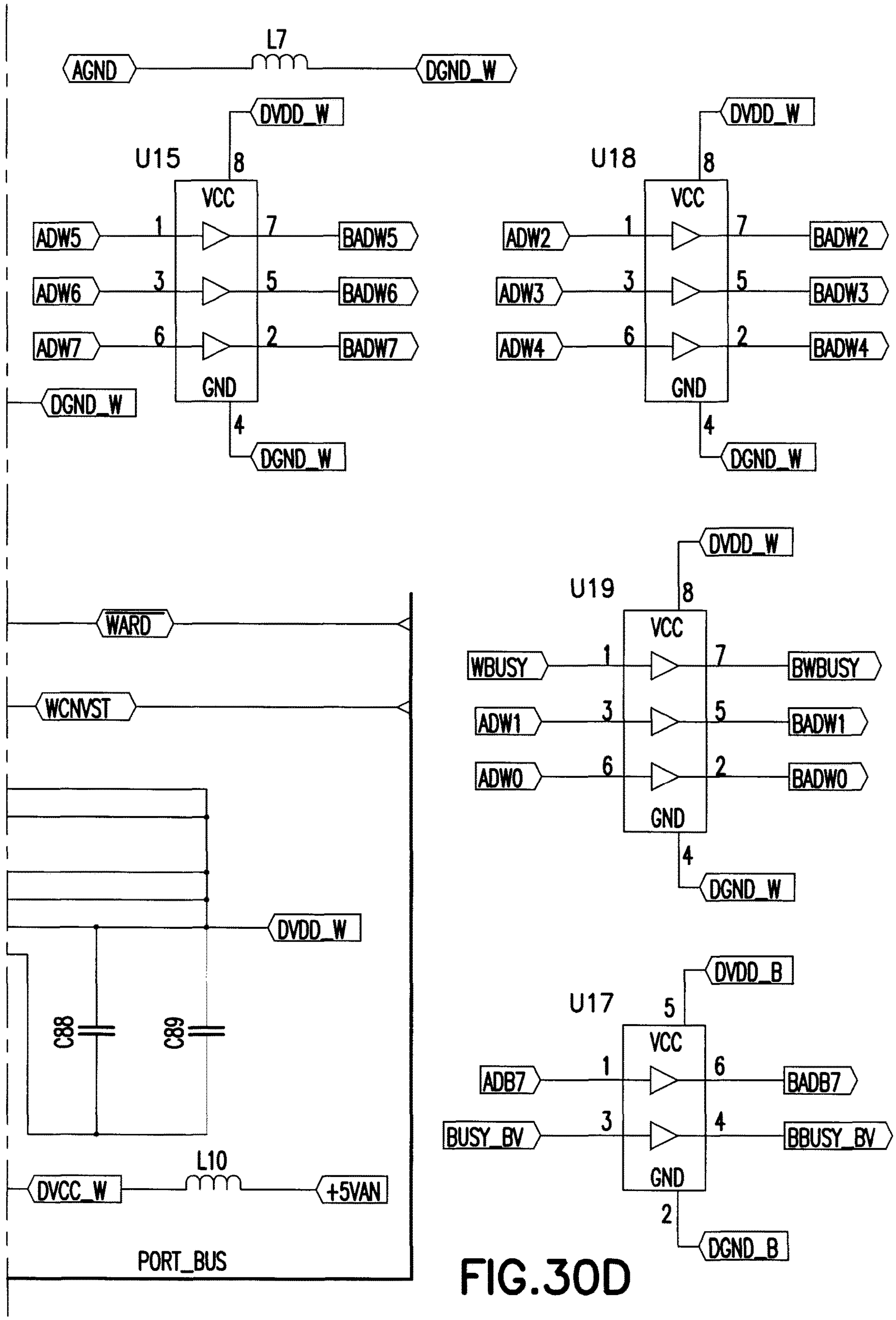
Figure 30E:
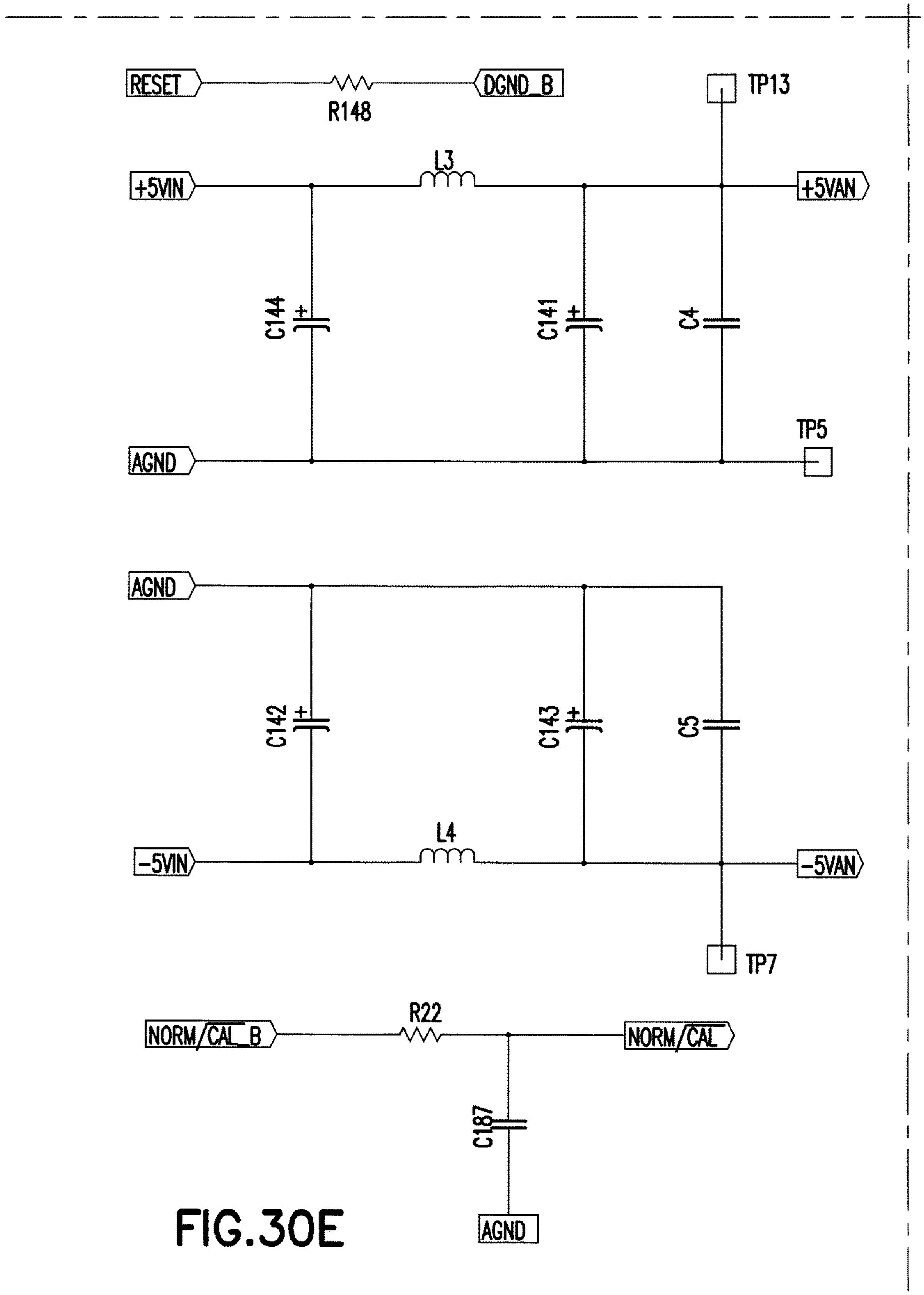

FIG. 30E of FIG. 30 shows additional decoupler circuits.

Figure 30F:
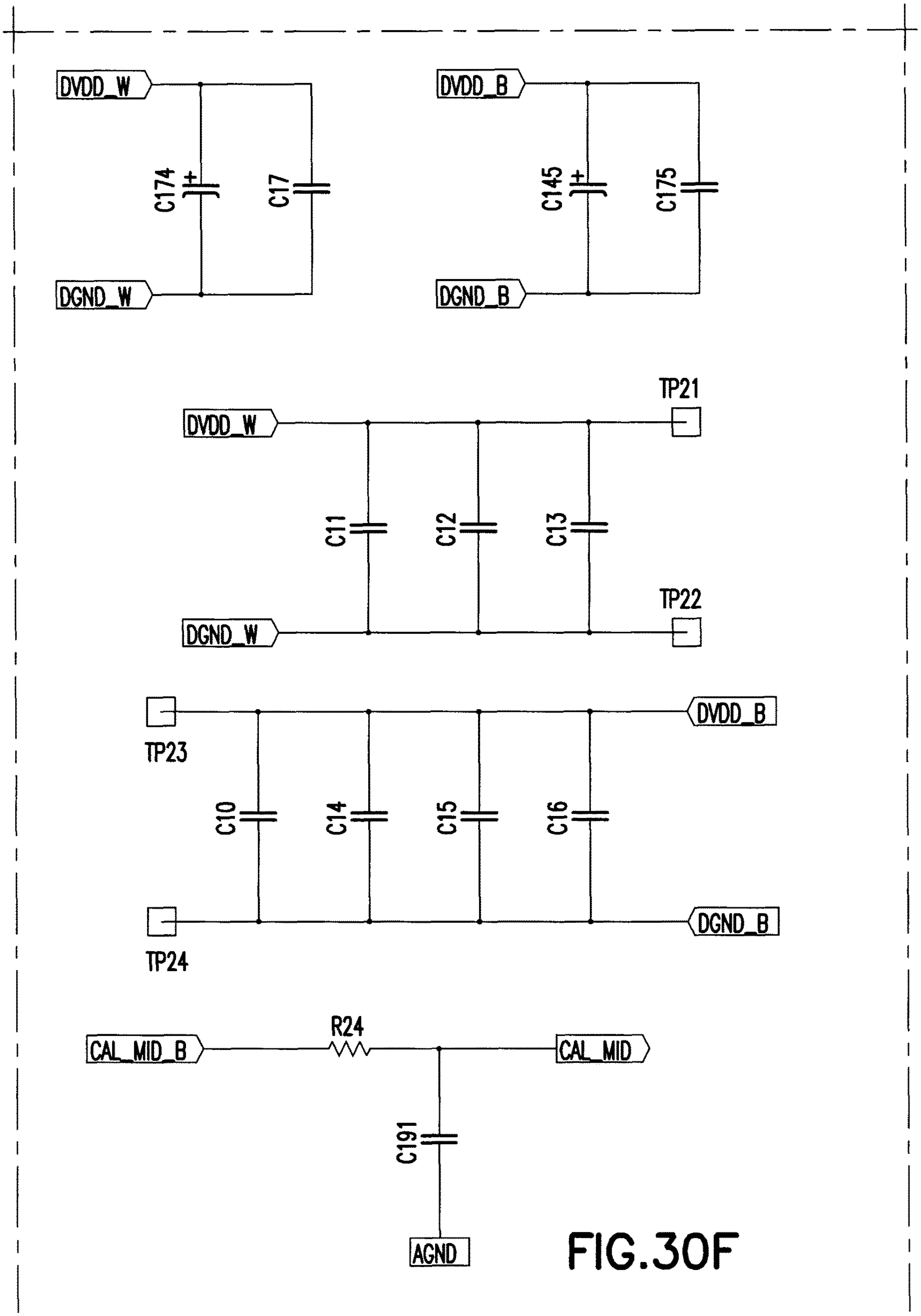
Figure 30G:
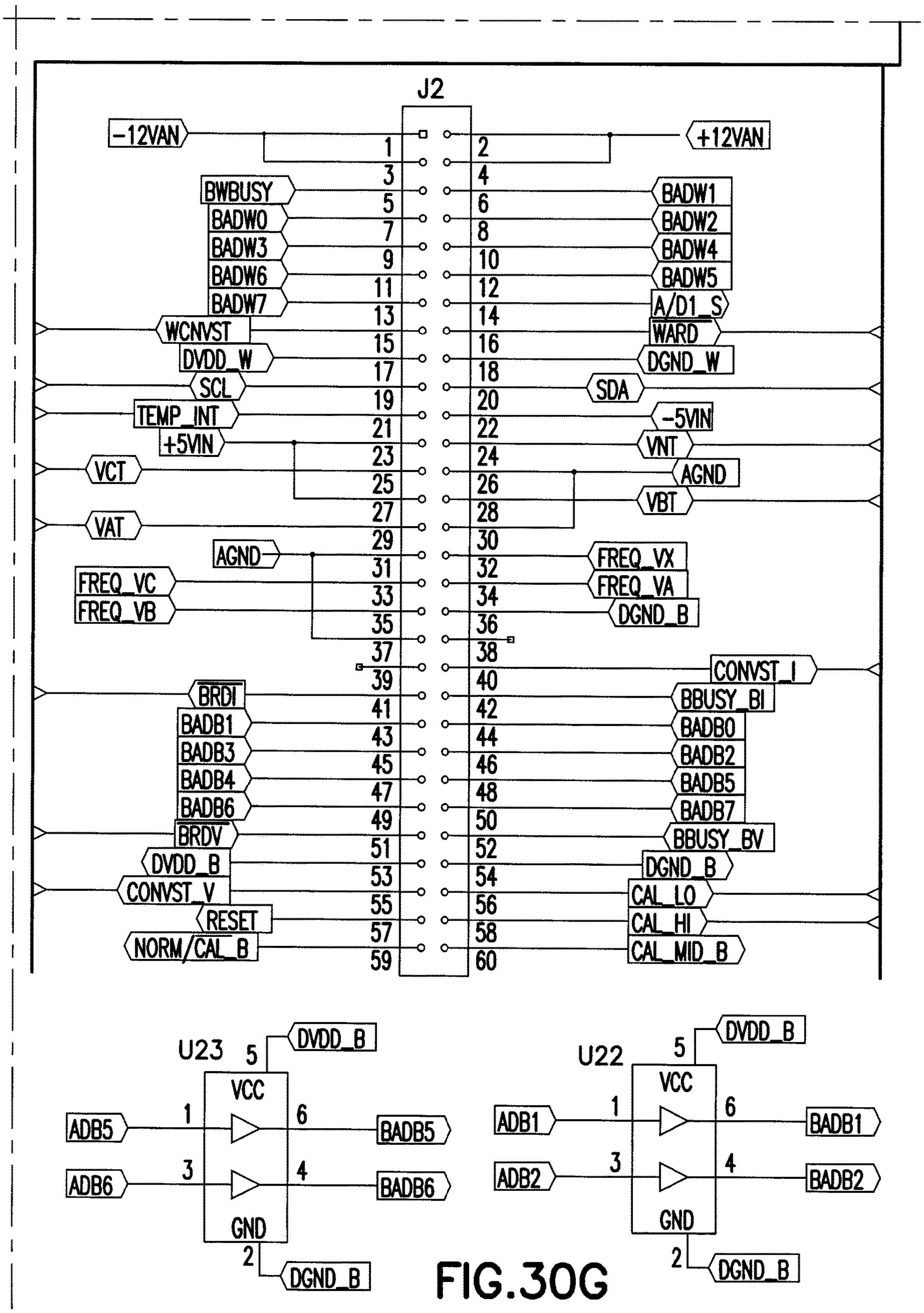

FIG. 30F with FIG. 30G of FIG. 30 together show I/O connectors and signals and digital output buffer of the A/Ds for the revenue measurement circuit.

FIGS. 30C and 30D of FIG. 30 shows the waveform capture A/Ds and the digital output buffers for the waveform capture A/Ds.

While presently preferred embodiments have been described for purposes of the disclosure, numerous changes in the arrangement of method steps and apparatus parts can be made by those skilled in the art. Such changes are encompassed within the spirit of the disclosure as defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '__________' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device (IED) for recording at least one waveform of an AC power system, the IED comprising:

a voltage input sensor circuit operative to sense line voltage from the AC power system and generate at least one voltage signal representative of the line voltage sensed from the AC power system;

a current input sensor circuit operative to sense line current from the AC power system and generate at least one current signal representative of the line current sensed from the AC power system;

a plurality of analog-to-digital converter circuits configured to sample the at least one voltage signal and the at least one current signal to output digital samples representative of the at least one voltage signal and the at least one current signal;

at least one processor operatively coupled to the plurality of analog-to-digital converter circuits and configured to perform at least one mathematical computation on the digital samples received from the analog-to-digital converter circuits; and at least one volatile memory operatively coupled to the at least one processor to receive and store the digital samples from the plurality of analog-to-digital converter circuits;

wherein the at least one processor is configured to monitor abnormal magnitude values of voltage and current waveform samples from the digital samples and monitor a duration of the abnormal magnitude values, the at least one processor further configured to analyze a combination of the abnormal magnitude values and the duration of the abnormal magnitude values to detect whether an alarm condition exists, wherein a magnitude of a current level multiple times higher than normal over at least one and a half cycles of a current waveform constitutes a first type of alarm condition and a magnitude of a voltage level higher than normal over multiple cycles of a voltage waveform constitutes a second type of alarm condition, and the at least one processor is configured to analyze the digital samples to generate a trigger based on an algorithm that includes at least one of an adaptive trigger, an envelope type waveform trigger including upper and lower thresholds for each digital sample in a waveform cycle that dynamically change according to digital samples in a previous waveform cycle, and a rate of change trigger, and wherein the at least one processor is further configured to store at least one of the digital samples in a non-volatile memory based on the generated trigger and send a communication based on the generated trigger.

2. The IED of claim 1, further comprising an internal circuit breaker configured to protect a load circuit from the alarm condition.

3. The IED of claim 2, wherein the internal circuit breaker includes a trip coil in line with incoming transmission lines from the AC power system, and wherein the internal circuit breaker is configured to activate the trip coil when an alarm output signal from the at least one processor is received.

4. The IED of claim 3, further comprising an alarm relay configured to receive the alarm output signal from the at least one processor and relay the alarm output signal to the trip coil.

5. The IED of claim 1, wherein the at least one processor is configured to compare the abnormal magnitude values and the duration of the abnormal magnitude values to values in a user-defined chart to detect whether the alarm condition exists.

6. The IED of claim 1, wherein the communication is an alarm output signal indicative of the alarm condition.

7. The IED of claim 1, wherein the IED is at least one of a programmable logic controller ("PLC"), a remote-terminal unit ("RTU"), an electric power meter, a protective relay, a fault recorder and a revenue meter.

8. An intelligent electronic device (IED) comprising:

a plurality of sensors configured to sense electrical parameters of incoming power lines, the incoming power lines configured to provide power from an electrical power distribution system to load circuitry;

a plurality of analog-to-digital converters configured to sample the electrical parameters sensed by the plurality of sensors to provide digital data; and at least one processor configured to receive the digital data and calculate, based on the digital data, at least one of power usage and waveform recording;

wherein the at least one processor is further configured to analyze the digital data and monitor a magnitude of an abnormal condition and a duration of the abnormal condition to detect whether an alarm condition exists;

wherein a magnitude of a current level multiple times higher than normal over at least one half cycle of a current waveform constitutes the alarm condition; and wherein the at least one processor is further configured to provide an alarm output signal when the alarm condition is detected.

9. The IED of claim 8, further comprising a protective circuit breaker configured to protect the load circuitry from the alarm condition.

10. The IED of claim 9, further comprising a housing, wherein the plurality of sensors, the plurality of analog-to-digital converters, the at least one processor, and the protective circuit breaker are disposed internally within the housing.

11. The IED of claim 9, wherein the protective circuit breaker includes a trip coil in line with the incoming power lines, and wherein the protective circuit breaker is configured to activate the trip coil when the alarm output signal from the at least one processor is received.

12. The IED of claim 11, further comprising an alarm relay configured to receive the alarm output signal from the at least one processor and relay the alarm output signal to the trip coil.

13. The IED of claim 8, wherein the at least one processor is configured to analyze voltage and current waveform samples of the digital data to detect whether the alarm condition exists.

14. The IED of claim 8, wherein the at least one processor is configured to compare the magnitude of the abnormal condition and the duration of the abnormal condition to values in a user-defined chart to detect whether the alarm condition exists.

15. The IED of claim 8, wherein the IED is at least one of a programmable logic controller ("PLC"), a remote terminal unit ("RTU"), an electric power meter, a protective relay, a fault recorder and a revenue meter.

16. An intelligent electronic device (IED), the IED comprising:

at least one sensor configured to sense electrical parameters of incoming power lines, the incoming power lines configured to provide power from an electrical power distribution system to load circuitry;

at least one input channel for receiving AC voltages and currents from the at least one sensor including at least one analog to digital converter for outputting digitized signals, the at least one input channel including a first input channel for transient detection sampling, a second input channel for waveform capture sampling and a third input channel for revenue measurement sampling, the at least one analog to digital converter for each of the at least one input channels having a different sampling rate, at least one processor that processes the digitized signals from the first input channel for transient detection sampling, the second input channel for waveform capture sampling, and the third input channel for revenue measurement sampling, wherein the at least one processor is further configured to analyze the digitized signals received from the second input channel for waveform capture sampling to detect whether an alarm condition exists; and wherein the at least one processor is further configured to provide an alarm output signal when the alarm condition is detected.

17. The IED of claim 16, further comprising a protective circuit breaker configured to protect the load circuitry from the alarm condition.

18. The IED of claim 17, wherein the protective circuit breaker includes a trip coil in line with the incoming power lines, and wherein the protective circuit breaker is configured to activate the trip coil when the alarm output signal from the at least one processor is received.

19. The IED of claim 16, wherein the IED is at least one of a programmable logic controller ("PLC"), a remote terminal unit ("RTU"), an electric power meter, a protective relay, a fault recorder and a revenue meter.

20. An intelligent electronic device (IED) comprising:

a plurality of sensors configured to sense electrical parameters of incoming power lines, the incoming power lines configured to provide power from an electrical power distribution system to load circuitry;

a plurality of analog-to-digital converters configured to sample the electrical parameters sensed by the plurality of sensors to provide digital data; and at least one processor configured to receive the digital data and calculate, based on the digital data, at least one of power usage and waveform recording;

wherein the at least one processor is further configured to analyze the digital data and monitor a magnitude of an abnormal condition and a duration of the abnormal condition to detect whether an alarm condition exists;

wherein a magnitude of a voltage level multiple times higher than normal over at least one half cycle of a voltage waveform constitutes the alarm condition; and wherein the at least one processor is further configured to provide an alarm output signal when the alarm condition is detected.

21. The IED of claim 20, further comprising a communication device for sending the alarm output signal via Ethernet Protocol.

22. The IED of claim 21, wherein the communication device sends the alarm output signal via email.

23. The IED of claim 20, wherein the IED is at least one of a programmable logic controller ("PLC"), a remote-terminal unit ("RTU"), an electric power meter, a protective relay, a fault recorder and a revenue meter.

* * * * *